(12) United States Patent
Takahashi et al.

(10) Patent No.: US 12,167,571 B2
(45) Date of Patent: Dec. 10, 2024

(54) VAPOR CHAMBER, ELECTRONIC DEVICE, METALLIC SHEET FOR VAPOR CHAMBER AND MANUFACTURING METHOD OF VAPOR CHAMBER

(71) Applicant: DAI NIPPON PRINTING CO., LTD., Tokyo-to (JP)

(72) Inventors: Shinichiro Takahashi, Tokyo-to (JP); Takayuki Ota, Tokyo-to (JP); Kiyotaka Takematsu, Tokyo-to (JP); Kenro Hirata, Tokyo-to (JP); Taizo Hashimoto, Tokyo-to (JP); Yoko Nakamura, Tokyo-to (JP); Kazunori Oda, Tokyo-to (JP); Toshihiko Takeda, Tokyo-to (JP); Terutoshi Momose, Tokyo-to (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 1088 days.

(21) Appl. No.: 16/651,565

(22) PCT Filed: Sep. 28, 2018

(86) PCT No.: PCT/JP2018/036261
§ 371 (c)(1),
(2) Date: Jul. 24, 2020

(87) PCT Pub. No.: WO2019/065969
PCT Pub. Date: Apr. 4, 2019

(65) Prior Publication Data
US 2020/0404802 A1  Dec. 24, 2020

(30) Foreign Application Priority Data

Sep. 28, 2017 (JP) .................. 2017-188534
Oct. 6, 2017 (JP) .................. 2017-196065
(Continued)

(51) Int. Cl.
*H05K 7/20* (2006.01)
*B32B 3/30* (2006.01)
(Continued)

(52) U.S. Cl.
CPC .............. *H05K 7/2029* (2013.01); *B32B 3/30* (2013.01); *B32B 15/01* (2013.01); *C23F 1/02* (2013.01);
(Continued)

(58) Field of Classification Search
None
See application file for complete search history.

(56) References Cited

U.S. PATENT DOCUMENTS 9,568,965 B2   2/2017   Honmura et al.
2005/0022978 A1   2/2005   Duval
(Continued)

FOREIGN PATENT DOCUMENTS

CN   101047045 A   10/2007
CN   101119625 A   2/2008
(Continued)

OTHER PUBLICATIONS

Apr. 3, 2020 Office Action issued in Japanese Patent Application No. 2018-534996.
(Continued)

*Primary Examiner* — Jerry-Daryl Fletcher
*Assistant Examiner* — Daniel C Comings
(74) *Attorney, Agent, or Firm* — Oliff PLC

(57) ABSTRACT

A liquid flow path portion of a vapor chamber according to the present invention includes a plurality of main flow grooves which each extend in the first direction and through which working fluid in liquid form passes. A convex array which includes a plurality of liquid flow path convex portions arranged in the first direction via a communicating
(Continued)

groove, is provided between a pair of the main flow grooves adjacent to each other. Each of the communicating grooves allows communication between the corresponding pair of the main flow grooves. The width of the communicating groove is larger than the width of the main flow groove.

22 Claims, 53 Drawing Sheets

(30) Foreign Application Priority Data

| | | | |
|---|---|---|---|
| Nov. 10, 2017 | (JP) | ............................... | 2017-217593 |
| Nov. 10, 2017 | (JP) | ............................... | 2017-217633 |
| Feb. 23, 2018 | (JP) | ............................... | 2018-030999 |
| Apr. 17, 2018 | (JP) | ............................... | 2018-079326 |
| May 2, 2018 | (JP) | ............................... | 2018-088848 |

(51) Int. Cl.
  *B32B 15/01* (2006.01)
  *C23F 1/02* (2006.01)
  *F28D 15/02* (2006.01)
  *F28D 15/04* (2006.01)
  *F28F 3/12* (2006.01)
  *F28D 21/00* (2006.01)

(52) U.S. Cl.
  CPC ....... *F28D 15/0233* (2013.01); *F28D 15/046* (2013.01); *F28F 3/12* (2013.01); *B32B 2457/00* (2013.01); *F28D 2021/0029* (2013.01); *H05K 7/20336* (2013.01)

(56) References Cited

U.S. PATENT DOCUMENTS

| | | | |
|---|---|---|---|
| 2006/0144565 A1 | 7/2006 | Tsai et al. | |
| 2007/0068657 A1 | 3/2007 | Yamamoto et al. | |
| 2007/0227704 A1 | 10/2007 | Nagai et al. | |
| 2008/0029251 A1 | 2/2008 | Nakajima et al. | |
| 2008/0216994 A1* | 9/2008 | Lee ..................... | F28D 15/0233 29/890.03 |
| 2009/0178784 A1 | 7/2009 | Wang | |
| 2010/0018676 A1 | 1/2010 | Yang et al. | |
| 2014/0311713 A1 | 10/2014 | Wu et al. | |
| 2015/0077929 A1 | 3/2015 | Honmura et al. | |
| 2017/0023307 A1 | 1/2017 | Wang et al. | |
| 2017/0023308 A1 | 1/2017 | Huang et al. | |
| 2018/0066897 A1* | 3/2018 | Lin ..................... | H05K 7/20336 |
| 2018/0156545 A1* | 6/2018 | Delano ................ | F28D 15/043 |

FOREIGN PATENT DOCUMENTS

| | | | |
|---|---|---|---|
| CN | 101133295 A | 2/2008 | |
| CN | 102778156 A | 11/2012 | |
| CN | 203687721 U | 7/2014 | |
| JP | S58-012991 A | 1/1983 | |
| JP | S62-156273 U | 10/1987 | |
| JP | H03-186195 A | 8/1991 | |
| JP | H03-271695 A | 12/1991 | |
| JP | 104-32695 A | 2/1992 | |
| JP | H10-185465 A | 7/1998 | |
| JP | 2002-39693 A | 2/2002 | |
| JP | 2002-323292 A | 11/2002 | |
| JP | 2004-245550 A | 9/2004 | |
| JP | 2004-309002 A | 11/2004 | |
| JP | 2007-212028 A | 8/2007 | |
| JP | 2007266153 A * | 10/2007 | ......... F28D 15/0233 |
| JP | 2007-315745 A | 12/2007 | |
| JP | 2010-19495 A | 1/2010 | |
| JP | 2010-181057 A | 8/2010 | |
| JP | 2011-145044 A | 7/2011 | |
| JP | 2011-226686 A | 11/2011 | |
| JP | 2014-142143 A | 8/2014 | |
| JP | 2015-059693 A | 3/2015 | |
| JP | 2015-088882 A | 5/2015 | |
| JP | 2015-219639 A | 12/2015 | |
| JP | 2016-017702 A | 2/2016 | |
| JP | 2016-050682 A | 4/2016 | |
| JP | 2016-142416 A | 8/2016 | |
| JP | 2016-156584 A | 9/2016 | |
| JP | 2016-205693 * | 12/2016 | ............. F28D 15/02 |
| JP | 2016-205693 A | 12/2016 | |
| JP | 2016-223673 A | 12/2016 | |
| JP | 2017-106672 A | 6/2017 | |
| KR | 10-2005-0073424 A | 7/2005 | |
| KR | 10-2009-0059449 A | 6/2009 | |
| KR | 10-2016-0114626 A | 10/2016 | |
| KR | 10-2016-0146614 A | 12/2016 | |
| WO | 2017/203574 A1 | 11/2017 | |
| WO | 2018/155641 A1 | 8/2018 | |

OTHER PUBLICATIONS

Apr. 20, 2020 Office Action issued in Chinese Patent Application No. 201880013745.8.
Sep. 11, 2020 Office Action issued in Japanese Patent Application No. 2018-186079.
Jul. 28, 2020 Office Action issued in Japanese Patent Application No. 2018-186079.
Sep. 18, 2020 Office Action issued in Japanese Patent Application No. 2020-142964.
Jun. 4, 2021 Office Action issued in Chinese Patent Application No. 201880076012.9.
Jul. 16, 2021 Office Action issued in Taiwanese Patent Application No. 107134333.
Nov. 20, 2020 Office Action issued in Taiwanese Patent Application No. 107106230.
U.S. Appl. No. 16/488,843, filed Aug. 26, 2019 in the name of Takahashi et al.
Sep. 4, 2020 Office Action issued in Chinese Patent Application No. 201880013745.8.
Mar. 31, 2020 International Preliminary Report on Patentability issued in International Patent Application No. PCT/JP2018/036261.
Dec. 28, 2021 Office Action issued in Korean Application No. 10-2019-7024492.
Sep. 3, 2021 Office Action issued in Japanese Patent Application No. 2020-198796.
Sep. 2, 2021 Office Action issued in Chinese Patent Application No. 202011619911.4.
Dec. 25, 2018 International Search Report issued in International Patent Application No. PCT/JP2018/036261.
May 1, 2018 International Search Report issued in International Patent Application No. PCT/JP2018/006758.
Aug. 27, 2019 International Preliminary Report on Patentability issued in International Patent Application No. PCT/JP2018/006758.
Sep. 4, 2020 Office Action issued in Japanese Patent Application No. 2018-534996.
Jun. 11, 2021 Office Action issued in U.S. Appl. No. 16/488,843.
Jan. 31, 2024 Office Action issued in U.S. Appl. No. 18/223,723.
Jan. 30, 2024 Office Action issued in Korean Patent Application No. 10-2023-7041026.
Jun. 21, 2024 Office Action issued in Korean Patent Application No. 10-2023-7018049.
May 24, 2024 Office Action issued in U.S. Appl. No. 18/223,723.
May 24, 2024 Office Action issued in Japanese Application No. 2023-068849.
Feb. 16, 2022 Office Action issued in Chinese Application No. 202011619911.4.
Feb. 28, 2022 Office Action issued in Chinese Application No. 201880076012.9.
Mar. 29, 2022 Office Action issued in Korean Patent Application No. 10-2020-7011818.
Mar. 28, 2022 Office Action issued in Taiwanese Patent Application No. 110125873.
Jun. 14, 2022 Office Action issued in Japanese Patent Application No. 2018-186081.

(56) References Cited

OTHER PUBLICATIONS

Jun. 14, 2022 Office Action issued in Japanese Patent Application No. 2018-186084.
Jul. 1, 2022 Office Action issued in Japanese Application No. 2018-186121.
Jul. 5, 2022 Office Action issued in Japanese Application No. 2018-186082.
Sep. 20, 2022 Office Action issued in Chinese Patent Application No. 201880076012.9.
Sep. 2, 2022 Office Action issued in Japanese Patent Application No. 2021-163743.
Aug. 1, 2022 Office Action issued in Chinese Patent Application No. 202110492700.7.
Sep. 19, 2022 Office Action issued in U.S. Appl. No. 17/554,848.
Sep. 29, 2022 Office Action issued in Korean Patent Application No. 10-2022-7030577.
Nov. 1, 2022 Office Action issued in Japanese Patent Application No. 2021-211601.
Nov. 25, 2022 Office Action issued in Korean Patent Application No. 10-2020-7011818.
Apr. 17, 2023 Notice of Allowance Issued in U.S. Appl. No. 17/554,848.
Jul. 5, 2023 Office Action issued in Japanese Patent Application No. 2022-153003.
Aug. 30, 2023 Office Action issued in Korean Patent Application No. 10-2023-7018049.
Sep. 8, 2023 Office Action issued in Japanese Application No. 2022-210635.
Oct. 13, 2023 Office Action issued in Japanese Patent Application No. 2022-153003.
Jan. 15, 2024 Office Action issued in Taiwanese Patent Application No. 112100567.
Oct. 9, 2024 Office Action issued in Taiwanese Application No. 112100567.
Aug. 29, 2024 Office Action issued in U.S. Appl. No. 18/223,723.

* cited by examiner

VAPOR CHAMBER, ELECTRONIC DEVICE, METALLIC SHEET FOR VAPOR CHAMBER AND MANUFACTURING METHOD OF VAPOR CHAMBER

TECHNICAL FIELD

Embodiments of this disclosure relate to a vapor chamber including a sealed space in which a working fluid is enclosed, an electronic device, a metallic sheet for the vapor chamber and a manufacturing method of the vapor chamber.

BACKGROUND ART

A device accompanied with heat generation such as a central processing unit (CPU), a light-emitting diode (LED) and a power semiconductor, which is used in a mobile terminal and the like including a portable terminal or a tablet terminal, is cooled by a heat release member such as a heat pipe (for example, see Patent Literatures 1 to 5). In recent years, to make a mobile terminal etc. thinner, thickness reduction of the heat release member has been requested, and development has been advanced for a vapor chamber which can be thinner than the heat pipe. In the vapor chamber, a working fluid is enclosed, and the working fluid absorbs heat in the device and releases the heat to the outside, whereby the device is cooled.

More specifically, the working fluid in the vapor chamber evaporates to turn into a vapor by receiving heat from the device at a portion close to the device (an evaporating portion). After that, in a vapor flow path portion, the vapor moves to a position away from the evaporating portion, and is cooled and liquidized by condensation. In the vapor chamber, a liquid flow path portion as a capillary structure (wick) is provided, and the working fluid liquidized by condensation enters the liquid flow path portion from the vapor flow path portion, and is transported through the liquid flow path portion toward the evaporating portion. The working fluid then receives the heat again at the evaporating portion to evaporate. In this way, the working fluid transfers the heat of the device by circulating in the vapor chamber while executing a change of phase, that is, repeating evaporation and condensation, which improves heat release efficiency.

Patent Literature 1

Japanese Patent Laid-Open No. 2015-59693

Patent Literature 2

Japanese Patent Laid-Open No. 2015-88882

Patent Literature 3

Japanese Patent Laid-Open No. 2016-17702

Patent Literature 4

Japanese Patent Laid-Open No. 2016-50682

Patent Literature 5

Japanese Patent Laid-Open No. 2016-205693

DISCLOSURE OF THE INVENTION

An object of the embodiments of this disclosure is to provide an improved vapor chamber, an electronic device, a metallic sheet for the vapor chamber and a manufacturing method of the vapor chamber.

An embodiment of this disclosure provides, as a first solution, a vapor chamber in which a working fluid is enclosed, the vapor chamber including:

a first metallic sheet;

a second metallic sheet laminated on the first metallic sheet; and a sealed space which is provided between the first metallic sheet and the second metallic sheet, the sealed space including a vapor flow path portion through which a vapor of the working fluid passes and a liquid flow path portion through which the working fluid in liquid form passes, wherein the liquid flow path portion includes a plurality of main flow grooves which each extend in a first direction and through which the working fluid in liquid form passes, a convex array which includes a plurality of liquid flow path convex portions arranged in the first direction via a communicating groove, is provided between a pair of the main flow grooves adjacent to each other, the communicating groove allows communication between the corresponding pair of the main flow grooves, and a width of the communicating groove is larger than a width of the main flow groove.

In the vapor chamber according to the first solution described above, the depth of the communicating groove may be deeper than the depth of the main flow groove.

In the vapor chamber according to the first solution described above, the main flow groove may include an intersection which communicates with the communicating groove, and a main flow groove main body which is positioned at a position different from the intersection in the first direction and is positioned between a pair of the liquid flow path convex portions adjacent to each other, and the depth of the intersection of the main flow groove may be deeper than the depth of the main flow groove main body.

In the vapor chamber according to the first solution described above, the depth of the intersection of the main flow groove may be deeper than the depth of the communicating groove.

In the vapor chamber according to the first solution described above, a rounded curved portion may be provided at a corner portion of the liquid flow path convex portion.

In the vapor chamber according to the first solution described above, a plurality of main flow groove convex portions protruding toward the main flow grooves may further be provided.

In the vapor chamber according to the first solution described above, a cross section of the main flow groove convex portion may be formed to be curved.

In the vapor chamber according to the first solution described above, a plurality of communicating groove convex portions protruding toward the communicating grooves may further be provided.

In the vapor chamber according to the first solution described above, a cross section of the communicating groove convex portion may be formed to be curved.

In the vapor chamber according to the first solution described above,
the communicating grooves may be aligned in a second direction intersecting with the first direction.

In the vapor chamber according to the first solution described above,
a second metallic sheet may be provided on the first metallic sheet, and
the liquid flow path portion may be provided in a surface of the first metallic sheet on a side of the second metallic sheet.

In the vapor chamber according to the first solution described above,
a third metallic sheet interposed between the first metallic sheet and the second metallic sheet may further be provided,
the vapor flow path portion may include a second vapor flow path portion provided on at least one of a surface of the second metallic sheet on a side of the third metallic sheet, and a surface of the third metallic sheet on a side of the second metallic sheet,
the liquid flow path portion may be provided in a surface of the first metallic sheet on a side of the third metallic sheet, and
a communicating portion allowing communication between the second vapor flow path portion and the liquid flow path portion may be provided in the third metallic sheet.

In the vapor chamber according to the first solution described above,
a third metallic sheet interposed between the first metallic sheet and the second metallic sheet may further be provided,
the third metallic sheet may include a first surface provided on a side of the first metallic sheet, and a second surface provided on a side of the second metallic sheet,
the vapor flow path portion may be provided in the second surface of the third metallic sheet, and
the liquid flow path portion may be provided in the first surface of the third metallic sheet, and communicates with the vapor flow path portion.

An embodiment of this disclosure provides, as a second solution,
a vapor chamber in which a working fluid is enclosed, the vapor chamber including:
a first metallic sheet;
a second metallic sheet provided on the first metallic sheet; and
a sealed space which is provided between the first metallic sheet and the second metallic sheet, the sealed space including a vapor flow path portion through which a vapor of the working fluid passes and a liquid flow path portion through which the working fluid in liquid form passes,
wherein the liquid flow path portion is provided in a surface of the first metallic sheet on a side of the second metallic sheet,
the liquid flow path portion includes a plurality of main flow grooves which each extend in a first direction and through which the working fluid in liquid form passes, and
the second metallic sheet includes a plurality of main flow groove convex portions which each protrude toward the main flow grooves of the first metallic sheet from a surface of the second metallic sheet on a side of the first metallic sheet.

An embodiment of this disclosure provides, as a third solution,
a vapor chamber in which a working fluid is enclosed, the vapor chamber including:
a first metallic sheet;
a second metallic sheet provided on the first metallic sheet; and
a sealed space which is provided between the first metallic sheet and the second metallic sheet, the sealed space including a vapor flow path portion through which a vapor of the working fluid passes and a liquid flow path portion through which the working fluid in liquid form passes,
wherein the liquid flow path portion is provided in a surface of the first metallic sheet on a side of the second metallic sheet,
the liquid flow path portion includes a plurality of main flow grooves which each extend in a first direction and through which the working fluid in liquid form passes,
a convex array which includes a plurality of liquid flow path convex portions arranged in the first direction via a communicating groove, is provided between a pair of the main flow grooves adjacent to each other,
the communicating groove allows communication between the corresponding pair of the main flow grooves, and
the second metallic sheet includes a plurality of communicating groove convex portions which each protrude toward the communicating groove of the first metallic sheet from a surface of the second metallic sheet on a side of the first metallic sheet.

An embodiment of this disclosure provides, as a fourth solution,
an electronic device, including:
a housing;
a device housed in the housing; and
the vapor chamber as described above, the vapor chamber being thermally contact with the device.

An embodiment of this disclosure provides, as a fifth solution,
a metallic sheet for a vapor chamber used for the vapor chamber including a sealed space in which a working fluid is enclosed, the sealed space including a vapor flow path portion through which a vapor of the working fluid passes, and a liquid flow path portion through which the working fluid in liquid form passes, the metallic sheet including:
a first surface; and
a second surface provided on an opposite side from the first surface,
wherein the first surface is provided with the liquid flow path portion,
the liquid flow path portion includes a plurality of main flow grooves which each extend in a first direction and through which the working fluid in liquid form passes,
a convex array which includes a plurality of liquid flow path convex portions arranged in the first direction via a communicating groove, is provided between a pair of the main flow grooves adjacent to each other,
the communicating groove allows communication between the corresponding pair of the main flow grooves, and
a width of the communicating groove is larger than a width of the main flow groove.

An embodiment of this disclosure provides, as a sixth solution, a manufacturing method of a vapor chamber including a sealed space which is provided between a first metallic sheet and a second metallic sheet and in which a working fluid is enclosed, the sealed space including a vapor flow path portion through which a vapor of the working fluid passes and a liquid flow path portion through which the working fluid in liquid form passes, the manufacturing method of the vapor chamber including:

half-etching in which the liquid flow path portion is formed on a surface of the first metallic sheet on a side of the second metallic sheet by half-etching;

joining the first metallic sheet and the second metallic sheet such that the sealed space is formed between the first metallic sheet and the second metallic sheet; and enclosing the working fluid in the sealed space, wherein the liquid flow path portion includes a plurality of main flow grooves which each extends in a first direction and through which the working fluid in liquid form passes, a convex array which includes a plurality of liquid flow path convex portions arranged in the first direction via a communicating groove, is provided between a pair of the main flow grooves adjacent to each other, the communicating groove allows communication between the corresponding pair of the main flow grooves, and a width of the communicating groove is larger than a width of the main flow groove.

The vapor chamber according to the sixth solution described above, may further include forming the vapor flow path portion in at least one of a surface of the second metallic sheet on a side of the first metallic sheet, and a surface of the third metallic sheet on a side of the second metallic sheet, by half-etching, and forming the third metallic sheet provided with a communicating portion allowing communication between the vapor flow path portion and the liquid flow path portion, and in the joining, the first metallic sheet and the second metallic sheet may be joined to each other via the third metallic sheet.

An embodiment of this disclosure provides, as a seventh solution, a manufacturing method of a vapor chamber including: a sealed space which is provided between a first metallic sheet and a second metallic sheet and in which a working fluid is enclosed, the sealed space including a vapor flow path portion through which a vapor of the working fluid passes and a liquid flow path portion through which the working fluid in liquid form passes; and a third metallic sheet interposed between the first metallic sheet and the second metallic sheet, the manufacturing method of the vapor chamber including:

forming the liquid flow path portion in a surface of the third metallic sheet on a side of the first metallic sheet, and forming the vapor flow path portion in a surface of the third metallic sheet on a side of the second metallic sheet;

joining the first metallic sheet and the second metallic sheet via the third metallic sheet such that the sealed space is formed between the first metallic sheet and the second metallic sheet; and enclosing the working fluid in the sealed space, wherein the liquid flow path portion includes a plurality of main flow grooves which each extend in a first direction and through which the working fluid in liquid form passes, a convex array which includes a plurality of liquid flow path convex portions arranged in the first direction via a communicating groove, is provided between a pair of the main flow grooves adjacent to each other, the communicating groove allows communication between the corresponding pair of the main flow grooves, and a width of the communicating groove is larger than a width of the main flow groove.

An embodiment of this disclosure provides, as an eighth solution, a manufacturing method of a vapor chamber including a sealed space which is provided between a first metallic sheet and a second metallic sheet and in which a working fluid is enclosed, the sealed space including a vapor flow path portion through which a vapor of the working fluid passes and a liquid flow path portion through which the working fluid in liquid form passes, the manufacturing method of the vapor chamber including:

half-etching in which the liquid flow path portion is formed on a surface of the first metallic sheet on a side of the second metallic sheet by half-etching;

joining the first metallic sheet and the second metallic sheet such that the sealed space is formed between the first metallic sheet and the second metallic sheet; and enclosing the working fluid in the sealed space, wherein the liquid flow path portion includes a plurality of main flow grooves which each extend in a first direction and through which the working fluid in liquid form passes, and the second metallic sheet includes a plurality of main flow groove convex portions which each protrudes toward the main flow grooves of the first metallic sheet from a surface of the second metallic sheet on a side of the first metallic sheet.

An embodiment of this disclosure provides, as a ninth solution, a manufacturing method of a vapor chamber including a sealed space which is provided between a first metallic sheet and a second metallic sheet and in which a working fluid is enclosed, the sealed space including a vapor flow path portion through which a vapor of the working fluid passes and a liquid flow path portion through which the working fluid in liquid form passes, the manufacturing method of the vapor chamber including:

half-etching in which the liquid flow path portion is formed on a surface of the first metallic sheet on a side of the second metallic sheet by half-etching;

joining the first metallic sheet and the second metallic sheet such that the sealed space is formed between the first metallic sheet and the second metallic sheet; and enclosing the working fluid in the sealed space, wherein the liquid flow path portion includes a plurality of main flow grooves which each extend in a first direction and through which the working fluid in liquid form passes, a convex array which includes a plurality of liquid flow path convex portions arranged in the first direction via a communicating groove, is provided between a pair of the main flow grooves adjacent to each other, the communicating groove allows communication between the corresponding pair of the main flow grooves, and the second metallic sheet includes a plurality of communicating groove convex portions which each protrude toward the communicating groove of the first metallic sheet from a surface of the second metallic sheet on a side of the first metallic sheet.

An embodiment of this disclosure provides, as a tenth solution, a vapor chamber in which a working fluid is enclosed, the vapor chamber including:

a first metallic sheet having a linearly extending linear region defined by a pair of outer edges extending in a first direction;

a second metallic sheet laminated on the first metallic sheet; and a sealed space which is provided between the first metallic sheet and the second metallic sheet, the sealed space including a vapor flow path portion through which a vapor of the working fluid passes and a liquid flow path portion through which the working fluid in liquid form passes, wherein the liquid flow path portion is provided in a surface of the first metallic sheet on a side of the second metallic sheet, and in the linear region, the liquid flow path portion includes a plurality of first grooves extending in a direction inclined with respect to the first direction.

In the vapor chamber according to the tenth solution described above, in the linear region, the liquid flow path portion may further include a plurality of second grooves extending in a direction which is inclined with respect to the first direction and which is different from the direction in which the first grooves extend.

In the vapor chamber according to the tenth solution described above, one of the first grooves and one of the second grooves may intersect with each other at one intersection.

In the vapor chamber according to the tenth solution described above, when a line passing through the intersection and extending in the first direction is a reference line, the first groove constituting the intersection may extend from one side of the reference line toward the other side while extending to one side in the first direction, and the second groove constituting the intersection may extend from the other side of the reference line toward the one side while extending to the one side in the first direction.

In the vapor chamber according to the tenth solution described above, the first groove and the second groove may be formed to be line-symmetric with respect to the reference line.

In the vapor chamber according to the tenth solution described above, the liquid flow path portion may include a liquid flow path convex portion surrounded by an adjacent pair of the first grooves and an adjacent pair of the second grooves, an array of the liquid flow path convex portions arranged in the first direction may form a convex array, and when seen from a second direction orthogonal to the first direction, the intersection arranged between the liquid flow path convex portions which are adjacent to each other and form one convex array may overlap with the liquid flow path convex portions forming another convex array adjacent to the convex array.

In the vapor chamber according to the tenth solution described above, the depth of the intersection may be deeper than the depth of the first groove and the depth of the second groove.

In the vapor chamber according to the tenth solution described above, a plurality of first groove convex portions protruding toward the first groove may further be provided.

In the vapor chamber according to the tenth solution described above, a plurality of second groove convex portions protruding toward the second grooves may further be provided.

An embodiment of this disclosure provides, as an eleventh solution, a vapor chamber in which a working fluid is enclosed, the vapor chamber including:

a first metallic sheet having a linearly extending linear region defined by a pair of outer edges extending in a first direction;

a second metallic sheet laminated on the first metallic sheet; and a sealed space which is provided between the first metallic sheet and the second metallic sheet, the sealed space including a vapor flow path portion through which a vapor of the working fluid passes and a liquid flow path portion through which the working fluid in liquid form passes, wherein the liquid flow path portion is provided in a surface of the first metallic sheet on a side of the second metallic sheet, the liquid flow path portion includes a convex array including a plurality of liquid flow path convex portions arranged in the first direction, when seen from a second direction orthogonal to the first direction, in the linear region, the liquid flow path convex portions forming the certain convex array is arranged in a region between the liquid flow path convex portions which form another convex array adjacent to the convex array and are adjacent to each other, and a planar shape of the liquid flow path convex portion is an ellipse or a circle.

In the vapor chamber according to the eleventh solution described above, between the liquid flow path convex portions adjacent to each other, a groove through which the working fluid in liquid form passes may be provided.

In the vapor chamber according to the tenth solution or the eleventh solution described above, the second metallic sheet may be provided on the first metallic sheet.

In the vapor chamber according to the tenth solution or the eleventh solution described above, a third metallic sheet interposed between the first metallic sheet and the second metallic sheet may further be provided, the vapor flow path portion may include a second vapor flow path portion provided on at least one of a surface of the second metallic sheet on a side of the third metallic sheet, and a surface of the third metallic sheet on a side of the second metallic sheet, the liquid flow path portion may be provided in a surface of the first metallic sheet on a side of the third metallic sheet, and a communicating portion allowing communication between the second vapor flow path portion and the liquid flow path portion may be provided in the third metallic sheet.

An embodiment of this disclosure provides, as a twelfth solution,
a vapor chamber in which a working fluid is enclosed, the vapor chamber including:
a first metallic sheet;
a second metallic sheet laminated on the first metallic sheet;
a third metallic sheet which is interposed between the first metallic sheet and the second metallic sheet, and which has a linearly extending linear region defined by a pair of outer edges extending in a first direction; and
a sealed space which is provided between the first metallic sheet and the second metallic sheet, the sealed space including a vapor flow path portion through which a vapor of the working fluid passes and a liquid flow path portion through which the working fluid in liquid form passes,
wherein the third metallic sheet includes a first surface provided on a side of the first metallic sheet, and a second surface provided on a side of the second metallic sheet,
the vapor flow path portion is provided in the second surface of the third metallic sheet,
the liquid flow path portion is provided in the first surface of the third metallic sheet, and communicates with the vapor flow path portion, and
in the linear region, the liquid flow path portion includes a plurality of first grooves extending in a direction inclined with respect to the first direction.

An embodiment of this disclosure provides, as a thirteenth solution,
a vapor chamber in which a working fluid is enclosed, the vapor chamber including:
a first metallic sheet;
a second metallic sheet laminated on the first metallic sheet;
a third metallic sheet which is interposed between the first metallic sheet and the second metallic sheet, and which has a linearly extending linear region defined by a pair of outer edges extending in a first direction; and
a sealed space which is provided between the first metallic sheet and the second metallic sheet, the sealed space including a vapor flow path portion through which a vapor of the working fluid passes and a liquid flow path portion through which the working fluid in liquid form passes,
wherein the third metallic sheet includes a first surface provided on a side of the first metallic sheet, and a second surface provided on a side of the second metallic sheet,
the vapor flow path portion is provided in the second surface of the third metallic sheet,
the liquid flow path portion is provided in the first surface of the third metallic sheet, and communicates with the vapor flow path portion, and
the liquid flow path portion includes a convex array including a plurality of liquid flow path convex portions arranged in the first direction,
when seen from a second direction orthogonal to the first direction, in the linear region, the liquid flow path convex portions forming the certain convex array is arranged in a region between the liquid flow path convex portions which form another convex array adjacent to the convex array and are adjacent to each other, and
a planar shape of the liquid flow path convex portion is an ellipse or a circle.

An embodiment of this disclosure provides, as a fourteenth solution,
an electronic device, including:
a housing;
a device housed in the housing; and
the vapor chamber as described above, the vapor being thermally contact with the device.

An embodiment of this disclosure provides, as a fifteenth solution,
a metallic sheet for a vapor chamber used for the vapor chamber including a sealed space in which a working fluid is enclosed, the sealed space including a vapor flow path portion through which a vapor of the working fluid passes, and a liquid flow path portion through which the working fluid in liquid form passes, the metallic sheet including:
a first surface;
a second surface provided on an opposite side from the first surface; and
a linearly extending linear region defined by a pair of outer edges extending in a first direction,
wherein the first surface is provided with the liquid flow path portion, and
in the linear region, the liquid flow path portion includes a plurality of first grooves extending in a direction inclined with respect to the first direction, and a plurality of second grooves extending in a direction which is inclined with respect to the first direction and which is different from the direction in which the first grooves extend.

An embodiment of this disclosure provides, as a sixteenth solution,
a metallic sheet for a vapor chamber used for the vapor chamber including a sealed space in which a working fluid is enclosed, the sealed space including a vapor flow path portion through which a vapor of the working fluid passes, and a liquid flow path portion through which the working fluid in liquid form passes, the metallic sheet including:
a first surface;
a second surface provided on an opposite side from the first surface; and
a linearly extending linear region defined by a pair of outer edges extending in a first direction,
wherein the first surface is provided with the liquid flow path portion, and
the liquid flow path portion includes a convex array including a plurality of liquid flow path convex portions arranged in the first direction,
when seen from a second direction orthogonal to the first direction, in the linear region, the liquid flow path convex portions forming the certain convex array is arranged in a region between the liquid flow path convex portions which form the another convex array adjacent to the convex array and are adjacent to each other, and
a planar shape of the liquid flow path convex portion is an ellipse or a circle.

An embodiment of this disclosure provides, as a seventeenth solution,
a manufacturing method of a vapor chamber including a sealed space which is provided between a first metallic sheet and a second metallic sheet and in which a working fluid is enclosed, the sealed space including a vapor flow path portion through which a vapor of the working fluid passes and a liquid flow path portion through which the working fluid in liquid form passes, the manufacturing method of the vapor chamber including:
half-etching in which the liquid flow path portion is formed on a surface of the first metallic sheet on a side of the second metallic sheet and a linearly extending linear region defined by a pair of outer edges extending in the first direction is formed, by half-etching,
joining the first metallic sheet and the second metallic sheet such that the sealed space is formed between the first metallic sheet and the second metallic sheet; and
enclosing the working fluid in the sealed space,
wherein in the linear region, the liquid flow path portion includes a plurality of first grooves extending in a direction inclined with respect to the first direction.

An embodiment of this disclosure provides, as an eighteenth solution,
a manufacturing method of a vapor chamber including a sealed space which is provided between a first metallic sheet and a second metallic sheet and in which a working fluid is enclosed, the sealed space including a vapor flow path portion through which a vapor of the working fluid passes and a liquid flow path portion through which the working fluid in liquid form passes, the manufacturing method of the vapor chamber including:
half-etching in which the liquid flow path portion is formed on a surface of the first metallic sheet on a side of the second metallic sheet and a linearly extending linear region defined by a pair of outer edges extending in the first direction is formed, by half-etching;
joining the first metallic sheet and the second metallic sheet such that the sealed space is formed between the first metallic sheet and the second metallic sheet; and
enclosing the working fluid in the sealed space,
wherein the liquid flow path portion includes a convex array including a plurality of liquid flow path convex portions arranged in the first direction,
when seen from a second direction orthogonal to the first direction, in the linear region, the liquid flow path convex portions forming the certain convex array is arranged in a region between the liquid flow path convex portions which form another convex array adjacent to the convex array and are adjacent to each other, and
a planar shape of the liquid flow path convex portion is an ellipse or a circle.

The manufacturing method of the vapor chamber according to the seventeenth solution or the eighteenth solution described above, may further include:
forming the vapor flow path portion in at least one of a surface of the second metallic sheet on a side of the first metallic sheet, and a surface of the third metallic sheet on a side of the second metallic sheet, by half-etching; and
forming the third metallic sheet provided with a communicating portion allowing communication between the vapor flow path portion and the liquid flow path portion,
wherein in the joining, the first metallic sheet and the second metallic sheet may be joined to each other via the third metallic sheet.

An embodiment of this disclosure provides, as a nineteenth solution,
a manufacturing method of a vapor chamber including: a sealed space which is provided between a first metallic sheet and a second metallic sheet and in which a working fluid is enclosed, the sealed space including a vapor flow path portion through which a vapor of the working fluid passes and a liquid flow path portion through which the working fluid in liquid form passes; and a third metallic sheet interposed between the first metallic sheet and the second metallic sheet, the manufacturing method of the vapor chamber including:
forming the liquid flow path portion in a surface of the third metallic sheet on a side of the first metallic sheet, forming the vapor flow path portion in a surface of the third metallic sheet on a side of the second metallic sheet, and forming a linearly extending linear region defined by a pair of outer edges extending in the first direction;
joining the first metallic sheet and the second metallic sheet via the third metallic sheet such that the sealed space is formed between the first metallic sheet and the second metallic sheet; and
enclosing the working fluid in the sealed space,
wherein in the linear region, the liquid flow path portion includes a plurality of first grooves extending in a direction inclined with respect to the first direction.

An embodiment of this disclosure provides, as a twentieth solution,
a manufacturing method of a vapor chamber including: a sealed space which is provided between a first metallic sheet and a second metallic sheet and in which a working fluid is enclosed, the sealed space including a vapor flow path portion through which a vapor of the working fluid passes and a liquid flow path portion through which the working fluid in liquid form passes; and a third metallic sheet interposed between the first metallic sheet and the second metallic sheet, the manufacturing method of the vapor chamber including:
forming the liquid flow path portion in a surface of the third metallic sheet on a side of the first metallic sheet, forming the vapor flow path portion in a surface of the third metallic sheet on a side of the second metallic sheet, and forming a linearly extending linear region defined by a pair of outer edges extending in the first direction;
joining the first metallic sheet and the second metallic sheet via the third metallic sheet such that the sealed space is formed between the first metallic sheet and the second metallic sheet; and
enclosing the working fluid in the sealed space,
wherein the liquid flow path portion includes a convex array including a plurality of liquid flow path convex portions arranged in the first direction,
when seen from a second direction orthogonal to the first direction, in the linear region, the liquid flow path convex portions forming the certain convex array is arranged in a region between the liquid flow path convex portions which form another convex array adjacent to the convex array and are adjacent to each other, and
a planar shape of the liquid flow path convex portion is an ellipse or a circle.

An embodiment of this disclosure provides, as a twenty-first solution,
a vapor chamber in which a working fluid is enclosed, the vapor chamber including:

a first metallic sheet;
a second metallic sheet laminated on the first metallic sheet; and
a sealed space which is provided between the first metallic sheet and the second metallic sheet, the sealed space including a vapor flow path portion through which a vapor of the working fluid passes and a liquid flow path portion through which the working fluid in liquid form passes,
wherein the liquid flow path portion includes a plurality of main flow grooves which each extend in a first direction and through which the working fluid in liquid form passes,
a convex array which includes a plurality of liquid flow path convex portions arranged in the first direction via a communicating groove, is provided between a pair of the main flow grooves adjacent to each other,
each of the communicating grooves allows communication between the corresponding pair of the main flow grooves,
a plurality of the main flow grooves include one reference main flow groove,
a plurality of the communicating grooves include first communicating grooves arranged on one side with respect to the reference main flow groove, and second communicating grooves arranged on the other side with respect to the reference main flow groove,
the first communicating grooves extend in a direction inclined with respect to the first direction so as to extend to one side in the first direction while extending toward the reference main flow groove, and
the second communicating grooves extend in a direction inclined with respect to the first direction so as to extend to the one side in the first direction while extending toward the reference main flow groove.

In the vapor chamber according to the twenty-first solution described above,
the first communicating grooves and the second communicating grooves may be formed to be line-symmetric with respect to the reference main flow groove.

In the vapor chamber according to the twenty-first solution described above,
the first communicating grooves may be aligned in a direction where the first communicating grooves extend, and
the second communicating grooves may be aligned in a direction where the second communicating grooves extend.

In the vapor chamber according to the twenty-first solution described above,
a width of the communicating groove may be larger than a width of the main flow groove.

In the vapor chamber according to the twenty-first solution described above,
the depth of the communicating groove may be deeper than the depth of the main flow groove.

In the vapor chamber according to the twenty-first solution described above,
the main flow groove may include an intersection which communicates with the communicating groove, and a main flow groove main body which is positioned at a position different from the intersection in the first direction and is positioned between a pair of the liquid flow path convex portions adjacent to each other, and
the depth of the intersection of the main flow groove may be deeper than the depth of the main flow groove main body.

In the vapor chamber according to the twenty-first solution described above,
the depth of the intersection of the main flow groove may be deeper than the depth of the communicating groove.

In the vapor chamber according to the twenty-first solution described above,
a rounded curved portion may be provided at a corner portion of the liquid flow path convex portion.

In the vapor chamber according to the twenty-first solution described above,
a plurality of main flow groove convex portions protruding toward the main flow grooves may further be provided.

In the vapor chamber according to the twenty-first solution described above,
a cross section of the main flow groove convex portion may be formed to be curved.

In the vapor chamber according to the twenty-first solution described above,
a plurality of main flow groove convex portions protruding toward the communicating grooves may further be provided.

In the vapor chamber according to the twenty-first solution described above,
a cross section of the communicating groove convex portion may be formed to be curved.

In the vapor chamber according to the twenty-first solution described above,
a second metallic sheet may be provided on the first metallic sheet, and
the liquid flow path portion may be provided in a surface of the first metallic sheet on a side of the second metallic sheet.

In the vapor chamber according to the twenty-first solution described above,
a third metallic sheet interposed between the first metallic sheet and the second metallic sheet may further be provided,
the vapor flow path portion may include a second vapor flow path portion provided on at least one of a surface of the second metallic sheet on a side of the third metallic sheet, and a surface of the third metallic sheet on a side of the second metallic sheet,
the liquid flow path portion may be provided in a surface of the first metallic sheet on a side of the third metallic sheet, and
a communicating portion allowing communication between the second vapor flow path portion and the liquid flow path portion may be provided in the third metallic sheet.

In the vapor chamber according to the twenty-first solution described above,
a third metallic sheet interposed between the first metallic sheet and the second metallic sheet may further be provided,
the third metallic sheet may include a first surface provided on a side of the first metallic sheet, and a second surface provided on a side of the second metallic sheet,
the vapor flow path portion may be provided in the second surface of the third metallic sheet, and
the liquid flow path portion may be provided in the first surface of the third metallic sheet, and communicates with the vapor flow path portion.

An embodiment of this disclosure provides, as a twenty-second solution,
an electronic device, including:
a housing;

a device housed in the housing; and
the vapor chamber as described above, the vapor chamber being thermally contact with the device.

An embodiment of this disclosure provides, as a twenty-third solution,
a metallic sheet for a vapor chamber used for the vapor chamber including a sealed space in which a working fluid is enclosed, the sealed space including a vapor flow path portion through which a vapor of the working fluid passes, and a liquid flow path portion through which the working fluid in liquid form passes, the metallic sheet including:
a first surface; and
a second surface provided on an opposite side from the first surface,
wherein the first surface is provided with the liquid flow path portion,
the liquid flow path portion includes a plurality of main flow grooves which each extend in a first direction and through which the working fluid in liquid form passes,
a convex array which includes a plurality of liquid flow path convex portions arranged in the first direction via a communicating groove, is provided between a pair of the main flow grooves adjacent to each other,
each of the communicating grooves allows communication between the corresponding pair of the main flow grooves,
a plurality of the main flow grooves include one reference main flow groove,
a plurality of the communicating grooves include first communicating grooves arranged on one side with respect to the reference main flow groove, and second communicating grooves arranged on the other side with respect to the reference main flow groove,
the first communicating grooves extend in a direction inclined with respect to the first direction so as to extend to one side in the first direction while extending toward the reference main flow groove, and
the second communicating grooves extend in a direction inclined with respect to the first direction so as to extend to the one side in the first direction while extending toward the reference main flow groove.

An embodiment of this disclosure provides, as a twenty-fourth solution,
a manufacturing method of a vapor chamber including a sealed space which is provided between a first metallic sheet and a second metallic sheet and in which a working fluid is enclosed, the sealed space including a vapor flow path portion through which a vapor of the working fluid passes and a liquid flow path portion through which the working fluid in liquid form passes, the manufacturing method of the vapor chamber including:
half-etching in which the liquid flow path portion is formed on a surface of the first metallic sheet on a side of the second metallic sheet by half-etching;
joining the first metallic sheet and the second metallic sheet such that the sealed space is formed between the first metallic sheet and the second metallic sheet; and
enclosing the working fluid in the sealed space,
wherein the liquid flow path portion includes a plurality of main flow grooves which each extend in a first direction and through which the working fluid in liquid form passes,
a convex array which includes a plurality of liquid flow path convex portions arranged in the first direction via a communicating groove, is provided between a pair of the main flow grooves adjacent to each other,
each of the communicating grooves allows communication between the corresponding pair of the main flow grooves,
a plurality of the main flow grooves include one reference main flow groove,
a plurality of the communicating grooves include first communicating grooves arranged on one side with respect to the reference main flow groove, and second communicating grooves arranged on the other side with respect to the reference main flow groove,
the first communicating grooves extend in a direction inclined with respect to the first direction so as to extend to one side in the first direction while extending toward the reference main flow groove, and
the second communicating grooves extend in a direction inclined with respect to the first direction so as to extend to the one side in the first direction while extending toward the reference main flow groove.

The manufacturing method of the vapor chamber according to the twenty-fourth solution described above, may further include:
forming the vapor flow path portion in at least one of a surface of the second metallic sheet on a side of the first metallic sheet, and a surface of the third metallic sheet on a side of the second metallic sheet, by half-etching; and
forming the third metallic sheet provided with a communicating portion allowing communication between the vapor flow path portion and the liquid flow path portion,
wherein in the joining, the first metallic sheet and the second metallic sheet may be joined to each other via the third metallic sheet.

An embodiment of this disclosure provides, as a twenty-fifth solution,
a manufacturing method of a vapor chamber including: a sealed space which is provided between a first metallic sheet and a second metallic sheet and in which a working fluid is enclosed, the sealed space including a vapor flow path portion through which a vapor of the working fluid passes and a liquid flow path portion through which the working fluid in liquid form passes; and a third metallic sheet interposed between the first metallic sheet and the second metallic sheet, the manufacturing method of the vapor chamber including:
forming the liquid flow path portion in a surface of the third metallic sheet on a side of the first metallic sheet, and forming the vapor flow path portion in a surface of the third metallic sheet on a side of the second metallic sheet;
joining the first metallic sheet and the second metallic sheet via the third metallic sheet such that the sealed space is formed between the first metallic sheet and the second metallic sheet; and
enclosing the working fluid in the sealed space,
wherein the liquid flow path portion includes a plurality of main flow grooves which each extend in a first direction and through which the working fluid in liquid form passes,
a convex array which includes a plurality of liquid flow path convex portions arranged in the first direction via a communicating groove, is provided between a pair of the main flow grooves adjacent to each other, each of the communicating grooves allows communication between the corresponding pair of the main flow grooves,
a plurality of the main flow grooves include one reference main flow groove,
a plurality of the communicating grooves include first communicating grooves arranged on one side with respect to the reference main flow groove, and second communicating grooves arranged on the other side with respect to the reference main flow groove,
the first communicating grooves extend in a direction inclined with respect to the first direction so as to extend to one side in the first direction while extending toward the reference main flow groove, and
the second communicating grooves extend in a direction inclined with respect to the first direction so as to extend to the one side in the first direction while extending toward the reference main flow groove.

An embodiment of this disclosure provides, as a twenty-sixth solution,
a vapor chamber in which a working fluid is enclosed, the vapor chamber including:
a first metallic sheet; and
a second metallic sheet laminated on the first metallic sheet,
wherein a vapor flow path recess including a plurality of vapor passages through which a vapor of the working fluid passes is formed on at least one of the first metallic sheet and the second metallic sheet,
a liquid flow path portion through which the working fluid in liquid form passes is formed on at least one of the first metallic sheet and the second metallic sheet,
an injection flow path recess through which the working fluid in liquid form is injected is formed on at least one of the first metallic sheet and the second metallic sheet, and
a width of the injection flow path recess is wider than a width of the vapor passage.

In the vapor chamber according to the twenty-sixth solution described above,
a plurality of columns may be provided in the injection flow path recess in a protruding manner.

In the vapor chamber according to the twenty-sixth solution described above,
a caulking region may be formed at the injection flow path recess, and the caulking region may include a plurality of projections.

In the vapor chamber according to the twenty-sixth solution described above,
the width of the injection flow path recess may be at least 1.5 times as wide as the width of the vapor passage.

In the vapor chamber according to the twenty-sixth solution described above,
the depth of the injection flow path recess may be deeper than the depth of the vapor passage.

In the vapor chamber according to the twenty-sixth solution described above,
the liquid flow path portion may include a plurality of main flow grooves extending in parallel with each other, and communicating grooves allowing the main flow grooves adjacent to each other to communicate.

In the vapor chamber according to the twenty-sixth solution described above,
convex portions may be formed so as to be surrounded by the main flow grooves and the communicating grooves, and a plurality of the convex portions may be arranged in a staggered arrangement in a planar view.

In the vapor chamber according to the twenty-sixth solution described above,
the second metallic sheet may be provided on the first metallic sheet.

In the vapor chamber according to the twenty-sixth solution described above,
a third metallic sheet interposed between the first metallic sheet and the second metallic sheet may further be provided,
the vapor flow path recess may be formed on one of the first metallic sheet and the second metallic sheet, and the liquid flow path portion may be formed on the other one, and
a communicating portion allowing communication between the vapor flow path recess and the liquid flow path portion may be provided in the third metallic sheet.

An embodiment of this disclosure provides, as a twenty-seventh solution,
a vapor chamber in which a working fluid is enclosed, the vapor chamber including:
a first metallic sheet;
a second metallic sheet laminated on the first metallic sheet; and
a third metallic sheet interposed between the first metallic sheet and the second metallic sheet,
wherein the third metallic sheet includes a first surface provided on a side of the first metallic sheet, and a second surface provided on a side of the second metallic sheet,
a vapor flow path portion including a plurality of vapor passages through which a vapor of the working fluid passes is formed on at least one of the first surface and the second surface of the third metallic sheet,
a liquid flow path portion through which the working fluid in liquid form passes is formed on at least one of the first surface and the second surface of the third metallic sheet,
an injection flow path portion through which the working fluid in liquid form is injected is formed on at least one of the first surface and the second surface of the third metallic sheet, and
a width of the injection flow path portion is wider than a width of the vapor passage.

An embodiment of this disclosure provides, as a twenty-eighth solution,
an electronic device, including:
a housing;
a device housed in the housing; and
the vapor chamber as described above, the vapor chamber being thermally contact with the device.

An embodiment of this disclosure provides, as a twenty-ninth solution,
a metallic sheet for the vapor chamber used for the vapor chamber in which a working fluid is enclosed, including:
a first surface; and
a second surface provided on an opposite side from the first surface,
wherein a vapor flow path recess including a plurality of vapor passages through which a vapor of the working fluid passes is formed on the first surface, and
an injection flow path recess through which the working fluid in liquid form is injected is formed on the first surface, and the width of the injection flow path recess is wider than the width of the vapor passage.

An embodiment of this disclosure provides, as a thirtieth solution,
a vapor chamber in which a working fluid is enclosed, the vapor chamber including:
a first metallic sheet; and
a second metallic sheet laminated on the first metallic sheet,
wherein a vapor flow path portion through which a vapor of the working fluid passes is formed on at least one of the first metallic sheet and the second metallic sheet,
a liquid flow path portion through which the working fluid in liquid form passes is formed on at least one of the first metallic sheet and the second metallic sheet,
a first peripheral liquid flow path portion through which the working fluid in liquid form passes is formed in the first metallic sheet along a periphery of the first metallic sheet, and
the first peripheral liquid flow path portion is formed over the entire periphery of the first metallic sheet.

In the vapor chamber according to the thirtieth solution described above,
a second peripheral liquid flow path portion through which the working fluid in liquid form passes may be formed in the second metallic sheet along a periphery of the second metallic sheet, and
at least a part of the first peripheral liquid flow path portion and at least a part of the second peripheral liquid flow path portion may overlap with each other.

In the vapor chamber according to the thirtieth solution described above,
the width of the first peripheral liquid flow path portion and the width of the second peripheral liquid flow path portion may be different from each other.

In the vapor chamber according to the thirtieth solution described above,
the second metallic sheet may include an injection flow path recess communicating with the vapor flow path portion via a conduction portion, and the second peripheral liquid flow path portion may be formed over the entire periphery region of the second metallic sheet except the conduction portion.

In the vapor chamber according to the thirtieth solution described above,
the first peripheral liquid flow path portion may include a plurality of main flow grooves extending in parallel with each other, and communicating grooves allowing the main flow grooves adjacent to each other to communicate.

In the vapor chamber according to the thirtieth solution described above,
convex portions may be formed so as to be surrounded by the main flow grooves and the communicating grooves, and a plurality of the convex portions may be arranged in a staggered arrangement in a planar view.

In the vapor chamber according to the thirtieth solution described above,
the second metallic sheet may be provided on the first metallic sheet.

In the vapor chamber according to the thirtieth solution described above,
a third metallic sheet interposed between the first metallic sheet and the second metallic sheet may further be provided, the vapor flow path portion may be formed in the second metallic sheet,
the liquid flow path portion may be formed in the first metallic sheet, and a communicating portion allowing communication between the vapor flow path portion and the liquid flow path portion may be provided in the third metallic sheet.

An embodiment of this disclosure provides, as a thirty-first solution,
a vapor chamber in which a working fluid is enclosed, the vapor chamber including:
a first metallic sheet;
a second metallic sheet laminated on the first metallic sheet; and
a third metallic sheet interposed between the first metallic sheet and the second metallic sheet,
wherein the third metallic sheet includes a first surface provided on a side of the first metallic sheet, and a second surface provided on a side of the second metallic sheet,
a vapor flow path portion through which a vapor of the working fluid passes is formed on at least one of the first surface and the second surface of the third metallic sheet,
a liquid flow path portion through which the working fluid in liquid form passes is formed on at least one of the first surface and the second surface of the third metallic sheet,
a third peripheral liquid flow path portion through which the working fluid in liquid form passes is formed in the first surface of the third metallic sheet along a periphery of the third metallic sheet, and
the third peripheral liquid flow path portion may be formed over the entire periphery of the third metallic sheet.

An embodiment of this disclosure provides, as a thirty-second solution,
an electronic device, including:
a housing;
a device housed in the housing; and
the vapor chamber as described above, the vapor chamber being thermally contact with the device.

An embodiment of this disclosure provides, as a thirty-third solution,
a metallic sheet for the vapor chamber used for the vapor chamber in which a working fluid is enclosed, including:
a first surface; and
a second surface provided on an opposite side from the first surface,
wherein a first peripheral liquid flow path portion through which the working fluid in liquid form passes may be formed along the periphery of the first surface, and
the first peripheral liquid flow path portion may be formed over the entire periphery of the first surface.

DESCRIPTION OF EMBODIMENTS

Figure 1:
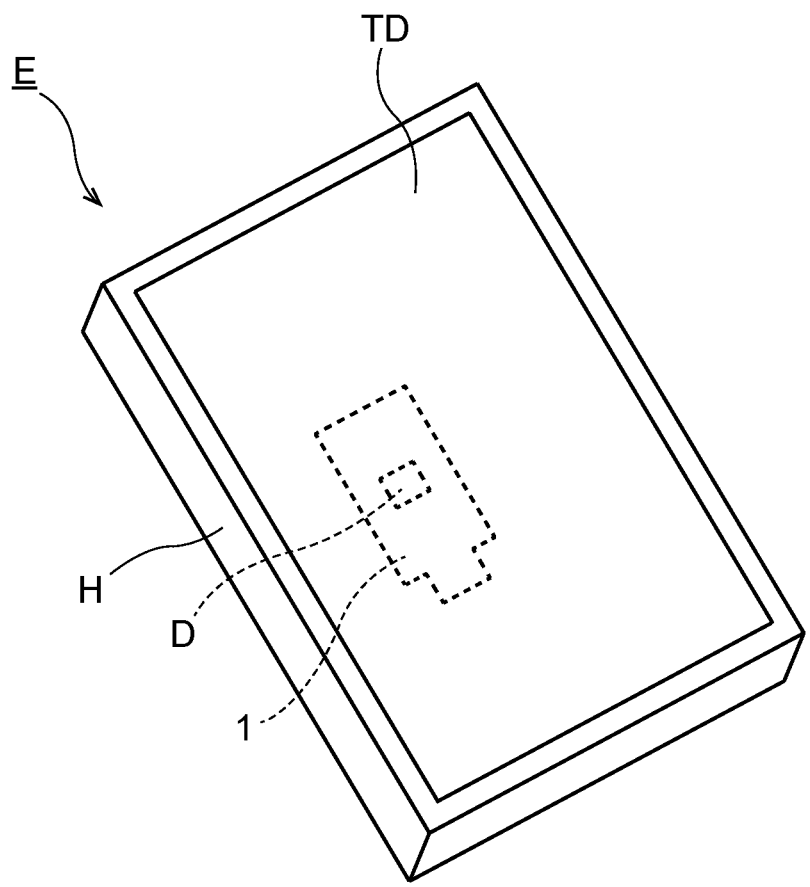
FIG. 1 is a schematic perspective view for explaining an electronic device according to a first embodiment.

Hereinafter, embodiments according to the present invention will be explained with reference to drawings. Additionally, for convenience of illustration and easy understanding, in the drawings attached to the present specification, the scale and an aspect ratio etc. are appropriately changed and exaggerated from those of a real product.

Terms specifying shapes, geometrical conditions and physical characteristics and the degrees thereof, for example, "parallel", "orthogonal" and "identical", and values of the length and angles and physical characteristics and the like used in this specification are not limited to strict meanings, but are construed including ranges to an extent allowing similar functions to be expected. Furthermore, in the drawings, for the clarity, shapes of a plurality of portions allowing similar functions to be expected are regularly illustrated. However, without limitation to strict meanings, the shapes of the portions may be different from each other within a range allowing the functions to be expected. In the drawings, boundaries indicating joint surfaces between members are indicated by simple lines, for convenience. However, there is no limitation to strict lines. Any shape may be adopted as each boundary concerned within the range allowing a desired joining performance to be expected.

First Embodiment

A liquid flow path portion of a typical vapor chamber includes a plurality of main flow grooves extending in a first direction. A working fluid condensed from a vapor in a vapor flow path portion enters main flow grooves through a plurality of communicating grooves extending in a second direction intersecting with the first direction, and due to capillary action of the main flow grooves, thrust toward an evaporating portion is obtained. In this way, the working fluid passes through the main flow grooves toward the evaporating portion. Also, the working fluid can reciprocate between the main flow grooves adjacent to each other by the plurality of communicating grooves. In this way, at the liquid flow path portion, a plurality of the main flow grooves and the plurality of communicating grooves are formed to have a lattice shape, whereby the working fluid is evenly distributed in the liquid flow path portion.

However, when the working fluid condensed from the vapor is difficult to pass through the communicating grooves smoothly, the working fluid is difficult to enter the main flow grooves nearer to the vapor flow path portion and the main flow grooves more apart from the vapor flow path portion, thus reducing the amount of the working fluid entering the main flow grooves. In this case, the amount of transport of the working fluid to the evaporating portion decreases, which causes a problem of reduction in thermal transport efficiency.

The first embodiment is made considering this point, and has an object to provide a vapor chamber, an electronic device, a metallic sheet for the vapor chamber, and a manufacturing method of the vapor chamber which can improve the transport function of the working fluid in liquid form and improve the thermal transport efficiency.

This embodiment, and second to fifth embodiments which will be described later mainly correspond to the following first solution to ninth solution. Hereinafter, this embodiment will be explained with reference to drawings.

A vapor chamber, an electronic device, a manufacturing method for the vapor chamber and a manufacturing method of the vapor chamber according to the first embodiment of the present invention will be explained using FIGS. 1 to 17. A vapor chamber 1 according to this embodiment is an apparatus mounted on an electronic device E for cooling a device D as a heating element housed in the electronic device E. As an example of the device D, an electronic device accompanied with heat generation (a device to be cooled) such as a central processing unit (CPU), a light-emitting diode (LED) and a power semiconductor, which is used in a mobile terminal and the like such as a portable terminal or a tablet terminal, can be listed.

Here, firstly, an explanation will be made on the electronic device E on which the vapor chamber 1 is mounted according to this embodiment taking a tablet terminal as an example. As shown in FIG. 1, the electronic device E (tablet terminal) includes a housing H, the device D housed in the housing H and the vapor chamber 1. In the electronic device E shown in FIG. 1, a touch panel display TD is provided in a front surface of the housing H. The vapor chamber 1 is housed in the housing H and arranged to thermally contact to the device D. Thereby, heat generated at the device D when the electronic device E is used can be received by the vapor chamber 1. The heat received by the vapor chamber 1 is released to the outside of the vapor chamber 1 via a working fluid 2 which will be described later. In this way, the device D is effectively cooled. If the electronic device E is the tablet terminal, the device D corresponds to the central processing unit etc.

Next, the vapor chamber 1 according to this embodiment will be explained. The vapor chamber 1 includes a sealed space 3 in which the working fluid 2 is enclosed, and the working fluid 2 in the sealed space 3 repeats change of phase, so that the device D of the electronic device E described above is effectively cooled.

Figure 2:
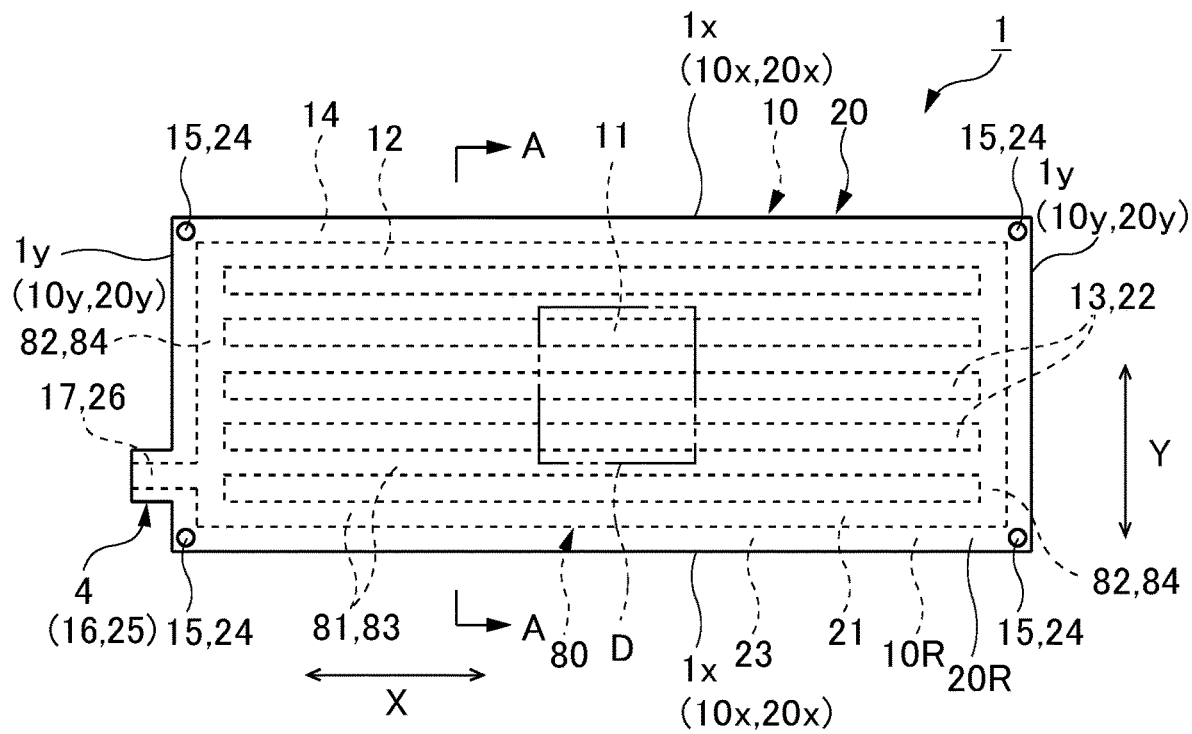
FIG. 2 is a top view showing a vapor chamber according to the first embodiment.

The vapor chamber 1 is formed as a schematically thin plate. While the vapor chamber 1 may have any planar shape, a rectangle as shown in FIG. 2 may be applied. In this case, the vapor chamber 1 includes four linear outer edges 1x, 1y forming a planar outline. Among these, two outer edges 1x are formed along a first direction X which will be described later, and remaining two outer edges 1y are formed along a second direction Y which will be described later. For example, a planar shape of the vapor chamber 1 may be a rectangle having one side of 1 cm and the other side of 3 cm, or may be a square having one side of 15 cm. The vapor chamber 1 may have any planar dimension. The planar shape of the vapor chamber 1 is not limited to be rectangular. Alternatively, this shape may be any shape, such as a circle, an ellipse, an L-shape, or a T-shape. Additionally, linear regions 10R, 20R and outer edges 10x, 10y, 20x, 20y shown in FIGS. 2 to 5 will be explained in a sixth embodiment which will be described later.

Figure 3:
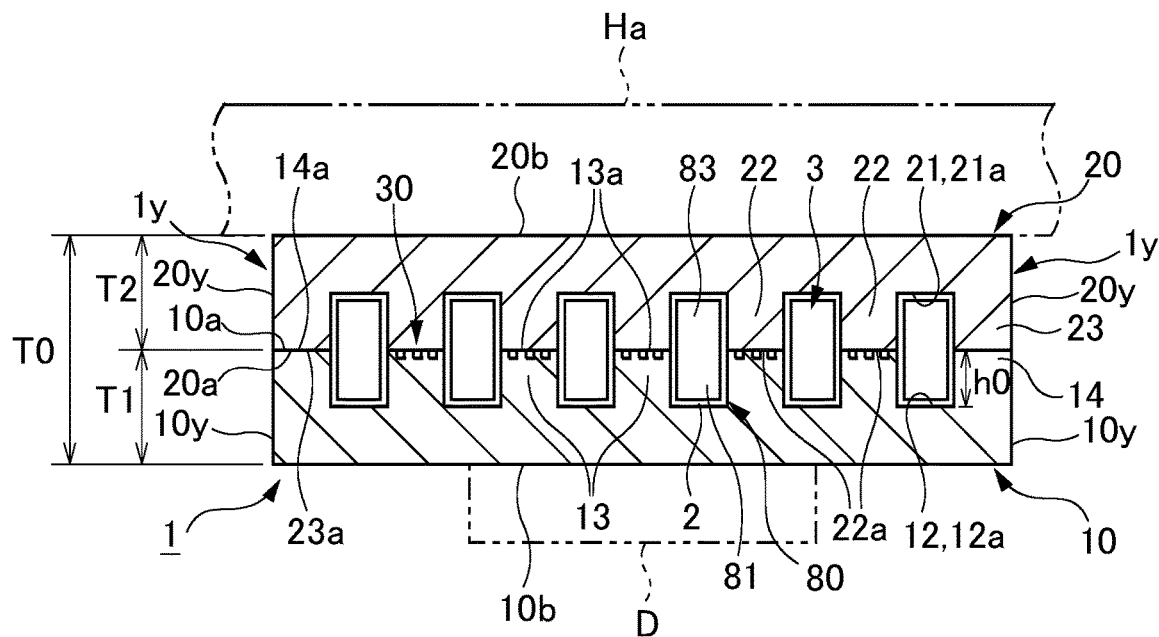
FIG. 3 is a cross-sectional view showing the vapor chamber of FIG. 2 taken along the line A-A.

As shown in FIGS. 2 and 3, the vapor chamber 1 includes a lower metallic sheet 10 (a first metallic sheet, a metallic sheet for the vapor chamber) and an upper metallic sheet 20 (a second metallic sheet, a metallic sheet for the vapor chamber) laminated on the lower metallic sheet 10. In this embodiment, the upper metallic sheet 20 is provided on the lower metallic sheet 10. The lower metallic sheet 10 includes an upper surface 10a (first surface) and a lower surface 10b (second surface) provided on an opposite side from the upper surface 10a. The upper metallic sheet 20 includes a lower surface 20a (a surface nearer to the lower metallic sheet 10) layered on the upper surface 10a of the lower metallic sheet 10 (a surface nearer to the upper metallic sheet 20) and an upper surface 20b provided on an opposite side from the lower surface 20a. The device D which is an object of cooling is attached to the lower surface 10b of the lower metallic sheet 10 (especially, a lower surface of an evaporating portion 11 which will be described later).

The sealed space 3 in which the working fluid 2 is enclosed is formed between the lower metallic sheet 10 and the upper metallic sheet 20. In this embodiment, the sealed space 3 includes a vapor flow path portion 80 through which a vapor of the working fluid 2 mainly passes (a lower vapor flow path recess 12 and an upper vapor flow path recess 21 which will be described later) and a liquid flow path portion 30 through which the working fluid 2 in liquid form mainly passes. As examples of the working fluid 2, pure water, ethanol, methanol and acetone etc. can be listed.

The lower metallic sheet 10 and the upper metallic sheet 20 are joined by diffused junction which will be described later. In the embodiment shown in FIGS. 2 and 3, an example in which the lower metallic sheet 10 and the upper metallic sheet 20 are formed to be rectangular in a planar view is shown. However, the form is not limited thereto. Here, the planar view is a state seen in a direction which is orthogonal to a surface at which the vapor chamber 1 receives heat from the device D (the lower surface 10b of the lower metallic sheet 10) as well as a surface at which the received heat is released (the upper surface 20b of the upper metallic sheet 20), and for example, this corresponds to a state that the vapor chamber 1 is seen from an upper side (see FIG. 2) or seen from a lower side.

Additionally, when the vapor chamber 1 is installed in the mobile terminal, depending on an attitude of the mobile terminal, the vertical relationship between the lower metallic sheet 10 and the upper metallic sheet 20 may be changed. However, in this embodiment, for convenience, a metallic sheet which receives heat from the device D is called the lower metallic sheet 10, while a metallic sheet which releases the received heat is called the upper metallic sheet 20, and an explanation will be made in a state that the lower metallic sheet 10 is disposed at the lower side and the upper metallic sheet 20 is disposed at the upper side.

Figure 4:
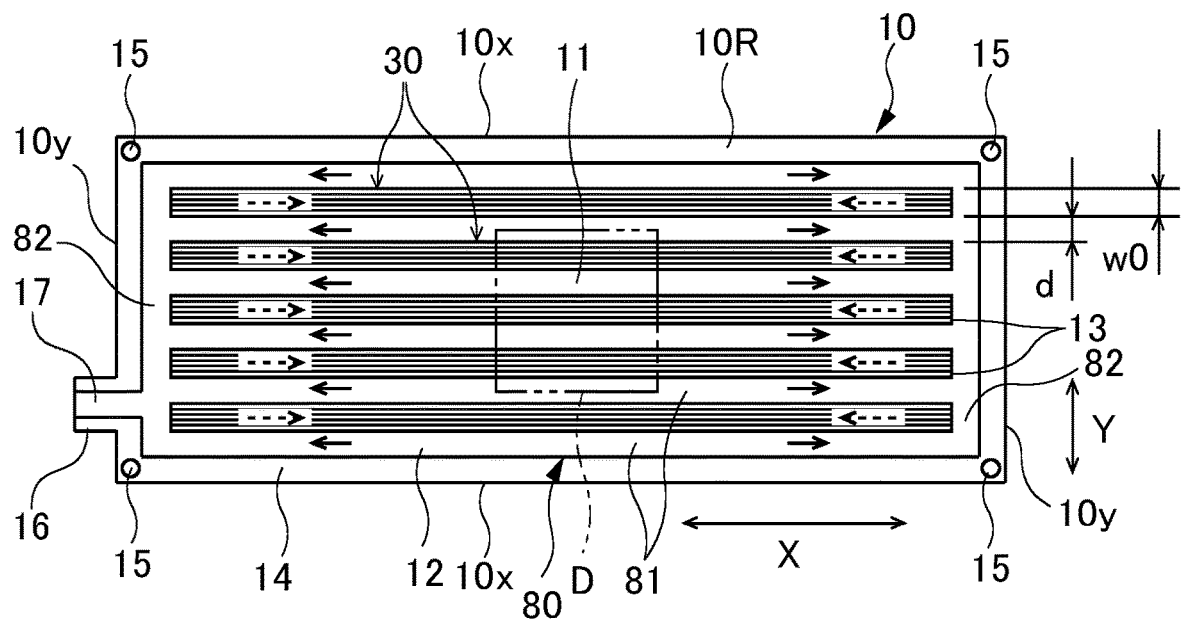
FIG. 4 is a top view of a lower metallic sheet of FIG. 2.

As shown in FIG. 4, the lower metallic sheet 10 includes the evaporating portion 11 in which the working fluid 2 evaporates to generate a vapor, and the lower vapor flow path recess 12 (a first vapor flow path recess, a first vapor flow path portion) provided in the upper surface 10a and formed to be rectangular in a planar view. Among these components, the lower vapor flow path recess 12 constitutes a part of the sealed space 3 described above, and is mainly configured such that the vapor generated in the evaporating portion 11 passes.

The evaporating portion 11 is disposed in the lower vapor flow path recess 12. The vapor in the lower vapor flow path recess 12 is diffused in a direction away from the evaporating portion 11, and most of the vapor is transported to a peripheral portion with a relatively low temperature. Additionally, the evaporating portion 11 is a portion at which the working fluid 2 in the sealed space 3 evaporates by receiving heat from the device D attached to the lower surface 10b of the lower metallic sheet 10. Consequently, the term of the evaporating portion 11 is not a concept limited to a portion overlapped with the device D, and is used as a concept including a portion which is not overlapped with the device D but allows the working fluid 2 to evaporate. Here, the evaporating portion 11 can be provided at any portion of the lower metallic sheet 10. However, in FIGS. 2 and 4, an example in which the evaporating portion 11 is provided at a center portion of the lower metallic sheet 10 is shown. In this case, an operation of the vapor chamber 1 can be stabilized regardless of the attitude of the mobile terminal in which the vapor chamber 1 is installed.

As shown in FIGS. 3 and 4, in this embodiment, a plurality of lower flow path wall portions 13 (first flow path wall portions, first flow path protruding portion) protruding upward from a bottom surface 12a (which will be described later) of the lower vapor flow path recess 12 (a direction orthogonal to the bottom surface 12a) are provided in the lower vapor flow path recess 12 of the lower metallic sheet 10. In this embodiment, an example in which the lower flow path wall portions 13 extend to be elongated along the first direction X of the vapor chamber 1 (a longitudinal direction, a right and left direction in FIG. 4) is shown. Each lower flow path wall portion 13 includes an upper surface 13a (a first abutting surface, a protruding end surface) abutting a lower surface 22a of the corresponding upper flow path wall portion 22 which will be described later. The upper surface 13a is a surface which is not etched by two etching steps which will be described later, and formed on the same plane as the upper surface 10a of the lower metallic sheet 10. Also, each lower flow path wall portion 13 is separated from each other with even intervals, and disposed to be parallel with each other.

As shown in FIGS. 3 and 4, the lower vapor flow path recess 12 includes a plurality of lower vapor passages 81 (first vapor passages) partitioned by the lower flow path wall portions 13. The lower vapor passages 81 extend to be elongated along the first direction X, and are disposed to be parallel with each other. The both end portions of each lower vapor passage 81 communicate with the lower communicating vapor passage 82 extending to be elongated along the second direction Y, and each lower vapor passage 81 communicates via the lower communicating vapor passage 82. In this way, such a configuration is made that the vapor of the working fluid 2 flows along a periphery of each lower flow path wall portion 13 (the lower vapor passage 81 and the lower communicating vapor passage 82) and the vapor is transported to a peripheral portion of the lower vapor flow path recess 12, which inhibits blocking of vapor flow. Additionally, in FIG. 3, the shape of the cross section (the section in the second direction Y) of each lower vapor passage 81 of the lower vapor flow path recess 12 is a rectangle. However, not limited to this, the shape of the cross section of each lower vapor passage 81, for example, may be curved, semi-circular or V-shaped, and may be arbitrary as long as the vapor of the working fluid 2 can be diffused. The same is applied to the lower communicating vapor passage 82. The width (the dimension in the second direction Y) of the lower vapor passage 81 corresponds to the interval d between lower flow path wall portions 13 which will be described later. The same is applied to the width (the dimension in the first direction X) of the lower communicating vapor passage 82.

Each lower flow path wall portion 13 is disposed to be overlapped with the corresponding upper flow path wall portion 22 (which will be described later) of the upper metallic sheet 20 in a planar view, which improves mechanical strength of the vapor chamber 1. The lower vapor passage 81 is formed to be overlapped with the corresponding upper vapor passage 83 (which will be described later) in a planar view. In the same manner, the lower communicating vapor passage 82 is formed to be overlapped with the corresponding upper communicating vapor passage 84 (which will be described later) in a planar view.

The width w0 of the lower flow path wall portions 13 may be, for example, 0.1 mm to 30 mm, preferably, 0.1 mm to 2.0 mm. The interval d between the lower flow path wall portions 13 adjacent to each other may be 0.1 mm to 30 mm, preferably, 0.1 mm to 2.0 mm. Here, the width w0 has a dimension of the lower flow path wall portion 13 in the second direction Y orthogonal to the first direction X of the lower flow path wall portion 13, and means the dimension of the lower metallic sheet 10 on the upper surface 10a, for example, corresponding to the dimension in the vertical direction in FIG. 4. The interval d means the dimension of the lower metallic sheet 10 on the upper surface 10a. The height of each lower flow path wall portion 13 (in other words, the maximum depth of the lower vapor flow path recess 12) h0 (see FIG. 3) may be 10 μm to 300 μm. Additionally, the extending direction of each lower flow path wall portion 13 is not limited to the upward direction (or vertical direction), and is arbitrary as long as protruding from the bottom surface 12a of the lower vapor flow path recess 12.

As shown in FIGS. 3 and 4, a lower peripheral wall 14 is provided at a peripheral portion of the lower metallic sheet 10. The lower peripheral wall 14 is formed to surround the sealed space 3, especially the lower vapor flow path recess 12 to define the sealed space 3. Also, lower alignment holes 15 which execute positioning between the lower metallic sheet 10 and the upper metallic sheet 20 are respectively provided at four corners of the lower peripheral wall 14 in a planar view.

In this embodiment, the upper metallic sheet 20 has substantially the same configuration as in the lower metallic sheet 10 excluding the point that the liquid flow path portion 30 which will be described later is not provided. Hereinafter, the configuration of the upper metallic sheet 20 will be explained in more detail.

Figure 5:
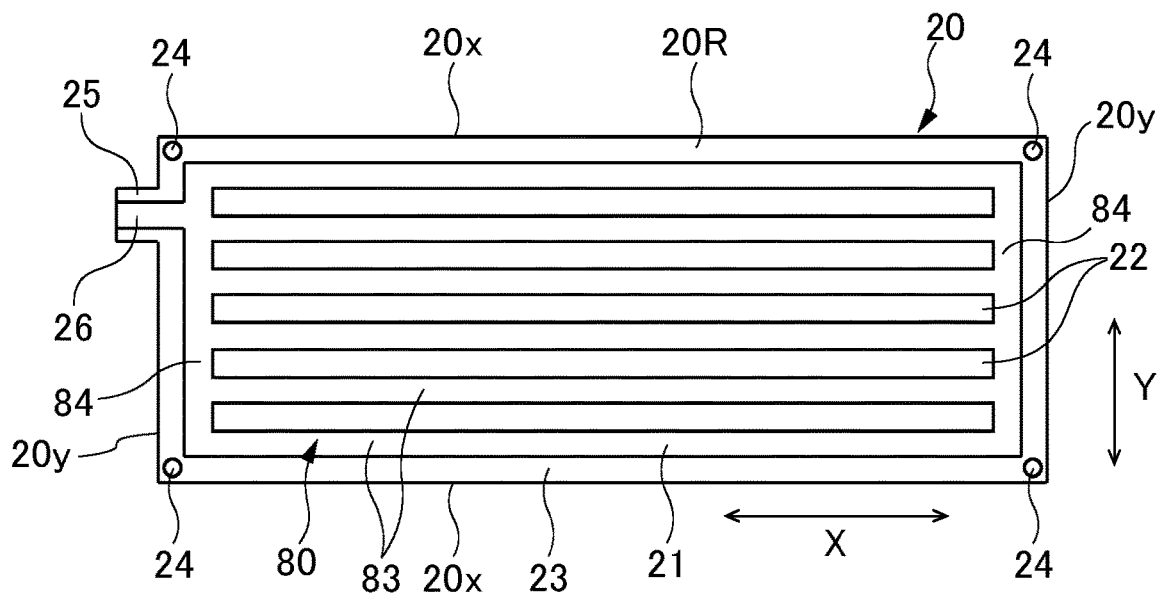
FIG. 5 is a bottom view of an upper metallic sheet of FIG. 2.

As shown in FIGS. 3 and 5, the upper metallic sheet 20 includes an upper vapor flow path recess 21 (a second vapor flow path recess, a second vapor flow path portion) provided in the lower surface 20a. The upper vapor flow path recess 21 constitutes a part of the sealed space 3, and is mainly configured to diffuse the vapor generated in the evaporating portion 11 for cooling. More concretely, the vapor in the upper vapor flow path recess 21 is diffused in a direction away from the evaporating portion 11, and most of the vapor is transported to the peripheral portion with a relatively low temperature. Also, as shown in FIG. 3, a housing member Ha constituting a part of the housing H such as the mobile terminal (see FIG. 1) is disposed on the upper surface 20b of the upper metallic sheet 20. Thereby, the vapor in the upper vapor flow path recess 21 is cooled by the outside via the upper metallic sheet 20 and the housing member Ha.

As shown in FIGS. 2, 3 and 5, in this embodiment, a plurality of upper flow path wall portions 22 (a second flow path wall portion, second flow path protruding portion) protruding from the bottom surface 21a of the upper vapor flow path recess 21 to a lower side (a direction perpendicular to the bottom surface 21a) are provided in the upper vapor flow path recess 21 of the upper metallic sheet 20. In this embodiment, an example in which the upper flow path wall portions 22 extend to be elongated along the first direction X (a right and left direction of FIG. 5) of the vapor chamber 1 is shown. Each upper flow path wall portion 22 includes the planar lower surface 22a (a second abutting surface, a protruding end surface) which abuts the upper surface 10a of the lower metallic sheet 10 (more specifically, the upper surface 13a of each lower flow path wall portion 13 described above) and covers the liquid flow path portion 30. Also, the upper flow path wall portions 22 are separated from each other with even intervals and disposed to be parallel with each other.

As shown in FIGS. 3 and 5, the upper vapor flow path recess 21 includes a plurality of upper vapor passages 83 (second vapor passages) partitioned by the upper flow path wall portions 22. The upper vapor passages 83 extend to be elongated along the first direction X, and are disposed to be parallel with each other. The both end portions of each upper vapor passage 83 communicate with the upper communicating vapor passage 84 extending to be elongated along the second direction Y, and each upper vapor passage 83 communicates via the upper communicating vapor passage 84. In this way, such a configuration is made that the vapor of the working fluid 2 flows along a periphery of each upper flow path wall portion 22 (the upper vapor passage 83 and the upper communicating vapor passage 84) and the vapor is transported to a peripheral portion of the upper vapor flow path recess 21, which inhibits blocking of vapor flow. Additionally, in FIG. 3, the shape of the cross section (the section in the second direction Y) of each upper vapor passage 83 of the upper vapor flow path recess 21 is a rectangle. However, not limited to this, the shape of the cross section of each upper vapor passage 83 may be, for example, curved, semi-circular or V-shaped, and may be arbitrary as long as the vapor of the working fluid 2 can be diffused. The same is applied to the cross-sectional shape of the upper communicating vapor passage 84. The width (the dimension in the second direction Y) of the upper vapor passage 83 and the width of the upper communicating vapor passage 84 may be similar to the width of the lower vapor passage 81 and the width of the lower communicating vapor passage 82 as shown in FIG. 3 and the like, but may be different instead.

Each upper flow path wall portion 22 is disposed to be overlapped with the corresponding lower flow path wall portions 13 of the lower metallic sheet 10 in a planar view, which improves mechanical strength of the vapor chamber 1. The upper vapor passage 83 is formed to be overlapped with the corresponding lower vapor passage 81 (which will be described later) in a planar view. In the same manner, the upper communicating vapor passage 84 is formed to be overlapped with the corresponding lower communicating vapor passage 82 in a planar view.

A width and a height of each upper flow path wall portion 22 may be the same as the width w0 and height h0 of each lower flow path wall portion 13 described above. Here, while the bottom surface 21a of the upper vapor flow path recess 21 can be also said as a ceiling surface in the vertical disposition relationship between the lower metallic sheet 10 and the upper metallic sheet 20 as shown in FIG. 3 etc., this corresponds to a surface on a deeper side of the upper vapor flow path recess 21, so that this is described as the bottom surface 21a in the present specification.

As shown in FIGS. 3 and 5, an upper peripheral wall 23 is provided at a peripheral portion of the upper metallic sheet 20. The upper peripheral wall 23 is formed to surround the sealed space 3, especially the upper vapor flow path recess 21 to define the sealed space 3. Also, upper alignment holes 24 which execute positioning between the lower metallic sheet 10 and the upper metallic sheet 20 are respectively provided at four corners of the upper peripheral wall 23 in a planar view. In other words, such a configuration is made that each upper alignment hole 24 is disposed to be overlapped with the corresponding lower alignment hole 15 at the time of temporary joint which will be described later, which allows positioning between the lower metallic sheet 10 and the upper metallic sheet 20.

The lower metallic sheet 10 and the upper metallic sheet 20 are permanently joined to each other preferably by the diffused junction. More specifically, as shown in FIG. 3, an upper surface 14a of the lower peripheral wall 14 of the lower metallic sheet 10 abuts a lower surface 23a of the upper peripheral wall 23 of the upper metallic sheet 20, so that the lower peripheral wall 14 and the upper peripheral wall 23 are joined to each other. Thereby, the sealed space 3 which seals the working fluid 2 is formed between the lower metallic sheet 10 and the upper metallic sheet 20. Also, the upper surface 13a of each lower flow path wall portion 13 of the lower metallic sheet 10 abuts the lower surface 22a of corresponding upper flow path wall portion 22 of the upper metallic sheet 20, so that each lower flow path wall portion 13 and the corresponding upper flow path wall portion 22 are joined to each other. This improves the mechanical strength of the vapor chamber 1. Especially, since the lower flow path wall portions 13 and the upper flow path wall portions 22 according to this embodiment are disposed with even intervals, the mechanical strength at each portion of the vapor chamber 1 can be equalized. Additionally, the lower metallic sheet 10 and the upper metallic sheet 20 may be joined by other methods such as brazing as long as permanent joining is performed, not by the diffused junction. Additionally, the term of "permanent joining" is not strictly limited to a certain meaning, but is used as a term that means joining during operation of the vapor chamber 1, to an extent capable of maintaining the hermeticity of the sealed space 3 and to an extent of capable of maintaining joining of the upper surface 10a of the lower metallic sheet 10 and the lower surface 20a of the upper metallic sheet 20.

Also, as shown in FIG. 2, the vapor chamber 1 further includes an injection portion 4 for pouring the working fluid 2 in the sealed space 3 at one end of a pair of ends in the first direction X. The injection portion 4 includes a lower injection protruding portion 16 which protrudes from an end surface of the lower metallic sheet 10 and an upper injection protruding portion 25 which protrudes from an end surface of the upper metallic sheet 20. Among these components, a lower injection flow path recess 17 is formed on an upper surface of the lower injection protruding portion 16, and the upper injection flow path recess 26 is formed on a lower surface of the upper injection protruding portion 25. The lower injection flow path recess 17 communicates with the lower vapor flow path recess 12, and the upper injection flow path recess 26 communicates with the upper vapor flow path recess 21. The lower injection flow path recess 17 and the upper injection flow path recess 26 form an injection flow path of the working fluid 2 when the lower metallic sheet 10 and the upper metallic sheet 20 are joined. The working fluid 2 passes through the injection flow path and is poured into the sealed space 3. Additionally, in this embodiment, while an example in which the injection portion 4 is provided at one of the pair of ends of the vapor chamber 1 in the first direction X, this is not restrictive. The injection portion 4 may be provided at any position. Two or more injection portions 4 may be provided.

Next, the liquid flow path portion 30 of the lower metallic sheet 10 will be explained in more detail using FIGS. 3, 4, and 6 to 9.

As show in FIGS. 3 and 4, the liquid flow path portion 30 through which the working fluid 2 in liquid form passes is provided in the upper surface 10a of the lower metallic sheet 10 (more specifically, the upper surface 13a of each lower flow path wall portion 13). The liquid flow path portion 30 constitutes a part of the above-described sealed space 3, and communicates with the lower vapor flow path recess 12 and the upper vapor flow path recess 21 described above. The liquid flow path portion 30 is not necessarily provided in every lower flow path wall portions 13. For example, lower flow path wall portions 13 provided with no liquid flow path portion 30 may exist.

Figure 6:
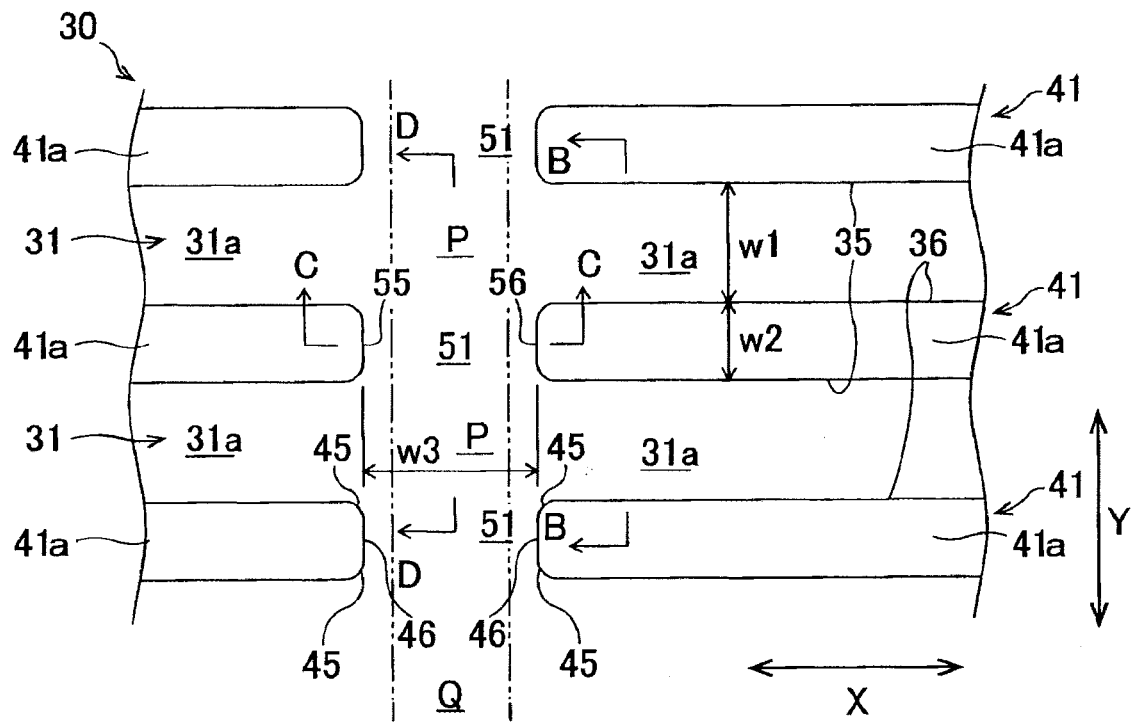
FIG. 6 is an enlarged top view showing a liquid flow path portion of FIG. 4.

As shown in FIG. 6, the liquid flow path portion 30 includes a plurality of main flow grooves 31. The main flow grooves 31 respectively extend in the first direction X to allow the working fluid 2 in liquid form to pass through, and are arranged at different positions in the second direction Y described above. The main flow grooves 31 are configured to mainly transport the working fluid 2, condensed from the vapor generated at the evaporating portion 11, to the evaporating portion 11.

A convex array 41 is provided between a pair of main flow grooves 31 adjacent to each other. The convex array 41 includes a plurality of liquid flow path convex portions 41a arranged in the first direction X. In the convex arrays 41, the liquid flow path convex portions 41a are arranged at a constant pitch in the first direction X. The liquid flow path convex portions 41a of one convex array 41 and the liquid flow path convex portions 41a of another convex array 41 are arranged at the same position in the first direction X. In this way, the liquid flow path convex portions 41a are arranged to have a lattice shape. Over the entire liquid flow path portion 30, the liquid flow path convex portions 41a may be arranged to have a lattice shape.

Each communicating groove 51 is interposed between the liquid flow path convex portions 41a adjacent to each other. The communicating grooves 51 extend in the second direction Y and are aligned in the second direction Y. In this embodiment, the second direction in which the communicating grooves 51 are aligned is the direction Y orthogonal to the first direction X. Each communicating groove 51 communicates with the corresponding pair of main flow grooves 31 (the main flow grooves 31 adjacent to each other in the vertical direction in FIG. 6) to allow the working fluid 2 to reciprocate between the main flow grooves 31. The communicating groove 51 is a region between the liquid flow path convex portions 41a adjacent to each other in the first direction X, and is a region between a pair of main flow grooves 31 adjacent to each other in the second direction Y.

As shown in FIG. 6, the main flow grooves 31 include intersections P communicating with the communicating grooves 51, and main flow groove main bodies 31a.

Among these components, at the intersections P, a pair of the communicating grooves 51 disposed on both sides of the main flow grooves 31 in the second direction Y communicate with this main flow groove 31. The pair of communicating grooves 51 are aligned in the second direction Y and are each disposed in the straight line. In this way, at the intersection P, the main flow groove 31 and the communicating groove 51 intersect in a cross shape. The intersection P is a region between the main flow groove main bodies 31a adjacent to each other in the first direction X, and is a region between the communicating grooves 51 adjacent to each other in the second direction Y. In other words, at the regions, the intersection P is a region in which the arrays of main flow grooves 31 and communicating grooves 51 intersect (that is, overlap).

The main flow groove main bodies 31a are disposed at positions different from those of the intersections P in the first direction X, and are portions positioned between the liquid flow path convex portions 41a adjacent to each other in the second direction Y. The intersections P and the main flow groove main bodies 31a are alternately arranged.

The width w1 (the dimension in the second direction Y) of the main flow groove 31 may be larger than the width w2 (the dimension in the second direction Y) of the liquid flow path convex portion 41a. In this case, the ratio of the main flow grooves 31 on the upper surface 13a of the lower flow path wall portions 13 can be made larger. Consequently, a flow path density of the main flow grooves 31 on the upper surface 13a can be increased to improve a transport function of the working fluid 2 in liquid form. For example, the width w1 of the main flow groove 31 may be 30 μm to 200 μm, and the width w2 of the liquid flow path convex portion 41a may be 20 μm to 180 μm.

Figure 7:
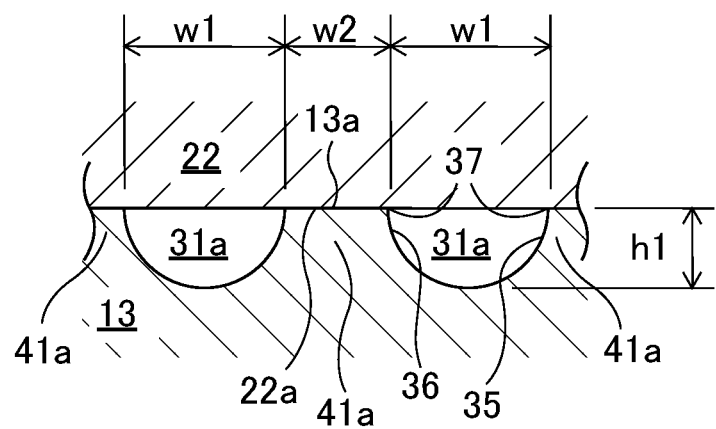
FIG. 7 is a cross-sectional view of FIG. 6 taken along the line B-B with addition of an upper flow path wall portion of the upper metallic sheet.

A depth h1 of the main flow groove 31 shown in FIG. 7 may be smaller than a depth h0 of the above-described lower vapor flow path recess 12. In this case, the capillary action of the main flow grooves 31 can be improved. For example, the depth h1 of the main flow groove 31 is preferably about a half of h0, and may be 5 μm to 180 μm.

Also, the width w3 of the first communicating groove 51 may be larger than the width w1 of the main flow groove 31 (in more detail, the width of the main flow groove main body 31a). The width w3 of the communicating groove 51 may be, for example, 40 μm to 300 μm.

Figure 8:
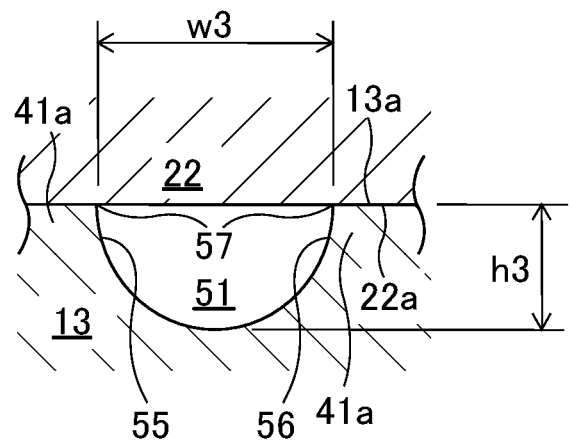
FIG. 8 is a cross-sectional view of FIG. 6 taken along the line C-C with addition of an upper flow path wall portion of the upper metallic sheet.

The shape of a cross section (a cross section in the second direction Y) of the main flow groove 31 is not particularly limited, and for example, may be rectangular, curved, semicircular or V-shaped. The same is applied to the cross section (a cross section in the first direction X) of the communicating grooves 51. FIGS. 7 and 8 show the example in which the cross sections of each main flow groove 31 and each communicating groove 51 are formed to be curved. In this case, the width of each of the main flow grooves 31 and communicating grooves 51 is the width of each groove of the lower flow path wall portions 13 on the upper surface 13a. In the same manner, the width of each liquid flow path convex portion 41a is the width of each convex portion on the upper surface 13a.

Incidentally, in FIG. 6, each of liquid flow path convex portions 41a is formed to be rectangular such that the first direction X is the longitudinal direction in a planar view in a large sense. Over the entire liquid flow path portion 30, the liquid flow path convex portions 41a may be formed to have a similar form. However, a rounded curved portion 45 is provided at a corner portion of each of the liquid flow path convex portions 41a. Thereby, the corner portion of each convex portion 41a is formed to be smoothly curved, which reduces the flow path resistance of the working fluid 2 in liquid form. Additionally, such an example is shown that two curved portions 45 are respectively provided at right and left end portions in FIG. 6 of the liquid flow path convex portions 41a, and a linear portion 46 is provided between the two curved portions 45. Consequently, the width w3 of each communicating groove 51 is the distance between the linear portions 46 of the liquid flow path convex portions 41a adjacent to each other in the first direction X. Although not shown, the same is applied to a case where no curved portion 45 is formed at each of the liquid flow path convex portions 41a. However, the shape of end portions of the liquid flow path convex portions 41a is not limited to this. For example, instead of providing the linear portions 46 at the right and left end portions respectively, the entire end portion may be curved (for example, semicircular). In such a case, the width w3 of each of the communicating grooves 51 is the smallest distance between the liquid flow path convex portions 41a adjacent to each other in the first direction X.

Figure 9:
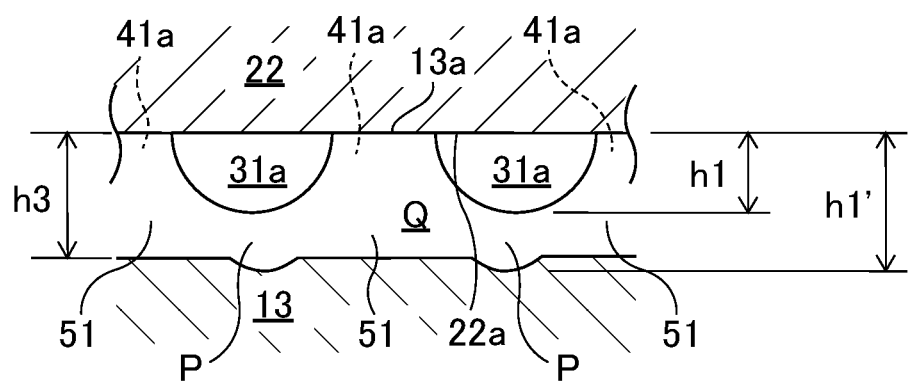
FIG. 9 is a cross-sectional view of FIG. 6 taken along the line D-D with addition of the upper flow path wall portion of the upper metallic sheet.

As shown in FIGS. 8 and 9, in this embodiment, the depth h3 of each communicating groove 51 may be deeper than the depth h1 of each main flow groove 31 (more specifically, the depth of each main flow groove main body 31a). Here, when the shape of the cross section of each of the main flow grooves 31 and the shape of the cross section of each of the communicating grooves 51 are formed to be curved as described above, the depths of the grooves 31, 51 are the depth at a deepest position in the corresponding groove. The depth h3 of the communicating groove 51 may be, for example, 10 µm to 250 µm.

In this embodiment, as shown in FIG. 9, a depth h1' of each intersection P of the main flow grooves 31 may be deeper than the depth h1 of each main flow groove main body 31a. The depth h1' of the intersection P of each main flow groove 31 may be deeper than the depth h3 of each communicating groove 51. The depth h1 of the intersection P may be, for example, 20 µm to 300 µm. The depth h1' of the intersection P is the depth at the deepest position at the intersection P.

Above-described, the depth h3 of each communicating groove 51 may be deeper than the depth h1 of the main flow groove main body 31a of each main flow groove 31, and the depth h1' of the intersection P of the main flow groove 31 may be deeper than the depth h1 of the main flow groove main body 31a. Thereby, a buffer region Q which is deeper than the depth h1 of each main flow groove main body 31a is formed in a region from the intersection P through the communicating groove 51 to the intersection P. The working fluid 2 in liquid form can be stored in the buffer region Q. Typically, the main flow grooves 31 and the communicating grooves 51 of the liquid flow path portions 30 are filled with the working fluid 2 in liquid form. Accordingly, since the depth of the buffer region Q (h1' and h3) is deeper than the depth h1 of the main flow groove main bodies 31a, a large quantity of working fluid 2 can be stored in the buffer regions Q. As described above, since the main flow grooves 31 and the communicating grooves 51 are filled with the working fluid 2, the working fluid 2 can be stored in the buffer regions Q regardless of the attitude of the vapor chamber 1. In this embodiment, since the communicating grooves 51 are aligned in the second direction Y, the buffer regions Q are formed so as to extend in the second direction Y in a continuing manner.

Additionally, while a large number of intersections P are formed in each liquid flow path portion 30 of the vapor chamber 1, as long as the depth h1' of at least one intersection P is deeper than the depth h1 of the main flow groove main bodies 31a (or the depth h3 of the communicating groove 51), retaining property of the working fluid 2 at the intersections P can be improved. Since this retaining property improves as the number of intersections P having h1' which is deeper than the depth h1 of the main flow groove main bodies 31a increases, the depth h1' of all the intersections P is preferably the same depth. However, the retaining property of the working fluid 2 can be evidently improved even when the depth h1' of some intersections P is not deeper than the depth h1 of the main flow groove main bodies 31a due to a production error etc. The same is applied to the depth h3 of the communicating grooves 51.

Here, a method of confirming the width and the depth of the main flow grooves 31 and the width and the depth of the communicating grooves 51 from the vapor chamber 1 in the finished form will be explained. Generally, the main flow grooves 31 and the communicating grooves 51 cannot be seen from the outside of the vapor chamber 1. Consequently, such a method can be listed in which the widths and the depths of the main flow grooves 31 and the communicating grooves 51 are confirmed from a cross-sectional shape obtained by cutting the vapor chamber 1 in the finished form at a desired position.

More specifically, firstly, the vapor chamber 1 is cut by a wire saw into a 10 mm square piece as a sample. After that, the sample is embedded in resin with vacuum degassing such that resin enters the vapor flow path recesses 12, 21 and the liquid flow path portion 30 (the main flow grooves 31 and the communicating grooves 51). Next, a trimming process is performed by a diamond knife to obtain a desired cross section. At this time, for example, using a diamond knife of a microtome (for example, an ultra microtome manufactured by Leica microsystems GmbH), a trimming process is executed to a portion 40 µm away from a measured object position. For example, assuming that a pitch of the communicating grooves 51 is 200 µm, by shaving the communicating groove 51 adjacent to the communicating groove 51 as a measured object by 160 µm, a portion which is 40 µm away from the communicating groove 51 as the measured object can be specified. Next, a trimming-processed cutting surface is shaved to provide a cutting surface for observation. At this time, using a cross section sample manufacturing apparatus (for example, a cross section polisher manufactured by JEOL Ltd.), setting a protruding width of 40 µm, the voltage of 5 kV, and the time of 6 hours, the cutting surface is shaved in ion beam processing. Thereafter, the obtained cutting surface of the sample is observed. At this time, using a scanning electron microscope (for example, a scanning electron microscope manufactured by Carl Zeiss Co., Ltd.), setting the voltage of 5 kV, an operation distance of 3 mm and an observation magnification of 200 times or 500 times, the cutting surface is observed. In this way, the widths and the depths of the main flow grooves 31 and the communicating grooves 51 can be measured. Additionally, an observation magnification standard at the time of shooting is polaroid 545. Also, the above-described method is one example, and an apparatus to be used or the measuring condition etc. can be arbitrarily determined in accordance with the shape and the configuration etc. of the sample.

As described above, in a case where the width w3 of the communicating grooves 51 is larger than the width w1 of the main flow grooves 31, the buffer region Q is a region which opens wider than the main flow groove main bodies 31a. Consequently, in the second half-etching step shown in FIG. 12, more etching liquid enters the buffer region Q than the main flow groove main bodies 31a. As a result, erosion by the etching liquid progresses in the buffer region Q, and the depth of the buffer region Q is made deeper. Moreover, in the buffer region Q, a portion corresponding to the intersection P communicates with the main flow groove main bodies 31a, so that the etching liquid more easily enters this portion than the communicating grooves 51. Thereby, the depth h1' of the intersection P can be deeper than the depth h3 of the communicating grooves 51. In this way, the buffer region Q as shown in FIG. 9 is formed.

Incidentally, the above-described liquid flow path portion 30 is formed on the upper surface 13a of each lower flow path wall portion 13 of the lower metallic sheet 10. On the other hand, in this embodiment, the lower surface 22a of each upper flow path wall portion 22 of the upper metallic sheet 20 is formed to be planar. Thereby, each of the main flow grooves 31 of the liquid flow path portion 30 is covered by the lower surface 22a which is planar. In this case, as shown in FIG. 7, by the pair of side walls 35, 36 extending in the first direction X of the main flow grooves 31 and the lower surface 22a of each upper flow path wall portion 22, two corner portions 37 in a right angle or an acute angle can be formed, which can improve capillary action at the two corner portions 37. In other words, even when the cross section of each of the main flow grooves 31 is formed to be curved, capillary action can be improved at the corner portions 37.

In the same manner, each of the communicating grooves 51 of the liquid flow path portion 30 is covered by the planar lower surface 22a. In this case, as shown in FIGS. 6 and 8, by the pair of side walls 55, 56 extending in the second direction Y of the communicating grooves 51 and the lower surface 22a of each upper flow path wall portion 22, two corner portions 57 in a right angle or an acute angle can be formed, which improves capillary action at the two corner portions 57. In other words, even when the cross section of each of the communicating grooves 51 is formed to be curved, capillary action can be improved at the corner portions 57.

Here, the working fluid 2 in liquid form condensed from the vapor passes through the communicating grooves 51 and enter the main flow grooves 31, which will be described later. Consequently, since capillary action of the communicating grooves 51 is improved, the working fluid 2 condensed in liquid form is allowed to smoothly enter the main flow grooves 31. That is, due to capillary action of the communicating grooves 51, the working fluid 2 condensed in liquid form can smoothly enter not only the main flow groove 31 nearer to the vapor flow path recesses 12, 21, but also the main flow grooves 31 more apart from the vapor flow path recesses 12, 21, which improves the transport function of the working fluid 2 condensed in liquid form. Also, in a case where the width w3 of the communicating grooves 51 is larger than the width w1 of the main flow grooves 31, the flow path resistance of the working fluid 2 in the communicating grooves 51 can be reduced, and also in this point, the working fluid 2 condensed in liquid form is allowed to smoothly enter each of the main flow grooves 31. Moreover, the working fluid 2 entering each of the main flow grooves 31 can be smoothly transported to the evaporating portion 11 due to capillary action of the main flow grooves 31. As a result, as the entire liquid flow path portion 30, the transport function of the working fluid 2 in liquid form can be improved.

Additionally, while a material used for the lower metallic sheet 10 and the upper metallic sheet 20 is not especially limited as long as the material has a good thermal conductivity, for example, the lower metallic sheet 10 and the upper metallic sheet 20 may be formed by copper (an oxygen-free copper) or copper alloy. This improves the thermal conductivity of the lower metallic sheet 10 and the upper metallic sheet 20. As a result, heat release efficiency of the vapor chamber 1 can be improved. Alternatively, as long as a desired heat release efficiency can be obtained, other metallic materials such as aluminum or other metallic alloy materials such as stainless steel may be used for these metallic sheets 10 and 20. The thickness of the vapor chamber 1 is, for example, 0.1 mm to 1.0 mm. While FIG. 3 shows a case where a thickness T1 of the lower metallic sheet 10 and a thickness T2 of the upper metallic sheet 20 are equal, not limited to this, the thickness T1 of the lower metallic sheet 10 and the thickness T2 of the upper metallic sheet 20 may be different.

Next, an operation of this embodiment constituted by such a configuration will be explained. Here, firstly, a manufacturing method of the vapor chamber 1 will be explained using FIGS. 10 to 15, but an explanation of a half-etching step of the upper metallic sheet 20 is simplified. Additionally, in FIGS. 10 to 15, the same cross section as in FIG. 3 is shown.

Figure 10:
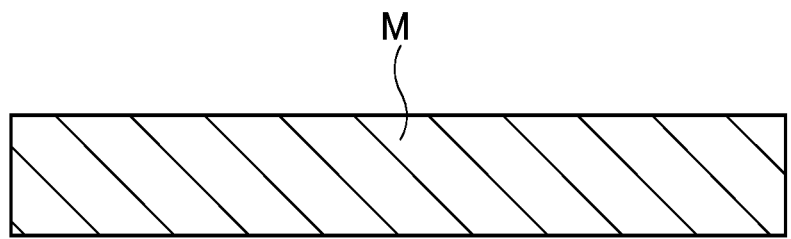
FIG. 10 is a drawing for explaining a preparation step of the lower metallic sheet in a manufacturing method of the vapor chamber according to the first embodiment.

Firstly as shown in FIG. 10, as a preparation step, a planar metal material sheet M is prepared.

Figure 11:
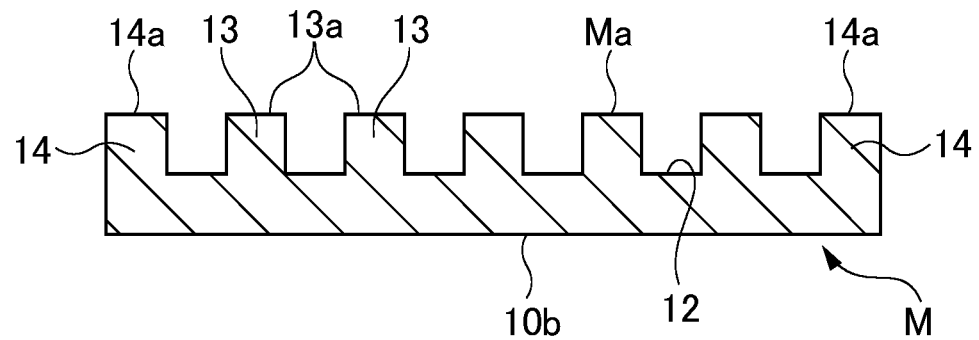
FIG. 11 is a drawing for explaining a first half-etching step of the lower metallic sheet in the manufacturing method of the vapor chamber according to the first embodiment.

After that, as shown in FIG. 11, the metal material sheet M is half-etched to form the lower vapor flow path recess 12 constituting a part of the sealed space 3. In this case, firstly, a not shown first resist film is formed to have a pattern corresponding to the plurality of lower flow path wall portions 13 and the lower peripheral wall 14 by a photolithographic technique on an upper surface Ma of the metal material sheet M. Thereafter, as a first half-etching step, the upper surface Ma of the metal material sheet M is half-etched. Thereby, a portion of the upper surface Ma of the metal material sheet M corresponding to a resist opening (not shown) of the first resist film is half-etched, and the lower vapor flow path recess 12, the lower flow path wall portions 13 and the lower peripheral wall 14 as shown in FIG. 11 are formed. At this time, the lower injection flow path recess 17 as shown in FIGS. 2 and 4 is simultaneously formed, and the metal material sheet M is etched to have an outer shape as shown in FIG. 4 from the upper surface Ma and a lower surface, thereby a predetermined outer shape can be obtained. After the first half-etching step, the first resist film is removed. Additionally, the half-etching means etching to form a recess not penetrating through a material. Consequently, the depth of the recess formed by the half-etching is not limited to a half of the thickness of the lower metallic sheet 10. As etching liquid, for example, ferric chloride etching liquid such as aqueous ferric chloride, or copper chloride etching liquid such as aqueous copper chloride can be used.

Figure 12:
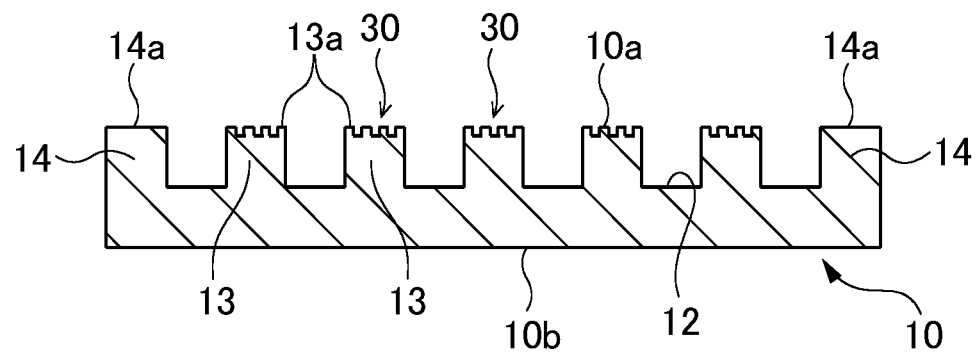
FIG. 12 is a drawing for explaining a second half-etching step of the lower metallic sheet in the manufacturing method of the vapor chamber according to the first embodiment.

After the lower vapor flow path recess 12 is formed, as shown in FIG. 12, the liquid flow path portion 30 is formed on the upper surface 13a of each lower flow path wall portion 13.

In this case, firstly, a not shown second resist film is formed to have a pattern corresponding to the liquid flow path convex portions 41a of the liquid flow path portion 30 by the photolithographic technique on the upper surface 13a of each lower flow path wall portion 13. After that, as a second half-etching step, the upper surface 13a of each lower flow path wall portion 13 is half-etched. Thereby, a portion of the upper surface 13a corresponding to a resist opening (not shown) of the second resist film is half-etched, and the liquid flow path portion 30 is formed on the upper surface 13a of each lower flow path wall portion 13. In other words, on the upper surface 13a, each of the liquid flow path convex portions 41a is formed. By these liquid flow path convex portions 41a, the main flow grooves 31 and the first communicating grooves 51 are defined. After the second half-etching step, the second resist film is removed.

In this way, the lower metallic sheet 10 formed with the liquid flow path portion 30 is obtained. Additionally, by forming the liquid flow path portion 30 as the second half-etching step as a different step from the first half-etching step, the main flow grooves 31 and the communicating grooves 51 can be easily formed with a depth which is different from the depth h0 of the lower vapor flow path recess 12. However, the lower vapor flow path recess 12 and the main flow grooves 31 as well as the communicating grooves 51 may be formed with the same half-etching step. In such a case, the number of half-etching step can be reduced, which can reduce a manufacturing cost of the vapor chamber 1.

On the other hand, in the same manner as the lower metallic sheet 10, the upper metallic sheet 20 is half-etched from the lower surface 20*a* to form the upper vapor flow path recess 21, the upper flow path wall portions 22 and the upper peripheral wall 23. In this way, the above-described upper metallic sheet 20 is obtained.

Figure 13:
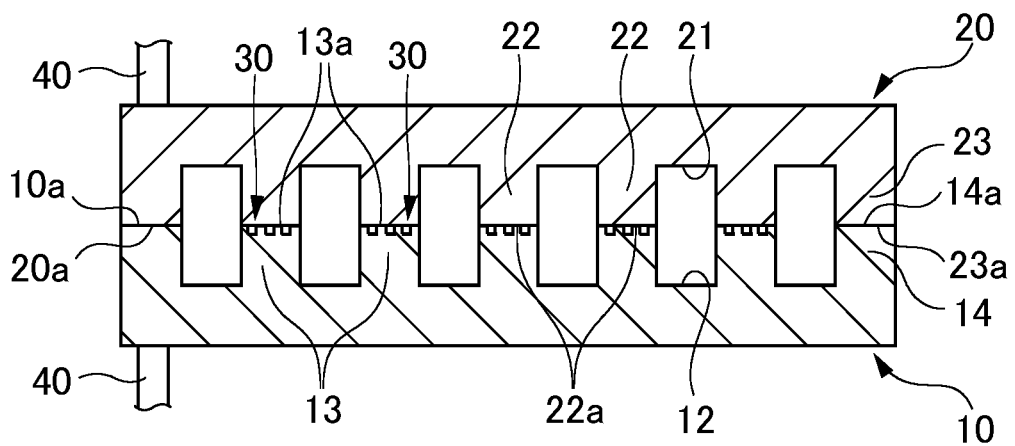
FIG. 13 is a drawing for explaining a temporary joint step in the manufacturing method of the vapor chamber according to the first embodiment.

Next, as shown in FIG. 13, as a temporary joint step, the lower metallic sheet 10 having the lower vapor flow path recess 12 and the upper metallic sheet 20 having the upper vapor flow path recess 21 are temporarily joined. In such a case, firstly, using the lower alignment holes 15 of the lower metallic sheet 10 (see FIGS. 2 and 4) and the upper alignment holes 24 of the upper metallic sheet 20 (see FIGS. 2 and 5), positioning of the lower metallic sheet 10 and the upper metallic sheet 20 is executed. Thereafter, the lower metallic sheet 10 and the upper metallic sheet 20 are fixed. While a fixing method is not particularly limited, for example, the lower metallic sheet 10 and the upper metallic sheet 20 may be fixed by executing resistance welding to the lower metallic sheet 10 and the upper metallic sheet 20. In this case, as shown in FIG. 11, a resistance spot welding may be executed using an electrode rod 40. Instead of resistance welding, laser welding may be executed. Alternatively, ultrasonic junction may be executed to fix the lower metallic sheet 10 and the upper metallic sheet 20 by irradiation with ultrasonic waves. Further, an adhesive agent may be used, and the adhesive agent including no or little organic constituent may be used. In this way, the lower metallic sheet 10 and the upper metallic sheet 20 are fixed with execution of the positioning.

Figure 14:
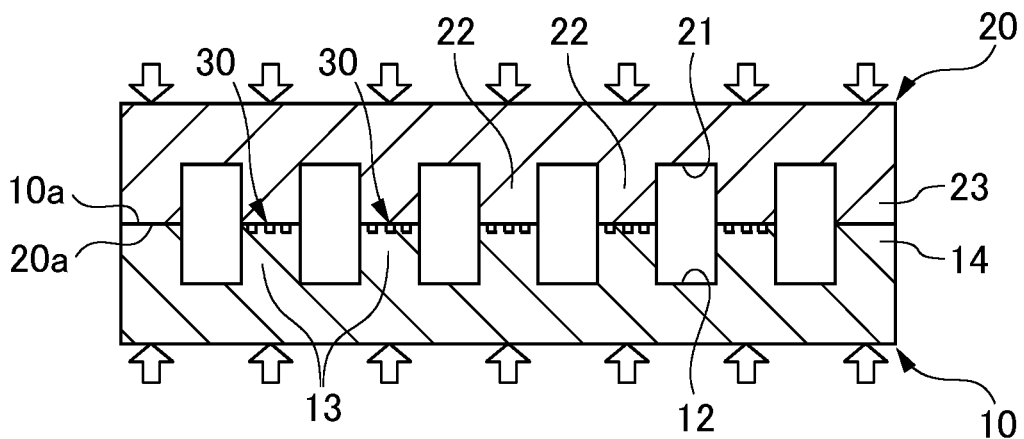
FIG. 14 is a drawing for explaining a permanent joint step in the manufacturing method of the vapor chamber according to the first embodiment.

After the temporary joint, as shown in FIG. 14, as a permanent joint step, the lower metallic sheet 10 and the upper metallic sheet 20 are permanently joined by the diffused junction. The diffused junction is a method in which the lower metallic sheet 10 and the upper metallic sheet 20 to be joined are closely contacted, and the metallic sheets 10, 20 are pressurized and heated in a contact direction in a controlled atmosphere such as vacuum or inert gas to execute joint using diffusion of atoms generated at joint surfaces. While the material of the lower metallic sheet 10 and the upper metallic sheet 20 is heated to a temperature approximate to a melting point in the diffused junction, this temperature is lower than the melting point, which avoids melting and deformation of each of the metallic sheets 10, 20. More specifically, the upper surface 14*a* of the lower peripheral wall 14 of the lower metallic sheet 10 and the lower surface 23*a* of the upper peripheral wall 23 of the upper metallic sheet 20 are subjected to the diffused junction as joint surfaces. Thereby, by the lower peripheral wall 14 and the upper peripheral wall 23, the sealed space 3 is formed between the lower metallic sheet 10 and the upper metallic sheet 20. Also, by the lower injection flow path recess 17 (see FIGS. 2 and 4) and the upper injection flow path recess 26 (see FIGS. 2 and 5), an injection flow path of the working fluid 2 communicating with the sealed space 3 is formed. Further, the upper surface 13*a* of the lower flow path wall portion 13 of the lower metallic sheet 10 and the lower surface 22*a* of the upper flow path wall portion 22 of the upper metallic sheet 20 are subjected to the diffused junction as joint surfaces, so that mechanical strength of the vapor chamber 1 is improved. The liquid flow path portion 30 formed on the upper surface 13*a* of each lower flow path wall portion 13 remains as a flow path of the working fluid 2 in liquid form.

Figure 15:
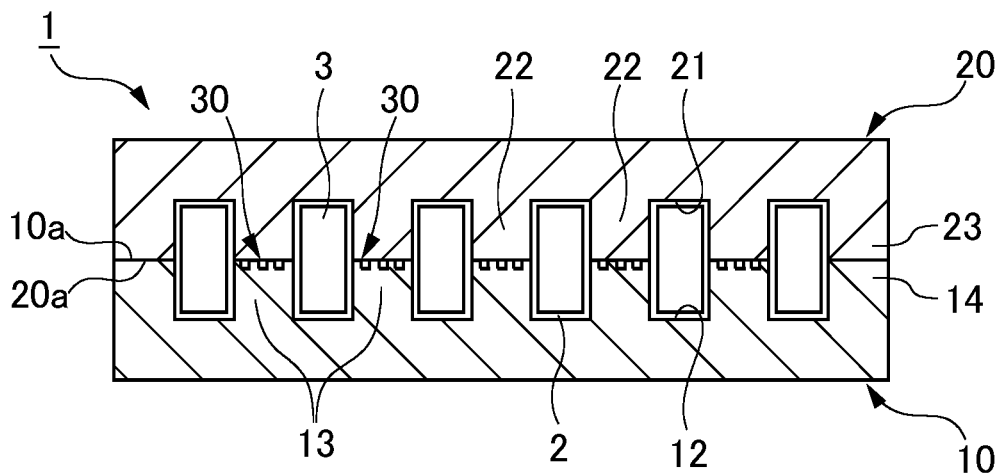
FIG. 15 is a drawing for explaining an enclosing step of a working fluid in the manufacturing method of the vapor chamber according to the first embodiment.

After the permanent joint, as shown in FIG. 15, as an enclosing step, the working fluid 2 is poured into the sealed space 3 from the injection portion 4 (see FIG. 2). At this time, firstly, the sealed space 3 is depressurized by vacuuming (for example, 5 Pa or less, preferably 1 Pa or less), and then the working fluid 2 is poured into the sealed space 3. At the time of injection, the working fluid 2 passes through the injection flow path formed by the lower injection flow path recess 17 and the upper injection flow path recess 26. For example, while the enclosing amount of the working fluid 2 depends on the configuration of the liquid flow path portion 30 in the vapor chamber 1, it may be 10% to 40% to the entire volume of the sealed space 3.

After the injection of the working fluid 2, the above-described injection flow path is sealed. For example, the injection portion 4 is irradiated with a laser beam to seal the injection flow path by partially melting the injection portion 4. Thereby, communication between the sealed space 3 and the outside is blocked, and the working fluid 2 is enclosed in the sealed space 3. This prevents leaking of the working fluid 2 in the sealed space 3 to the outside. Additionally, for sealing, swaging (plastic-deforming by pressurizing) or brazing of the injection portion 4 may be executed.

As described above, the vapor chamber 1 according to this embodiment can be obtained.

Next, an operation method of the vapor chamber 1, that is, a cooling method of the device D will be explained.

The vapor chamber 1 thus obtained is installed in the housing H of the mobile terminal etc., and the device D such as the CPU which is an object of cooling is attached to the lower surface 10*b* of the lower metallic sheet 10. Since the amount of the working fluid 2 poured into the sealed space 3 is small, the working fluid 2 in liquid form in the sealed space 3 attaches to a wall surface of the sealed space 3, that is, a wall surface of the lower vapor flow path recess 12, a wall surface of the upper vapor flow path recess 21 and a wall surface of the liquid flow path portion 30 by surface tension thereof.

When the device D generates heat in this state, the working fluid 2 existing at the evaporating portion 11 in the lower vapor flow path recess 12 receives the heat from the device D. The received heat is absorbed as latent heat and the working fluid 2 evaporates (vaporization) to generate the vapor of the working fluid 2. Most of the generated vapor diffuses in the lower vapor flow path recess 12 and the upper vapor flow path recess 21 constituting the sealed space 3 (see solid arrows of FIG. 4). The vapor in the upper vapor flow path recess 21 and the lower vapor flow path recess 12 is separated from the evaporating portion 11, and most of the vapor is transported to a peripheral portion of the vapor chamber 1 with a relatively low temperature. The diffused vapor is subjected to heat dissipation to the lower metallic sheet 10 and the upper metallic sheet 20 to be cooled. The heat received by the lower metallic sheet 10 and the upper metallic sheet 20 from the vapor is transferred to the outside via the housing member Ha (see FIG. 3).

Since the vapor is subjected to heat dissipation to the lower metallic sheet 10 and the upper metallic sheet 20, the vapor loses the latent heat absorbed in the evaporating portion 11 and is condensed. The working fluid 2 in a liquid form by condensation is attached to the wall surfaces of the lower vapor flow path recess 12 or the wall surfaces of the upper vapor flow path recess 21. Here, since the working fluid 2 continues to be evaporated at the evaporating portion 11, the working fluid 2 at portions other than the evaporating portion 11 in the liquid flow path portion 30 is transported toward the evaporating portion 11 (see dashed arrows in FIG. 4). As a result, the working fluid 2 in liquid form attached to the wall surfaces of the lower vapor flow path recess 12 and the wall surfaces of the upper vapor flow path recess 21 moves toward the liquid flow path portion 30 and enters the liquid flow path portion 30. In other words, the working fluid 2 enters the first main flow groove 31. Here, as described above, in a case where the width w3 of the communicating grooves 51 is larger than the width w1 of the main flow grooves 31, the flow path resistance of the working fluid 2 in each communicating groove 51 is reduced. Consequently, the working fluid 2 in liquid form attached to the wall surfaces of each of the vapor flow path recesses 12, 21 passes through each of the communicating grooves 51 to smoothly enter each of the main flow grooves 31. In addition, each of the main flow grooves 31 and each of the communicating grooves 51 are filled with the working fluid 2 in liquid form. Consequently, due to capillary action of each of the main flow grooves 31, the working fluid 2 which is filled obtains thrust toward the evaporating portion 11, and is smoothly transported to the evaporating portion 11.

At the liquid flow path portion 30, in the main flow grooves 31, one communicates with another which is adjacent thereto via the corresponding communicating grooves 51. Thereby, the working fluid 2 in liquid form reciprocates between the main flow grooves 31 adjacent to each other, which inhibits occurrence of dryout in the main flow grooves 31. Accordingly, capillary action is applied to the working fluid 2 in each of the main flow grooves 31, so that the working fluid 2 is smoothly transported toward the evaporating portion 11.

The working fluid 2 which has reached the evaporating portion 11 receives heat again from the device D to evaporate. In this way, the working fluid 2 circulates in the vapor chamber 1 while executing a change of phase, that is, repeating evaporation and condensation to transfer heat of the device D for releasing. As a result, the device D is cooled.

Incidentally, a part of the working fluid 2 toward the evaporating portion 11 is drawn into the buffer region Q constituted by the intersections P to be stored.

Here, when dryout occurs in the main flow groove main bodies 31a, the working fluid 2 stored in the buffer region Q moves toward an occurrence portion of the dryout. More specifically, when the dryout occurs at the main flow groove main body 31a, the working fluid 2 moves to an occurrence portion of the dryout by capillary action of the main flow groove main body 31a from the buffer region Q which is closest to the occurrence portion of the dryout. Thereby, the occurrence portion of the dryout is filled with the working fluid 2 to eliminate the dryout.

Also, in the main flow groove main bodies 31a, when air bubbles are generated in the working fluid 2 in liquid form due to its vapor, the air bubbles are drawn into the buffer region Q at a downstream side (on a side of the evaporating portion 11) to be retained. Since the depth of the buffer regions Q is deeper than the depth h1 of the main flow groove main bodies 31a, the air bubbles drawn into the buffer region Q are inhibited from moving from the buffer region Q to the main flow groove main bodies 31a. Consequently, the air bubbles generated in the main flow groove main bodies 31a can be captured by the buffer region Q, which inhibits the flow of the working fluid 2 to the evaporating portion 11 from being blocked due to the air bubbles.

In this way, according to this embodiment, the width w3 of the communicating grooves 51 is larger than the width w1 of the main flow grooves 31. This reduces the flow path resistance of the working fluid 2 in each of the communicating grooves 51. As a result, the working fluid 2 in liquid form condensed from the vapor is allowed to smoothly enter each of the main flow grooves 31. In other words, the working fluid 2 can smoothly enter not only the main flow grooves 31 at a closer side to the vapor flow path recesses 12, 21, but also the main flow grooves 31 at a farther side from the vapor flow path recesses 12, 21, which improves the transport function of the working fluid 2 condensed in liquid form. As a result, the transport function of the working fluid 2 in liquid form can be improved, and thermal transport efficiency can be improved.

Also, according to this embodiment, the depth h3 of the communicating grooves 51 is deeper than the depth h1 of the main flow grooves 31. Thereby, the buffer region Q which stores the working fluid 2 can be formed at each of the communicating grooves 51. Consequently, when the dryout occurs at the main flow grooves 31, the working fluid 2 stored in the buffer region Q can be moved to the occurrence portion of the dryout. This eliminates the dryout, which recovers the transport function of the working fluid 2 in each of the main flow grooves 31. Also, when air bubbles are generated in the main flow grooves 31, the air bubbles can be drawn into the buffer region Q to be captured. Also from this point, the transport function of the working fluid 2 in each of the main flow grooves 31 can be recovered.

Also, according to this embodiment, the depth h1' of the intersections P of the main flow grooves 31 is deeper than the depth h1 of the main flow groove main bodies 31a. Thereby, the buffer region Q can extend to the intersections P. Consequently, the storage volume of the working fluid 2 in the buffer region Q can be increased, and the dryout can be eliminated more easily.

According to this embodiment, a rounded curved portion 45 is provided at a corner portion of each of the liquid flow path convex portions 41a. Thereby, the corner portion of each of the liquid flow path convex portions 41a can be formed to be smoothly curved, which eliminates the flow path resistance of the working fluid 2 in liquid form.

Also, according to this embodiment, the depth h1' of the intersection P of the main flow grooves 31 is deeper than the depth h3 of the communicating grooves 51. Thereby, in the buffer region Q, the depth of the buffer region Q can be made deeper on a side close to the occurrence portion of the dryout. Consequently, the working fluid 2 stored can be smoothly moved to the occurrence portion of the dryout, which eliminates the dryout more easily.

In this embodiment described above, the example where the second direction in which the communicating grooves 51 are aligned is the direction Y orthogonal to the first direction X, has been explained. However, not limited to this, the second direction Y, in which the communicating grooves 51 are aligned, is not necessarily orthogonal to the first direction X, as long as the direction intersect with the first direction X.

In this embodiment described above, the example where the liquid flow path convex portions 41a are disposed to form rectangles and a lattice shape over the entire liquid flow path portion 30, has been explained. However, not limited to this, in a partial region of each liquid flow path portion 30, the liquid flow path convex portions 41a may be disposed to have a shape as shown in FIG. 16.

Figure 16:
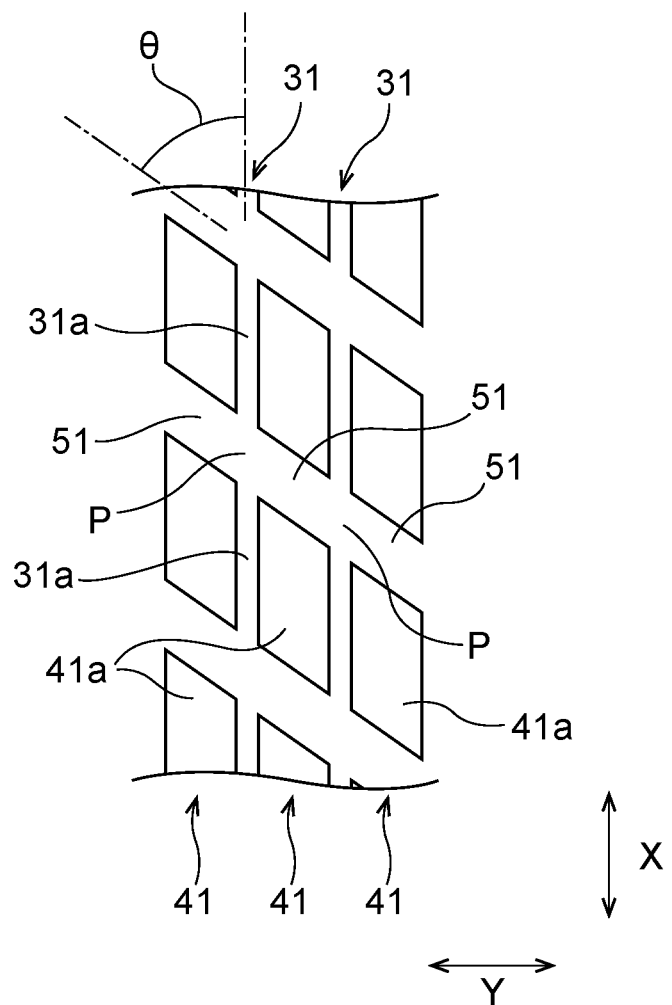
FIG. 16 is a top view showing a modification of a liquid flow path convex portion shown in FIG. 6.
Figure 17:
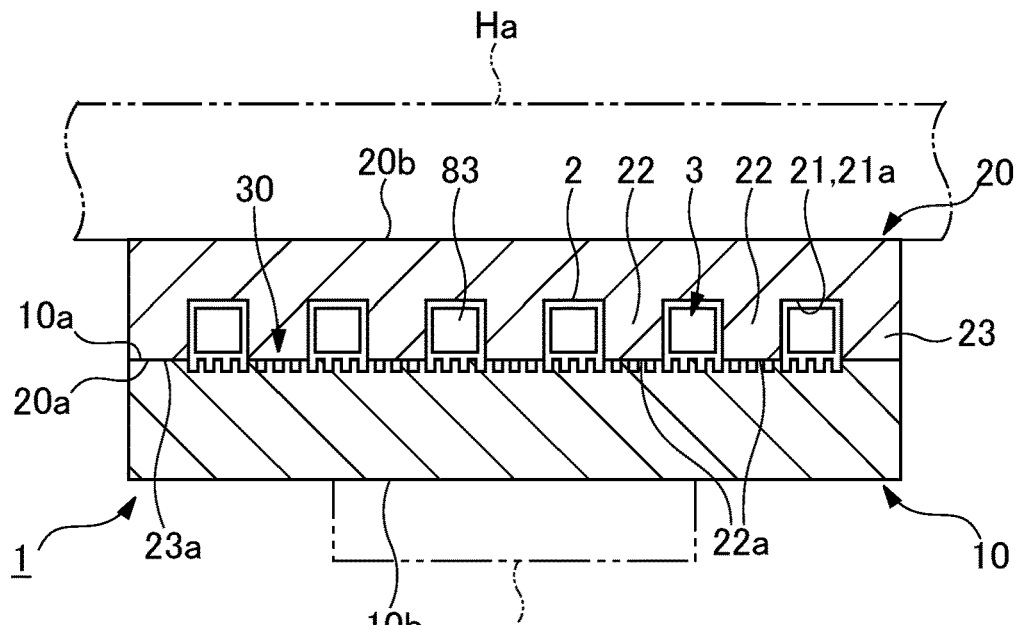
FIG. 17 is a drawing showing another modification of FIG. 3.

For example, as shown in FIG. 16, a direction of alignment of the communicating grooves 51 may be inclined with respect to the first direction X and the second direction Y. In this case, an inclining angle θ of the communicating grooves 51 from the first direction X is arbitrary. In an example shown in FIG. 16, a planar shape of each of the liquid flow path convex portions 41a is a parallelogram. When such a shape is applied to the vapor chamber 1 which is rectangular, four outer edges 1x, 1y (see FIG. 2) constituting the planar outline of the vapor chamber 1 do not intersect at a right angle with the communicating grooves 51. In such a case, deformation by bending along a line extending in the second direction Y can be prevented, which can prevent each of the grooves 31, 51 of the liquid flow path portion 30 from being crushed. Additionally, a rounded curved portion 45 may be formed also at the corner portion of each liquid flow path convex portion 41a shown in FIG. 16, similar to each liquid flow path convex portion 41a shown in FIG. 6.

Also, in this embodiment described above, an example in which the upper flow path wall portions 22 of the upper metallic sheet 20 extend to be elongated along the first direction X of the vapor chamber 1 has been explained. However, not limited to this, the shape of the upper flow path wall portions 22 is arbitrary. For example, the upper flow path wall portions 22 may be formed as a cylindrical boss. Also in this case, each upper flow path wall portion 22 is arranged to be overlapped with the corresponding lower flow path wall portion 13 in a planar view, and the lower surface 22a of each upper flow path wall portion 22 is allowed to abut the upper surface 13a of each lower flow path wall portion 13.

Also, in this embodiment described above, an example in which the upper metallic sheet 20 has the upper vapor flow path recess 21 has been explained. However, not limited to this, the upper metallic sheet 20 may be formed to be planar as a whole, and does not necessarily have the upper vapor flow path recess 21. In such a case, the lower surface 20a of the upper metallic sheet 20 abuts the upper surface 13a of each lower flow path wall portion 13 as the second abutting surface, which improves mechanical strength of the vapor chamber 1. This can negate the need of an etching process to the lower surface 20a of the upper metallic sheet 20.

In this embodiment described above, an example in which the lower metallic sheet 10 has the lower vapor flow path recess 12 and the liquid flow path portion 30 has been explained. However, not limited to this, if the upper metallic sheet 20 has the upper vapor flow path recess 21, it is acceptable that the lower metallic sheet 10 does not have the lower vapor flow path recess 12, and the liquid flow path portion 30 may be provided in the upper surface 10a of the lower metallic sheet 10. In such a case, as show in FIG. 17, a region formed with the liquid flow path portion 30 of the upper surface 10a may be provided in, in addition to a region facing each upper flow path wall portion 22, a region excluding each upper flow path wall portion 22 in a region facing the upper vapor flow path recess 21. In such a case, the number of main flow grooves 31 constituting the liquid flow path portion 30 can be increased, which can improve the transport function of the working fluid 2 in liquid form. However, the region formed with the liquid flow path portion 30 is not limited to a form shown in FIG. 17, and is arbitrary as long as the transport function of the working fluid 2 in liquid form can be secured. Also, in the form shown in FIG. 17, the lower surface 22a (an abutting surface) of each upper flow path wall portion 22 of the upper metallic sheet 20 is formed at a partial region of the lower surface 20a of the upper metallic sheet 20 to secure a vapor flow path, and the lower surface 22a of each upper flow path wall portion 22 abuts a part of the region which is of the upper surface 10a of the lower metallic sheet 10 and is formed with the liquid flow path portion 30.

Also, in this embodiment described above, an example in which the vapor chamber 1 is manufactured mainly by etching, has been explained. However, not limited to this, this chamber may be manufactured by a 3D printer. For example, the entire vapor chamber 1 may be integrally manufactured by a 3D printer at one time. Alternatively, the metallic sheets 10, 20 may be separately manufactured by a 3D printer and then be joined to each other.

Second Embodiment

Next, a vapor chamber, an electronic device, a metallic sheet for the vapor chamber and a manufacturing method of the vapor chamber according to a second embodiment of the present invention will be explained using FIGS. 18 and 19.

Figure 18:
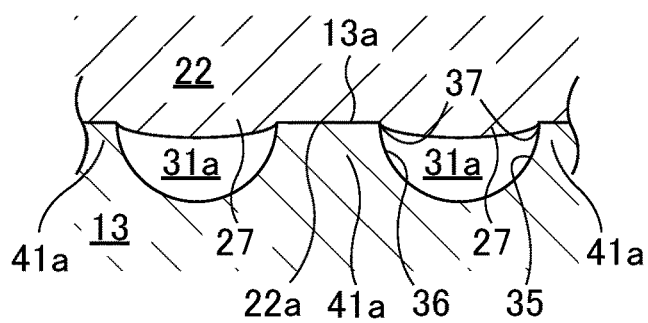
FIG. 18 is an enlarged cross-sectional view showing main flow groove convex portions in a vapor chamber according to a second embodiment, corresponding to FIG. 7.
Figure 19:
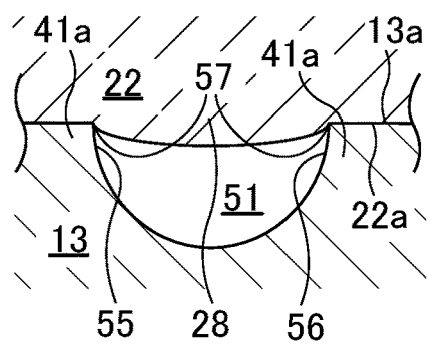
FIG. 19 is an enlarged cross-sectional view showing a communicating groove convex portion in the vapor chamber according to the second embodiment, corresponding to FIG. 8.

In the second embodiment shown in FIGS. 18 and 19, a main difference is that a main flow groove convex portion protrudes in the main flow groove, and a communicating groove convex portion protrudes in the communicating groove. The other configurations are substantially the same as in the first embodiment shown in FIGS. 1 to 17. Additionally, in FIGS. 18 to 19, the same components as those in the first embodiment shown in FIGS. 1 to 17 are assigned the same reference numerals, and a detailed explanation thereof is omitted.

As shown in FIG. 18, in this embodiment, the upper metallic sheet 20 includes a plurality of main flow groove convex portions 27 provided in the lower surface 20a. Each of the main flow groove convex portions 27 protrudes from the lower surface 20a to the corresponding one of the main flow grooves 31 of the lower metallic sheet 10. A lower end of each main flow groove convex portion 27 is separated from a bottom portion of the main flow groove 31, so that the flow path of the working fluid 2 is secured. Also, each main flow groove convex portion 27 is formed to extend in the first direction X along the corresponding one of the main flow grooves 31.

A cross section of each main flow groove convex portion 27 is formed to be curved. Also, as shown in FIG. 18, a lateral edge of each main flow groove convex portion 27 contacts or is close to the side walls 35, 36 of the main flow grooves 31. Thereby, the corner portions 37 formed by the side walls 35, 36 of the main flow grooves 31 and the lower surface 22a of each upper flow path wall portion 22 are formed to be wedge-shaped (or like an acute angle). In this way, a cross section of a flow path defined by the main flow grooves 31 and the main flow groove convex portions 27 (a cross section of a flow path in the second direction Y) is formed in a crescent shape as shown in FIG. 18.

Also, as shown in FIG. 19, in this embodiment, the upper metallic sheet 20 includes a plurality of communicating groove convex portions 28 provided in the lower surface 20a. Each of the communicating groove convex portion 28 protrudes to the corresponding one of the communicating grooves 51 of the lower metallic sheet 10 from the lower surface 20a. A lower end of each communicating groove convex portion 28 is separated from a bottom portion of the communicating groove 51, so that the flow path of the working fluid 2 is secured. Also, each communicating groove convex portion 28 is formed to extend in the second direction Y along the corresponding one of the communicating grooves 51. At the intersection P of the main flow groove 31, the above-described main flow groove convex portion 27 and communicating groove convex portion 28 intersect in a cross shape.

A cross section of each communicating groove convex portion 28 is formed to be curved in the same manner as each main flow groove convex portion 27. Also, as shown in FIG. 19, a lateral edge of each communicating groove convex portion 28 contacts or is close to the pair of side walls 55, 56 extending in the second direction Y of the communicating grooves 51. Thereby, the corner portions 57 formed by the side walls 55, 56 of the communicating grooves 51 and the lower surface 22a of each upper flow path wall portion 22 is formed to be wedge-shaped (or like an acute angle). In this way, a cross section of a flow path defined by the communicating grooves 51 and the communicating groove convex portions 28 (a cross section of a flow path in the first direction X) is formed in a crescent shape as shown in FIG. 19. The side walls 55, 56 correspond to the above-described linear portion 46 of the liquid flow path convex portions 41a described above.

The main flow groove convex portions 27 and the communicating groove convex portions 28 are formed, for example, by half-etching of the upper metallic sheet 20 to form the upper flow path wall portions 22 etc., and then press working of the upper metallic sheet 20 alone. Alternatively, in the permanent joint step as shown in FIG. 14, a welding pressure to be applied to the lower metallic sheet 10 and the upper metallic sheet 20 is increased to form the main flow groove convex portions 27 and the communicating groove convex portions 28. In other words, by increasing the welding pressure, a part of each upper flow path wall portion 22 of the upper metallic sheet 20 can be inserted into the main flow grooves 31 and the communicating grooves 51. As a result, the main flow groove convex portions 27 and the communicating groove convex portions 28, having a curved cross section, can be formed.

In this way, according to this embodiment, each main flow groove convex portion 27 protrudes to the corresponding one of the main flow grooves 31 of the lower metallic sheet 10 from the lower surface 20a of the upper metallic sheet 20. Thereby, the corner portions 37 formed by the side walls 35, 36 of the main flow grooves 31 and the lower surface 22a of each upper flow path wall portion 22 can be formed as a minute space defined by the side walls 35, 36 of the main flow grooves 31 and the main flow groove convex portions 27. This can improve capillary action at the corner portions 37. As a result, the transport function of the working fluid 2 in liquid form in each of the main flow grooves 31 can be improved, so that thermal transport efficiency can be improved. In particular, even when the intersections P of the main flow grooves 31 are configured as the buffer region Q as shown in FIG. 6, a high thrust toward the evaporating portion 11 can be applied to the working fluid 2 at the main flow groove main bodies 31a due to capillary action by the main flow groove convex portions 27, which improves the transport function of the working fluid 2 effectively.

Also, according to this embodiment, a cross section of the main flow groove convex portion 27 is formed to be curved. Thereby, the corner portions 37 can have a shape like an end portion of the crescent shape. Consequently, capillary action at the corner portions 37 can be further improved.

Also, according to this embodiment, each communicating groove convex portion 28 protrudes to the corresponding one of the communicating grooves 51 of the lower metallic sheet 10 from the lower surface 20a of the upper metallic sheet 20. Thereby, the corner portions 57 formed by the side walls 55, 56 of the communicating grooves 51 and the lower surface 22a of each upper flow path wall portion 22 can be formed as a minute space defined by the side walls 55, 56 of the communicating grooves 51 and the communicating groove convex portions 28. This can improve capillary action at the corner portions 57.

Here, the working fluid 2 in liquid form condensed from the vapor passes through the communicating grooves 51 to enter the main flow grooves 31 as described above. Consequently, since capillary action of the communicating grooves 51 is improved, the working fluid 2 condensed in liquid form is allowed to smoothly enter the main flow grooves 31. That is, due to capillary action of the communicating grooves 51, the working fluid 2 condensed in liquid form can smoothly enter not only the main flow groove 31 nearer to the vapor flow path recesses 12, 21, but also the main flow grooves 31 more apart from the vapor flow path recesses 12, 21, which improves the transport function of the working fluid 2 condensed in liquid form. Also, in a case where the width w3 of the communicating grooves 51 is larger than the width w1 of the main flow grooves 31, the flow path resistance of the working fluid 2 in the communicating grooves 51 can be reduced, and also in this point, the working fluid 2 condensed in liquid form is allowed to smoothly enter each of the main flow grooves 31. Moreover, the working fluid 2 entering each of the main flow grooves 31 can be smoothly transported to the evaporating portion 11 due to capillary action of the main flow grooves 31. As a result, as the entire liquid flow path portion 30, the transport function of the working fluid 2 in liquid form can be improved. Also, as described above, since capillary action of the communicating grooves 51 is improved, when the dryout occurs, the working fluid 2 can reciprocate among the main flow grooves 31 due to the capillary action of the communicating grooves 51, so that the dryout can be eliminated.

Also, according to this embodiment, a cross section of the communicating groove convex portion 28 is formed to be curved. Thereby, the corner portions 57 can have a shape like an end portion of the crescent shape. Consequently, capillary action at the corner portions 57 can be further improved.

Additionally, in this embodiment described above, an example in which the cross section of the main flow grooves 31 and the cross section of the communicating grooves 51 are formed to be curved has been explained. However, not limited to this, the cross section of the main flow grooves 31 and the cross section of the communicating grooves 51 may be formed to be rectangular, although not shown. Also in this case, capillary action in the corner portions 37, 57 can be improved, so that the transport function of the working fluid 2 in liquid form in the main flow grooves 31 and the communicating grooves 51 can be improved. To make the cross section rectangular, the main flow grooves 31 and the communicating grooves 51 are preferably formed by press working or cutting work.

In this embodiment described above, an example in which the width w3 of the communicating grooves 51 is larger than the width w1 of the main flow grooves 31 has been explained. However, not limited to this, the width w3 of each communicating groove 51 is not necessarily larger than the width w1 of each main flow groove 31. In other words, an effect of improving the transport function of the working fluid 2 in liquid form in the main flow grooves 31 with improvement of capillary action of the main flow grooves 31 by the main flow groove convex portions 27 can be exerted regardless of the magnitude relationship between the width w3 of the communicating grooves 51 and the width w1 of the main flow grooves 31. In the same manner, an effect of improving the transport function of the working fluid 2 condensed in liquid form with improvement of capillary action of the communicating grooves 51 by the communicating groove convex portions 28 can be exerted regardless of the magnitude relationship between the width w3 of the communicating grooves 51 and the width w1 of the main flow grooves 31.

Third Embodiment

Next, a vapor chamber, an electronic device, a metallic sheet for the vapor chamber and a manufacturing method of the vapor chamber according to a third embodiment of the present invention will be explained using FIGS. 20 to 25.

In the third embodiment shown in FIGS. 20 to 25, a main difference is that an intermediate metallic sheet is interposed between a lower metallic sheet and an upper metallic sheet, a vapor flow path portion is provided in a surface of the upper metallic sheet on a side of the intermediate metallic sheet, a liquid flow path portion is provided on the lower metallic sheet on a side of the intermediate metallic sheet, and the intermediate metallic sheet is provided with communicating portions that allow the vapor flow path portion and the liquid flow path portion to communicate. The other configurations are substantially the same as in the first embodiment shown in FIGS. 1 to 17. Additionally, in FIGS. 20 to 25, the same components as those in the first embodiment shown in FIGS. 1 to 17 are assigned the same reference numerals, and a detailed explanation thereof is omitted.

Figure 20:
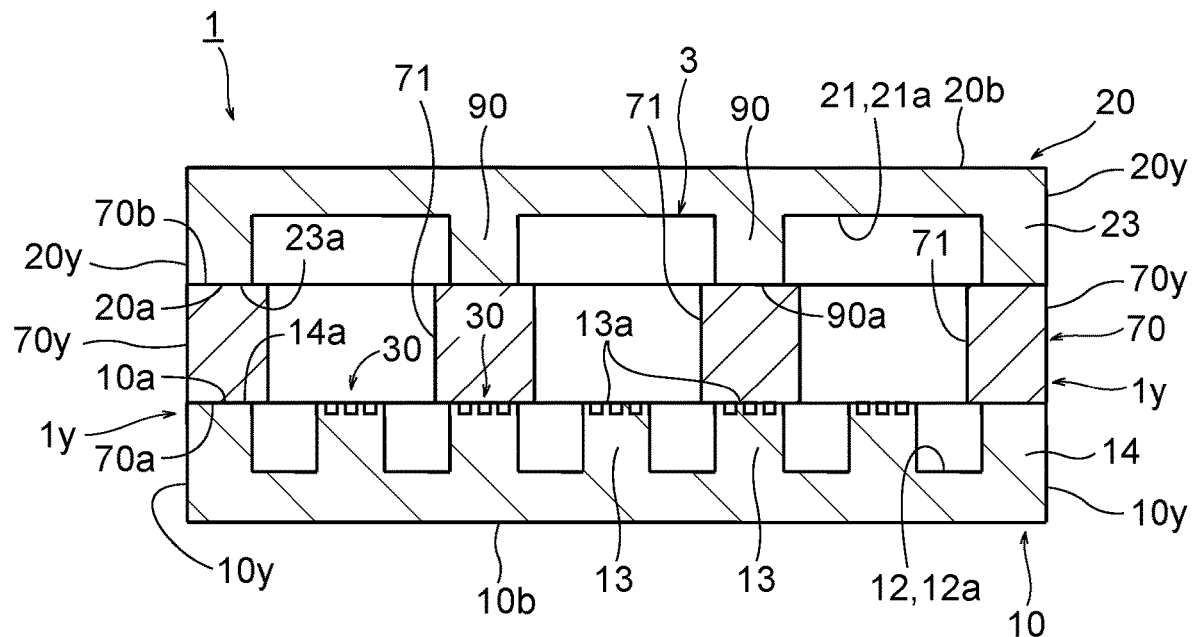
FIG. 20 is a cross-sectional view showing a vapor chamber according to a third embodiment.

As shown in FIG. 20, in this embodiment, the intermediate metallic sheet 70 (third metallic sheet) is interposed between the lower metallic sheet 10 (first metallic sheet) and the upper metallic sheet 20 (second metallic sheet). In other words, in the vapor chamber 1 according to this embodiment, the lower metallic sheet 10, the intermediate metallic sheet 70, and the upper metallic sheet 20 are laminated in this order. The intermediate metallic sheet 70 is provided on the lower metallic sheet 10, and the upper metallic sheet 20 is provided on the intermediate metallic sheet 70. Additionally, in FIG. 20, for clarity of the figure, illustration of the working fluid 2 is omitted. The same is applied also to FIGS. 26, 28 and 31 which will be described later. Additionally, linear regions 70R and outer edges 70x, 70y shown in FIGS. 20 to 25 will be explained in a sixth embodiment which will be described later.

The intermediate metallic sheet 70 includes: a lower surface 70a (first surface) provided on a side of the lower metallic sheet 10; and an upper surface 70b (second surface) which is provided on a side opposite to the lower surface 70a and is provided on a side of the upper metallic sheet 20. Among these components, the lower surface 70a is layered on the upper surface 10a of lower metallic sheet 10, and the upper surface 70b is layered on the lower surface 20a of the upper metallic sheet 20. The lower metallic sheet 10 and the intermediate metallic sheet 70 are joined by diffused junction. The intermediate metallic sheet 70 and the upper metallic sheet 20 are joined by diffused junction. The intermediate metallic sheet 70 can be formed of a material similar to that of the lower metallic sheet 10 and the upper metallic sheet 20. The thickness of the intermediate metallic sheet 70 may be, for example, 10 μm to 300 μm.

The sealed space 3 is formed between the lower metallic sheet 10 and the upper metallic sheet 20. A part of the sealed space 3 is formed also in the intermediate metallic sheet 70. In this embodiment, the sealed space 3 includes a vapor flow path portion 80 through which a vapor of the working fluid 2 mainly passes, and a liquid flow path portion 30 through which the working fluid 2 in liquid form mainly passes. The vapor flow path portion 80 and the liquid flow path portion 30 communicate with each other so as to circulate the working fluid 2. The vapor flow path portion 80 includes the lower vapor flow path recess 12 (first vapor flow path portion) and the upper vapor flow path recess 21 (second vapor flow path portion).

The lower metallic sheet 10, which includes the lower vapor flow path recess 12 and the liquid flow path portion 30, may have a configuration similar to that of the lower metallic sheet 10 in the first embodiment shown in FIGS. 1 to 17. Accordingly, a detailed explanation thereof is omitted here.

In this embodiment, the upper metallic sheet 20 is provided with no liquid flow path portion 30. The upper metallic sheet 20 includes an upper vapor flow path recess 21 (a second vapor flow path portion) provided in the lower surface 20a. In the upper vapor flow path recess 21, a plurality of upper flow path protruding portions 90 (second flow path protruding portions) protruding downward (a direction perpendicular to the bottom surface 21a) from the bottom surface 21a of the upper vapor flow path recess 21 are provided. The upper flow path protruding portions 90 are portions which are not etched in the half etching step and in which the material of the upper metallic sheet 20 remains.

As shown in FIG. 20, each upper flow path protruding portion 90 has a lower surface 90a disposed on the same plane as that of the lower surface 20a of the upper metallic sheet 20. The lower surface 90a abuts the upper surface 70b of the intermediate metallic sheet 70. This improves the mechanical strength of the vapor chamber 1 when the sealed space 3 is depressurized.

Figure 21:
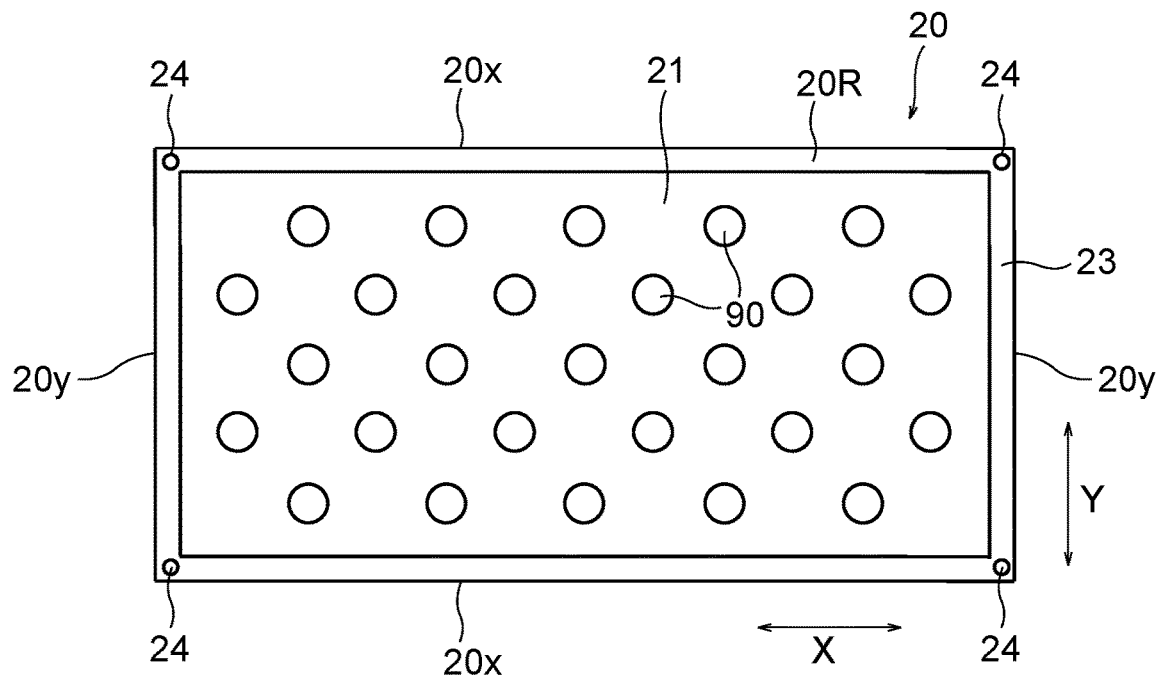
FIG. 21 is a bottom view of an upper metallic sheet of FIG. 20.

As shown in FIG. 21, in this embodiment, the upper flow path protruding portions 90 have a staggered arrangement in a planar view. Thereby, these portions are configured to allow the vapor of the working fluid 2 to flow around the upper flow path protruding portions 90, thereby inhibiting the vapor flow from being blocked. The planar shape of the lower surface of each upper flow path protruding portion 90 is circular. Also from this point, the flow of the vapor of the working fluid 2 is inhibited from being blocked. Additionally, the planar shape of each upper flow path protruding portion 90 is not limited to a circular shape as long as the flow of the vapor of the working fluid 2 can be inhibited from being blocked.

Figure 22:
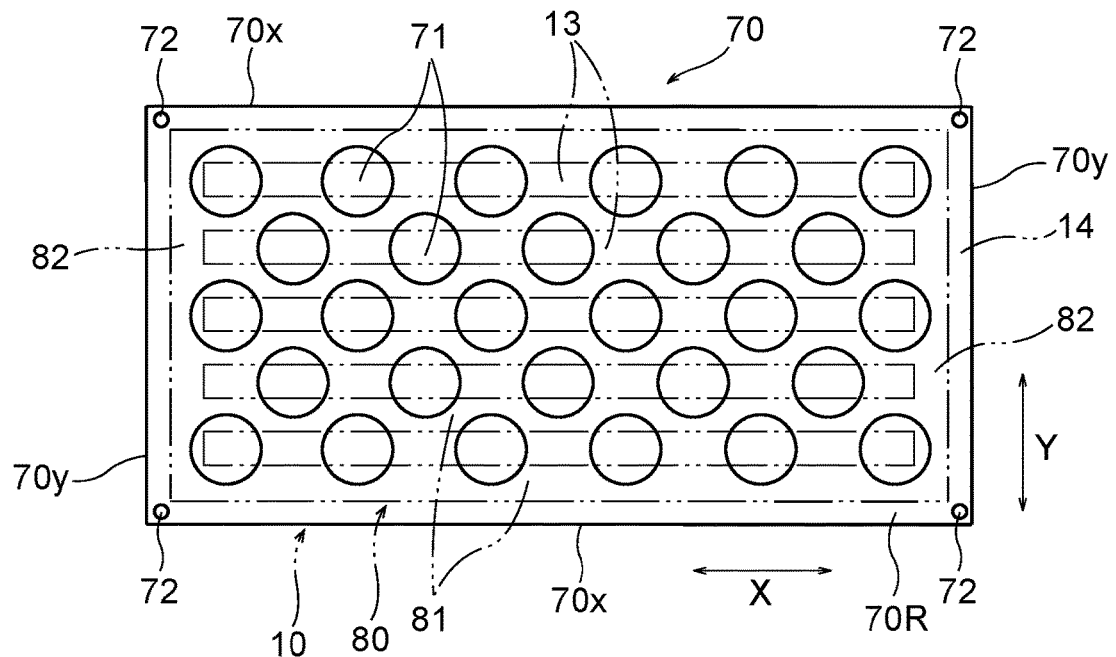
FIG. 22 is a top view of an intermediate metallic sheet of FIG. 20.

As shown in FIG. 22, the intermediate metallic sheet 70 is provided with communicating holes 71 (communicating portions) allowing communication between the upper vapor flow path recesses 21 and the liquid flow path portion 30. The communicating holes 71 penetrate the intermediate metallic sheet 70, and constitutes a part of the sealed space 3 described above. Each communicating hole 71 is disposed between the upper flow path protruding portions 90 adjacent to each other. The communicating holes 71 have the staggered arrangement in a planar view.

As shown in FIG. 20, the communicating holes 71 extend from the upper surface 70b to the lower surface 70a of the intermediate metallic sheet 70. Thereby, such a configuration is made that in the upper vapor flow path recess 21, the working fluid 2 in liquid form generated from the vapor of the working fluid 2 by condensation enters the main flow grooves 31 of the liquid flow path portion 30 through the communicating holes 71. On the other hand, the vapor of the working fluid 2 evaporated at the evaporating portion 11 can not only be diffused at the lower vapor flow path recess 12 but also be diffused to the upper vapor flow path recess 21 through the communicating holes 71.

The communicating holes 71 may be formed by etched from the upper surface 70b of the intermediate metallic sheet 70. In this case, the communicating holes 71 may be curved to have a shape convex toward the lower surface 70a. Alternatively, the communicating holes 71 may be etched from the lower surface 70a of the intermediate metallic sheet 70. In this case, the communicating holes 71 may be curved to have a shape convex toward the upper surface 70*b*. Further alternatively, the communicating holes 71 may be formed by half etching from the lower surface 70*a* and half etching from the upper surface 70*b*. In this case, portions of the communicating holes 71 nearer to the upper surface 70*b* and those nearer to the lower surface 70*a* may have different shapes or sizes. In this embodiment, as shown in FIG. 22, an example in which the planar shape of each communicating hole 71 is circular is illustrated. In a case where the diameter ϕ of each communicating hole 71 is the minimum diameter in a range from the upper surface 70*b* to the lower surface 70*a*, the diameter ϕ of each communicating hole 71 may be, for example, 50 μm to 2000 μm. Additionally, the planar shape of each communicating hole 71 is not limited to the circular shape.

As shown in FIG. 22, in this embodiment, each communicating hole 71 overlaps with a part of one lower vapor passage 81 between each pair of lower vapor passages 81 adjacent to each other in a planar view and a part of the other lower vapor passage 81. Thereby, each pair of lower vapor passages 81 adjacent to each other communicate with each other via the corresponding communicating holes 71. This can increase the flow path sectional area of each communicating hole 71, and smoothly diffuse the vapor of the working fluid 2 to the upper vapor flow path recess 21. Additionally, each communicating hole 71 may overlap with a part of each of three or more corresponding lower vapor passages 81, and allow these lower vapor passages 81 to communicate with each other.

As shown in FIG. 22, the intermediate metallic sheet 70 is provided with intermediate alignment holes 72 for positioning each of the metallic sheets 10, 20, 70. In other words, each intermediate alignment hole 72 is disposed to be overlapped with each of the above-described corresponding lower alignment hole 15 and upper alignment hole 24 at the time of temporary joint, which allows positioning among the metallic sheets 10, 20, 70.

Additionally, in this embodiment, the injection portion 4 may be formed similarly to the injection portion 4 in the first embodiment shown in FIGS. 1 to 17. In this case, the intermediate metallic sheet 70 may be provided with an injection protruding portion (not shown), and the injection protruding portion may be provided with an injection flow path. Alternatively, the lower metallic sheet 10 or the upper metallic sheet 20 may be provided with an injection hole, and the working fluid 2 may be injected through the injection hole.

In the vapor chamber 1 according to this embodiment, the lower vapor flow path recess 12 and the liquid flow path portion 30 of the lower metallic sheet 10, and the upper vapor flow path recess 21 of the upper metallic sheet 20 can be formed similarly to those in the first embodiment shown in FIGS. 1 to 17. Also, the communicating holes 71 of the intermediate metallic sheet 70 can be formed by etching. Subsequently, the lower metallic sheet 10 and the upper metallic sheet 20 are joined, with the intermediate metallic sheet 70 being intervening therebetween. In other words, the lower metallic sheet 10 and the intermediate metallic sheet 70 are subjected to diffused junction, while the upper metallic sheet 20 and the intermediate metallic sheet 70 are subjected to diffused junction. Thereby, the sealed space 3 is formed. The lower metallic sheet 10, the intermediate metallic sheet 70 and the upper metallic sheet 20 may be integrally subjected to diffused junction at one time.

As described above, according to this embodiment, the intermediate metallic sheet 70 is interposed between the lower metallic sheet 10 and the upper metallic sheet 20, the lower surface 20*a* of the upper metallic sheet 20 is provided with the upper vapor flow path recess 21, and the upper surface 10*a* of the lower metallic sheet 10 is provided with the liquid flow path portion 30. The intermediate metallic sheet 70 is provided with communicating holes 71 allowing communication between the upper vapor flow path recesses 21 and the liquid flow path portion 30. Thereby, even in a case where three metallic sheets 10, 20, 70 constitute the vapor chamber 1, the heat of the device D can be transferred and released by circulating the working fluid 2 in the sealed space 3, with the change of phase being repeated in the vapor chamber 1. Since the upper vapor flow path recess 21 of the upper metallic sheet 20 widely communicates, which can smoothly diffuse the vapor of the working fluid 2, and improve the thermal transport efficiency.

According to this embodiment, the liquid flow path portions 30 similar to those in the first embodiment shown in FIGS. 1 to 17 are provided on the upper surface 10*a* of the lower metallic sheet 10. Thereby, the transport function of the working fluid 2 in liquid form can be improved, and thermal transport efficiency can be improved.

Additionally, the example shown in FIG. 20 illustrates an example in which the cross sectional shape of the lower vapor flow path recess 12 and the cross sectional shape of the upper vapor flow path recess 21 are formed to be rectangular. However, not limited to this, the cross sectional shape of the vapor flow path recess 12, 21 may be formed to be curved. The same is applied to the main flow grooves 31 and the communicating grooves 51 of the liquid flow path portion 30.

In this embodiment described above, an example in which one intermediate metallic sheet 70 is interposed between the lower metallic sheet 10 and the upper metallic sheet 20 has been described. However, not limited to this, two or more intermediate metallic sheets 70 may be interposed between the lower metallic sheet 10 and the upper metallic sheet 20.

Figure 23:
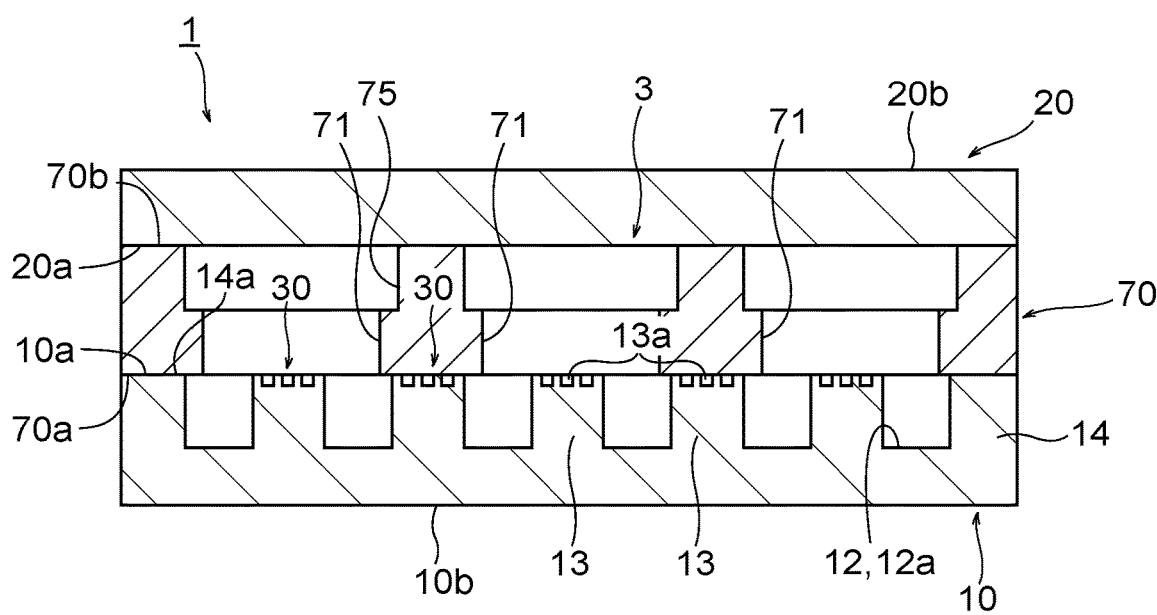
FIG. 23 is a cross-sectional view showing a modification of the vapor chamber of FIG. 20.
Figure 24:
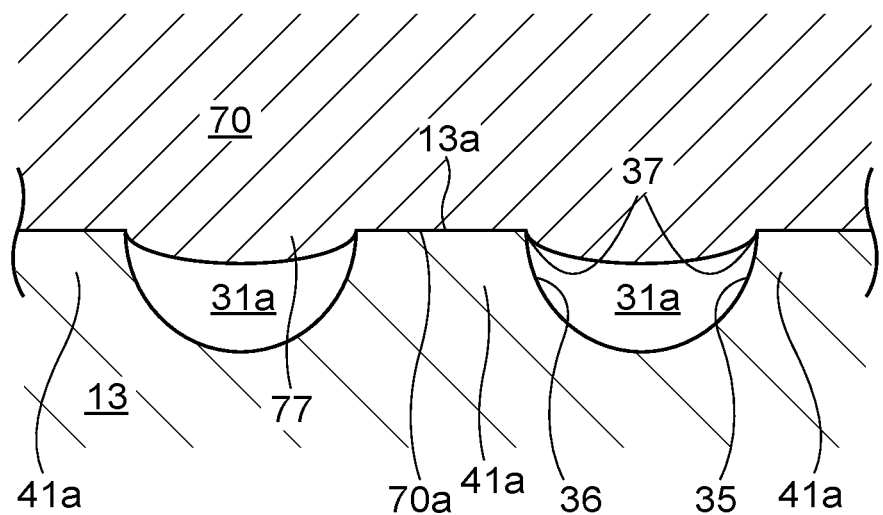
FIG. 24 is an enlarged cross-sectional view showing main flow groove convex portions in the modification of the vapor chamber shown in FIG. 20.

Also, in this embodiment described above, an example in which the upper metallic sheet 20 has the upper vapor flow path recess 21 has been explained. However, not limited to this, as shown in FIG. 23, intermediate vapor flow path recesses 75 (second vapor flow path portions) may be provided on the upper surface 70*b* of the intermediate metallic sheet 70. The intermediate vapor flow path recess 75 may have, for example, a shape obtained by vertically inverting the upper vapor flow path recess 21. In other words, intermediate flow path wall portions 76 similar to the upper flow path wall portions 22 may be provided in the intermediate vapor flow path recesses 75. The intermediate vapor flow path recesses 75 communicate with the communicating holes 71 described above. As shown in FIG. 23, the upper metallic sheet 20 is formed to be planar as a whole and have no upper vapor flow path recess 21. Alternatively, the upper vapor flow path recess 21 (second vapor flow path portion) as shown in FIG. 23 may be provided on the upper metallic sheet 20. In this case, the second vapor flow path portions are provided on both the upper metallic sheet 20 and the intermediate metallic sheet 70.

Figure 25:
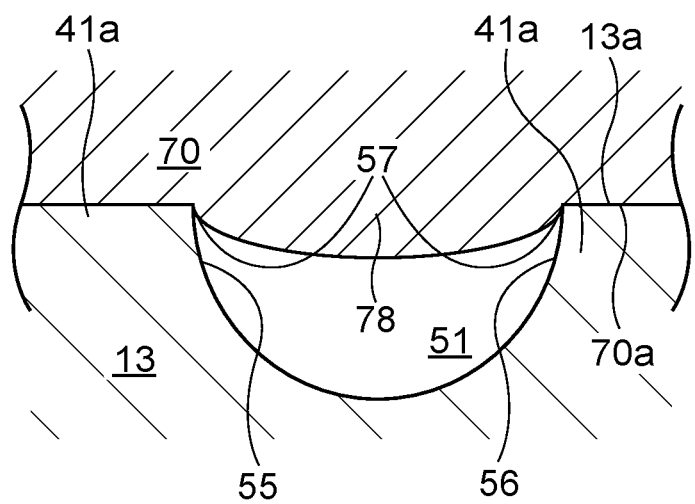
FIG. 25 is an enlarged cross-sectional view showing a communicating groove convex portion in the modification of the vapor chamber shown in FIG. 20.

In this embodiment described above, as shown in FIG. 24, the intermediate metallic sheet 70 may have a plurality of main flow groove convex portions 77 provided on the lower surface 70*a*. Each of the main flow groove convex portions 77 protrudes to the corresponding one of the main flow grooves 31 of the lower metallic sheet 10 from the lower surface 70*a*. The main flow groove convex portions 77 may be formed similarly to the main flow groove convex portion 27 in the second embodiment. Also, as shown in FIG. 25, the intermediate metallic sheet 70 may have a plurality of communicating groove convex portions 78 provided on the lower surface 70a. Each of the communicating groove convex portion 78 protrudes to the corresponding one of the communicating grooves 51 of the lower metallic sheet 10 from the lower surface 70a. The communicating groove convex portions 78 can be formed similarly to the communicating groove convex portions 28 in the second embodiment.

Fourth Embodiment

Next, a vapor chamber, an electronic device, a metallic sheet for the vapor chamber and a manufacturing method of the vapor chamber according to a fourth embodiment of the present invention will be explained using FIGS. 26 and 27.

Figure 26:
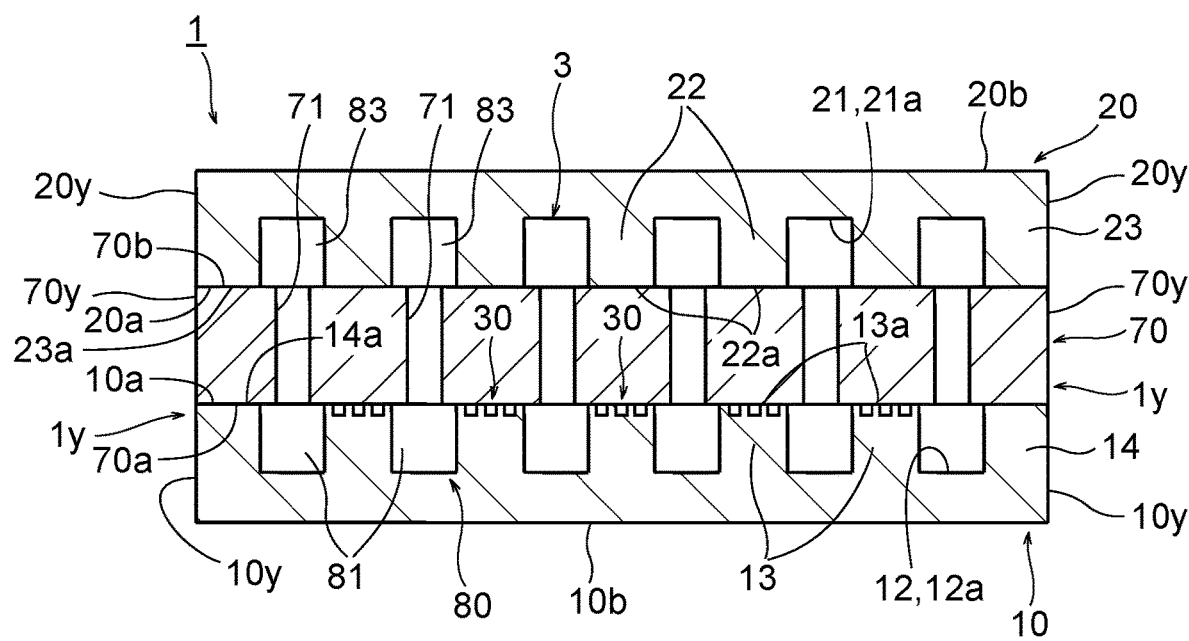
FIG. 26 is a cross-sectional view showing a vapor chamber according to a fourth embodiment.
Figure 27:
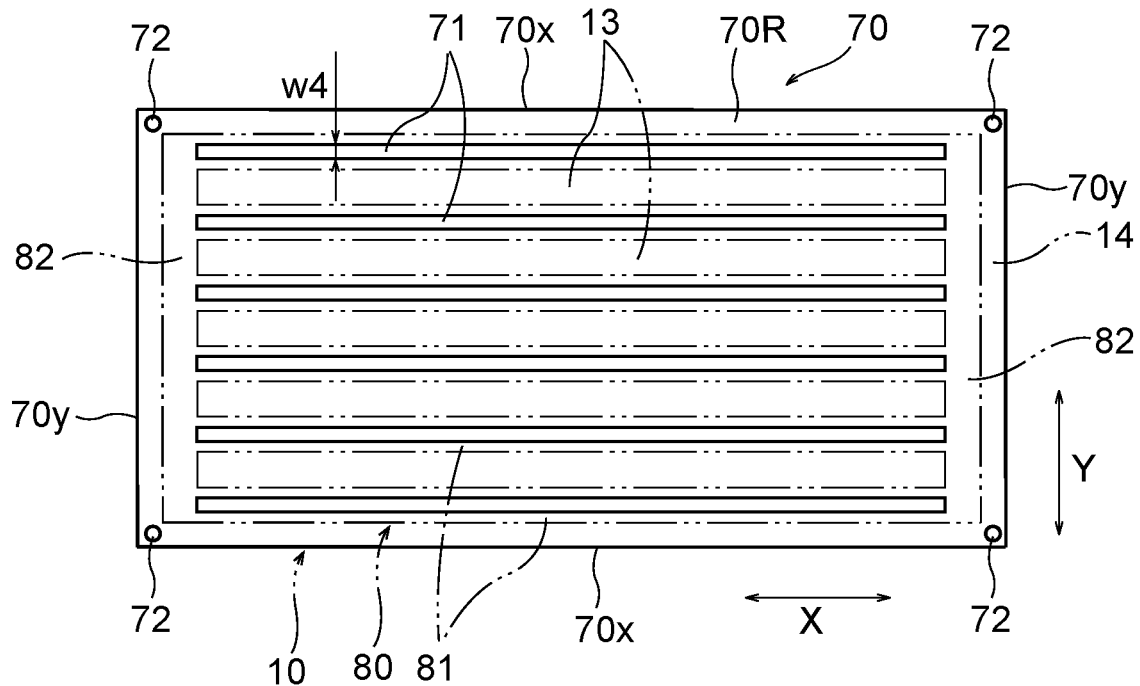
FIG. 27 is a top view of an intermediate metallic sheet of FIG. 26.

The fourth embodiment shown in FIGS. 26 and 27 is different mainly in that the upper flow path protruding portions and the communicating holes extend to be elongated along the first direction, and the other configurations are substantially the same as in the third embodiment shown in FIGS. 20 to 25. Additionally, in FIGS. 26 and 27, the same components as those in the third embodiment shown in FIGS. 20 to 25 are assigned the same reference numerals, and a detailed explanation thereof is omitted.

As shown in FIG. 26, in this embodiment, the upper flow path protruding portions 90 (second flow path protruding portions) provided for the upper metallic sheet 20 have a configuration similar to the upper flow path wall portions 22 in the first embodiment shown in FIGS. 1 to 17. Consequently, hereafter, the upper flow path protruding portions 90 are described as the upper flow path wall portions 22, and the detailed description of the upper metallic sheet 20 including the upper flow path protruding portions 90 is omitted.

As shown in FIG. 27, in this embodiment, the communicating holes 71 provided in the intermediate metallic sheet 70 are formed so as to extend to be elongated along the first direction X. Also in this embodiment, each communicating hole 71 is disposed between the upper flow path wall portions 22 adjacent to each other in a planar view. The width w4 (the dimension in the second direction Y) of the communicating hole 71 may be, for example, 50 μm to 1500 μm. Here, the width w4 of the communicating hole 71 is the minimum width in a range from the upper surface 70b to the lower surface 70a.

The communicating holes 71 according to this embodiment overlap with one of the lower vapor passages 81 of the lower vapor flow path recesses 12. The upper vapor passages 83 of the upper vapor flow path recesses 21, which overlap with the lower vapor passages 81, also overlap with the communicating holes 71 in a planar view. In other words, communicating holes 71 are provided between the lower vapor passages 81 and the upper vapor passages 83, in a manner overlapping with these passages. Consequently, the vapor of the working fluid 2 in the lower vapor passages 81 can rapidly reach the upper vapor passages 83 via the communicating holes 71, and smoothly diffuse to the upper vapor passages 83.

As described above, according to this embodiment, the intermediate metallic sheet 70 is interposed between the lower metallic sheet 10 and the upper metallic sheet 20, the lower surface 20a of the upper metallic sheet 20 is provided with the upper vapor flow path recess 21, and the upper surface 10a of the lower metallic sheet 10 is provided with the liquid flow path portion 30. The intermediate metallic sheet 70 is provided with communicating holes 71 allowing communication between the upper vapor flow path recesses 21 and the liquid flow path portion 30. Thereby, even in a case where three metallic sheets 10, 20, 70 constitute the vapor chamber 1, the heat of the device D can be transferred and released by circulating the working fluid 2 in the sealed space 3, with the change of phase being repeated in the vapor chamber 1.

According to this embodiment, the liquid flow path portions 30 similar to those in the first embodiment shown in FIGS. 1 to 17 are provided on the upper surface 10a of the lower metallic sheet 10. Thereby, the transport function of the working fluid 2 in liquid form can be improved, and thermal transport efficiency can be improved.

Fifth Embodiment

Next, a vapor chamber, an electronic device, a metallic sheet for the vapor chamber and a manufacturing method of the vapor chamber according to a fifth embodiment of the present invention will be explained using FIGS. 28 to 33.

In the fifth embodiment shown in FIGS. 28 to 33, a main difference is that an intermediate metallic sheet is interposed between a lower metallic sheet and an upper metallic sheet, the vapor flow path portion is provided in a surface of the intermediate metallic sheet, the liquid flow path portion is provided on the lower surface of the intermediate metallic sheet, and the other configurations are substantially the same as in the third embodiment shown in FIGS. 20 to 25. Additionally, in FIGS. 28 to 33, the same components as those in the third embodiment shown in FIGS. 20 to 25 are assigned the same reference numerals, and a detailed explanation thereof is omitted.

Figure 28:
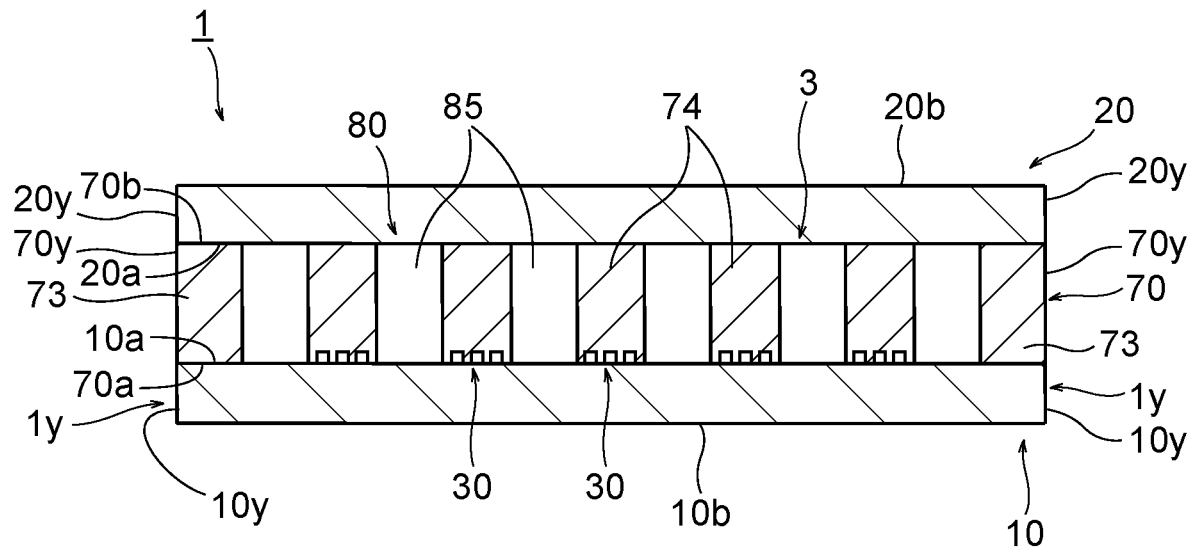
FIG. 28 is a cross-sectional view showing a vapor chamber according to a fifth embodiment.

As shown in FIG. 28, in this embodiment, the vapor flow path portion 80 is provided on the upper surface 70b of the intermediate metallic sheet 70. In other words, the vapor flow path portion 80 according to this embodiment is formed to be elongated from the upper surface 70b to the lower surface 70a of the intermediate metallic sheet 70, and penetrates the intermediate metallic sheet 70. The liquid flow path portion 30 is provided on the lower surface 70a of the intermediate metallic sheet 70. Consequently, the intermediate metallic sheet 70 according to this embodiment is sometimes called a wick sheet. The vapor flow path portion 80 and the liquid flow path portion 30 communicate with each other so as to circulate the working fluid 2.

Figure 29:
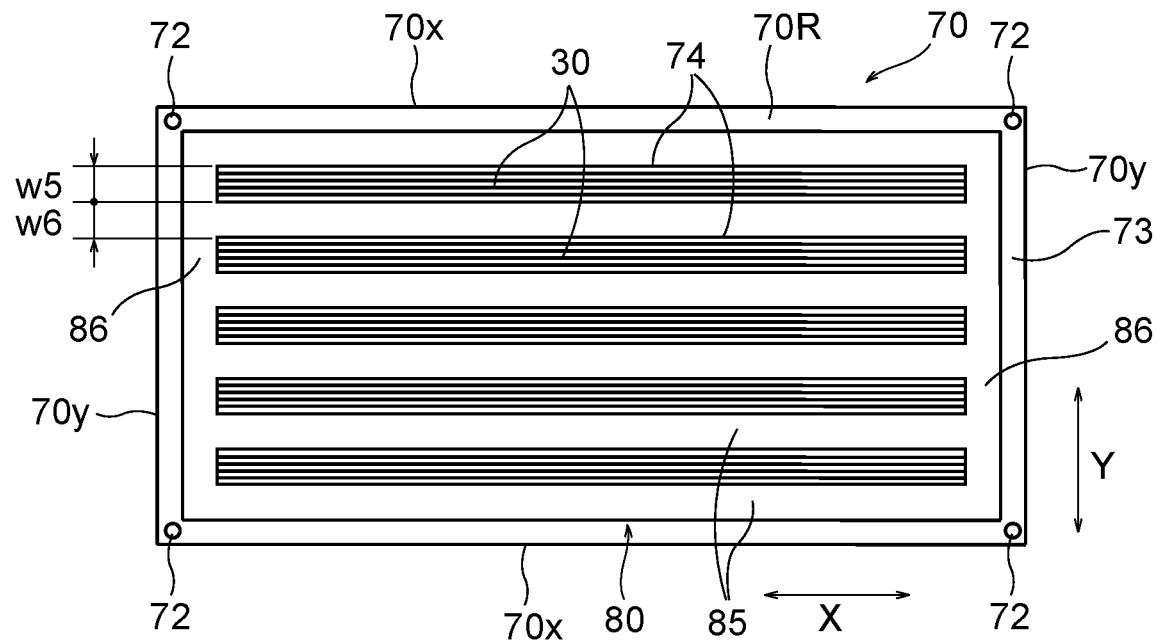
FIG. 29 is a bottom view of an intermediate metallic sheet of FIG. 28.
Figure 30:
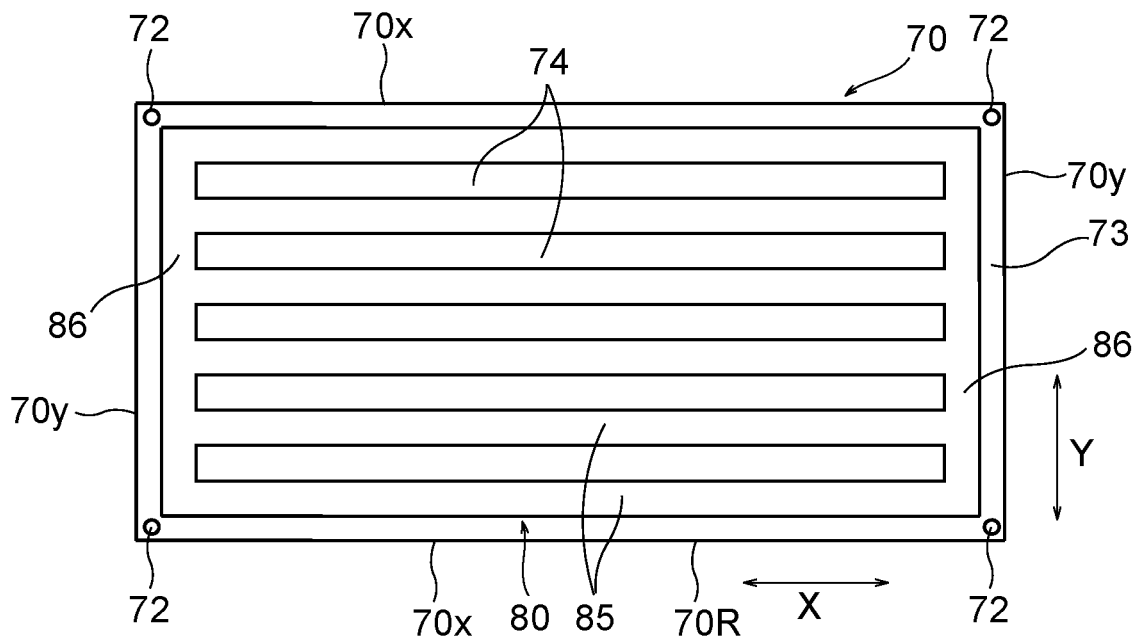
FIG. 30 is a top view of an intermediate metallic sheet of FIG. 28.

As shown in FIGS. 29 and 30, the intermediate metallic sheet 70 includes a frame portion 73 formed to have a rectangular frame in a planar view, and a plurality of land portions 74 provided in the frame portion 73. The frame portion 73 and the land portions 74 are portions which are not etched during etching of the intermediate metallic sheet 70 and at which the material of the intermediate metallic sheet 70 remains. The land portions 74 extend to be elongated along the first direction X, and are disposed in the vapor flow path portion 80. The land portions 74 are supported by each other via a supporting portion, not shown, and are supported by the frame portion 73. The supporting portion is formed so as to inhibit blocking of the flow of the vapor of the working fluid 2 flowing in the intermediate vapor passage 85 which will be described later. For example, the supporting portion may be formed at a part of a range from the upper surface 70b to the lower surface 70a of the intermediate metallic sheet 70 in the vertical direction in FIG. 28.

The vapor flow path portion 80 includes a plurality of intermediate vapor passages 85 (third vapor passages) partitioned by the land portions 74. The intermediate vapor passages 85 extend to be elongated along the first direction X, and are disposed to be parallel with each other. The both end portions of each intermediate vapor passage 85 communicate with the intermediate communicating vapor passage 86 extending to be elongated along the second direction Y, and each intermediate vapor passage 85 communicates via the intermediate communicating vapor passage 86. In this way, such a configuration is made that the vapor of the working fluid 2 flows along a periphery of each land portion 74 (the intermediate vapor passage 85 and the intermediate communicating vapor passage 86) and the vapor is transported to a peripheral portion of the vapor flow path portion 80, which inhibits blocking of vapor flow. Additionally, in FIG. 28, the shape of the cross section (the section in the second direction Y) of each intermediate vapor passage 85 is a rectangle. However, not limited to this, the shape of the cross section of each intermediate vapor passage 85 and for example, may be curved, semi-circular or V-shaped, and may be arbitrary as long as the vapor of the working fluid 2 can be diffused. The same is applied to the intermediate communicating vapor passage 86. The intermediate vapor passages 85 and the intermediate communicating vapor passage 86 can be formed by etching similarly to the communicating holes 71 in the third embodiment shown in FIGS. 20 to 25, and have cross sectional shapes similarly to the communicating holes 71 in the third embodiment shown in FIGS. 20 to 25.

In a case where the width w5 (the dimension in the second direction Y) of the land portion 74 of the intermediate metallic sheet 70 is the maximum dimension in a range from the upper surface 70b to the lower surface 70a, the width w5 may be, for example, 50 μm to 2000 μm. In a case where the width w6 (the dimension in the second direction Y) of the intermediate vapor passage 85 is the minimum dimension in a range from the upper surface 70b to the lower surface 70a, the width w6 may be, for example, 50 μm to 2000 μm. The same is applied to the width (the dimension in the first direction X) of the intermediate communicating vapor passage 86.

The liquid flow path portions 30 are provided on the land portions 74 on the lower surface 70a of the intermediate metallic sheet 70. In other words, the liquid flow path portions 30 are provided on the lower surfaces of the land portions 74.

The upper surface 10a of the lower metallic sheet 10 according to this embodiment is provided with no lower vapor flow path recess 12 and with no liquid flow path portion 30. The upper surface 10a is formed to be planar. In the same manner, the lower surface 20a of the upper metallic sheet 20 is provided with no upper vapor flow path recess 21 and with no liquid flow path portion 30. The lower surface 20a is formed to be planar. The thickness of the lower metallic sheet 10 and the thickness of the upper metallic sheet 20 according to this embodiment are, for example, 8 μm to 100 μm.

In the vapor chamber 1 according to this embodiment, the vapor flow path portion 80 and the liquid flow path portions 30 of the intermediate metallic sheet 70 can be formed by etching. Subsequently, the lower metallic sheet 10 and the upper metallic sheet 20 are joined, with the intermediate metallic sheet 70 being intervening therebetween. In other words, the lower metallic sheet 10 and the intermediate metallic sheet 70 are subjected to diffused junction, while the upper metallic sheet 20 and the intermediate metallic sheet 70 are subjected to diffused junction. Thereby, the sealed space 3 is formed. The lower metallic sheet 10, the intermediate metallic sheet 70 and the upper metallic sheet 20 may be integrally subjected to diffused junction at one time.

As described above, according to this embodiment, the intermediate metallic sheet 70 is interposed between the lower metallic sheet 10 and the upper metallic sheet 20, the upper surface 70b of the intermediate metallic sheet 70 is provided with the vapor flow path portion 80, and the lower surface 70a of the intermediate metallic sheet 70 is provided with the liquid flow path portion 30. Thereby, even in a case where three metallic sheets 10, 20, 70 constitute the vapor chamber 1, the heat of the device D can be transferred and released by circulating the working fluid 2 in the sealed space 3, with the change of phase being repeated in the vapor chamber 1.

According to this embodiment, the vapor flow path portion 80 is provided on the upper surface 70b of the intermediate metallic sheet 70 interposed between the lower metallic sheet 10 and the upper metallic sheet 20, and the liquid flow path portions 30 are provided on the lower surface 70a. This negates the need of the etching process for forming the vapor flow path and the liquid flow path, to the lower metallic sheet 10 and the upper metallic sheet 20. In other words, the number of members to be subjected to the etching process can be reduced. Consequently, the step of manufacturing the vapor chamber 1 can be simplified, thereby allowing the vapor chamber 1 to be simply manufactured. The vapor flow path portion 80 and the liquid flow path portions 30 are formed on the intermediate metallic sheet 70. Consequently, the vapor flow path portion 80 and the liquid flow path portions 30 can be accurately positioned during the etching process. This negates the need to position the vapor flow path portion 80 and the liquid flow path portions 30 with respect to each other in an assembling step. As a result, the vapor chamber 1 can be simply manufactured. The height (or depth) of the vapor flow path can be defined by the thickness of the intermediate metallic sheet 70, and the vapor chamber 1 can be simply manufactured.

According to this embodiment, the liquid flow path portions 30 similar to those in the first embodiment shown in FIGS. 1 to 17 are provided on the lower surface 70a of the intermediate metallic sheet 70. Thereby, the transport function of the working fluid 2 in liquid form can be improved, and thermal transport efficiency can be improved.

According to this embodiment, the vapor flow path portion 80 extends from the upper surface 70b to the lower surface 70a of the intermediate metallic sheet 70. Thereby, the flow path resistance of the vapor flow path portion 80 can be reduced. Consequently, the working fluid 2 in liquid form generated from the vapor of the working fluid 2 by condensation at the vapor flow path portion 80 is allowed to smoothly enter the main flow grooves 31 of the liquid flow path portion 30. On the other hand, the vapor of the working fluid 2 evaporated at the evaporating portion 11 is allowed to be smoothly diffused to the vapor flow path portion 80.

Figure 31:
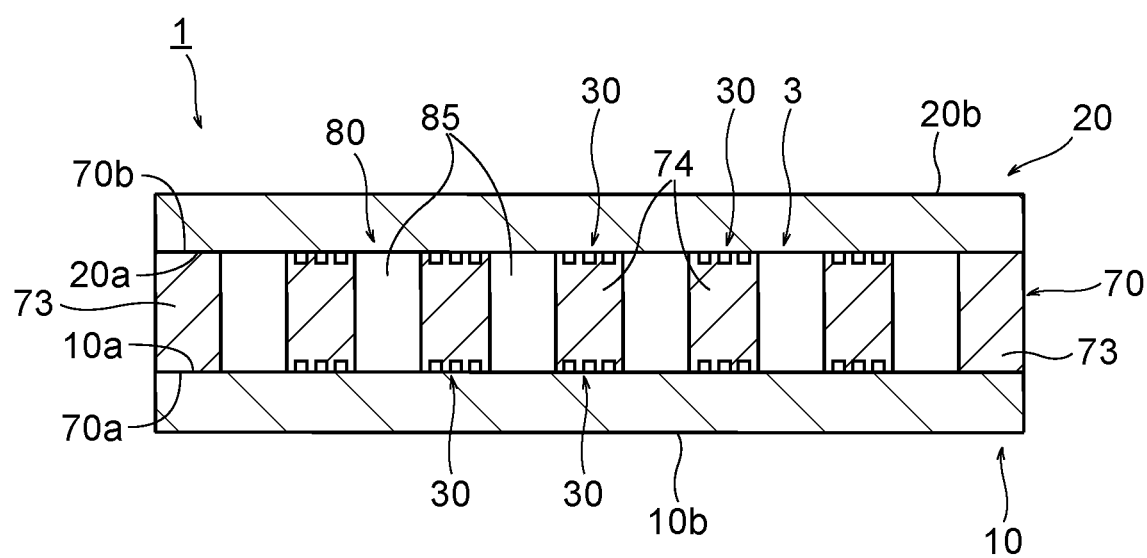
FIG. 31 is a cross-sectional view showing a modification of the vapor chamber of FIG. 28.
Figure 32:
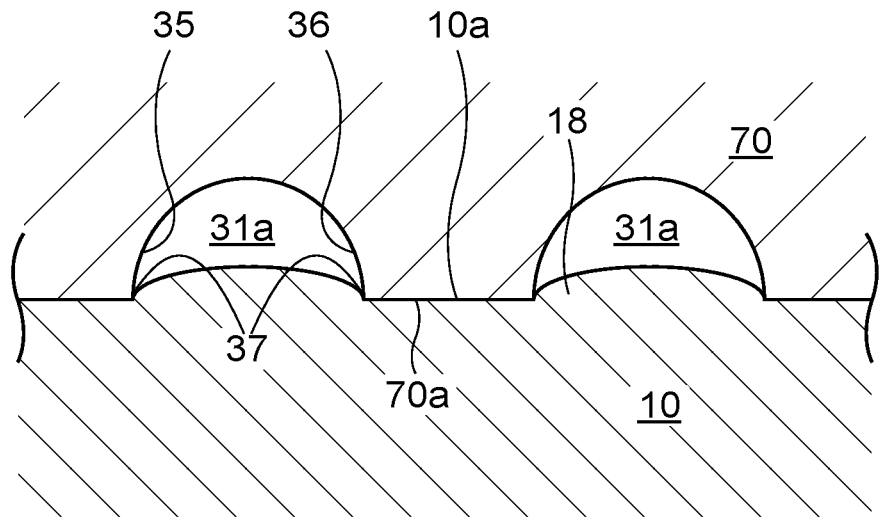
FIG. 32 is an enlarged cross-sectional view showing main flow groove convex portions in the modification of the vapor chamber shown in FIG. 28.

In this embodiment described above, an example in which the liquid flow path portion 30 is provided on the lower surface 70a of the intermediate metallic sheet 70 has been explained. However, not limited to this, as shown in FIG. 31, the liquid flow path portion 30 may be provided not only on the lower surface 70a but also on the upper surface 70b. In this case, the number of flow paths for transporting the working fluid 2 in liquid form to the evaporating portion 11 or a portion close to the evaporating portion 11 on the intermediate metallic sheet 70 can be increased, which can improve the transport efficiency of the working fluid 2 in liquid form. As a result, the thermal transport efficiency of the vapor chamber 1 can be improved.

In this embodiment described above, an example in which the vapor flow path portion 80 is formed so as to extend from the upper surface 70b to the lower surface 70a of the intermediate metallic sheet 70 has been explained. However, not limited to this, the vapor flow path portion 80 may be formed to be concave, as with the lower vapor flow path recess 12 shown in FIGS. 1 to 17 or the upper vapor flow path recess 21 shown in FIGS. 20 and 21, on the upper surface 70b of the intermediate metal sheet 70. In this case, the intermediate metallic sheet 70 may be provided with communicating holes (not shown) allowing the vapor flow path portion 80 to communicate with the liquid flow path portion 30.

In this embodiment described above, an example in which one intermediate metallic sheet 70 is interposed between the lower metallic sheet 10 and the upper metallic sheet 20 has been described. However, not limited to this, another metallic sheet, not shown, may be interposed between the lower metallic sheet 10 and the intermediate metallic sheet 70, or another metallic sheet, not shown, may be interposed between the upper metallic sheet 20 and the intermediate metallic sheet 70.

Figure 33:
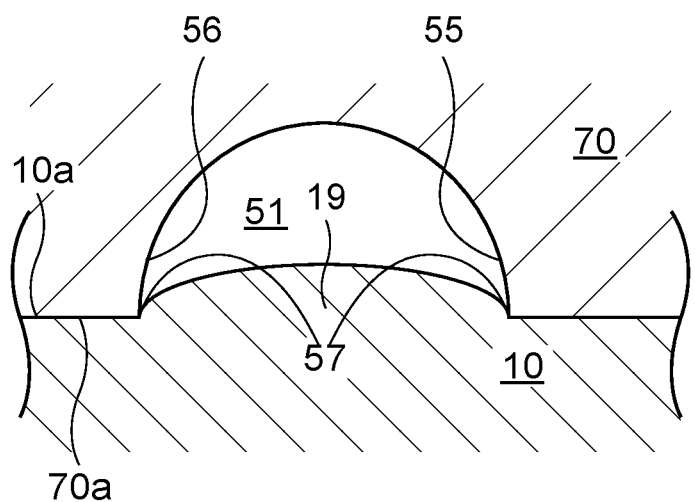
FIG. 33 is an enlarged cross-sectional view showing a communicating groove convex portion in the modification of the vapor chamber shown in FIG. 28.

In this embodiment described above, as shown in FIG. 32, the lower metallic sheet 10 may have a plurality of main flow groove convex portions 18 provided on the upper surface 10a. Each of the main flow groove convex portions 18 protrudes to the corresponding one of the main flow grooves 31 of the intermediate metallic sheet 70 from the upper surface 10a. The main flow groove convex portions 18 may be formed similarly to the main flow groove convex portion 27 in the second embodiment. Also, as shown in FIG. 33, the lower metallic sheet 10 may have a plurality of communicating groove convex portions 19 provided on the upper surface 10a. Each of the communicating groove convex portions 19 protrudes to the corresponding one of the communicating grooves 51 of the intermediate metallic sheet 70 from the upper surface 10a. The communicating groove convex portions 19 can be formed similarly to the communicating groove convex portions 28 in the second embodiment.

Sixth Embodiment

Next, a vapor chamber, an electronic device, a metallic sheet for the vapor chamber and a manufacturing method of the vapor chamber according to a sixth embodiment of the present invention will be explained using FIGS. 34 to 37.

The sixth embodiment shown in FIGS. 34 to 37 is different mainly in that in the linear region, the liquid flow path portion has a plurality of first grooves extending in a direction inclined with respect to the first direction. The other configurations are substantially the same as in the first embodiment shown in FIGS. 1 to 17. Additionally, in FIGS. 31 to 37, the same components as those in the first embodiment shown in FIGS. 1 to 17 are assigned the same reference numerals, and a detailed explanation thereof is omitted.

The liquid flow path portion in the typical vapor chamber is constituted by grooves formed to have a lattice shape. The lattice-shaped grooves are formed so as to be along the outer edge forming the outline of the vapor chamber, in order to transport the working fluid condensed at a position away from the evaporating portion, to the evaporating portion.

However, in the case where the lattice-shaped grooves are formed so as to be along the outer edge of the vapor chamber, a possibility can be considered that in a case of handling or implementation on an electronic device, the vapor chamber is deformed to be bent along the line extending in the direction orthogonal to the outer edge. In this case, the grooves of the liquid flow path portion are crushed, which can reduce the flow path sectional area of the working fluid in liquid form. Consequently, the amount of transport of the working fluid to the evaporating portion decreases, which causes a problem of reduction in thermal transport efficiency.

The sixth embodiment is made considering this point, and has an object to provide a vapor chamber, an electronic device, a metallic sheet for the vapor chamber, and a manufacturing method of the vapor chamber which can improve the transport function of the working fluid in liquid form and improve the thermal transport efficiency. Consequently, in this embodiment, the magnitude relationship between the width of the first groove and the width of the second groove (the magnitude relationship between the width of the main flow groove and the width of the communicating groove) is arbitrary.

This embodiment, and seventh and eighth embodiments which will be described later mainly correspond to the tenth solution to twentieth solution described above. Hereinafter, this embodiment will be explained with reference to drawings.

As shown in FIG. 2, the lower metallic sheet 10 according to this embodiment has a lower linear region 10R which linearly extends and is defined by a pair of outer edges 10x extending in the first direction X. In this embodiment, as shown in FIG. 4, the lower metallic sheet 10 is formed to be rectangular as a whole in a planar view, and has four outer edges 10x, 10y which form the planar outline of the lower metallic sheet 10. Among these components, the two outer edges 10x extend in the first direction X, and the remaining two outer edges 10y extend in the second direction Y. In other words, the lower metallic sheet 10 according to this embodiment is constituted by the lower linear region 10R as a whole.

In the same manner, the upper metallic sheet 20 has an upper linear region 20R which linearly extends and is defined by a pair of outer edges 20x extending in the first direction X. In this embodiment, as shown in FIG. 5, the upper metallic sheet 20 is formed to be rectangular as a whole in a planar view, and has four outer edges 20x, 20y which form the planar outline of the upper metallic sheet 20. Among these components, the two outer edges 20x extend in the first direction X, and the remaining two outer edge 20y extend in the second direction Y. In other words, the upper metallic sheet 20 according to this embodiment is constituted by the upper linear region 20R as a whole.

The outer edges 10x of the lower metallic sheet 10 and the outer edges 20x of the upper metallic sheet 20 form the outer edges 1x of the vapor chamber 1 described above. The outer edges 10y of the lower metallic sheet 10 and the outer edges 20y of the upper metallic sheet 20 form the outer edges 1y of the vapor chamber 1 described above.

Although the example in which the lower metallic sheet 10 and the upper metallic sheet 20 are both formed to be rectangular in a planar view is shown, no limitation thereto is required as long as the linear regions 10R and 20R are included. For example, a part of the lower metallic sheet 10 may be constituted by the lower linear region 10R, and the remaining part is constituted by a region having any planar shape. The lower metallic sheet 10 may be constituted by a plurality of lower linear regions 10R having planar shapes different from each other. For example, the lower metallic sheet 10 may have an L-shape or a T-shape as a whole. In a case where an L-shape or a T-shape is formed by two linear regions extending in directions orthogonal to each other, the vapor chamber 1 is prevented from being deformed to be bend at a portion where these two linear regions intersect with each other. The same is applied to the upper metallic sheet 20.

Figure 34:
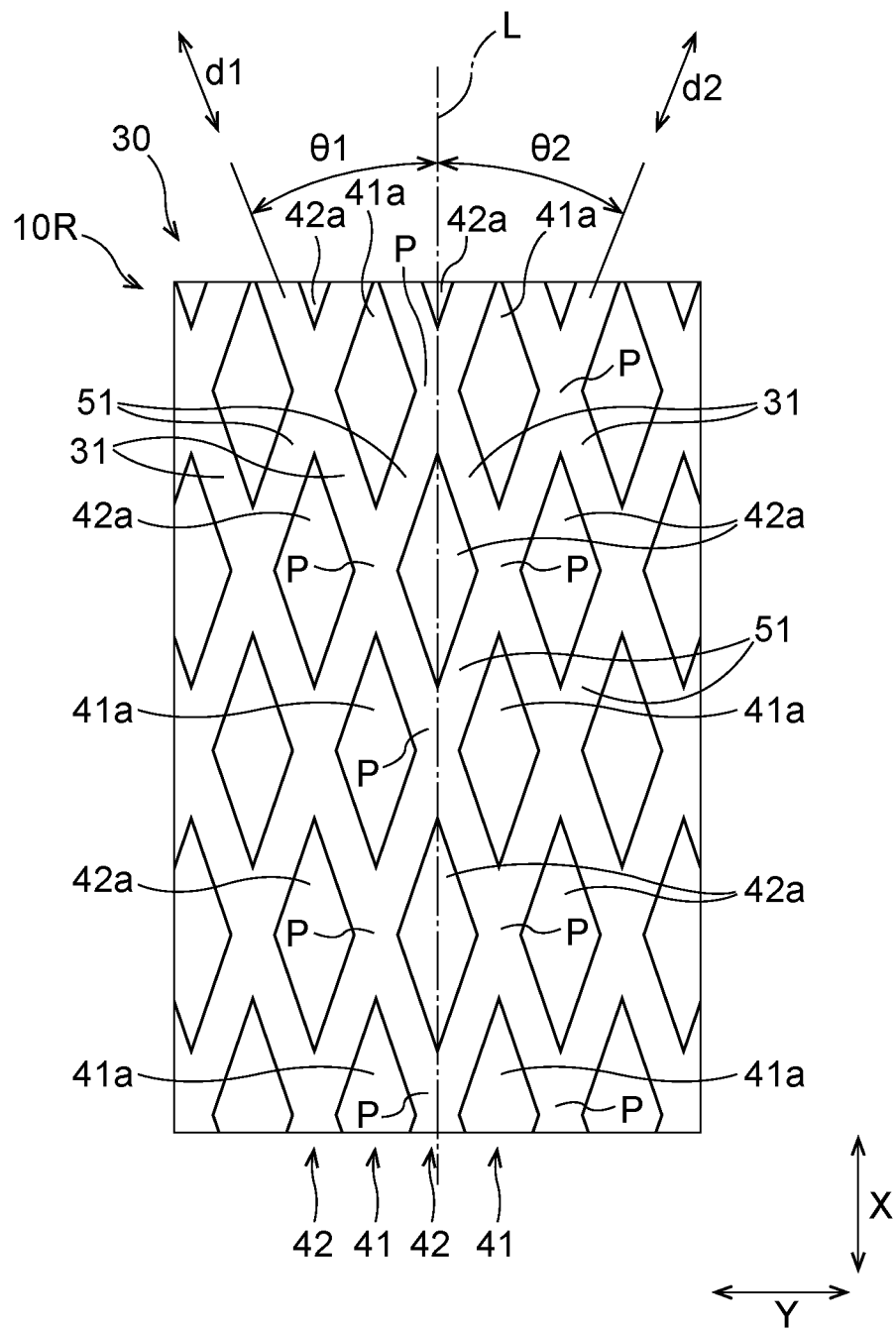
FIG. 34 is an enlarged top view showing liquid flow path portions of a vapor chamber according to a sixth embodiment.

As shown in FIG. 34, in the lower linear region 10R, the liquid flow path portion 30 includes a plurality of first grooves 31 and a plurality of second grooves 51. The first grooves 31 and the second grooves 51 allow the working fluid 2 in liquid form to pass therethrough. The first grooves 31 extend in a direction (first groove direction d1) inclined with respect to the first direction X, and are formed to be parallel with each other. The second grooves 51 extend in a direction (second groove direction d2) which is a direction inclined with respect to the first direction X and is different from the first groove direction d1. One first groove 31 and one second groove 51 intersect with each other at an intersection P. In other words, the liquid flow path portion 30 includes a plurality of intersections P at which the first grooves 31 and the second grooves 51 intersect with each other. At each intersection P, one first groove 31 communicates with the corresponding second groove 51. The intersections P are regions where the first grooves 31 intersect with the second grooves 51 (overlapping regions).

A line which passes through a certain intersection P and extends in the first direction X is adopted as a reference line L. The first groove 31 constituting this intersection P extends from one side (left in FIG. 34) of the reference line L to the other side (right in FIG. 34) while extending to one side (downward in FIG. 34) in the first direction X. The second grooves 51 constituting this intersection P extends from the other side (right in FIG. 34) of the reference line L to the one side (left in FIG. 34) while extending to the one side (downward in FIG. 34) in the first direction X. The first groove direction d1 forms an angle θ1 with respect to the first direction X. The second groove direction d2 forms θ2 with respect to the first direction X. The angles θ1 and θ2 are, for example, 10° to 45°. An angle of 10° or larger can inhibit both the end portions of each liquid flow path convex portion 41a in the first direction X from being an acute angle, and stabilize the shape of these end portions. An angle of 45° or less can inhibit the transport distance of the working fluid 2 in liquid form from being long, and prevent the transport function from decreasing.

The liquid flow path portion 30 includes a plurality of liquid flow path convex portions 41a, 42a each surrounded by an adjacent pair of first grooves 31 and an adjacent pair of second grooves 51. The row of the liquid flow path convex portions 41a, 42a arranged along the first direction X form convex arrays 41, 42. In the convex arrays 41, 42, the liquid flow path convex portions 41a, 42a are arranged at a constant pitch in the first direction X. At positions different in the second direction Y, the convex array 41 and the convex array 42 are formed. In other words, in the second direction Y, the convex array 41 and the convex array 42 are alternately arranged. The pitch of the liquid flow path convex portions 41a in the convex array 41, and the pitch of the liquid flow path convex portion 42a in the convex array 42 may be the same as each other. The liquid flow path convex portions 41a of the convex array 41 and the liquid flow path convex portions 42a of the convex array 42 are arranged at positions different in the first direction X. In this embodiment, when seen from the second direction Y, the intersection P disposed between the liquid flow path convex portions 41a which are adjacent to each other and form the convex array 41 overlaps with the liquid flow path convex portions 42a forming the other convex array 42 adjacent to the convex array 41. When seen from the second direction Y, the intersection P disposed between the liquid flow path convex portions 42a which are adjacent to each other and form the convex array 42 overlaps with the liquid flow path convex portions 41a forming the other convex array 41 adjacent to the convex array 42.

As with the example shown in FIG. 34, the first grooves 31 and the second grooves 51 may be formed to be line-symmetric with respect to the reference line L described above. In other words, the angle θ1 and angle θ2 described above are the same as each other. The first grooves 31 and the second grooves 51 are formed to have an X-shape. In this case, the liquid flow path convex portions 41a, 42a are also formed to be line-symmetric with respect to the reference line L. The liquid flow path convex portions 41a, 42a are disposed to have a staggered arrangement. Each of the planar shapes of the liquid flow path convex portions 41a, 42a is a rhombus.

Figure 35:
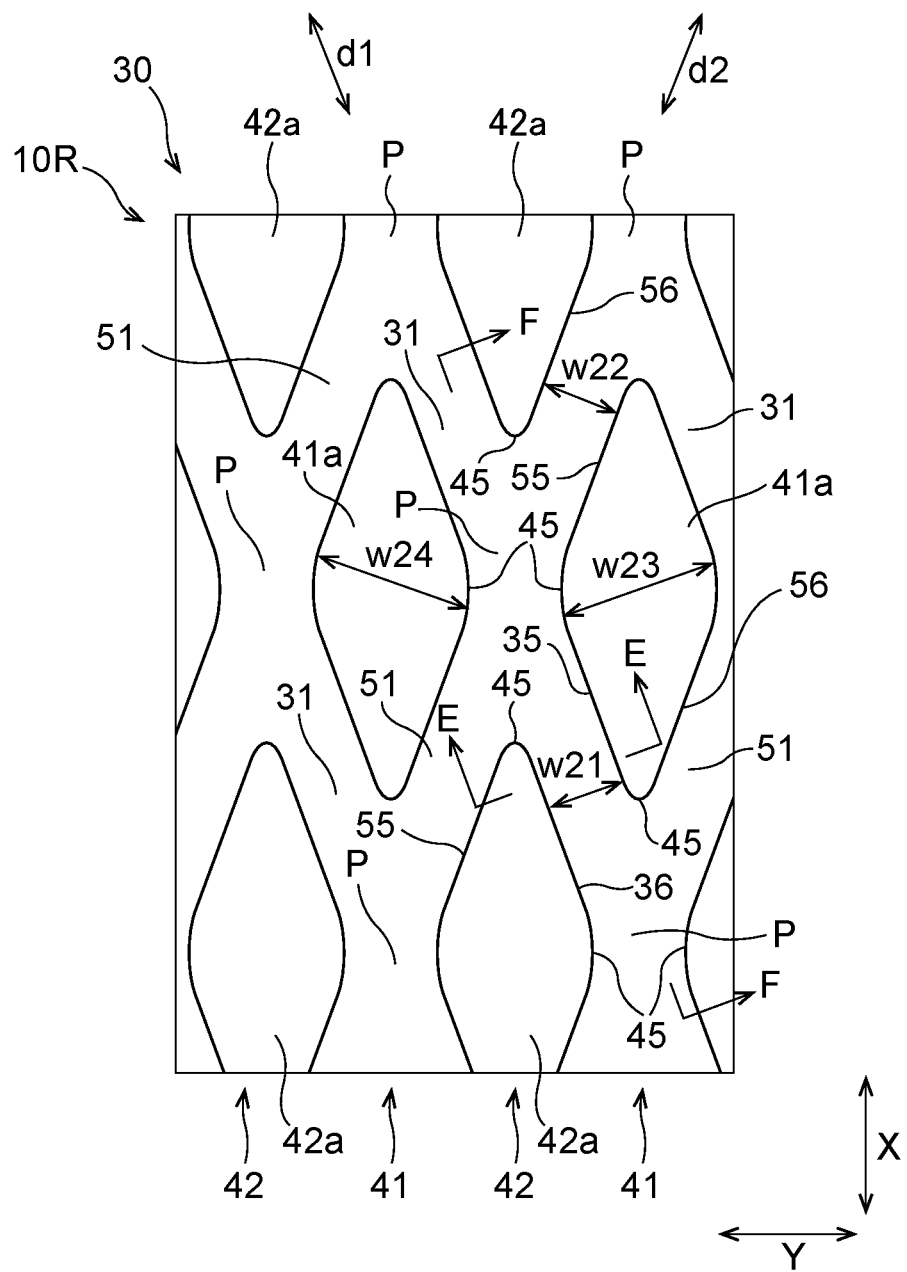
FIG. 35 is an enlarged top view showing the liquid flow path portions of FIG. 34 in a further enlarged manner.

As shown in FIG. 35, the width w21 of the first grooves 31 and the width w22 of the second grooves 51 may be the same as each other. For example, the width w21 of the first grooves 31 and the width w22 of the second grooves 51 are 30 μm to 200 μm. The interval w23 of the first grooves 31 (the dimension of the liquid flow path convex portions 41a, 42a in a direction orthogonal to the first groove direction d1), and the interval w24 of the second grooves 51 (the dimension of the liquid flow path convex portions 41a, 42a in the direction orthogonal to the second groove direction d2) may be the same as each other. For example, the interval w23 of the first grooves 31 and the interval w24 of the second grooves 51 may be 30 μm to 200 μm. In FIG. 35, the example in which the width w21 of the first grooves 31 and the width w22 of the second grooves 51 are smaller than the interval w23 of the first grooves 31 and the interval w24 of the second grooves 51. However not limited to this, the magnitude relationship between w21 and w22, and that between w23 and w24 may be arbitrary.

Figure 36:
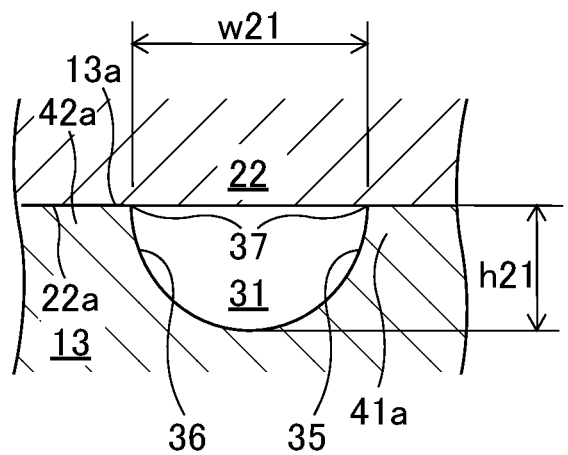
FIG. 36 is a cross-sectional view of FIG. 35 taken along the line E-E with addition of the upper flow path wall portion of the upper metallic sheet.
Figure 37:
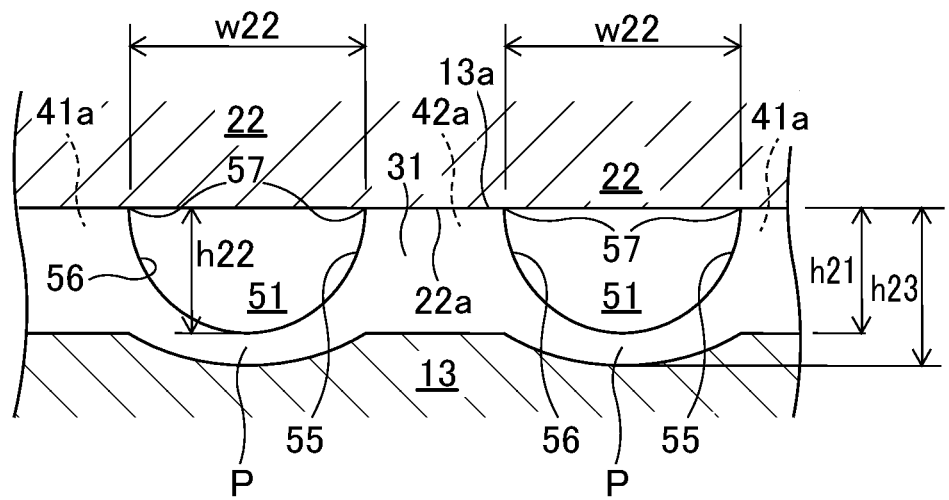
FIG. 37 is a cross-sectional view of FIG. 35 taken along the line F-F with addition of the upper flow path wall portion of the upper metallic sheet.

A depth h21 (see FIG. 36) of the first grooves 31 may be smaller than the depth h0 of the above-described lower vapor flow path recess 12. In this case, the capillary action of the first grooves 31 can be improved. As shown in FIG. 37, the depth h21 of the first grooves 31 and the depth h22 of the second grooves 51 may be the same as each other. For example, preferably, the depth h21, h22 of the first grooves 31 and the second grooves 51 are about half of the h0, and may be 5 μm to 180 μm.

The shape of a cross section (a cross section in a direction orthogonal to the first groove direction d1) of the first groove 31 is not particularly limited, and for example, may be rectangular, curved, semi-circular or V-shaped. The same is applied to the cross section (a cross section in a direction orthogonal to the second groove direction d2) of the second grooves 51. FIGS. 36 and 37 show the example in which the cross sections of each first groove 31 and each second groove 51 are formed to be curved. In this case, each of the widths w21, w22 of the first grooves 31 and second grooves 51 is the width of each groove of the lower flow path wall portions 13 on the upper surface 13a. In the same manner, each of the intervals w23, w24 of the first grooves 31 and the second grooves 51 is also the width of the convex portions on the upper surface 13a. The depths h21, h22 of each first groove 31 and each second groove 51 are the depth at the deepest position in the groove. For the sake of simplicity of the drawing, the section of each second groove 51 shown in FIG. 37 is a cross section in a direction orthogonal to the second groove direction d2.

Incidentally, in FIG. 34, each of liquid flow path convex portions 41a, 42a is formed so as to be a rhombus in a planar view in a large sense. Over the entire liquid flow path portion 30, the liquid flow path convex portions 41a, 42a may be formed to have a similar form. However, as shown in FIG. 35, a rounded curved portion 45 may be provided at a corner portion of each of the liquid flow path convex portions 41a, 42a. Thereby, each of the corner portions of the liquid flow path convex portion 41a, 42a is formed to be smoothly curved, which reduces the flow path resistance of the working fluid 2 in liquid form.

In this embodiment, as shown in FIG. 37, the depth h23 of the intersection P is deeper than the depth h21 of the first grooves 31 and deeper than the depth h22 of the second grooves 51. The depth h23 of the intersection P may be, for example, 20 μm to 300 μm. The depth h23 of the intersection P is the depth at the deepest position at the intersection P.

The intersections P are regions where the first grooves 31 and the second grooves 51 intersect with each other and the first grooves 31 and the second grooves 51 communicate with each other. Consequently, in the second half-etching step shown in FIG. 12, more etching liquid enters the intersections P than the first grooves 31 and the second grooves 51. As a result, erosion by the etching liquid progresses at the intersections P, and the depth of the intersections P is made deeper. Thereby, the depth h23 of the intersections P can be deeper than the depths h21, h22 of the first grooves 31 and the second grooves 51.

As described above, the depth h23 of the intersections P is deeper than the depth h21 of the first grooves 31 and deeper than the depth h22 of the second grooves 51. Thereby, the intersections P serve as the buffer region and can store the working fluid 2 in liquid form. Typically, each first groove 31 and each second groove 51 of the liquid flow path portions 30 are filled with the working fluid 2 in liquid form. Accordingly, since the depth h23 of the intersections P is deeper than the depth h21, h22 of the first grooves 31 and the second grooves 51, a large quantity of working fluid 2 can be stored in the intersections P. As described above, since the first grooves 31 and the second grooves 51 are filled with the working fluid 2, the working fluid 2 can be stored in the intersections P regardless of the attitude of the vapor chamber 1.

Additionally, while a large number of intersections P are formed in each liquid flow path portion 30 of the vapor chamber 1, as long as the depth h23 of at least one intersection P thereamong is deeper than the depth h21, h22 of the first grooves 31 and the second grooves 51, the retaining property of the working fluid 2 at the intersections P can be improved. Since this retaining property improves as the number of intersections P having the depth h23 which is deeper than the depths h21, h22 of the first grooves 31 and the second grooves 51 increase, the depth h23 of all the intersections P preferably has the same depth. However, the retaining property of the working fluid 2 can be evidently improved even when the depth h23 of some intersections P is not deeper than the depth h21 of the first grooves 31 or the depth h22 of the second grooves 51 due to a production error etc.

Here, a method of confirming the width and the depth of the first grooves 31 and the width and the depth of the second grooves 51 from the vapor chamber 1 in the finished form will be explained. Generally, the first grooves 31 and the second grooves 51 cannot be seen from the outside of the vapor chamber 1. Consequently, such a method can be listed in which the widths and the depths of the first grooves 31 and the second grooves 51 are confirmed from a cross-sectional shape obtained by cutting the vapor chamber 1 in the finished form at a desired position.

More specifically, firstly, the vapor chamber 1 is cut by a wire saw into a 10 mm square piece as a sample. After that, the sample is embedded in resin with vacuum degassing such that resin enters the vapor flow path recesses 12, 21 and the liquid flow path portion 30 (the first grooves 31 and the second grooves 51). Next, a square piece is polished in plane directions by buffing or the like, and the pitch and extending directions of the grooves 31, 51 are specified. Alternatively, after these are specified using an X-ray CT, a square piece may be cut out and embedded in resin. Subsequently, the square piece or another square piece is subjected to a trimming process by a diamond knife to obtain the cross section of the first grooves 31 (a section in a direction orthogonal to the first groove direction d1) or the cross section of the second grooves 51 (a section in a direction orthogonal to the second groove direction d2). At this time, for example, using a diamond knife of a microtome (an ultra microtome manufactured by Leica microsystems GmbH etc.), a trimming process is executed to a portion 40 μm away from a measured object position. For example, assuming that the pitch of the first groove 31 is 200 μm, by shaving the first groove 31 adjacent to the first grooves 31 as a measured object by 160 μm, a portion which is 40 μm away from the first groove 31 as the measured object can be specified. Next, a trimming-processed cutting surface is shaved to provide a cutting surface for observation. At this time, using a cross section sample manufacturing apparatus (for example, a cross section polisher manufactured by JOEL Ltd.), setting a protruding width of 40 μm, the voltage of 5 kV, and the time of 6 hours, the cutting surface is shaved in ion beam processing. Thereafter, the obtained cutting surface of the sample is observed. At this time, using a scanning electron microscope (for example, a scanning electron microscope manufactured by Carl Zeiss Co., Ltd.), setting the voltage of 5 kV, an operation distance of 3 mm and an observation magnification of 200 times or 500 times, the cutting surface is observed. In this way, the widths and the depths of the first grooves 31 and the second grooves 51 can be measured. Additionally, an observation magnification standard at the time of shooting is polaroid 545. Also, the above-described method is one example, and an apparatus to be used or the measuring condition etc. can be arbitrarily determined in accordance with the shape and the configuration etc. of the sample.

Incidentally, the above-described liquid flow path portion 30 is formed on the upper surface 13a of each lower flow path wall portion 13 of the lower metallic sheet 10. On the other hand, in this embodiment, the lower surface 22a of each upper flow path wall portion 22 of the upper metallic sheet 20 is formed to be planar. Thereby, each of the first grooves 31 of the liquid flow path portion 30 is covered by the lower surface 22a which is planar. In this case, as shown in FIGS. 35 to 37, by the pair of side walls 35, 36 extending in the first groove direction d1 of the first grooves 31 and the lower surface 22a of each upper flow path wall portion 22, two corner portions 37 in a right angle or an acute angle can be formed, which can improve capillary action at the two corner portions 37. In other words, even when the cross section of each of the first grooves 31 is formed to be curved, capillary action can be improved at the corner portions 37.

In the same manner, each of the second grooves 51 of the liquid flow path portion 30 is covered by the planar lower surface 22a. In this case, as shown in FIGS. 35 and 37, by the pair of side walls 55, 56 extending in the second groove direction d2 of the second grooves 51 and the lower surface 22a of each upper flow path wall portion 22, two corner portions 57 in a right angle or an acute angle can be formed, which can improve capillary action at the two corner portions 57. In other words, even when the cross section of each of the second grooves 51 is formed to be curved, capillary action can be improved at the corner portions 57.

When the vapor chamber 1 is manufactured, the first grooves 31 and the second grooves 51 according to this embodiment can be formed similarly to the main flow grooves 31 and the communicating grooves 51 according to the first embodiment.

In a manner similar to the main flow grooves 31 and the communicating grooves 51 according to the first embodiment, the first grooves 31 and the second grooves 51 can smoothly transport the working fluid 2 in liquid form to the evaporating portion 11 by capillary action. Especially, at the liquid flow path portion 30, the first grooves 31 and the second grooves 51 intersect with each other. Thereby, the working fluid 2 in liquid form reciprocates between the first grooves 31 adjacent to each other via the second grooves 51, which inhibits occurrence of dryout in the first grooves 31. The working fluid 2 in liquid form reciprocates between the second grooves 51 adjacent to each other via the first grooves 31, which inhibits occurrence of dryout in the second grooves 51. Accordingly, capillary action is applied to the working fluid 2 in each of the first grooves 31 and each of the second grooves 51, so that the working fluid 2 is smoothly transported toward the evaporating portion 11.

Incidentally, a part of the working fluid 2 toward the evaporating portion 11 is drawn into the intersections P to be stored.

Here, when dryout occurs in the first grooves 31 or the second grooves 51, the working fluid 2 stored in the intersections P moves toward an occurrence portion of the dryout. More specifically, when the dryout occurs at the first grooves 31, the working fluid 2 moves to an occurrence portion of the dryout by capillary action of the first grooves 31 from the intersection P which is closest to the occurrence portion of the dryout. Thereby, the occurrence portion of the dryout is filled with the working fluid 2 to eliminate the dryout.

Also, in the first grooves 31 or the second grooves 51, when air bubbles are generated in the working fluid 2 in liquid form due to its vapor, the air bubbles are drawn into the intersections P at a downstream side (on a side of the evaporating portion 11) to be retained. Since the depth h23 of the intersections P is deeper than the depths h21, h22 of the first grooves 31 and the second grooves 51, bubbles drawn to the intersections P are inhibited from being transported from the intersections P to the first grooves 31 or the second grooves 51. Consequently, the air bubbles generated in the first grooves 31 or the second grooves 51 can be captured by the intersections P, which inhibits the flow of the working fluid 2 to the evaporating portion 11 from being blocked due to the air bubbles.

As described above, according to this embodiment, the lower metallic sheet 10 has the lower linear region 10R which linearly extends and is defined by a pair of outer edges 10x extending in the first direction X. The liquid flow path portion 30 in the lower linear region 10R includes a plurality of the first grooves 31 extending in the first groove direction d1 inclined with respect to the first direction X, and a plurality of the second grooves 51 extending in the second groove direction d2 inclined with respect to the first direction X. Thereby, the outer edges 10x of the lower metallic sheet 10 do not intersect with the first grooves 31, and the outer edges 10x do not intersect with the second grooves 51. This can prevent the vapor chamber 1 from being deformed to be bent on a line extending in the second direction Y.

According to this embodiment, the first groove direction d1 and the second groove direction d2 are directions different from each other. Thereby, the vapor chamber 1 can be prevented from being deformed to be bent on a line extending in the second direction Y, prevented from being deformed to be bent on a line extending in the first groove direction d1, and prevented from being deformed to be bent on a line extending in the second groove direction d2. Consequently, the first grooves 31 and the second grooves 51 of the liquid flow path portion 30 can be prevented from being crushed, and the flow path sectional area of the working fluid 2 in liquid form can be secured. As a result, the transport function of the working fluid 2 in liquid form can be improved, and thermal transport efficiency can be improved.

According to this embodiment, the first grooves 31 and the second grooves 51 intersect with each other at the intersections P. Thereby, the working fluid 2 in liquid form can reciprocate between the first grooves 31 adjacent to each other via the second grooves 51, and the working fluid 2 in liquid form can reciprocate between the second grooves 51 adjacent to each other via the first grooves 31. Consequently, occurrence of dryout in the first grooves 31 and the second grooves 51 can be inhibited. Accordingly, capillary action is applied to the working fluid 2 in each of the first grooves 31 and each of the second grooves 51, so that the working fluid 2 can be smoothly transported toward the evaporating portion 11.

According to this embodiment, the first groove 31 constituting one intersection P extends from one side of the reference line L extending in the first direction X to the other side while extending to one side in the first direction X, and the second groove 51 constituting the one intersection P extends from the other side of the reference line L to the one side while extending to one side in the first direction X. Thereby, with reference to the direction of inclination of the first grooves 31 from the reference line L, the direction of inclination of the second grooves 51 can be reversed. Consequently, the working fluid 2 in liquid form in the first grooves 31 and the second grooves 51 can be inhibited from being transported in a direction shifted with respect to the first direction X in which the reference line L extends, for example, in a shifted manner to one side with respect to the reference line L. Consequently, the working fluid 2 can be smoothly transported toward the evaporating portion 11. Especially, according to this embodiment, the first grooves 31 and the second grooves 51 are formed to be line-symmetric with respect to the reference line L. Thereby, the working fluid 2 in liquid form in the first grooves 31 and the second grooves 51 can be further inhibited from being transported in a direction shifted with respect to the first direction X, and the working fluid 2 can be more smoothly transported toward the evaporating portion 11.

In this embodiment, when seen from the second direction Y, the intersection P disposed between the liquid flow path convex portions 41a, 42a which are adjacent to each other and form certain convex arrays 41, 42 overlaps with the liquid flow path convex portions 41a, 42a forming other convex arrays 41, 42 adjacent to the convex arrays 41, 42. Thereby, the intersections P can be prevented from being formed continuously in the second direction Y. This can effectively prevent the vapor chamber 1 from being deformed to be bent on a line extending in the second direction Y.

This embodiment described above can be combined with at least one of the third to fifth embodiments described above. In other words, the liquid flow path portion 30 including the first grooves 31 and the second grooves 51 according to this embodiment is applicable to the liquid flow path portion 30 described in the third to fifth embodiments. In this case, as shown in FIGS. 20 to 25, the intermediate metallic sheet 70 has an intermediate linear region 70R which linearly extends and is defined by a pair of outer edges 70x extending in the first direction X. In the form shown in FIGS. 20 to 25, the intermediate metallic sheet 70 is formed to be rectangular as a whole in a planar view, and has four outer edges 70x, 70y which form the planar outline of the intermediate metallic sheet 70. Among these components, the two outer edges 70x extend in the first direction X, and the remaining two outer edges 70y extend in the second direction Y. In other words, the intermediate metallic sheet 70 according to the embodiments shown in FIGS. 20 to 25 is constituted by the intermediate linear region 70R as a whole. As shown in FIGS. 20 to 25, the outer edges 70x form the outer edges 1x (see FIG. 2) of the vapor chamber 1, together with the outer edges 10x of the lower metallic sheet 10 and the outer edges 20x of the upper metallic sheet 20. The outer edges 70y form the outer edges 1y of the vapor chamber 1, together with the outer edges 10y of the lower metallic sheet 10 and the outer edges 20y of the upper metallic sheet 20. Although the example in which the intermediate metallic sheet 70 is formed to be rectangular in a planar view is shown, no limitation thereto is required, and this sheet may have a planar shape similar to that in the lower metallic sheet 10 and the upper metallic sheet 20 as long as the linear region 70R is included.

Seventh Embodiment

Next, a vapor chamber, an electronic device, a metallic sheet for the vapor chamber and a manufacturing method of the vapor chamber according to a seventh embodiment of the present invention will be explained using FIGS. 38 and 39.

Figure 38:
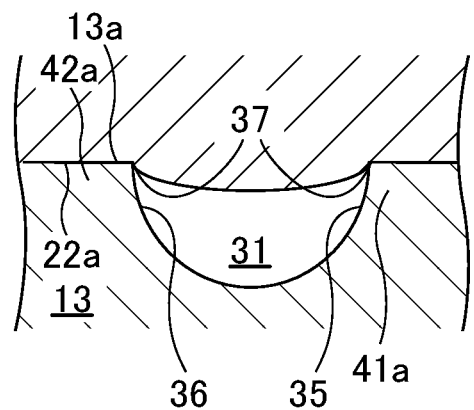
FIG. 38 is an enlarged cross-sectional view showing a first groove convex portion in the vapor chamber according to a seventh embodiment, corresponding to FIG. 36.
Figure 39:
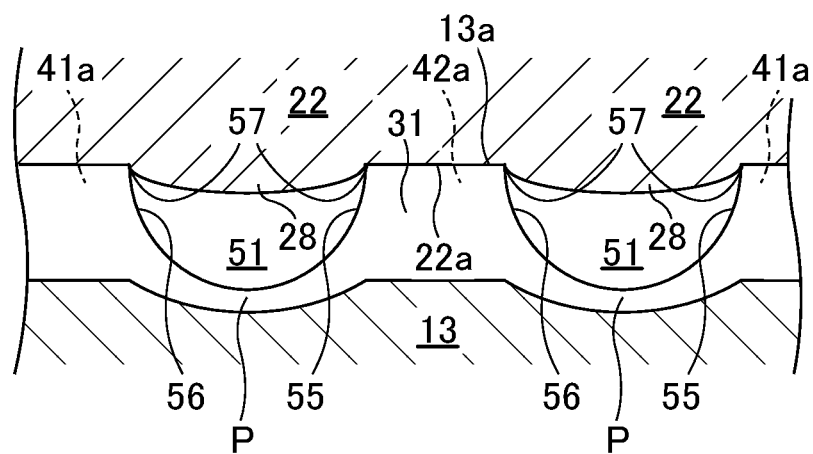
FIG. 39 is an enlarged cross-sectional view showing second groove convex portions in the vapor chamber according to the seventh embodiment, corresponding to FIG. 37.

In the seventh embodiment shown in FIGS. 38 and 39, a main difference is that a first groove convex portion protrudes in the first groove, and a second groove convex portion protrudes in the second groove, and the other configurations are substantially the same as in the sixth embodiment shown in FIGS. 34 to 37. Additionally, in FIGS. 38 and 39, the same components as those in the sixth embodiment shown in FIGS. 34 to 37 are assigned the same reference numerals, and a detailed explanation thereof is omitted.

As shown in FIG. 38, in this embodiment, the upper metallic sheet 20 includes a plurality of first groove convex portions 27 provided in the lower surface 20a. Each of the first groove convex portion 27 protrudes to the corresponding first groove 31 of the lower metallic sheet 10 from the lower surface 20a. A lower end of each first groove convex portion 27 is separated from the bottom portion of the first groove 31, so that the flow path of the working fluid 2 is secured. Each first groove convex portion 27 is formed to extend in the first groove direction d1.

A cross section of each first groove convex portion 27 is formed to be curved. Also, a lateral edge of each first groove convex portion 27 contacts or is close to the side walls 35, 36 of the first groove 31 as shown in FIG. 38. Thereby, the corner portions 37 formed by the side walls 35, 36 of the first grooves 31 and the lower surface 22a of each upper flow path wall portion 22 are formed to be wedge-shaped (or like an acute angle). In this way, a cross section of a flow path defined by the first grooves 31 and the first groove convex portions 27 (a cross section of in a direction orthogonal to the first groove direction d1) is formed in a crescent shape as shown in FIG. 38.

Also, as shown in FIG. 39, in this embodiment, the upper metallic sheet 20 includes a plurality of second groove convex portions 28 provided in the lower surface 20a. Each of the second groove convex portion 28 protrudes to the corresponding second groove 51 of the lower metallic sheet 10 from the lower surface 20a. A lower end of each second groove convex portion 28 is separated from the bottom portion of the second groove 51, so that the flow path of the working fluid 2 is secured. Each of the second groove convex portions 28 is formed to extend in the second groove direction d2. At the intersections P, the first groove convex portions 27 and the second groove convex portions 28 described above intersect with each other.

A cross section of each second groove convex portion 28 is formed to be curved in the same manner as each first groove convex portion 27. Also, a lateral edge of each second groove convex portion 28 contacts or is close to the side walls 55, 56 of the second grooves 51. Thereby, the corner portions 57 formed by the side walls 55, 56 of the second grooves 51 and the lower surface 22a of each upper flow path wall portion 22 is formed to be wedge-shaped (or like an acute angle). In this way, a cross section of a flow path defined by the second grooves 51 and the second groove convex portions 28 (a cross section in a direction orthogonal to the second groove direction d2) is formed in a crescent shape as shown in FIG. 39.

The first groove convex portions 27 and the second groove convex portions 28 are formed, for example, by half-etching of the upper metallic sheet 20 to form the upper flow path wall portions 22 etc., and then press working of the upper metallic sheet 20 alone. Alternatively, in the permanent joint step as shown in FIG. 14, a welding pressure to be applied to the lower metallic sheet 10 and the upper metallic sheet 20 is increased to form the first groove convex portions 27 and the second groove convex portions 28. In other words, by increasing the welding pressure, a part of each upper flow path wall portion 22 of the upper metallic sheet 20 can be inserted into the first grooves 31 and the second grooves 51. As a result, the first groove convex portions 27 and the second groove convex portions 28, having a curved cross section, can be formed.

As described above, according to this embodiment, each first groove convex portion 27 protrudes to one of the first grooves 31 of the lower metallic sheet 10 from the lower surface 20a of the upper metallic sheet 20. Thereby, the corner portions 37 formed by the side walls 35, 36 of the first grooves 31 and the lower surface 22a of each upper flow path wall portion 22 can be formed as a minute space defined by the side walls 35, 36 of the first grooves 31 and the first groove convex portions 27. This can improve capillary action at the corner portions 37. As a result, the transport function of the working fluid 2 in liquid form in each of the first grooves 31 can be improved, so that thermal transport efficiency can be improved. Especially, even in a case where the depth h23 of each intersection P is deeper than the depths h21, h22 of the first grooves 31 and the second grooves 51, a high thrust toward the evaporating portion 11 can be applied to the working fluid 2 in the first grooves 31 by capillary action due to the first groove convex portions 27. Consequently, the transport function of the working fluid 2 can be effectively improved.

Also, according to this embodiment, a cross section of the first groove convex portion 27 is formed to be curved.

Thereby, the corner portions 37 can have a shape like an end portion of the crescent shape. Consequently, capillary action at the corner portions 37 can be further improved.

Also, according to this embodiment, each second groove convex portion 28 protrudes to the second groove 51 of the lower metallic sheet 10 from the lower surface 20a of the upper metallic sheet 20. Thereby, the corner portions 57 formed by the side walls 55, 56 of the second grooves 51 and the lower surface 22a of each upper flow path wall portion 22 can be formed as a minute space defined by the side walls 55, 56 of the second grooves 51 and the second groove convex portions 28. This can improve capillary action at the corner portions 57. As a result, the transport function of the working fluid 2 in liquid form in each of the second grooves 51 can be improved, so that thermal transport efficiency can be improved. Especially, even in a case where the depth h23 of each intersection P is deeper than the depths h21, h22 of the first grooves 31 and the second grooves 51, a high thrust toward the evaporating portion 11 can be applied to the working fluid 2 in the second grooves 51 by capillary action due to the second groove convex portions 28. Consequently, the transport function of the working fluid 2 can be effectively improved.

Also, according to this embodiment, a cross section of the second groove convex portion 28 is formed to be curved. Thereby, the corner portions 57 can have a shape like an end portion of the crescent shape. Consequently, capillary action at the corner portions 57 can be further improved.

Additionally, in this embodiment described above, an example in which the cross section of the first grooves 31 and the cross section of the second grooves 51 are formed to be curved has been explained. However, not limited to this, the cross section of the first grooves 31 and the cross section of the second grooves 51 may be formed to be rectangular, although not shown. Also in this case, capillary action in the corner portions 37, 57 can be improved, so that the transport function of the working fluid 2 in liquid form in the first grooves 31 and the second grooves 51 can be improved. To make the cross section rectangular, the first grooves 31 and the second grooves 51 are preferably formed by press working or cutting work.

Eighth Embodiment

Next, a vapor chamber, an electronic device, a metallic sheet for the vapor chamber and a manufacturing method of the vapor chamber according to an eighth embodiment of the present invention will be explained using FIG. 40.

Figure 40:
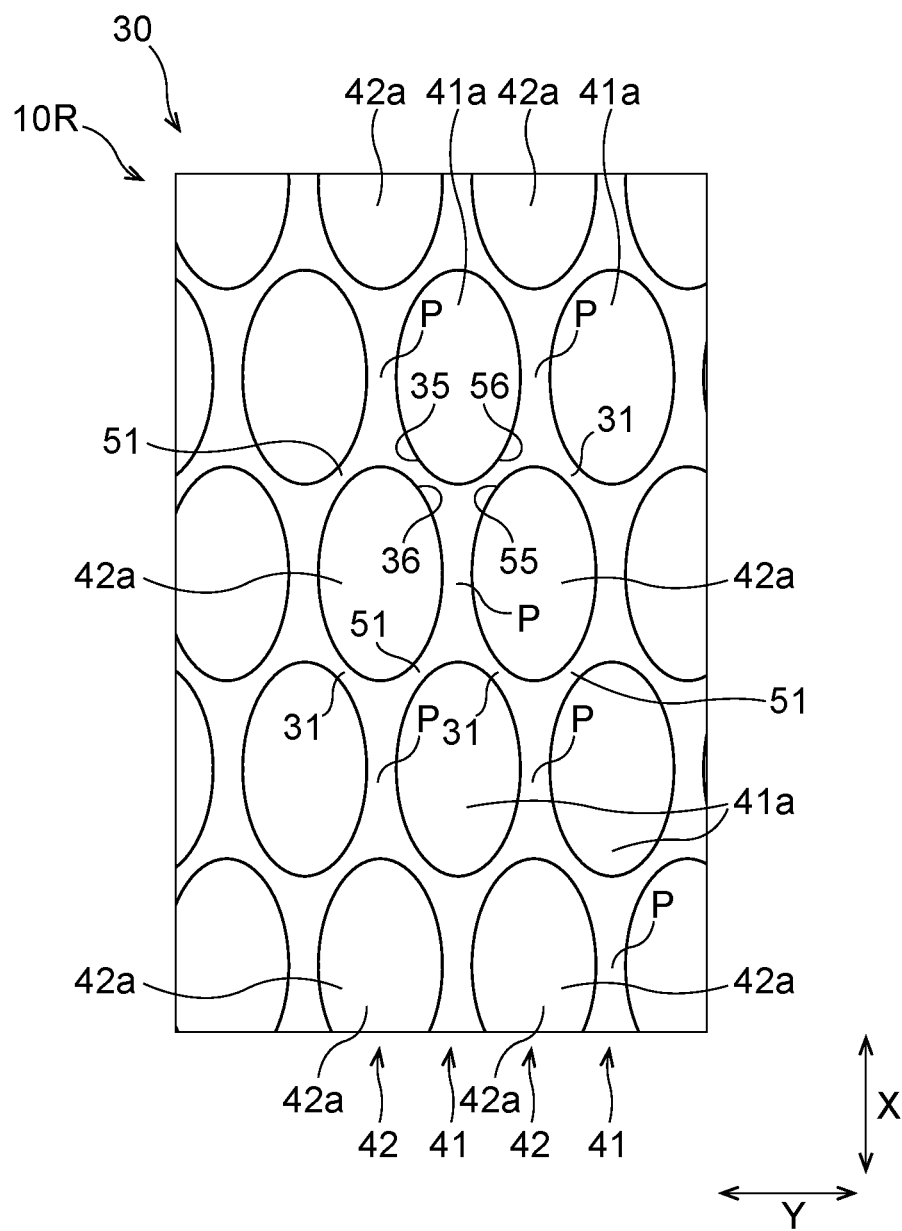
FIG. 40 is an enlarged top view showing liquid flow path portions of a vapor chamber according to an eighth embodiment.

In the eighth embodiment shown in FIG. 40, the planar shape of the liquid flow path convex portion is different mainly in that the shape is elliptic or circular, the other configurations are substantially the same as in the sixth embodiment shown in FIGS. 34 to 37. Additionally, in FIG. 40, the same components as those in the sixth embodiment shown in FIGS. 34 to 37 are assigned the same reference numerals, and a detailed explanation thereof is omitted.

As shown in FIG. 40, in this embodiment, when seen from the second direction Y, in the lower linear region 10R, in regions between the liquid flow path convex portions 41a, 42a which are adjacent to each other and form certain convex arrays 41, 42, the liquid flow path convex portions 41a, 42a forming other convex arrays 41, 42 adjacent to the convex arrays 41, 42 are disposed. In other words, in regions (intersections P) between the liquid flow path convex portions 41a which are adjacent to each other and form the certain convex array 41, the liquid flow path convex portions 42a forming the other convex array 42 adjacent to the convex array 41 are disposed. With the intersection P between the liquid flow path convex portions 41a adjacent to each other in the first direction X, the liquid flow path convex portion 42a adjacent to the intersection P overlaps. In regions (intersections P) between the liquid flow path convex portions 42a which are adjacent to each other and form the certain convex array 42, the liquid flow path convex portions 41a forming the other convex array 41 adjacent to the convex array 42 are disposed. With the intersection P between the liquid flow path convex portions 42a adjacent to each other in the first direction X, the liquid flow path convex portion 41a adjacent to the intersection P overlaps.

The planar shapes of the liquid flow path convex portions 41a, 42a are elliptic or circular. FIG. 40 shows an example in which the planar shapes of the liquid flow path convex portions 41a, 42a are elliptic or circular. The liquid flow path convex portions 41a, 42a having elliptic shapes are disposed to have a staggered arrangement.

The first grooves 31 and the second grooves 51 constituting the liquid flow path portions 30 are formed between the liquid flow path convex portions 41a, 42a adjacent to each other. In this embodiment, the first grooves 31 and the second grooves 51 are formed to be along the shapes of the adjacent liquid flow path convex portions 41a, 42a.

As described above, according to this embodiment, in the lower linear region 10R, when seen from the second direction Y, in regions between the liquid flow path convex portions 41a, 42a which are adjacent to each other and form certain convex arrays 41, 42, the liquid flow path convex portions 41a, 42a forming other convex arrays 41, 42 adjacent to the convex arrays 41, 42 are disposed. In this case, the first grooves 31 and the second grooves 51 can be inhibited from continuously extending in the second direction Y. This can prevent the vapor chamber 1 from being deformed to be bent on a line extending in the second direction Y. Consequently, the first grooves 31 and the second grooves 51 of the liquid flow path portion 30 can be prevented from being crushed, and the flow path sectional area of the working fluid 2 in liquid form can be secured. As a result, the transport function of the working fluid 2 in liquid form can be improved, and thermal transport efficiency can be improved.

According to this embodiment, the planar shapes of the liquid flow path convex portions 41a, 42a are elliptic or circular. Thereby, the side walls 35, 36 of the first grooves 31 and the side walls 55, 56 of the second grooves 51 of the liquid flow path portion 30 provided between the liquid flow path convex portions 41a, 42a adjacent to each other can be formed to be an elliptical arc or a circular arc so as to be along the shapes of the liquid flow path convex portions 41a, 42a. Consequently, the flow path resistance of the working fluid 2 in liquid form in the first grooves 31 and the second grooves 51 can be reduced. Consequently, the working fluid 2 can be smoothly transported toward the evaporating portion 11.

Also in this embodiment described above, the upper metallic sheet 20 may have a plurality of first groove convex portions 27 similar to those in the second embodiment. The upper metallic sheet 20 may include a plurality of second groove convex portions 28 similar to those in the second embodiment.

Ninth Embodiment

Next, a vapor chamber, an electronic device, a metallic sheet for the vapor chamber and a manufacturing method of the vapor chamber according to a ninth embodiment of the present invention will be explained using FIGS. 41 and 42.

Figure 41:
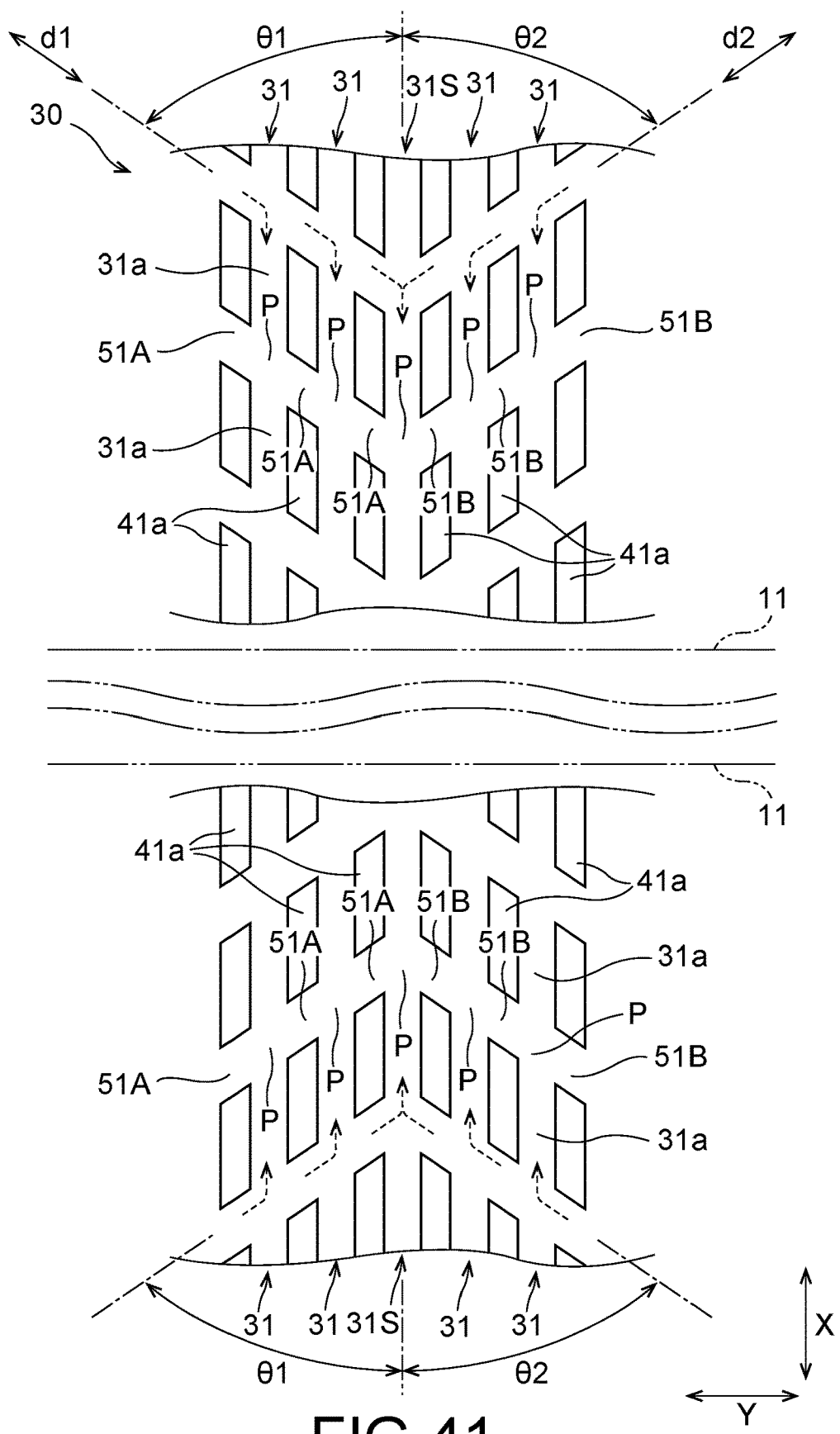
FIG. 41 is an enlarged top view showing liquid flow path portions of a vapor chamber according to a ninth embodiment.
Figure 42:
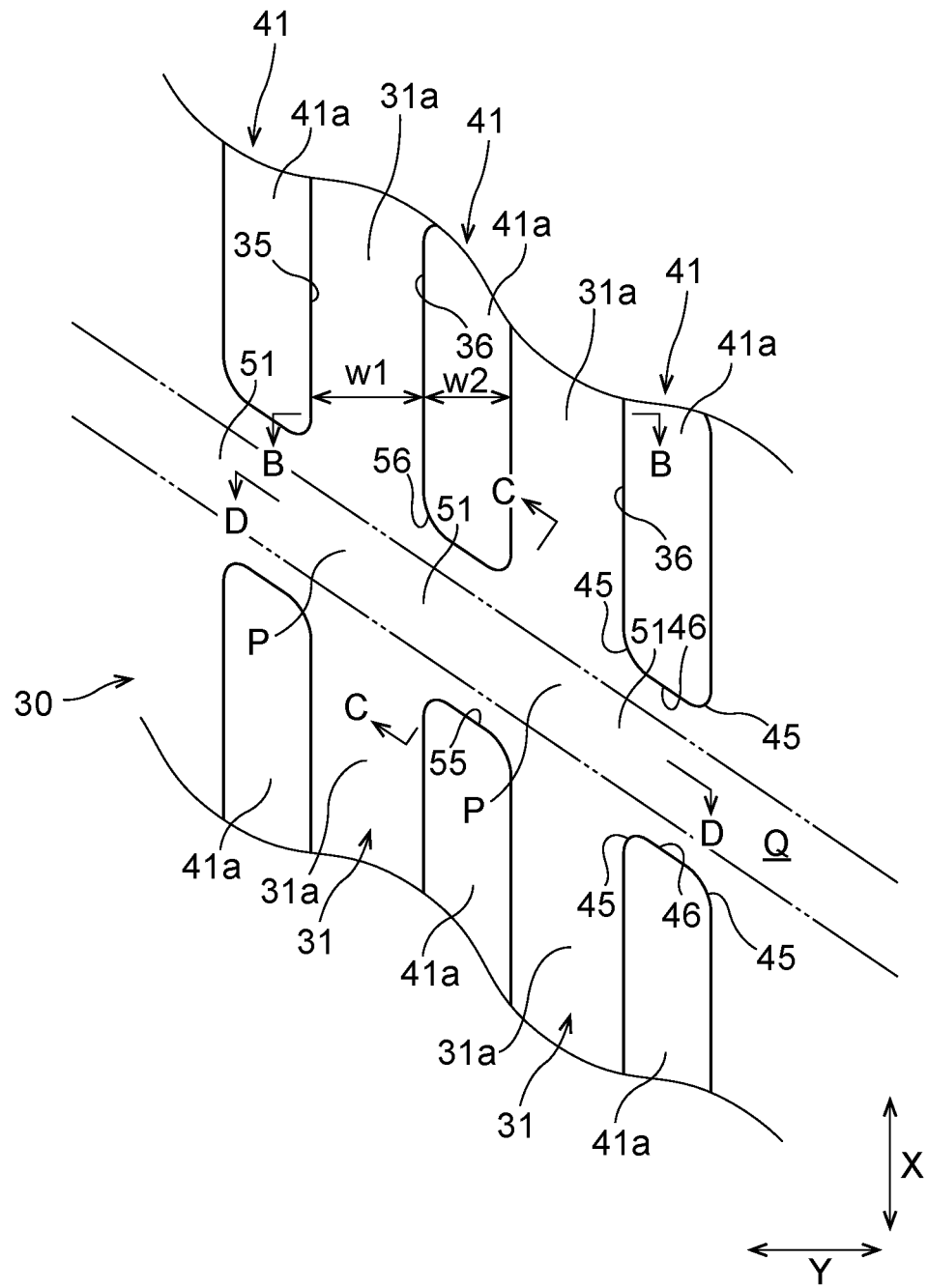
FIG. 42 is an enlarged top view showing the liquid flow path portion of FIG. 41 in a further enlarged manner.

In the ninth embodiment shown in FIGS. 41 and 42, a main difference is that first communicating grooves extend in a direction inclined with respect to the first direction so as to extend to one side in the first direction while extending toward a reference main flow groove, and second communicating grooves extend in a direction inclined with respect to the first direction so as to extend to the one side in the first direction while extending toward the reference main flow groove, and the other configurations are substantially the same as in the first embodiment shown in FIGS. 1 to 17. Additionally, in FIGS. 41 and 42, the same components as those in the first embodiment shown in FIGS. 1 to 17 are assigned the same reference numerals, and a detailed explanation thereof is omitted.

A liquid flow path portion of a typical vapor chamber includes a plurality of main flow grooves extending in the first direction. A working fluid in liquid form condensed from a vapor in the vapor flow path portion enters main flow grooves through communicating grooves extending in a second direction orthogonal to a first direction, and due to capillary action of the main flow grooves, thrust toward an evaporating portion is obtained. In this way, the working fluid passes through the main flow grooves toward the evaporating portion. Also, the working fluid can reciprocate between the main flow grooves adjacent to each other by a plurality of the communicating grooves. In this way, at the liquid flow path portion, a plurality of the main flow grooves and the plurality of communicating grooves are formed to have a lattice shape, whereby the working fluid is evenly distributed in the liquid flow path portion.

However, in a case where the main flow grooves and the communicating grooves are orthogonal to each other, the flow resistance when the working fluid condensed from the vapor flows from the communicating grooves to the main flow grooves increases. Thereby, it is difficult to allow a smooth flow from the communicating grooves to the main flow grooves. In this case, the amount of the working fluid entering the main flow grooves decreases. Consequently, the amount of transport of the working fluid to the evaporating portion decreases, which causes a problem of reduction in thermal transport efficiency.

The ninth embodiment is made considering this point, and has an object to provide a vapor chamber, an electronic device, a metallic sheet for the vapor chamber, and a manufacturing method of the vapor chamber which can improve the transport function of the working fluid in liquid form and improve the thermal transport efficiency. Consequently, this embodiment is not limited to that the width of the communicating groove is larger than the width of the main flow groove.

This embodiment mainly corresponds to the twenty-first solution to the twenty-fifth solution described above. Hereinafter, this embodiment will be explained with reference to drawings.

As shown in FIG. 41, the liquid flow path portion 30 according to this embodiment includes a plurality of main flow grooves 31. The main flow grooves 31 respectively extend in the first direction X to allow the working fluid 2 in liquid form to pass through, and are arranged at different positions in the second direction Y described above. The main flow grooves 31 are configured to mainly transport the working fluid 2, condensed from the vapor generated at the evaporating portion 11, to the evaporating portion 11.

A convex array 41 is provided between a pair of main flow grooves 31 adjacent to each other. The convex array 41 includes a plurality of liquid flow path convex portions 41a arranged in the first direction X. In the convex arrays 41, the liquid flow path convex portions 41a are arranged at a constant pitch in the first direction X. The liquid flow path convex portions 41a of one convex array 41 and the liquid flow path convex portions 41a of another convex array 41 are arranged at positions different in the first direction X.

Each communicating groove 51 is interposed between the first convex portions 41a adjacent to each other. Each communicating groove 51 communicates with the corresponding pair of main flow grooves 31 (the main flow grooves 31 adjacent to each other in the right and left direction in FIG. 41) to allow the working fluid 2 to reciprocate between the main flow grooves 31. The communicating groove 51 is a region between the liquid flow path convex portions 41a adjacent to each other in the first direction X, and is a region between a pair of main flow grooves 31 adjacent to each other in the second direction Y.

The communicating grooves 51 are inclined with respect to the first direction X and with respect to the second direction Y. In this embodiment, the communicating grooves 51 are formed to be line-symmetric with respect to one main flow groove 31. The shapes of the communicating grooves 51 will hereinafter be explained in more detail.

The main flow grooves 31 include one reference main flow groove 31S. In other words, one main flow groove 31 among a plurality of the main flow grooves 31 is the reference main flow groove 31S. The reference main flow groove 31S may be a main flow groove 31 positioned at the center of the plurality of main flow grooves 31 existing in the liquid flow path portion 30 in the second direction Y.

The communicating grooves 51 existing in the liquid flow path portion 30 include the first communicating grooves 51A disposed on one side (left in FIG. 41) with respect to the reference main flow groove 31S, and the second communicating grooves 51B disposed on the other side (right in FIG. 41) with respect to the reference main flow groove 31S.

The first communicating grooves 51A extend in a direction inclined with respect to the first direction X so as to extend to one side in the first direction X while extending toward the reference main flow groove 31S. In a region of the first communicating grooves 51A shown in FIG. 41 above the evaporating portion 11, the first communicating grooves 51A linearly extend to the lower right in an inclined manner and form an angle $\theta 1$ from the first direction X. In the same manner, in a region of the first communicating grooves 51A shown in FIG. 41 below the evaporating portion 11, the first communicating grooves 51A linearly extend to the upper right in an inclined manner and form an angle $\theta 1$ from the first direction X. The first communicating grooves 51A are aligned in the direction in which the first communicating grooves 51A extend (the first communicating groove direction d1 forming an angle $\theta 1$ from the first direction X). The angle $\theta 1$ is, for example, 30° to 60°.

The second communicating grooves 51B extend in a direction inclined with respect to the first direction X so as to extend to one side in the first direction X while extending toward the reference main flow groove 31S. In a region of the second communicating grooves 51B shown in FIG. 41 above the evaporating portion 11, the second communicating grooves 51B linearly extend to the lower left in an inclined manner and form an angle $\theta 2$ from the first direction X. In the same manner, in a region of the second communicating grooves 51B shown in FIG. 41 below the evaporating portion 11, the second communicating grooves 51B linearly extend to the upper left in an inclined manner and form an angle $\theta 2$ from the first direction X. The second communicating grooves 51B are aligned in the direction in which the second communicating grooves 51B extend (the second communicating groove direction d2 forming an angle θ2 from the first direction X). The angle θ2 is, for example, 30° to 60°.

The first communicating grooves 51A and the second communicating grooves 51B are preferably formed to be toward the evaporating portion 11. In the example shown in FIG. 41, the first communicating grooves 51A and the second communicating grooves 51B existing below the evaporating portion 11, and the first communicating grooves 51A and the second communicating grooves 51B existing above the evaporating portion 11 are formed to be toward the evaporating portion 11. According to such a configuration, the first communicating grooves 51A and the second communicating grooves 51B are configured to guide the flow of the working fluid 2 in liquid form such that the working fluid 2 has a velocity component toward the evaporating portion 11.

In the example shown in FIG. 41, the first communicating grooves 51A and the second communicating grooves 51B are formed to be line-symmetric with respect to the reference main flow groove 31S. That is, the above-described angle θ1 and angle θ2 are equal to each other, and the array of the first communicating grooves 51A and the array of the second communicating grooves 51B form V-shapes. In this case, the liquid flow path convex portions 41a are formed to be line-symmetric with respect to the reference main flow groove 31S. The planar shape of each of the liquid flow path convex portions 41a is a parallelogram.

As shown in FIGS. 41 and 42, each main flow groove 31 includes intersections P communicating with the corresponding communicating grooves 51, and main flow groove main bodies 31a.

Among these components, at the intersections P, a pair of the communicating grooves 51 disposed on both sides of the main flow grooves 31 in the second direction Y communicate with the main flow groove 31. The intersection P is a region between the main flow groove main bodies 31a adjacent to each other in the first direction X, and is a region between the communicating grooves 51 adjacent to each other in the second direction Y. In other words, at the regions, the intersection P is a region in which the arrays of main flow grooves 31 and communicating grooves 51 intersect (that is, overlap).

The main flow groove main bodies 31a are disposed at positions different from those of the intersections P in the first direction X, and are portions positioned between the liquid flow path convex portions 41a adjacent to each other in the second direction Y. The intersections P and the main flow groove main bodies 31a are alternately arranged.

The width w1 of the main flow grooves 31, the width w2 of the liquid flow path convex portions 41a, and the width w3 of the communicating grooves 51 according to this embodiment may be similar to those in the first embodiment. Additionally, in this embodiment, the width w3 of the communicating grooves 51 corresponds to the dimension in the direction orthogonal to the directions d1 and d2 extending in the communicating grooves 51. The depth h21 of the main flow grooves 31 and the depth h23 of the communicating grooves 51 according to this embodiment may be the similar to those in the first embodiment. The cross sectional shape of the main flow grooves 31, and the cross sectional shape of the communicating grooves 51 according to this embodiment may be similar to those in the first embodiment. Additionally, in this embodiment, the cross section of the communicating grooves 51 corresponds to the cross section in the direction orthogonal to the directions d1 and d2 extending in the communicating grooves 51.

Incidentally, in FIG. 42, each of the liquid flow path convex portions 41a is formed to have a parallelogram shape along the first direction X in a planar view in a large sense. Over the entire liquid flow path portion 30, the liquid flow path convex portions 41a may be formed to have a similar form. However, a rounded curved portion 45 is provided at a corner portion of each of the liquid flow path convex portions 41a. Thereby, each of the corner portions of the liquid flow path convex portion 41a is formed to be smoothly curved, which reduces the flow path resistance of the working fluid 2 in liquid form. Additionally, such an example is shown that two curved portions 45 are respectively provided at right and left end portions in FIG. 42 of the liquid flow path convex portions 41a, and a linear portion 46 is provided between the two curved portions 45. Consequently, the width w3 of each communicating groove 51 is the distance between the linear portions 46 of the liquid flow path convex portions 41a adjacent to each other in the first direction X. Although not shown in the drawing, the same is applied to a case where no curved portion 45 is formed at the corner portions of each of the convex portions 41a. However, the shape of end portions of the liquid flow path convex portions 41a is not limited to this. For example, instead of providing the linear portions 46 at the right and left end portions respectively, the entire end portion may be curved (for example, semicircular). In such a case, the width w3 of each of the communicating grooves 51 is the smallest distance between the liquid flow path convex portions 41a adjacent to each other in the direction orthogonal to the directions d1 and d2 in which the communicating grooves 51 extend.

In this embodiment, the method of confirming the width and depth of the main flow grooves 31, and the width and depth of the communicating grooves 51 from the vapor chamber 1 in a finished form may be similar to those in the first embodiment. Especially, after embedded in resin, the square piece is polished in plane directions by buffing or the like, and the pitch and extending directions d1, d2 of the communicating grooves 51 are specified. Alternatively, after these are specified using an X-ray CT, a square piece may be cut out and embedded in resin. Subsequently, the square piece or another square piece may be subjected to a trimming process with a diamond knife so as to achieve a desired cross section along the extending directions d1 and d2 of the communicating grooves 51.

When the vapor chamber 1 according to this embodiment is operated, the working fluid 2 in liquid form attached to the wall surfaces of each of the vapor flow path recesses 12, 21 passes through each of the communicating grooves 51 to smoothly enter each of the main flow grooves 31.

The first communicating grooves 51A is inclined so as to extend to the one side (the side of the evaporating portion 11) in the first direction X while extending toward the reference main flow grove 31S. Thereby, the working fluid 2 in liquid form flowing in the first communicating grooves 51A is allowed to have a velocity component in a direction toward the evaporating portion 11. The second communicating grooves 51B is inclined so as to extend to the one side (the side of the evaporating portion 11) in the first direction X while extending toward the reference main flow groove 31S. Thereby, the working fluid 2 in liquid form flowing in the second communicating grooves 51B is allowed to have a velocity component in a direction toward the evaporating portion 11. Consequently, the working fluid 2 is allowed to easily enter the main flow grooves 31 from the communicating grooves 51. This can enhance the flow of the working fluid 2 in the main flow grooves 31 toward the evaporating portion 11, and improve the transport function of the working fluid 2.

At the intersections P of the reference main flow groove 31S, the working fluid 2 flowing in the first communicating grooves 51A and the working fluid 2 flowing in the second communicating grooves 51B converge. Thereby, the velocity component in the second direction Y that the working fluid 2 has is lost. Consequently, the velocity component that is in the direction toward the evaporating portion 11 and is present during flowing in the communicating grooves 51, allows the working fluid 2 to enter the main flow grooves 31 easily. This point can also enhance the flow of the working fluid 2 in the main flow grooves 31 toward the evaporating portion 11, and improve the transport function of the working fluid 2.

In this way, the working fluid 2 in liquid form enters each main flow groove 31 and each communicating groove 51, and each main flow groove 31 and each communicating groove 51 are filled with the working fluid 2 in liquid form. Consequently, due to capillary action of each of the main flow grooves 31, the working fluid 2 which is filled obtains thrust toward the evaporating portion 11, and is smoothly transported to the evaporating portion 11.

As described above, according to this embodiment, the first communicating grooves 51A is inclined with respect to the first direction X so as to extend to one side in the first direction X while extending toward the reference main flow groove 31S, and the second communicating grooves 51B is inclined with respect to the first direction X so as to extend to the one side in the first direction X while extending toward the reference main flow groove 31S. Thereby, the working fluid 2 in liquid form flowing in each communicating groove 51 is allowed to have a velocity component in the direction toward the one side in the first direction X. Consequently, the working fluid 2 is allowed to easily enter the main flow grooves 31 from the communicating grooves 51. As a result, the transport function of the working fluid 2 can be improved, and thermal transport efficiency can be improved.

According to this embodiment, as described above, the first communicating grooves 51A and the second communicating grooves 51B are inclined with respect to the first direction X. Thereby, the outer edges 1x, 1y (see FIG. 2) forming the planar outline of the vapor chamber 1, and each communicating groove 51 do not intersect with each other. In this case, the vapor chamber 1 can be prevented from being deformed to be bent on the line extending in the second direction Y, and the mechanical strength of the vapor chamber 1 can be improved. Also, the vapor chamber 1 can be prevented from being bent and deformed. Accordingly, each of the grooves 31, 51 of the liquid flow path portion 30 can be prevented from being crushed. Especially, according to this embodiment, the first communicating groove direction d1 in which the first communicating grooves 51A extend and the second communicating groove direction d2 in which the second communicating grooves 51B extend are different from each other at the reference main flow groove 31S as a boundary. Accordingly, it can be regarded that the vapor chamber 1 can be further prevented from being bent.

According to this embodiment, the first communicating grooves 51A and the second communicating grooves 51B are formed to be line-symmetric with respect to the reference main flow groove 31S. Thereby, the ease of entry of the flow of the working fluid 2 from the first communicating grooves 51A to the main flow grooves 31, and the ease of entry of the flow of the working fluid 2 from the second communicating grooves 51B to the main flow grooves 31 can be equalized. As a result, as the entire liquid flow path portion 30, the transport function of the working fluid 2 can be improved. Especially, according to this embodiment, the first communicating grooves 51A are aligned in the first communicating groove direction d1, and the second communicating grooves 51B are aligned in the second communicating groove direction d2. Thereby, as the entire liquid flow path portion 30, the transport function of the working fluid 2 can be further improved.

This embodiment described above can be combined with the second embodiment described above. In other words, the main flow groove convex portion 27 and the communicating groove convex portion 28 are applicable to the liquid flow path portion 30 which includes the main flow grooves 31 and the communicating grooves 51 according to this embodiment. This embodiment described above can be combined with at least one of the third to fifth embodiments described above. In other words, the liquid flow path portion 30 including the main flow grooves 31 and the communicating grooves 51 according to this embodiment is applicable to the liquid flow path portion 30 described in the third to fifth embodiments.

Tenth Embodiment

Next, a vapor chamber, an electronic device, a metallic sheet for the vapor chamber and a manufacturing method of the vapor chamber according to a tenth embodiment of the present invention will be explained using FIGS. 43 to 56.

In the tenth embodiment shown in FIGS. 43 to 56, a main difference is that the width of the injection flow path recess is wider than the width of the vapor passage, the other configurations are substantially the same as in the first embodiment shown in FIGS. 1 to 17. Additionally, in FIGS. 43 to 56, the same components as those in the first embodiment shown in FIGS. 1 to 17 are assigned the same reference numerals, and a detailed explanation thereof is omitted.

In the planar vapor chamber, such as a typical vapor chamber, the metallic sheet is provided with an injection path for allowing the working fluid to be injected after deaeration. However, if the width of the injection path is narrower than the vapor passage or the groove of wick as with the sheet type heat pipe described in Patent Literature 4 for example, a problem occurs in that operations of deaeration in the vapor chamber and injection of the working fluid into the vapor chamber require time, and the operability decreases.

The tenth embodiment is made considering this point, and has an object to provide a vapor chamber, an electronic device, and a metallic sheet for the vapor chamber which can perform an operation of deaeration in the vapor chamber and an operation of injecting the working fluid into the vapor chamber in a short time. Consequently, this embodiment is not limited to that the width of the communicating groove is larger than the width of the main flow groove.

This embodiment, and eleventh and twelfth embodiments which will be described later mainly correspond to the twenty-sixth solution to the twenty-ninth solution. Hereinafter, this embodiment will be explained with reference to drawings.

Figure 43:
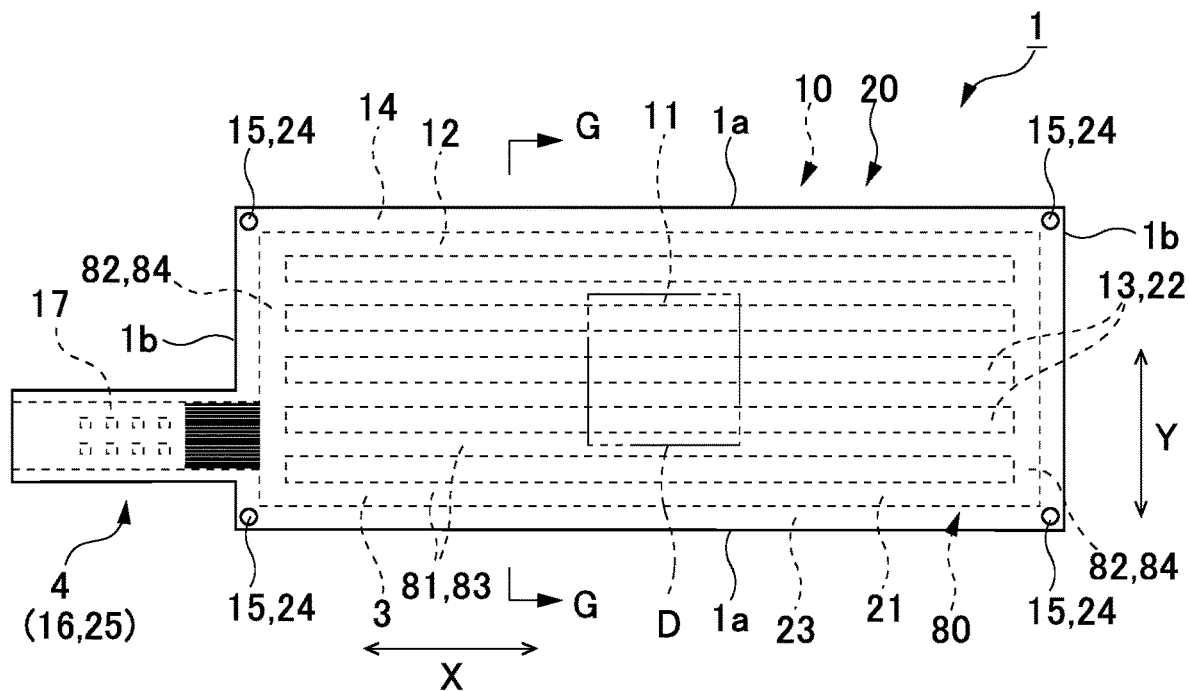
FIG. 43 is a top view showing a vapor chamber according to a tenth embodiment.
Figure 44:
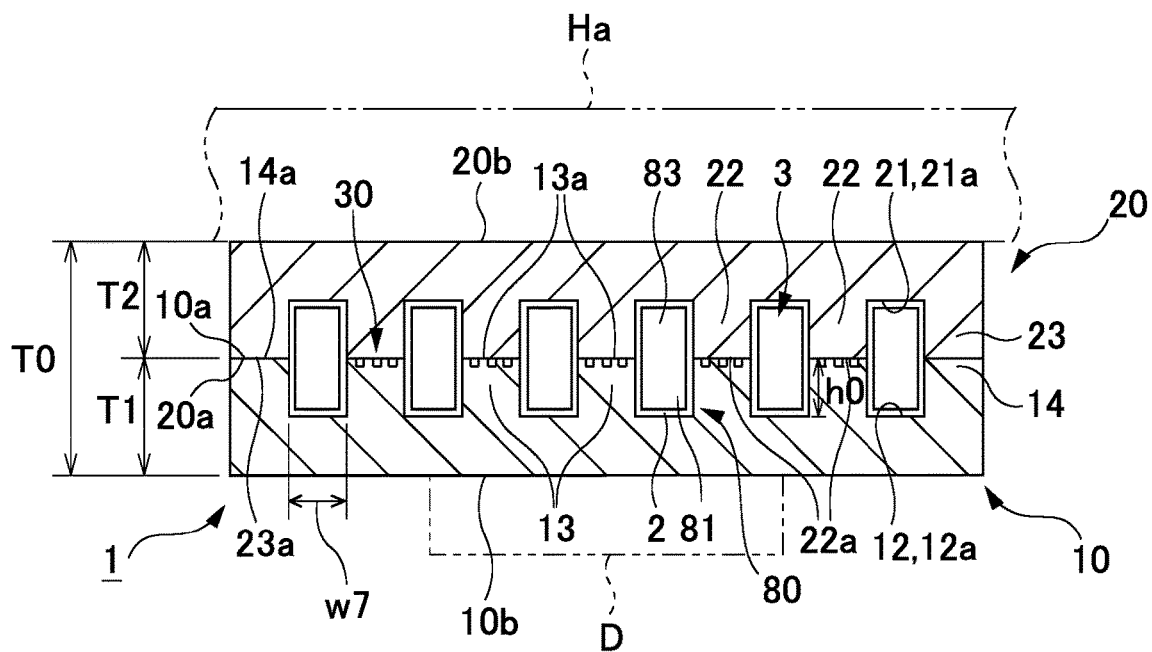
FIG. 44 is a cross-sectional view showing the vapor chamber of FIG. 43 taken along the line G-G.

As shown in FIGS. 43 and 44, the vapor chamber 1 includes a lower metallic sheet 10 (a first metallic sheet or a second metallic sheet, and a metallic sheet for the vapor chamber) and an upper metallic sheet 20 (the second metallic sheet or the first metallic sheet, a metallic sheet for the vapor chamber) laminated on the lower metallic sheet 10. In this embodiment, the upper metallic sheet 20 is provided on the lower metallic sheet 10. The lower metallic sheet 10 includes an upper surface 10*a* (first surface) and a lower surface 10*b* (second surface) provided on an opposite side from the upper surface 10*a*. The upper metallic sheet 20 includes a lower surface 20*a* (a surface nearer to the lower metallic sheet 10) layered on the upper surface 10*a* of the lower metallic sheet 10 (a surface nearer to the upper metallic sheet 20) and an upper surface 20*b* provided on an opposite side from the lower surface 20*a*. The device D which is an object of cooling is attached to the lower surface 10*b* of the lower metallic sheet 10 (especially, a lower surface of an evaporating portion 11 which will be described later).

The sealed space 3 in which the working fluid 2 is enclosed is formed between the lower metallic sheet 10 and the upper metallic sheet 20. In this embodiment, the sealed space 3 includes a vapor flow path portion 80 through which a vapor of the working fluid 2 mainly passes (a lower vapor flow path recess 12 and an upper vapor flow path recess 21 which will be described later) and a liquid flow path portion 30 through which the working fluid 2 in liquid form mainly passes. As examples of the working fluid 2, pure water, ethanol, methanol and acetone etc. can be listed.

The lower metallic sheet 10 and the upper metallic sheet 20 are joined by diffused junction which will be described later. In the embodiment shown in FIGS. 43 and 44, portions of the lower metallic sheet 10 and the upper metallic sheet 20 except the injection portion 4 which will be described later are formed to be rectangular in a planar view. However, the formation is not limited thereto. Here, the planar view is a state seen in a direction which is orthogonal to a surface at which the vapor chamber 1 receives heat from the device D (the lower surface 10*b* of the lower metallic sheet 10) as well as a surface at which the received heat is released (the upper surface 20*b* of the upper metallic sheet 20), and for example, this corresponds to a state that the vapor chamber 1 is seen from an upper side (see FIG. 43) or seen from a lower side.

Additionally, when the vapor chamber 1 is installed in the mobile terminal, depending on an attitude of the mobile terminal, the vertical relationship between the lower metallic sheet 10 and the upper metallic sheet 20 may be changed. However, in this embodiment, for convenience, a metallic sheet which receives heat from the device D is called the lower metallic sheet 10, while a metallic sheet which releases the received heat is called the upper metallic sheet 20, and an explanation will be made in a state that the lower metallic sheet 10 is disposed at the lower side and the upper metallic sheet 20 is disposed at the upper side.

Also, as shown in FIG. 43, the vapor chamber 1 further includes an injection portion 4 for pouring the working fluid 2 in the sealed space 3 at one of a pair of end portions in the first direction X. The injection portion 4 includes the lower injection protruding portion 16 laterally protruding from the end surface (the surface corresponding to the outer edges 1*y* in FIG. 43) of the lower metallic sheet 10, and the upper injection protruding portion 25 laterally protruding from the end surface (the surface corresponding to the outer edges 1*y* in FIG. 43) of the upper metallic sheet 20. Among these components, on the upper surface (the surface corresponding to the upper surface 10*a* of the lower metallic sheet 10) of the lower injection protruding portion 16, the lower injection flow path recess 17 (injection flow path recess) is formed (see FIG. 45). On the other hand, on the lower surface (the surface corresponding to the lower surface 20*a* of the upper metallic sheet 20) of the upper injection protruding portion 25, no recess is formed, and the upper injection protruding portion 25 has the same thickness as an unprocessed metal material sheet (a metal material sheet M which will be described later) (see FIG. 46). The inner end (an end on a side of the sealed space 3) of the lower injection flow path recess 17 communicates with the lower vapor flow path recess 12, and the outer end (an end on a side opposite to the sealed space 3) of the lower injection flow path recess 17 is opened to the outside. The lower injection flow path recess 17 and the upper injection protruding portion 25 integrally form an injection flow path of the working fluid 2 when the lower metallic sheet 10 and the upper metallic sheet 20 are joined. The working fluid 2 passes through the injection flow path and is poured into the sealed space 3. Additionally, in this embodiment, while an example in which the injection portion 4 is provided at one of the pair of end portions of the vapor chamber 1 in the first direction X, this is not restrictive. The injection portion 4 may be provided at any position. Two or more injection portions 4 may be provided.

Figure 45:
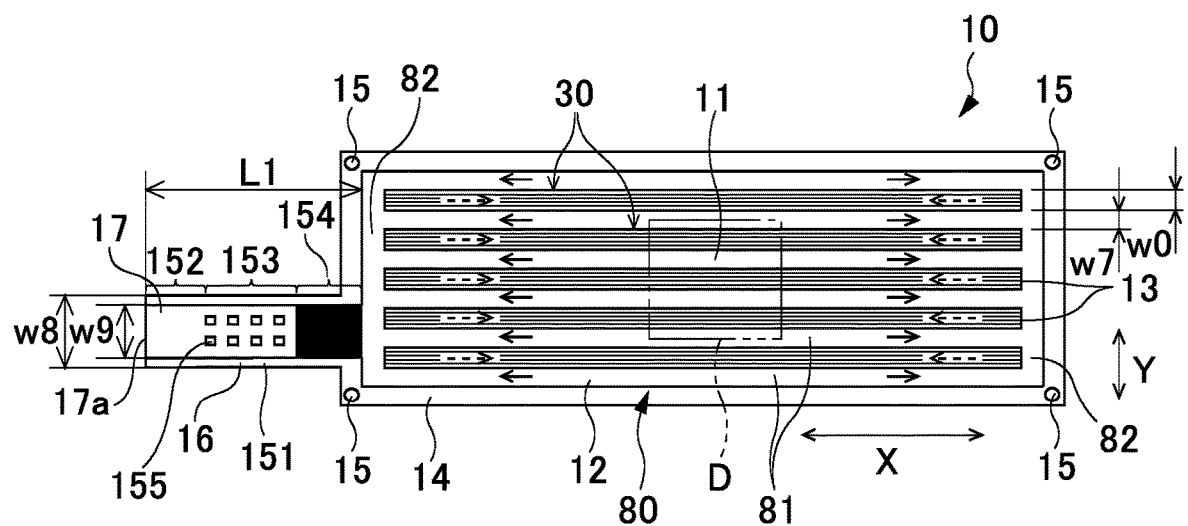
FIG. 45 is a top view showing a lower metallic sheet of the vapor chamber of FIG. 43.

Next, the configuration of the lower metallic sheet 10 will be described. As shown in FIG. 45, the lower metallic sheet 10 includes the evaporating portion 11 in which the working fluid 2 evaporates to generate a vapor, and the lower vapor flow path recess 12 (first vapor flow path portion) provided in the upper surface 10*a* and formed to be rectangular in a planar view. Among these components, the lower vapor flow path recess 12 constitutes a part of the sealed space 3 described above, and is mainly configured such that the vapor generated in the evaporating portion 11 passes.

The evaporating portion 11 is disposed in the lower vapor flow path recess 12. The vapor in the lower vapor flow path recess 12 is diffused in a direction away from the evaporating portion 11, and most of the vapor is transported to a peripheral portion with a relatively low temperature. Additionally, the evaporating portion 11 is a portion at which the working fluid 2 in the sealed space 3 evaporates by receiving heat from the device D attached to the lower surface 10*b* of the lower metallic sheet 10. Consequently, the term of the evaporating portion 11 is not a concept limited to a portion overlapped with the device D, and is used as a concept including a portion which is not overlapped with the device D but allows the working fluid 2 to evaporate. Here, the evaporating portion 11 can be provided at any portion of the lower metallic sheet 10. However, in FIGS. 43 and 45, an example in which the evaporating portion 11 is provided at a center portion of the lower metallic sheet 10 is shown. In this case, an operation of the vapor chamber 1 can be stabilized regardless of the attitude of the mobile terminal in which the vapor chamber 1 is installed.

As shown in FIGS. 44 and 45, in this embodiment, a plurality of lower flow path wall portions 13 (first flow path protruding portions) protruding upward from a bottom surface 12*a* (which will be described later) of the lower vapor flow path recess 12 (a direction orthogonal to the bottom surface 12*a*) are provided in the lower vapor flow path recess 12 of the lower metallic sheet 10. In this case, the lower flow path wall portions 13 protrude in the direction perpendicular to the bottom surface 12*a*. However, not limited thereto, the portions may protrude in a direction which is not perpendicular to the bottom surface 12*a*. In this embodiment, an example in which the lower flow path wall portions 13 extend to be elongated along the first direction X of the vapor chamber 1 (a longitudinal direction, a right and left direction in FIG. 45) is shown. Each lower flow path wall portion 13 includes an upper surface 13*a* (an abutting surface, a protruding end surface) abutting a lower surface 22a of the corresponding upper flow path wall portion 22 which will be described later. The upper surface 13a is a surface which is not etched by etching steps which will be described later, and formed on the same plane as the upper surface 10a of the lower metallic sheet 10. Also, each lower flow path wall portion 13 is separated from each other with even intervals, and disposed to be parallel with each other.

As shown in FIGS. 44 and 45, the lower vapor flow path recess 12 includes a plurality of lower vapor passages 81 (first vapor passages) partitioned by the lower flow path wall portions 13. The lower vapor passages 81 extend to be elongated along the first direction X, and are disposed to be parallel with each other. The both end portions of each lower vapor passage 81 communicate with the lower communicating vapor passage 82 extending to be elongated along the second direction Y, and each lower vapor passage 81 communicates via the lower communicating vapor passage 82. In this way, such a configuration is made that the vapor of the working fluid 2 flows along a periphery of each lower flow path wall portion 13 (the lower vapor passage 81 and the lower communicating vapor passage 82) and the vapor is transported to a peripheral portion of the lower vapor flow path recess 12, which inhibits blocking of vapor flow. Additionally, in FIG. 44, the shape of the cross section (the section in the second direction Y) of each lower vapor passage 81 of the lower vapor flow path recess 12 is a rectangle. However, not limited to this, the shape of the cross section of each lower vapor passage 81 may be, for example, curved, semi-circular or V-shaped, and may be arbitrary as long as the vapor of the working fluid 2 can be diffused. The same is applied to the lower communicating vapor passage 82. The width (the dimension in the second direction Y) w7 of the lower vapor passage 81 corresponds to the interval between lower flow path wall portions 13 which will be described later. The same is applied to the width (the dimension in the first direction X) of the lower communicating vapor passage 82.

Each lower flow path wall portion 13 is disposed to be overlapped with the corresponding upper flow path wall portion 22 (which will be described later) of the upper metallic sheet 20 in a planar view, which improves mechanical strength of the vapor chamber 1. The lower vapor passage 81 is formed to be overlapped with the corresponding upper vapor passage 83 (which will be described later) in a planar view. In the same manner, the lower communicating vapor passage 82 is formed to be overlapped with the corresponding upper communicating vapor passage 84 (which will be described later) in a planar view.

The width w0 of the lower flow path wall portions 13 may be, for example, 0.05 mm to 30 mm, preferably, 0.05 mm to 2.0 mm. The width w7 (that is, the interval d between the lower flow path wall portions 13 adjacent to each other (see FIG. 63 which will be described later)) of the lower vapor passages 81 of the lower vapor flow path recess 12 is 0.05 mm to 30 mm, preferably, 0.05 mm to 2.0 mm. Here, the widths w0 and w7 mean the dimensions of the lower flow path wall portion 13 and the lower vapor flow path recess 12 in the second direction Y, and mean the dimension of the lower metallic sheet 10 on the upper surface 10a, for example, corresponding to the dimension in the vertical direction in FIG. 45. The height of each lower flow path wall portion 13 (in other words, the maximum depth of the lower vapor flow path recess 12) h0 (see FIG. 44) may be smaller than the thickness T1 of the lower metallic sheet 10 by at least 10 μm. Assuming that the residue of subtraction of h0 from T1 is equal to or larger than 10 μm, the lower vapor flow path recess 12 can be prevented from being broken by lack of strength. The thickness of the vapor chamber 1 may be 0.1 mm to 2.0 mm. The thickness T1 of the lower metallic sheet 10 and the thickness T2 of the upper metallic sheet 20 may be equal to each other. For example, in a case where the thickness of the vapor chamber 1 is 0.5 mm and T1 equals to T2, h0 is preferably 200 μm.

As shown in FIGS. 44 and 45, a lower peripheral wall 14 is provided at a peripheral portion of the lower metallic sheet 10. The lower peripheral wall 14 is formed to surround the sealed space 3, especially the lower vapor flow path recess 12 to define the sealed space 3. Also, lower alignment holes 15 which execute positioning between the lower metallic sheet 10 and the upper metallic sheet 20 are respectively provided at four corners of the lower peripheral wall 14 in a planar view.

The lower injection protruding portion 16 of the injection portion 4 described above is used for deaeration in the sealed space 3 and injection of the working fluid 2 in liquid form into the sealed space 3 during manufacturing of the vapor chamber 1. The lower injection protruding portion 16 is formed to protrude outward from the end surface of the lower metallic sheet 10 in a planar view. The lower injection protruding portion 16 is formed at a position deviating from the center portion of the lower metallic sheet 10 in the width direction (the second direction Y). However, not limited thereto, the portion may be formed at the center portion of the lower metallic sheet 10 in the width direction (the second direction Y)

On the upper surface of the lower injection protruding portion 16, the lower injection flow path recess 17 extending along the longitudinal direction (the first direction X) of the lower metallic sheet 10 is formed. The lower injection flow path recess 17 is formed as a non penetration recess formed by half etching from the upper surface of the lower injection protruding portion 16. An opening portion 17a for deaeration in the sealed space 3 and for injecting the working fluid 2 in liquid form into the sealed space 3 is formed at an external end portion (the end portion on the opposite side of the lower vapor flow path recess 12) of the lower injection flow path recess 17. The opening portion 17a allows communication between the lower injection flow path recess 17 and the outside of the vapor chamber 1, and is opened to the outside (the opposite side of the lower vapor flow path recess 12).

On both sides of the lower injection flow path recess 17 in the width direction (the second direction Y), bank portions 151 are respectively formed. The bank portions 151 constitute wall portions on both sides of the lower injection flow path recess 17. The bank portions 151 are regions which are not etched, their upper surfaces are formed on the same plane as the upper surface 10a of the lower metallic sheet 10.

The length (the distance in the first direction X) L1 of the lower injection protruding portion 16 may be, for example, 5 mm to 30 mm, preferably, 5 mm to 20 mm. The width w8 (the distance in the second direction Y) of the lower injection protruding portion 16 may be, for example, 4 mm to 15 mm, preferably, 4 mm to 10 mm. The width w9 of the lower injection flow path recess 17 is, for example, 1 mm to 10 mm, preferably, 1 mm to 6 mm. The width w9 means the dimension of the lower injection flow path recess 17 in the second direction Y, and corresponds to, for example, the dimension in the vertical direction in FIG. 45. With the configuration of L1 of 5 mm or longer, the operability of vacuuming of the sealed space 3 is improved. With the configuration of 30 mm or less, a failure such as deformation during operation such as vacuuming becomes less likely to occur. With the configuration of w8 of 4 mm or wider, the width of the bank portions 151 sufficient to joining can be obtained while the width w9 of the lower injection flow path recess 17 is secured. With the configuration of w8 of 15 mm or less, the operation, such as of vacuuming, can be facilitated. With the configuration of w9 of 1 mm or wider, the sectional area of the injection flow path is widened, and the deaeration operation and the operation of injecting the working fluid 2 can be efficiently and rapidly performed. With the configuration of w9 of 10 mm or less, a leak becomes less likely to occur after caulking.

The width w9 of the lower injection flow path recess 17 may be wider than the width w7 of the lower vapor passages 81 described above. In this case, for example, the width w7 is 0.05 mm to 2.0 mm, and the width w9 is 1 mm to 10 mm. The width w9 of the lower injection flow path recess 17 is preferably at least 1.5 times as wide as the width w7 of the lower vapor passage 81. More specifically, if the width w7 is 0.05 mm, the width w9 may be 1 mm to 6 mm, and preferably, 1 mm to 3 mm. If the width w7 is 2 mm, the width w9 may be 3.5 mm to 10 mm, and preferably, 3.5 mm to 6 mm. In this way, the width w9 of the lower injection flow path recess 17 is configured to be wider than the width w7 of the lower vapor passage 81, which can rapidly perform deaeration from the sealed space 3 and inject the working fluid 2 into the sealed space 3.

The width w9 of the lower injection flow path recess 17 is the width of a part of the lower injection flow path recess 17 having the widest width, and for example, the maximum distance between both the bank portions 151. In the same manner, the width w7 of the lower vapor passage 81 is the width of a portion of the lower vapor flow path recess 12 having the widest width.

Figure 47:
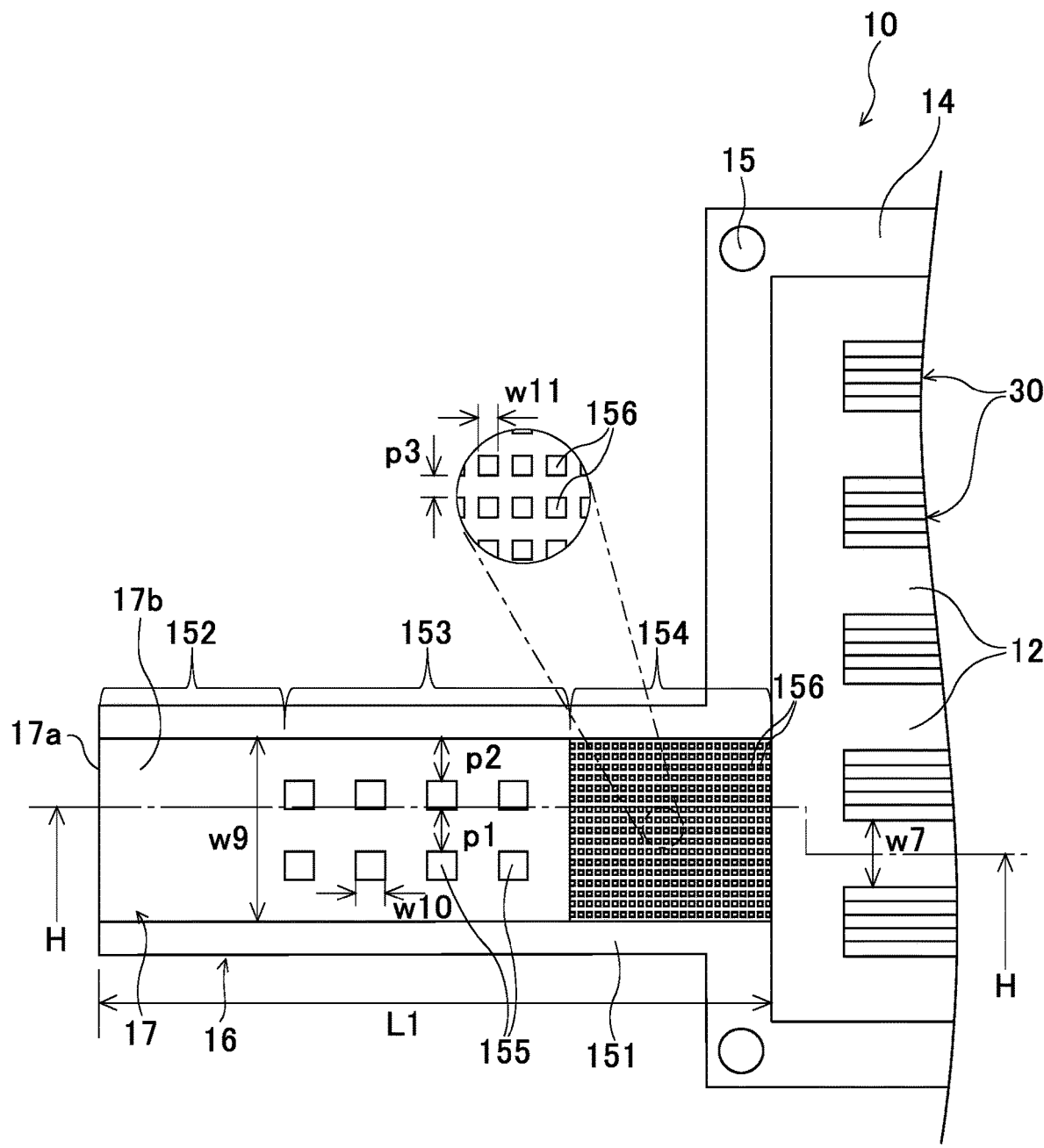
FIG. 47 is an enlarged top view showing a lower injection protruding portion of the lower metallic sheet of FIG. 45.
Figure 48:
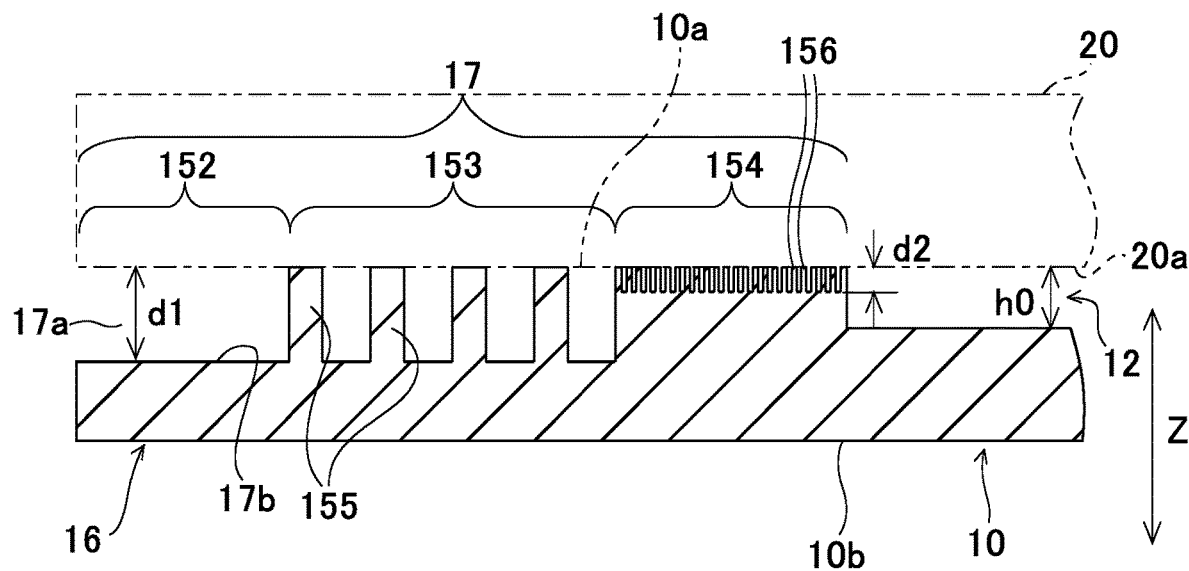
FIG. 48 is a cross-sectional view showing the lower injection protruding portion of the lower metallic sheet of FIG. 47 taken along the line H-H.

Next, referring to FIGS. 47 and 48, the configuration of the lower injection flow path recess 17 will be further explained. As shown in FIG. 47, an input region 152, an intermediate region 153 and a caulking region 154 are formed at the lower injection flow path recess 17 along the longitudinal direction from the opening portion 17a to the sealed space 3.

Among these components, the input region 152 is a region into which the working fluid 2 in liquid form is injected from the opening portion 17a, directly communicates with the opening portion 17a, and has a substantially flat bottom surface 17b where no irregularities are formed.

The intermediate region 153 is disposed between the input region 152 and the caulking region 154. In the intermediate region 153, the lower injection flow path recess 17 is provided with a plurality of columns 155 in a protruding manner. Each column 155 is provided on the bottom surface 17b in a manner protruding upward. Each column 155 is a region which is not etched, their upper surfaces are formed on the same plane as the upper surface 10a of the lower metallic sheet 10. The lower surface 20a of the upper metallic sheet 20 is in contact with the upper surface of each column 155 (see FIG. 48). These columns 155 play a role of improving the strength of the lower injection flow path recess 17, and of preventing the lower injection protruding portion 16 from being deformed and preventing the inside of the lower injection flow path recess 17 from being blocked. In this way, the plurality of columns 155 are provided, which can secure the inner space of the lower injection flow path recess 17, and can further securely perform deaeration from the sealed space 3 and inject the working fluid 2 into the sealed space 3.

The plurality of columns 155 (four in the first direction X and eight in the second direction Y in this embodiment) are formed along the longitudinal direction (first direction X) and the width direction (second direction Y) of the lower injection flow path recess 17. Each column 155 has a rectangular shape in a planar view. However, not limited thereto, the shape may be a circular, an elliptical, or a polygonal shape in a planar view. The shapes of the plurality of columns 155 may be the same as each other. Alternatively, the shapes of the plurality of columns 155 may be different from each other. The width w10 of each column 155 may be, for example, 0.1 mm to 2 mm. Furthermore, the interval p1 between the columns 155 may be, for example, 0.1 mm to 2 mm. The interval p2 between the column 155 and the bank portion 151 may be, for example, 0.1 mm to 2 mm. The configuration having w10 of 0.1 mm or wider can improve the strength as that for columns. The configuration with 2 mm or less can efficiently and rapidly perform the deaeration operation and the operation of injecting the working fluid 2. The configuration having p1 and p2 of 0.1 mm or wider can efficiently and rapidly perform the deaeration operation and the operation of injecting the working fluid 2. With the configuration having 2 mm or less, the upper injection protruding portion 25 becomes less likely to be deformed during joining, and the sectional area of the injection flow path can be prevented from being narrowed.

The caulking region 154 is a region which is blocked and sealed by caulking (plastic-deforming by pressurizing) after injection of the working fluid 2 into the sealed space 3. The caulking region 154 includes a plurality of projections 156 provided in the lower injection flow path recess 17 upward in a protruding manner. Each projection 156 is a region which are not etched, their upper surfaces are formed on the same plane as the upper surface 10a of the lower metallic sheet 10. The lower surface 20a of the upper metallic sheet 20 is in contact with the upper surface of each projection 156 (see FIG. 48). The plurality of projections 156 are deformed by pressed through caulking, and block the lower injection flow path recess 17. The plurality of projections 156 are thus provided in the caulking region 154, which can further securely seal the sealed space 3 where the working fluid 2 has been injected.

The plurality of projections 156 are formed in each of the longitudinal direction (first direction X) and the width direction (second direction Y) of the lower injection flow path recess 17. Each projection 156 has a rectangular shape in a planar view. However, not limited thereto, the shape may be a circular, an elliptical, or a polygonal shape in a planar view. The width w11 of each projection 156 may be 0.01 mm to 0.5 mm. The interval p3 between the projections 156 may be, for example, 0.01 mm to 0.5 mm. The width w11 of each projection 156 is less than the width w10 of each column 155. The interval p3 between the projections 156 is narrower than the interval p1 between the columns 155. As described above, the width w9 of the lower injection flow path recess 17 is formed to be substantially wider than the width w7 of the lower vapor passage 81. Accordingly, the presence of the plurality of projections 156 in the caulking region 154 can prevent the operation of deaerating the sealed space 3 and the operation of injecting the working fluid 2 into the sealed space 3 from being inhibited.

As shown in FIG. 48, the depth d1 of the lower injection flow path recess 17 may be, for example, 40 μm to 300 μm. In this case, the depth d1 of the lower injection flow path recess 17 may be deeper than the depth h0 of the lower vapor flow path recess 12. In this case, for example, the depth h0 is 10 μm to 200 μm, and the depth d1 is 40 μm to 300 μm. More specifically, for example, if the depth h0 is 0.1 mm, the width w7 may be 0.3 mm to 1.5 mm, and preferably, 0.5 mm to 1.2 mm. If the depth d1 is 0.15 mm at this time, the width w9 may be 1.3 mm to 10 mm, and preferably, 1.5 mm to 6 mm. In this way, the depth d1 of the lower injection flow path recess 17 is configured to be deeper than the depth h0 of the lower vapor flow path recess 12, which can rapidly perform deaeration from the sealed space 3 to the lower injection flow path recess 17 and inject the working fluid 2 from the lower injection flow path recess 17 into the sealed space 3. The depth d1 of the lower injection flow path recess 17 is the depth of the lower injection flow path recess 17 at a portion having the largest depth, and is the maximum distance (the distance in the Z direction) between the upper surface 10a of the lower metallic sheet 10 and the bottom surface 17b of the lower injection flow path recess 17. In this embodiment, the depth d1 of the lower injection flow path recess 17 corresponds to the depth of the lower injection flow path recess 17 in the input region 152 and in the intermediate region 153. The depth h0 of the lower vapor flow path recess 12 is the depth of the lower vapor flow path recess 12 at a portion having the largest depth.

As shown in FIG. 48, the depth d1 of the lower injection flow path recess 17 is the same in the input region 152 and in the intermediate region 153. However, not limited thereto, the depth of the lower injection flow path recess 17 in the input region 152 may be deeper than the depth of the lower injection flow path recess 17 in the intermediate region 153. Furthermore, the depth d2 of the lower injection flow path recess 17 in the caulking region 154 is shallower than the depth d1 of the lower injection flow path recess 17 in the input region 152 and in the intermediate region 153. Thereby, the plurality of projections 156 can be more easily pressed by caulking, which can further securely enclose the sealed space 3 where the working fluid 2 has been injected. In a case where the injection flow path is blocked using a method other than caulking, for example by brazing, such a caulking region 154 is not necessarily provided.

Next, the configuration of the upper metallic sheet 20 will be described. In this embodiment, the upper metallic sheet 20 is different from the lower metallic sheet 10 in that the liquid flow path portions 30 which will be described later are not provided and the configuration of the upper injection protruding portion 25 is different. Hereinafter, the configuration of the upper metallic sheet 20 will be explained in more detail.

Figure 46:
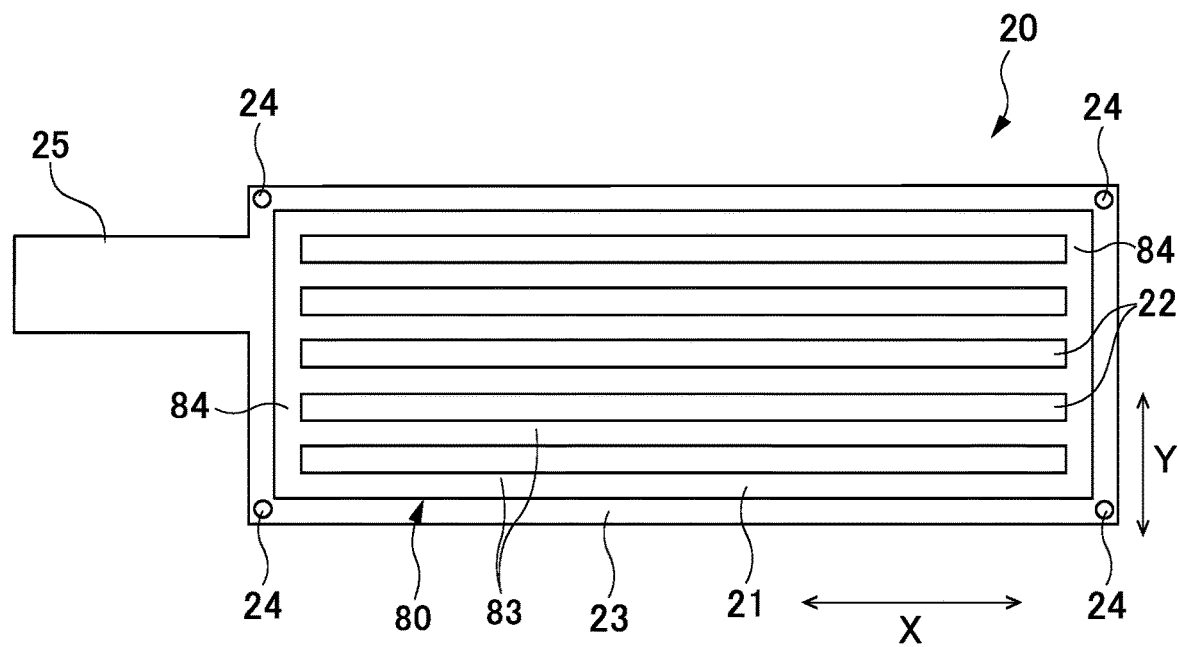
FIG. 46 is a bottom view showing an upper metallic sheet of the vapor chamber of FIG. 43.

As shown in FIGS. 44 and 46, the upper metallic sheet 20 includes an upper vapor flow path recess 21 (a second vapor flow path portion) provided in the lower surface 20a. The upper vapor flow path recess 21 constitutes a part of the sealed space 3, and is mainly configured to diffuse the vapor generated in the evaporating portion 11 for cooling. More concretely, the vapor in the upper vapor flow path recess 21 is diffused in a direction away from the evaporating portion 11, and most of the vapor is transported to the peripheral portion with a relatively low temperature. Also, as shown in FIG. 44, a housing member Ha constituting a part of the housing such as the mobile terminal is disposed on the upper surface 20b of the upper metallic sheet 20. Thereby, the vapor in the upper vapor flow path recess 21 is cooled by the outside air via the upper metallic sheet 20 and the housing member Ha.

As shown in FIGS. 43, 44 and 46, in this embodiment, a plurality of upper flow path wall portions 22 (a second flow path wall portion, second flow path protruding portion) protruding from the bottom surface 21a of the upper vapor flow path recess 21 to a lower side (a direction perpendicular to the bottom surface 21a) are provided in the upper vapor flow path recess 21 of the upper metallic sheet 20. In this embodiment, an example in which the upper flow path wall portions 22 extend to be elongated along the first direction X (a right and left direction of FIG. 46) of the vapor chamber 1 is shown. Each upper flow path wall portion 22 includes the planar lower surface 22a (an abutting surface, a protruding end surface) which abuts the upper surface 10a of the lower metallic sheet 10 (more specifically, the upper surface 13a of each lower flow path wall portion 13 described above). Also, the upper flow path wall portions 22 are separated from each other with even intervals and disposed to be parallel with each other.

As shown in FIGS. 44 and 46, the upper vapor flow path recess 21 includes a plurality of upper vapor passages 83 (second vapor passages) partitioned by the upper flow path wall portions 22. The upper vapor passages 83 extend to be elongated along the first direction X, and are disposed to be parallel with each other. The both end portions of each upper vapor passage 83 communicate with the upper communicating vapor passage 84 extending to be elongated along the second direction Y, and each upper vapor passage 83 communicates via the upper communicating vapor passage 84. In this way, such a configuration is made that the vapor of the working fluid 2 flows along a periphery of each upper flow path wall portion 22 (the upper vapor passage 83 and the upper communicating vapor passage 84) and the vapor is transported to a peripheral portion of the upper vapor flow path recess 21, which inhibits blocking of vapor flow. Additionally, in FIG. 44, the shape of the cross section (the section in the second direction Y) of each upper vapor passage 83 of the upper vapor flow path recess 21 is a rectangle. However, not limited to this, the shape of the cross section of each upper vapor passage 83 may be, for example, curved, semi-circular or V-shaped, and may be arbitrary as long as the vapor of the working fluid 2 can be diffused. The same is applied to the cross-sectional shape of the upper communicating vapor passage 84. The width (the dimension in the second direction Y) of the upper vapor passage 83 and the width of the upper communicating vapor passage 84 may be similar to the width of the lower vapor passage 81 and the width of the lower communicating vapor passage 82 as shown in FIG. 3 and the like, but may be different instead.

Each upper flow path wall portion 22 is disposed to be overlapped with the corresponding lower flow path wall portions 13 of the lower metallic sheet 10 in a planar view, which improves mechanical strength of the vapor chamber 1. The upper vapor passage 83 is formed to be overlapped with the corresponding lower vapor passage 81 (which will be described later) in a planar view. In the same manner, the upper communicating vapor passage 84 is formed to be overlapped with the corresponding lower communicating vapor passage 82 in a planar view.

The width and height of the upper flow path wall portion 22 may respectively be the same as the width w0 and height h0 of the above-described lower flow path wall portion 13. Here, while the bottom surface 21a of the upper vapor flow path recess 21 can be also said as a ceiling surface in the vertical disposition relationship between the lower metallic sheet 10 and the upper metallic sheet 20 as shown in FIG. 44, this corresponds to a surface on a deeper side of the upper vapor flow path recess 21, so that this is described as the bottom surface 21a in the present specification.

As shown in FIGS. 44 and 46, an upper peripheral wall 23 is provided at a peripheral portion of the upper metallic sheet 20. The upper peripheral wall 23 is formed to surround the sealed space 3, especially the upper vapor flow path recess 21 to define the sealed space 3. Also, upper alignment holes 24 which execute positioning between the lower metallic sheet 10 and the upper metallic sheet 20 are respectively provided at four corners of the upper peripheral wall 23 in a planar view. In other words, such a configuration is made that each upper alignment hole 24 is disposed to be overlapped with the corresponding lower alignment hole 15 at the time of temporary joint which will be described later, which allows positioning between the lower metallic sheet 10 and the upper metallic sheet 20.

The upper injection protruding portion 25 is configured to allow the working fluid 2 in liquid form to be injected toward the sealed space 3, by covering the lower injection flow path recess 17 of the lower injection protruding portion 16 from above. The upper injection protruding portion 25 is formed to protrude outward from the end surface of the upper metallic sheet 20 in a planar view. The upper injection protruding portion 25 is formed at a position where this portion is overlapped with the lower injection protruding portion 16 after the lower metallic sheet 10 and the upper metallic sheet 20 are joined to each other.

The injection flow path recess is not formed on the lower surface of the upper injection protruding portion 25. Accordingly, the upper injection protruding portion 25 is formed to have a flat shape without irregularities as a whole. That is, the upper injection protruding portion 25 is a region which is not entirely etched in the etching step which will be described later. The lower surface of the upper injection protruding portion 25 is formed on the same plane as the lower surface 20a of the upper metallic sheet 20.

However, not limited thereto, for example, an upper injection flow path recess (injection flow path recess) having a shape mirror-symmetric with the shape of the lower injection flow path recess 17 may be formed on the lower surface of the upper injection protruding portion 25. Alternatively, the upper injection flow path recess (injection flow path recess) may be formed on the lower surface of the upper injection protruding portion 25, and no lower injection flow path recess 17 may be formed on the lower injection protruding portion 16.

The lower metallic sheet 10 and the upper metallic sheet 20 are permanently joined to each other preferably by the diffused junction. More specifically, as shown in FIG. 44, an upper surface 14a of the lower peripheral wall 14 of the lower metallic sheet 10 abuts a lower surface 23a of the upper peripheral wall 23 of the upper metallic sheet 20, so that the lower peripheral wall 14 and the upper peripheral wall 23 are joined to each other. Thereby, the sealed space 3 which seals the working fluid 2 is formed between the lower metallic sheet 10 and the upper metallic sheet 20. Also, the upper surface 13a of each lower flow path wall portion 13 of the lower metallic sheet 10 abuts the lower surface 22a of corresponding upper flow path wall portion 22 of the upper metallic sheet 20, so that each lower flow path wall portion 13 and the corresponding upper flow path wall portion 22 are joined to each other. This improves the mechanical strength of the vapor chamber 1. Especially, since the lower flow path wall portions 13 and the upper flow path wall portions 22 according to this embodiment are disposed with even intervals, the mechanical strength at each portion of the vapor chamber 1 can be equalized. Additionally, the lower metallic sheet 10 and the upper metallic sheet 20 may be joined by other methods such as brazing as long as permanent joining is performed, not by the diffused junction. Additionally, the term of "permanent joining" is not strictly limited to a certain meaning, but is used as a term that means joining during operation of the vapor chamber 1, to an extent capable of maintaining the hermeticity of the sealed space 3 and to an extent of capable of maintaining joining the upper surface 10a of the lower metallic sheet 10 and the lower surface 20a of the upper metallic sheet 20.

Figure 49:
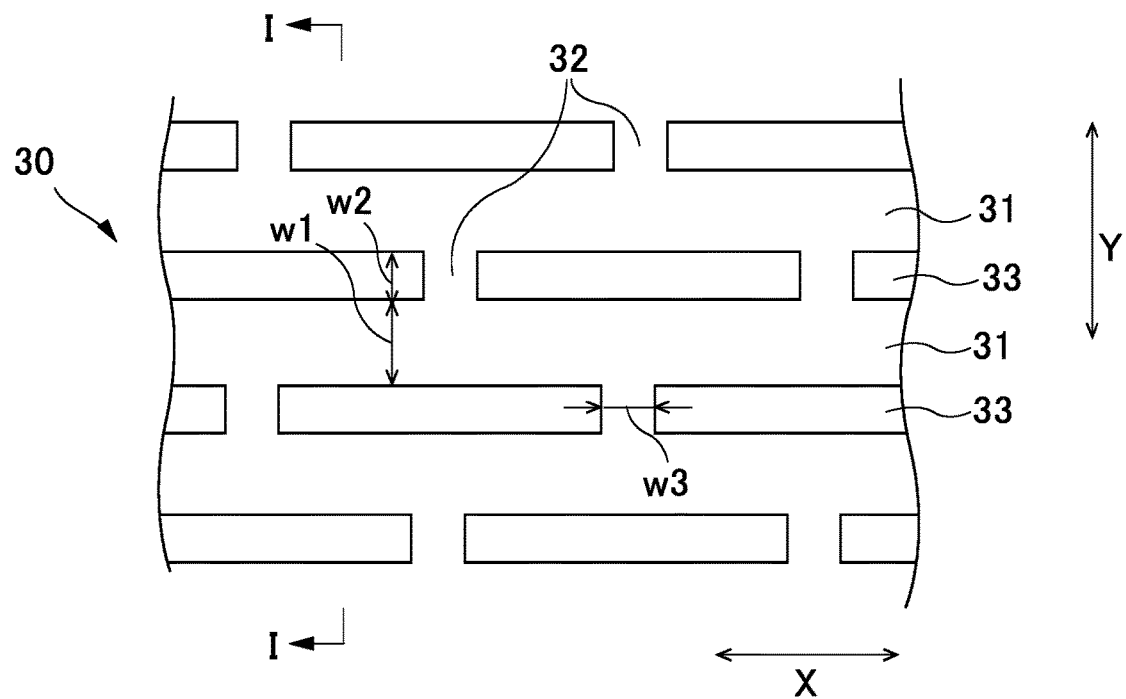
FIG. 49 is an enlarged top view showing a liquid flow path portion of FIG. 45.
Figure 50:
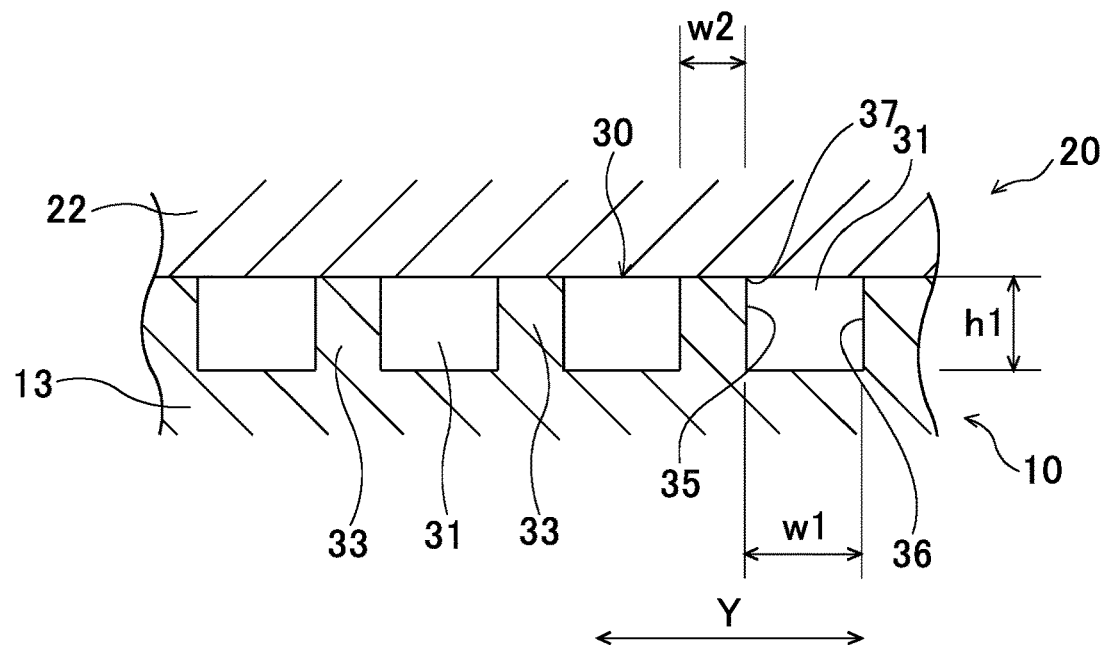
FIG. 50 is a cross-sectional view of FIG. 49 taken along the line I-I with addition of the upper metallic sheet.

Next, the configuration of the liquid flow path portion 30 will be explained in more detail using FIGS. 49 and 50. FIG. 49 is an enlarged plan view of the liquid flow path portion 30. FIG. 50 is a cross-sectional view of the liquid flow path portion 30.

As described above, the liquid flow path portion 30 through which the working fluid 2 in liquid form passes is provided in the upper surface 10a of the lower metallic sheet 10 (more specifically, the upper surface 13a of each lower flow path wall portion 13). The liquid flow path portion 30 constitutes a part of the above-described sealed space 3, and communicates with the lower vapor flow path recess 12 and the upper vapor flow path recess 21. The liquid flow path portion 30 is not necessarily provided in every lower flow path wall portions 13. For example, lower flow path wall portions 13 provided with no liquid flow path portion 30 may exist.

As shown in FIG. 49, the liquid flow path portion 30 includes a plurality of main flow grooves 31 extending in parallel with each other, and communicating grooves 32 allowing the main flow grooves 31 adjacent to each other to communicate. Among these components, the main flow grooves 31 extend along the main flow direction of the working fluid 2 (the first direction X in this case). The communicating grooves 32 extend along a direction (the second direction Y in this case) orthogonal to the main flow direction of the working fluid 2, and allow the working fluid 2 to reciprocate between the main flow grooves 31 adjacent to each other. The working fluid 2 in liquid form passes through the main flow grooves 31 and the communicating grooves 32. The main flow grooves 31 and the communicating grooves 32 play a role of mainly transporting the working fluid 2, condensed from the vapor generated at the evaporating portion 11, to the evaporating portion 11.

In the liquid flow path portion 30, a plurality of convex portions 33 are formed in a staggered arrangement in a planar view. Each convex portion 33 is formed so as to be surrounded by the main flow grooves 31 and the communicating grooves 32. In FIG. 49, the plurality of convex portions 33 have shapes identical to each other, and each convex portion 33 is formed to be rectangular such that the first direction X is the longitudinal direction in a planar view. In this embodiment, the arrangement pitch of the convex portions 33 along the main flow direction of the working fluid 2 (the first direction X in this case) is constant. That is, the convex portions 33 are disposed at a regular interval in the first direction X. The convex portions 33 adjacent to each other in the second direction Y are disposed to deviate in the first direction X by substantially half a length of the convex portion 33.

The width (the dimension in the second direction Y) w1 of the main flow groove 31 may be larger than the width (the dimension in the second direction Y) w2 of the convex portions 33. In this case, the ratios of the main flow grooves 31 occupying the upper surface 13a of the lower flow path wall portion 13, the upper surface 14a of the lower peripheral wall 14, and the lower surface 23a of the upper peripheral wall 23 can be high. Consequently, the sectional areas of the main flow grooves 31 in the lower flow path wall portions 13 are increased, which can improve the transport function of the working fluid 2 in liquid form. For example, the width w1 of the main flow groove 31 may be 20 μm to 200 μm, and the width w2 of the convex portion 33 may be 20 μm to 180 μm.

The depth h1 of the main flow groove 31 may be smaller than the depth h0 (see FIG. 44) of the above-described lower flow path wall portion 13. In this case, the capillary action of the main flow grooves 31 can be improved. For example, the depth h1 of the main flow groove 31 is preferably about half the height h0 of the lower flow path wall portions 13, and may be 5 μm to 200 μm.

The width of the communicating groove 32 (the dimension in the first direction X) w3 may be smaller than the width w1 of the main flow groove 31. Thereby, while the working fluid 2 in liquid form is transported to the evaporating portion 11 in each main flow groove 31, the working fluid 2 can be inhibited from flowing to the communicating grooves 32, and the transport function of the working fluid 2 can be improved. On the other hand, when dryout occurs in any of the main flow grooves 31, the working fluid 2 can be transported from adjacent main flow grooves 31 through corresponding communicating grooves 32, which can rapidly eliminate the dryout and secure the transport function of the working fluid 2. In other words, if the communicating grooves 32 allow the main flow grooves 31 adjacent to each other to communicate, the function can be exerted even with the width of each communicating groove 32 being smaller than the width of each main flow groove 31. The width w3 of such a communicating groove 32 may be, for example, 180 μm.

The depth (not shown) of the communicating groove 32 may be shallower than the depth of the main flow groove 31 in conformity with the width w3. For example, the depth of the communicating groove 32 may be, for example, 10 μm to 200 μm. The shape of a cross section of the main flow groove 31 is not particularly limited, and for example, may be rectangular, C-shaped, semi-circular, semi-elliptical, curved, or V-shaped. The same is applied to the cross-sectional shape of the communicating groove 32.

As shown in FIG. 50, the liquid flow path portion 30 is formed on the upper surface 13a of each lower flow path wall portion 13 of the lower metallic sheet 10. On the other hand, in this embodiment, the lower surface 22a of each upper flow path wall portion 22 of the upper metallic sheet 20 is formed to be planar. Thereby, each of the main flow grooves 31 of the liquid flow path portion 30 is covered by the lower surface 22a which is planar. In this case, as shown in FIG. 50, by a pair of side walls 35, 36 extending in the first direction X of the main flow grooves 31 and the lower surface 22a of each upper flow path wall portion 22, a pair of corner portions 37 in a right angle or an acute angle can be formed, which can improve capillary action at these corner portions 37.

In this embodiment, the liquid flow path portions 30 are formed only on the lower metallic sheet 10. On the other hand, the vapor flow path recesses 12, 21 are formed on both the lower metallic sheet 10 and the upper metallic sheet 20. However, without limitation thereto, the liquid flow path portions 30 and the vapor flow path recesses 12, 21 may be formed on at least one of the lower metallic sheet 10 and the upper metallic sheet 20.

The shape of the liquid flow path portion 30 of each lower metallic sheet 10 is not limited to that described above.

Figure 51:
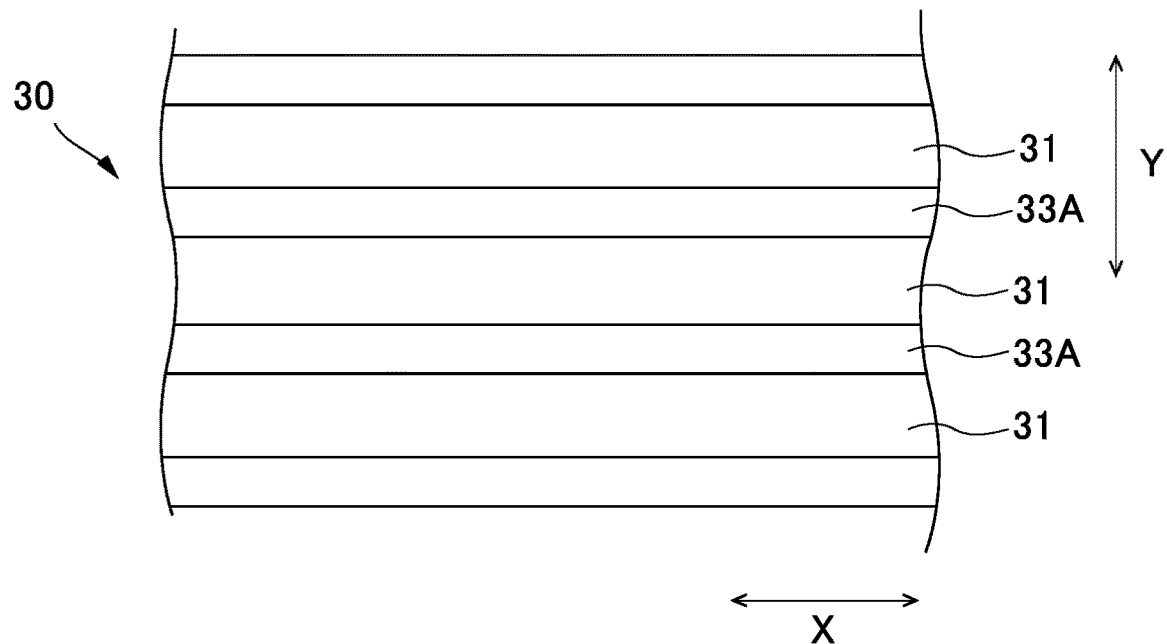
FIG. 51 is an enlarged top view showing a modification of a liquid flow path portion of FIG. 49.

For example, as shown in FIG. 51, the liquid flow path portion 30 may include a plurality of main flow grooves 31 extending in parallel with each other, and a plurality of elongated convex portions 33A configured between the main flow grooves 31 adjacent to each other. In this case, each convex portion 33A extends over a substantially entire region of the liquid flow path portion 30 in the longitudinal direction, along the main flow direction of the working fluid 2 (the first direction X in this case). Thereby, the working fluid 2 in liquid form can be efficiently transported toward the evaporating portion 11 in each main flow groove 31. Although not shown, a communicating groove may be provided for a part of the convex portion 33A, and the communicating groove may allow each main flow groove 31 to communicate with the lower vapor flow path recess 12 or the upper vapor flow path recess 21.

The material used for the lower metallic sheet 10 and the upper metallic sheet 20 is not especially limited as long as the material has a good thermal conductivity. For example, copper (an oxygen-free copper), copper alloy, aluminum, or stainless steel may be used. In this case, the thermal conductivities of the lower metallic sheet 10 and the upper metallic sheet 20 can be improved, and the heat release efficiency of the vapor chamber 1 can be improved. The thickness of the vapor chamber 1 may be, for example, 0.1 mm to 2.0 mm. While FIG. 44 shows a case where a thickness T1 of the lower metallic sheet 10 and a thickness T2 of the upper metallic sheet 20 are equal, not limited to this, the thickness T1 of the lower metallic sheet 10 and the thickness T2 of the upper metallic sheet 20 may be different.

Next, an operation of this embodiment constituted by such a configuration will be explained. Here, firstly, a manufacturing method of the vapor chamber 1 will be explained using FIGS. 52A to 52C and 53A to 53C, but an explanation of a half-etching step of the upper metallic sheet 20 is simplified. Additionally, in FIGS. 52A to 52C and 53A to 53C, the same cross section as in FIG. 44 is shown.

Figure 52A:
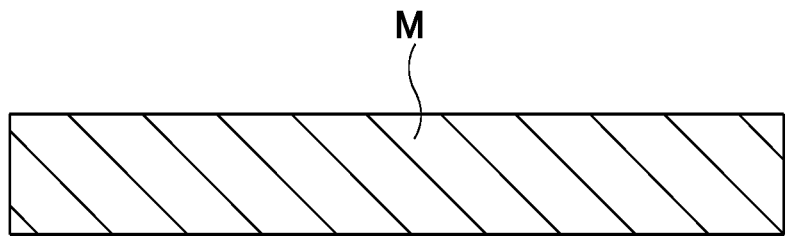
FIG. 52A is a drawing showing, together with FIGS. 52B and 52C, a manufacturing method of the vapor chamber (first half) according to the tenth embodiment.

Firstly, as shown in FIG. 52A, as a preparation step, a planar metal material sheet M is prepared.

Figure 52B:
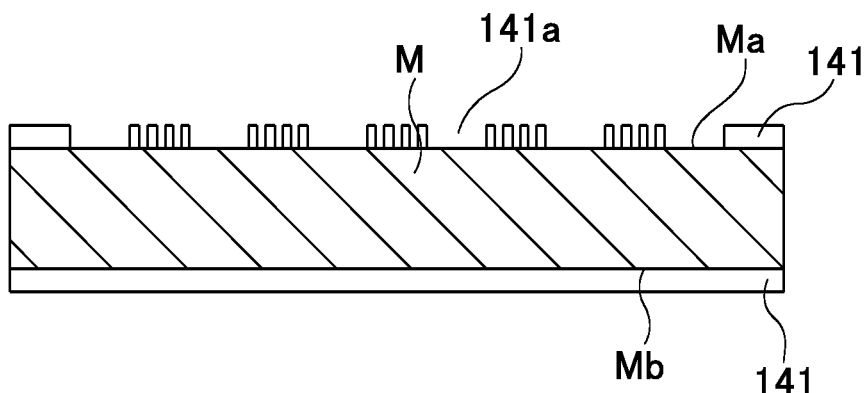
FIG. 52B is a drawing showing, together with FIGS. 52A and 52C, the manufacturing method of the vapor chamber (first half) according to the tenth embodiment.

Subsequently, as shown in FIG. 52B, resist films 141 are formed on the upper surface Ma and the lower surface Mb of the metal material sheet M by a photolithographic method. The resist films 141 formed on the upper surface Ma of the metal material sheet M have a pattern shape in conformity with the lower flow path wall portions 13 and the lower peripheral wall 14.

Figure 52C:
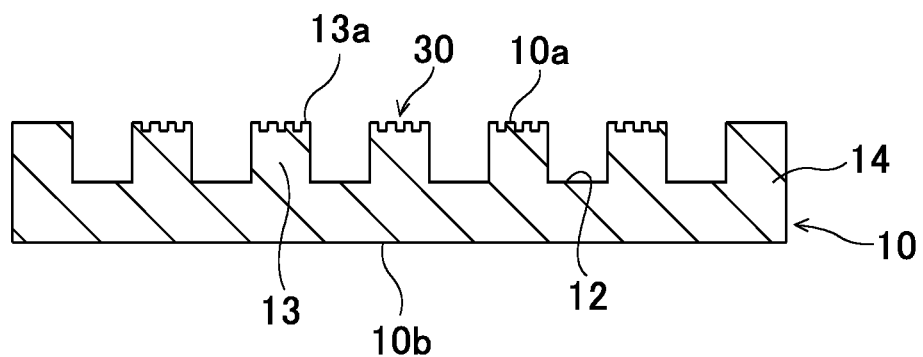
FIG. 52C is a drawing showing, together with FIGS. 52A and 52B, the manufacturing method of the vapor chamber (first half) according to the tenth embodiment.

Next, as shown in FIG. 52C, the metal material sheet M is half-etched to form the lower vapor flow path recess 12 constituting a part of the sealed space 3. Thereby, a part which is of the upper surface Ma of the metal material sheet M and corresponds to the resist opening 141a of the resist films 141 is half-etched. Subsequently, the resist films 141 are removed from the metal material sheet M. As a result, as shown in FIG. 52C, the lower vapor flow path recess 12, the lower flow path wall portions 13, and the lower peripheral wall 14 are formed. At the same time, the liquid flow path portions 30 are formed in the lower flow path wall portions 13 by half etching. Portions of the resist opening 141a which correspond to the main flow grooves 31 and the communicating grooves 32 of the liquid flow path portion 30 are narrow. Accordingly, the entering amount of etching liquid is small. Consequently, the main flow grooves 31 and the communicating grooves 32 are formed to have depths shallower than the depths of the lower vapor flow path recesses 12. At this time, the lower injection flow path recess 17 shown in FIGS. 43 and 45 is also formed by etching at the same time, and the lower metallic sheet 10 having the predetermined outer shape as shown in FIG. 45 is obtained.

Half-etching means that a material to be etched is etched to the middle in the thickness direction to form a recess not penetrating the material to be etched. Consequently, the depth of the recess formed by the half-etching is not limited to a half of the thickness of the material to be etched. The thickness of the material to be etched after half etching is, for example, 30% to 70%, preferably, 40% to 60%, of the thickness of the material to be etched before half etching. As etching liquid, for example, ferric chloride etching liquid such as aqueous ferric chloride, or copper chloride etching liquid such as aqueous copper chloride can be used.

First, the metal material sheet M is half-etched to form the lower vapor flow path recess 12 (first half etching step), and subsequently, the liquid flow path portion 30 is formed in the metal material sheet M in another etching step (second half etching step).

On the other hand, although not shown, in the same manner as the lower metallic sheet 10, the upper metallic sheet 20 is half-etched from the lower surface 20a to form the upper vapor flow path recess 21, the upper flow path wall portions 22 and the upper peripheral wall 23. In this way, the above-described upper metallic sheet 20 is obtained.

Figure 53A:
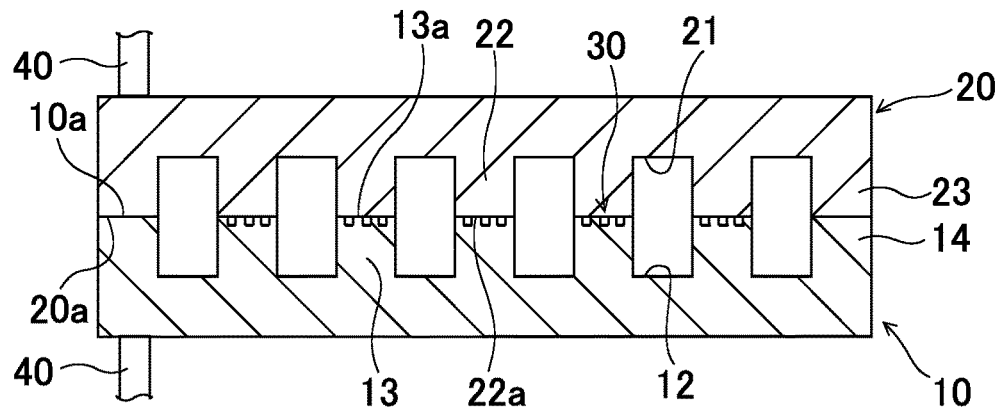
FIG. 53A is a drawing showing, together with FIGS. 53B and 53C, the manufacturing method of the vapor chamber (latter half) according to the tenth embodiment.

Next, as shown in FIG. 53A, as a temporary joint step, the lower metallic sheet 10 having the lower vapor flow path recess 12 and the upper metallic sheet 20 having the upper vapor flow path recess 21 are temporarily joined in a manner facing each other.

In such a case, firstly, using the lower alignment holes 15 of the lower metallic sheet 10 (see FIGS. 43 and 45) and the upper alignment holes 24 of the upper metallic sheet 20 (see FIGS. 43 and 46), positioning of the lower metallic sheet 10 and the upper metallic sheet 20 is executed. Thereafter, the lower metallic sheet 10 and the upper metallic sheet 20 are fixed. While a fixing method is not particularly limited, for example, the lower metallic sheet 10 and the upper metallic sheet 20 may be fixed by executing resistance welding to the lower metallic sheet 10 and the upper metallic sheet 20. In this case, as shown in FIG. 53A, a resistance spot welding may be executed using the electrode rod 40. Instead of resistance welding, laser welding may be executed. Alternatively, ultrasonic junction may be executed to fix the lower metallic sheet 10 and the upper metallic sheet 20 by irradiation with ultrasonic waves. Further, an adhesive agent may be used, and the adhesive agent including no or little organic constituent may be used. In this way, the lower metallic sheet 10 and the upper metallic sheet 20 are fixed with execution of the positioning.

Figure 53B:
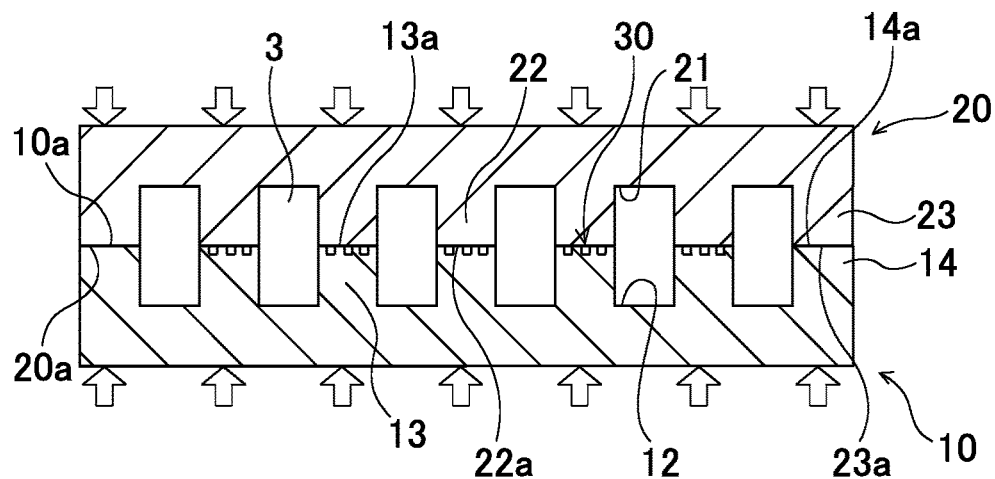
FIG. 53B is a drawing showing, together with FIGS. 53A and 53C, the manufacturing method of the vapor chamber (latter half) according to the tenth embodiment.

After the temporary joint, as shown in FIG. 53B, as a permanent joint step, the lower metallic sheet 10 and the upper metallic sheet 20 are permanently joined by the diffused junction. The diffused junction is a method in which the lower metallic sheet 10 and the upper metallic sheet 20 to be joined are closely contacted, and the metallic sheets 10, 20 are pressurized and heated in a contact direction in a controlled atmosphere such as vacuum or inert gas to execute joint using diffusion of atoms generated at joint surfaces. While the materials of the lower metallic sheet 10 and the upper metallic sheet 20 are heated to a temperature approximate to a melting point in the diffused junction, this temperature is lower than the melting point, which avoids melting and deformation of each of the metallic sheets 10, 20. More specifically, the upper surface 14a of the lower peripheral wall 14 of the lower metallic sheet 10 and the lower surface 23a of the upper peripheral wall 23 of the upper metallic sheet 20 are subjected to the diffused junction as joint surfaces. Thereby, by the lower peripheral wall 14 and the upper peripheral wall 23, the sealed space 3 is formed between the lower metallic sheet 10 and the upper metallic sheet 20. Also, by the lower injection flow path recess 17 of the lower injection protruding portion 16 (see FIGS. 43 and 45) and the upper injection protruding portion 25 (see FIGS. 43 and 46), an injection flow path of the working fluid 2 communicating with the sealed space 3 is formed. Further, the upper surface 13a of the lower flow path wall portion 13 of the lower metallic sheet 10 and the lower surface 22a of the upper flow path wall portion 22 of the upper metallic sheet 20 are subjected to the diffused junction as joint surfaces, so that mechanical strength of the vapor chamber 1 is improved. The liquid flow path portion 30 formed on the upper surface 13a of each lower flow path wall portion 13 remains as a flow path of the working fluid 2 in liquid form.

Figure 53C:
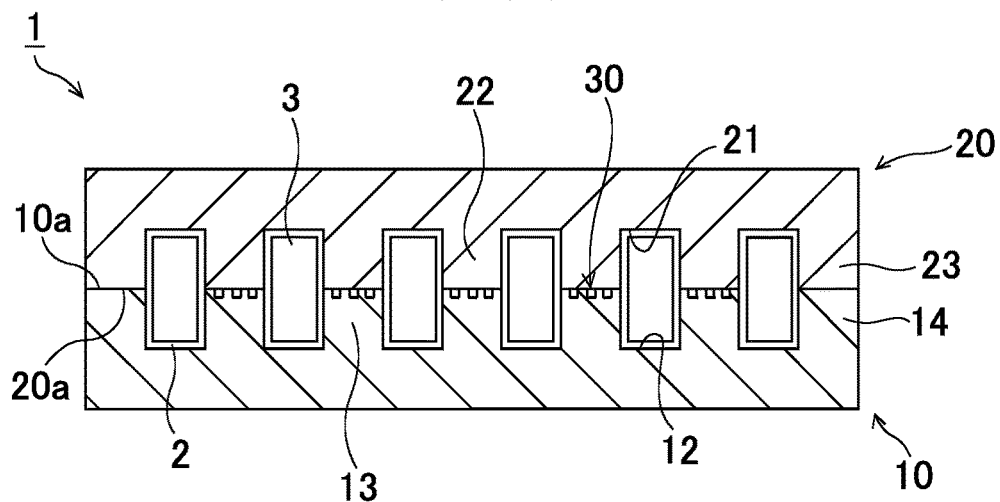
FIG. 53C is a drawing showing, together with FIGS. 53A and 53B, the manufacturing method of the vapor chamber (latter half) according to the tenth embodiment.

After the permanent joint, as shown in FIG. 53C, as an enclosing step, the working fluid 2 is poured into the sealed space 3 from the injection portion 4 (see FIG. 43). At this time, firstly, the sealed space 3 is depressurized by vacuuming (for example, 5 Pa or less, preferably 1 Pa or less), and then the working fluid 2 is poured into the sealed space 3. At the time of injection, the working fluid 2 passes through the injection flow path formed by the lower injection flow path recess 17 of the lower injection protruding portion 16 and the upper injection protruding portion 25. For example, while the enclosing amount of the working fluid 2 depends on the configuration of the liquid flow path portion 30 in the vapor chamber 1, it may be 10% to 40% to the entire volume of the sealed space 3. As described above, the width w9 of the lower injection flow path recess 17 constituting the injection flow path is wider than the width w7 of the lower vapor passage 81 (see FIG. 45). Consequently, the operation of vacuuming the injection flow path to reduce the pressure of the sealed space 3, and the operation of injecting the working fluid 2 through the injection flow path into the sealed space 3 can be efficiently performed in a short time.

Here, reduction of the time period of vacuuming the sealed space 3 causes a possibility that non-condensable gases (for example, air) in the sealed space 3 are not drawn from the sealed space 3 and remain therein. A long time period of injecting the working fluid 2 causes a possibility that non-condensable gas enter the sealed space 3 together with the working fluid 2. If the non-condensable gas remain in the sealed space 3, the vapor of the working fluid 2 or the working fluid 2 in liquid form can be inhibited from being transported during operation of the vapor chamber 1. In this case, it is difficult to achieve a desired thermal transport efficiency. If the desired thermal transport efficiency cannot be achieved by the thermal transport test for the vapor chamber 1, the vapor chamber 1 is determined to be a defective piece. As a result, there is a problem of possible reduction in yield ratio. The thermal transport test is a test which applies heat to the vapor chamber 1 and measures the temperature of each component, and verifies whether the heat is transported normally in the vapor chamber 1 or not according to the temperature measurement result (for example, see Japanese Patent Laid-Open No. 2004-301475).

On the contrary, according to this embodiment, the width w9 of the lower injection flow path recess 17 constituting the injection flow path is wider than the width w7 of the lower vapor passage 81 as described above. Consequently, the operation of vacuuming the injection flow path to reduce the pressure of the sealed space 3, and the operation of injecting the working fluid 2 through the injection flow path into the sealed space 3 can be efficiently performed in a short time. This can prevent non-condensable gases from remaining in the sealed space 3 and prevents the thermal transport efficiency from decreasing, and can improve the yield ratio as a result.

After the injection of the working fluid 2, the above-described injection flow path is sealed. In this case, for example, the plurality of projections 156 are deformed so as to be pressed by caulking the caulking region 154 of the lower injection flow path recess 17. Thereby, the injection portion 4 is blocked to seal the injection flow path, thus completing the sealing of the sealed space 3. Alternatively, the injection portion 4 is irradiated with a laser beam to seal the injection flow path by partially melting the injection portion 4. Alternatively, the injection flow path may be sealed by blocking the injection portion 4 by brazing. Thereby, communication between the sealed space 3 and the outside air is blocked, and the working fluid 2 is enclosed in the sealed space 3. This prevents leaking of the working fluid 2 in the sealed space 3 to the outside. To seal the injection portion 4 more securely, laser irradiation or brazing may be performed after the caulking region 154 is caulked. After the injection flow path is sealed, the injection portion 4 may be cut at any position of the injection portion 4 nearer to the opening portion 17a than the caulking region 154.

As described above, the vapor chamber 1 according to this embodiment can be obtained.

In this embodiment, an example in which the vapor chamber is manufactured mainly by etching, has been explained. However, not limited to this, this chamber may be manufactured by a 3D printer. For example, the entire vapor chamber 1 may be integrally manufactured by a 3D printer at one time. Alternatively, the metallic sheets 10, 20 may be separately manufactured by a 3D printer and then be joined to each other.

Next, an operation method of the vapor chamber 1, that is, a cooling method of the device D will be explained.

The vapor chamber 1 thus obtained is installed in the housing of the mobile terminal etc., and the device D such as the CPU which is an object of cooling is attached to the lower surface 10b of the lower metallic sheet 10. Since the amount of the working fluid 2 poured into the sealed space 3 is small, the working fluid 2 in liquid form in the sealed space 3 attaches to a wall surface of the sealed space 3, that is, a wall surface of the lower vapor flow path recess 12, a wall surface of the upper vapor flow path recess 21 and a wall surface of the liquid flow path portion 30 by surface tension thereof.

When the device D generates heat in this state, the working fluid 2 existing at the evaporating portion 11 in the lower vapor flow path recess 12 receives the heat from the device D. The received heat is absorbed as latent heat and the working fluid 2 evaporates (vaporization) to generate the vapor of the working fluid 2. Most of the generated vapor diffuses in the lower vapor flow path recess 12 and the upper vapor flow path recess 21 constituting the sealed space 3 (see solid arrows of FIG. 45). The vapor in the upper vapor flow path recess 21 and the lower vapor flow path recess 12 is separated from the evaporating portion 11, and most of the vapor is transported to a peripheral portion of the vapor chamber 1 with a relatively low temperature. The diffused vapor is subjected to heat dissipation to the lower metallic sheet 10 and the upper metallic sheet 20 to be cooled. The heat received by the lower metallic sheet 10 and the upper metallic sheet 20 from the vapor is transferred to the outside air via the housing member Ha (see FIG. 44).

Since the vapor is subjected to heat dissipation to the lower metallic sheet 10 and the upper metallic sheet 20, the vapor loses the latent heat absorbed in the evaporating portion 11 and is condensed. The working fluid 2 in a liquid form by condensation attaches to the wall surfaces of the lower vapor flow path recess 12 or the wall surfaces of the upper vapor flow path recess 21. Here, since the working fluid 2 continues to be evaporated at the evaporating portion 11, the working fluid 2 at portions other than the evaporating portion 11 in the liquid flow path portion 30 is transported toward the evaporating portion 11 (see dashed arrows in FIG. 45). Thereby, the working fluid 2 in liquid form attached to the wall surfaces of the lower vapor flow path recess 12 and the wall surfaces of the upper vapor flow path recess 21 moves toward the liquid flow path portion 30 and enters the liquid flow path portion 30. Consequently, due to capillary action of each of the main flow grooves 31, the working fluid 2 which is filled in the liquid flow path portion 30 obtains thrust toward the evaporating portion 11, and is smoothly transported to the evaporating portion 11.

The working fluid 2 which has reached the evaporating portion 11 receives heat again from the device D to evaporate. In this way, the working fluid 2 circulates in the vapor chamber 1 while executing a change of phase, that is, repeating evaporation and condensation to transfer heat of the device D for releasing. As a result, the device D is cooled.

As described above, according to this embodiment, the width w9 of the lower injection flow path recess 17 is wider than the width w7 of the lower vapor passage 81. Consequently, the cross section of the lower injection flow path recess 17 in the width direction (second direction Y) is wider than the cross section of the lower vapor passage 81 in the width direction (second direction Y). Thereby, the operation of deaerating the sealed space 3 by vacuuming the injection flow path, and the subsequent operation of injecting the working fluid 2 into the sealed space 3, during manufacturing of the vapor chamber 1, can be performed efficiently and rapidly. Especially, in a case where the width w9 of the lower injection flow path recess 17 is at least 1.5 times as large as the width w7 of the lower vapor passage 81, such an advantageous effect can be remarkably obtained.

According to this embodiment, since the plurality of columns 155 are provided for the lower injection flow path recess 17 in a protruding manner, the lower injection flow path recess 17 can be inhibited from being deformed. This can prevent a trouble in the operation of deaerating the sealed space 3 and the operation of injecting the working fluid 2 into the sealed space 3 due to the deformation of the lower injection flow path recess 17, during manufacturing of the vapor chamber 1, and can efficiently perform the deaeration operation and the injecting operation.

According to this embodiment, the caulking region 154 is formed on the lower injection flow path recess 17, and the caulking region 154 has the plurality of projections 156. The working fluid 2 is injected into the sealed space 3, and subsequently the plurality of projections 156 are crushed when the caulking region 154 is subjected to caulking. This can further securely seal the sealed space 3.

According to this embodiment, the depth d1 of the lower injection flow path recess 17 is deeper than the depth h0 of the vapor flow path recess 12. Consequently, the sectional area of the lower injection flow path recess 17 in the width direction (second direction Y) is larger than the sectional area of the lower vapor passage 81 in the width direction (second direction Y). Thereby, during manufacturing of the vapor chamber 1, the operation of deaerating the sealed space 3, and the operation of injecting the working fluid 2 into the sealed space 3 can be efficiently performed.

Furthermore, according to this embodiment, the liquid flow path portion 30 includes a plurality of main flow grooves 31 extending in parallel with each other, and communicating grooves allowing the main flow grooves 31 adjacent to each other to communicate. Thereby, the working fluid 2 in liquid form reciprocates between the main flow grooves 31 adjacent to each other, which inhibits occurrence of dryout in the main flow grooves 31. Accordingly, capillary action is applied to the working fluid 2 in each of the main flow grooves 31, so that the working fluid 2 is smoothly transported toward the evaporating portion 11.

Furthermore, according to this embodiment, in the liquid flow path portion 30, a plurality of convex portions 33 are formed in a staggered arrangement in a planar view. Thereby, the capillary action applied to the working fluid 2 in the main flow grooves 31 can be equalized in the width direction of the main flow grooves 31. In other words, since the plurality of convex portions 33 have a staggered arrangement in a planar view, the communicating grooves 32 alternately communicate with both ends of the main flow grooves 31. Consequently, unlike a case where the communicating grooves 32 communicate at the same positions of both ends of the main flow grooves 31, loss of capillary action in a direction toward the evaporating portion 11 by the communicating grooves 32 can be inhibited. Consequently, at intersections between the main flow grooves 31 and the communicating grooves 32, the capillary action can be inhibited from decreasing, and the capillary action can be continuously applied to the working fluid 2 toward the evaporating portion 11.

The sealed space 3 is depressurized as described above. Accordingly, the lower metallic sheet 10 and the upper metallic sheet 20 receive pressure in a direction of being recessed inwardly in the thickness direction from the outside air. Here, if the communicating grooves 32 communicate at the same positions on both ends of the corresponding main flow grooves 31 in the longitudinal direction, a possibility can be considered that the lower metallic sheet 10 and the upper metallic sheet 20 are recessed inwardly in the thickness direction along a direction parallel with the communicating grooves 32. In this case, the flow path sectional area of each main flow groove 31 is decreased, and the flow path resistance of the working fluid 2 can be increased. On the contrary, according to this embodiment, in the liquid flow path portion 30, the plurality of convex portions 33 are formed in a staggered arrangement in a planar view. Thereby, even if the lower metallic sheet 10 and the upper metallic sheet 20 are recessed inwardly in the thickness direction along the communicating grooves 32, the recess can be prevented from traversing the main flow grooves 31, and the flow path sectional area of the main flow grooves 31 can be secured, which inhibits blocking of the flow of the working fluid 2.

Figure 54:
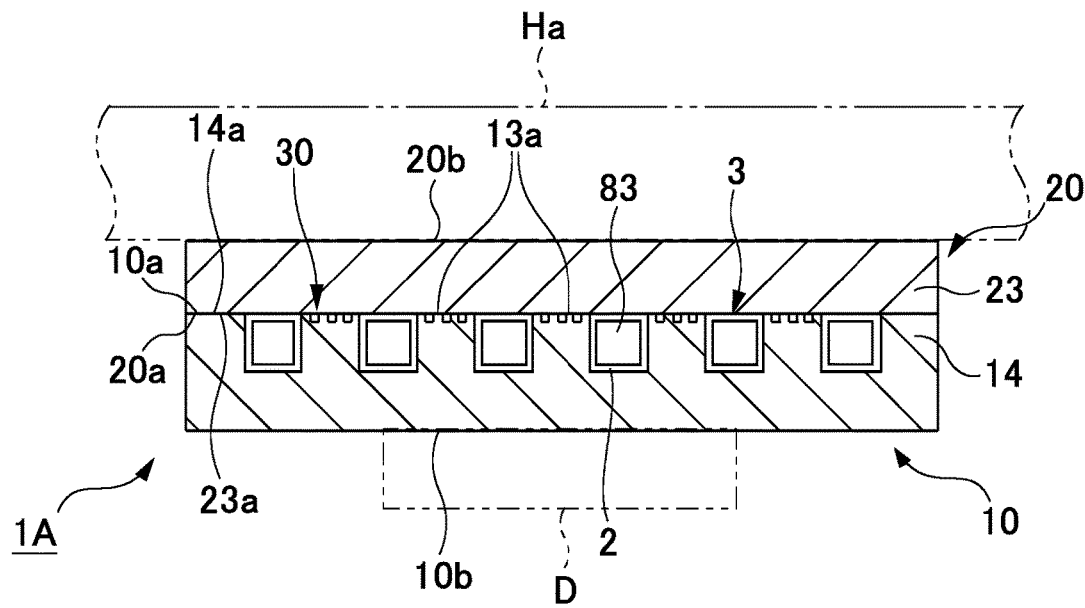
FIG. 54 is a drawing showing a modification of the vapor chamber of FIG. 44.
Figure 55:
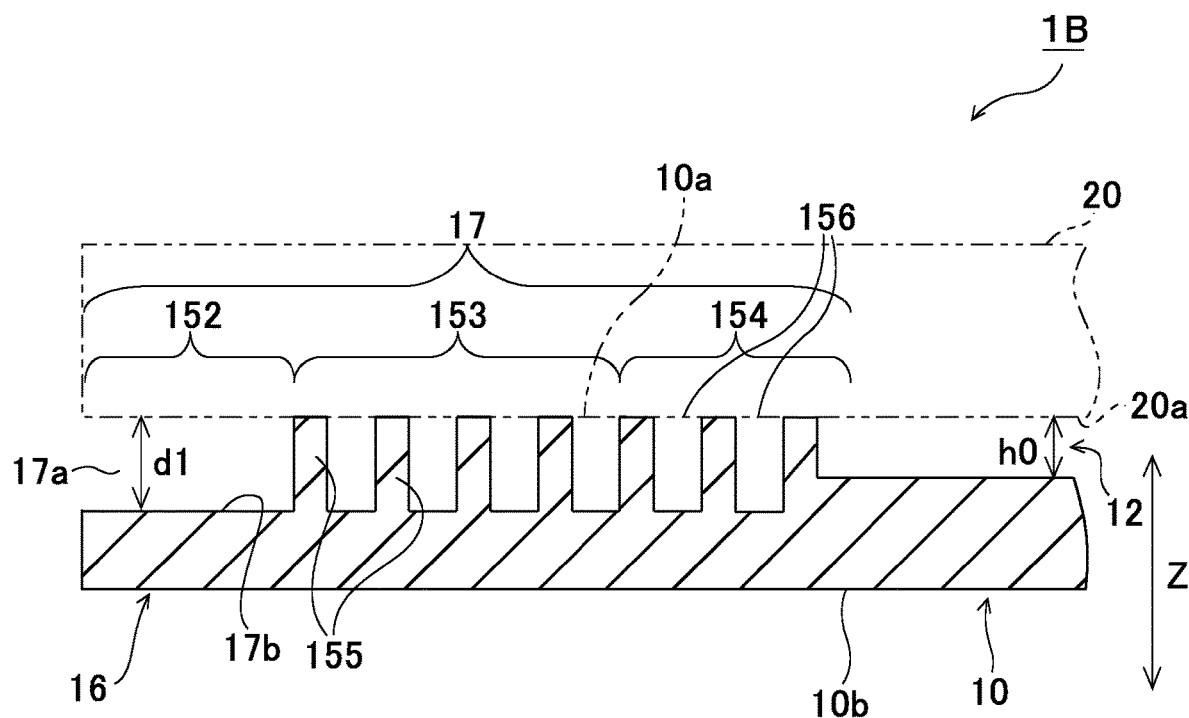
FIG. 55 is a drawing showing another modification of the lower injection protruding portion of FIG. 48
Figure 56:
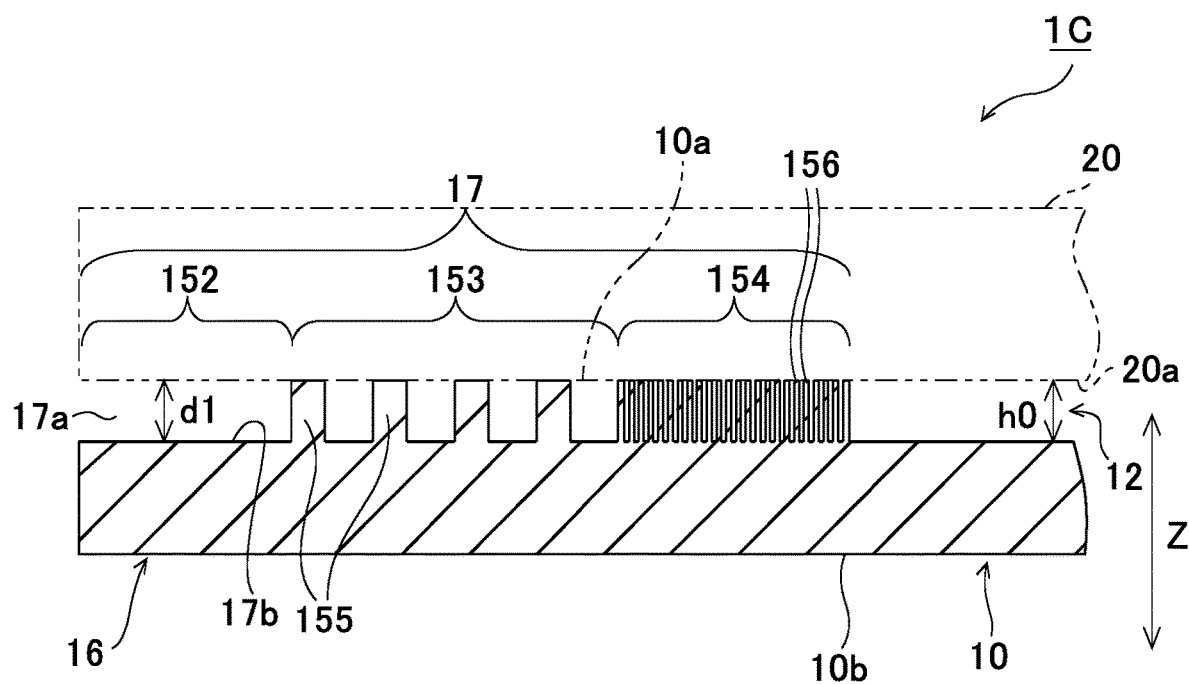
FIG. 56 is a drawing showing another modification of the lower injection protruding portion of FIG. 48

Next, referring to FIGS. 54 to 56, each modification of the vapor chamber will be explained. In FIGS. 54 to 56, the same components as those in FIGS. 43 to 53C are assigned the same reference numerals, and a detailed explanation thereof is omitted.

FIG. 54 shows a vapor chamber 1A according to a modification. Unlike the embodiment shown in FIGS. 43 to 53C, in the vapor chamber 1A shown in FIG. 54, the upper vapor flow path recess 21 is not formed in the upper metallic sheet 20. Although not shown in FIG. 44, the width of the injection flow path recess (the lower injection flow path recess 17 or the upper injection flow path recess) is wider than the width of the lower vapor passage 81. In this case, the thickness of the upper metallic sheet 20 can be reduced, which can reduce the thickness of the entire vapor chamber 1.

FIG. 55 shows a vapor chamber 1B according to another modification, and is a diagram corresponding to FIG. 48 described above. Unlike the embodiment shown in FIGS. 43 to 53C, in the vapor chamber 1B shown in FIG. 55, the shape of each projection 156 in the caulking region 154 is substantially the same as the shape of each column 155 of the intermediate region 153. The depth of the lower injection flow path recess 17 in the caulking region 154 may be the same as the depth d1 of the lower injection flow path recess 17 in the input region 152 and in the intermediate region 153. In this case, the interval p3 between the projections 156 is increased, and by deformation of the lower injection flow path recess 17, the operation of deaerating the sealed space 3 and the operation of injecting the working fluid 2 into the sealed space 3 can be efficiently performed.

FIG. 56 shows a vapor chamber 1C according to another modification, and is a diagram corresponding to FIG. 48 described above. Unlike the embodiment shown in FIGS. 43 to 53C, in the vapor chamber 1C shown in FIG. 56, the depth d1 of the lower injection flow path recess 17 is substantially uniform across the input region 152, the intermediate region 153 and the caulking region 154, and is the same as the depth h0 of the vapor flow path recess 12. In this case, the depth d1 of the lower injection flow path recess 17 and the depth h0 of the vapor flow path recess 12 are the same as each other. Accordingly, by deformation of the lower injection flow path recess 17, the operation of deaerating the sealed space 3 and the operation of injecting the working fluid 2 into the sealed space 3 can be smoothly performed.

Eleventh Embodiment

Next, a vapor chamber, an electronic device, a metallic sheet for the vapor chamber and a manufacturing method of the vapor chamber according to an eleventh embodiment of the present invention will be explained using FIGS. 57 to 59.

Figure 57:
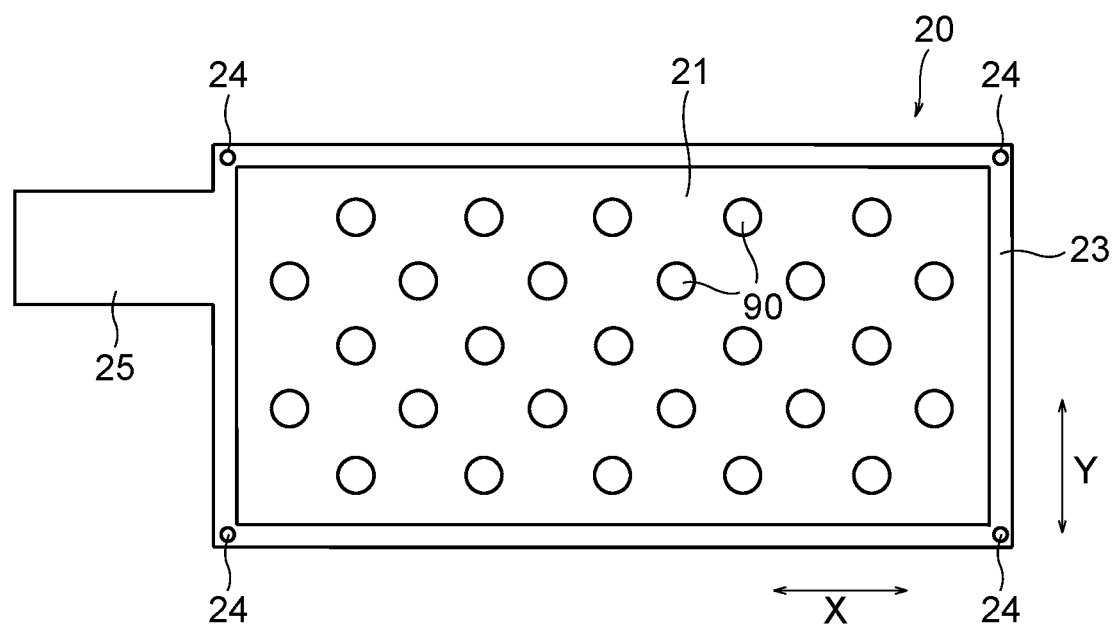
FIG. 57 is a bottom view of an upper metallic sheet of a vapor chamber according to an eleventh embodiment.
Figure 58:
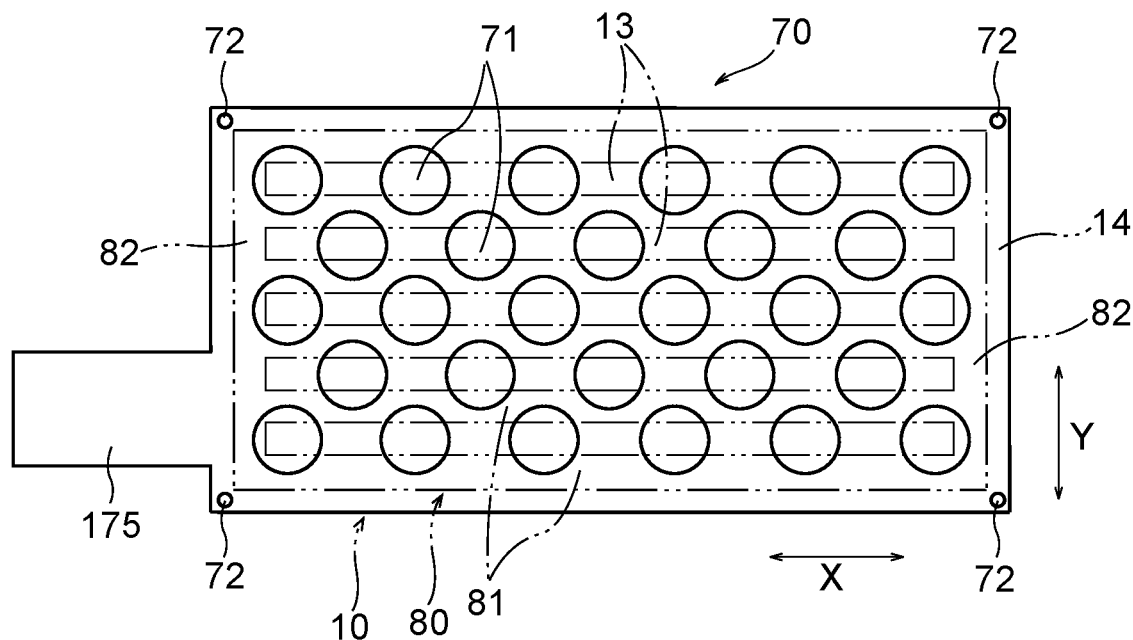
FIG. 58 is a top view of an intermediate metallic sheet of the vapor chamber according to the eleventh embodiment.
Figure 59:
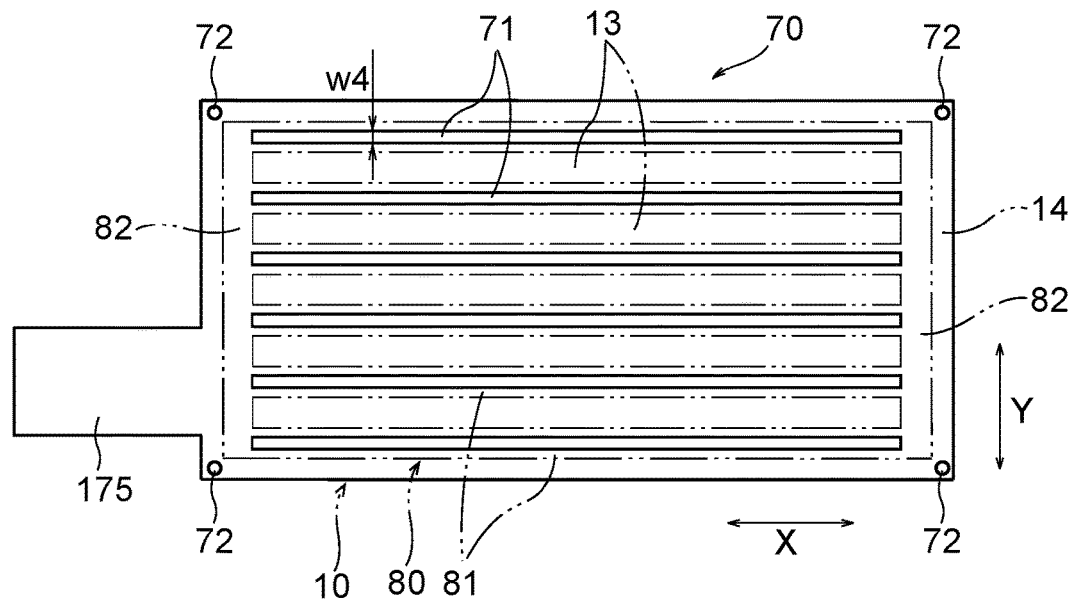
FIG. 59 is a drawing showing a modification of the intermediate metallic sheet of FIG. 58.

In the eleventh embodiment shown in FIGS. 57 to 59, a main difference is that an intermediate metallic sheet is interposed between a lower metallic sheet and an upper metallic sheet, the vapor flow path recess is formed in one of the lower metallic sheet and the upper metallic sheet, and the liquid flow path portion is formed on the other sheet, and the intermediate metallic sheet is provided with communicating portions that allow the vapor flow path recess and the liquid flow path portion to communicate. The other configurations are substantially the same as in the third embodiment shown in FIGS. 20 to 25 and the tenth embodiment shown in FIGS. 43 to 56. Additionally, in FIGS. 57 to 59, the same components as those in the third embodiment shown in FIGS. 20 to 25 and the tenth embodiment shown in FIGS. 43 to 56 are assigned the same reference numerals, and a detailed explanation thereof is omitted.

In this embodiment, the injection portion 4 may be formed similarly to the injection portion 4 in the tenth embodiment shown in FIGS. 43 to 56. In other words, the lower metallic sheet 10 includes the lower injection protruding portion 16, and the lower injection flow path recess (injection flow path recess) 17 is formed on the upper surface of the lower injection protruding portion 16. The upper metallic sheet 20 includes the upper injection protruding portion 25. However, no recess is formed on the lower surface of the upper injection protruding portion 25, which is formed to have a flat shape.

In this embodiment, as shown in FIG. 20, an intermediate metallic sheet 70 is interposed between the lower metallic sheet 10 and the upper metallic sheet 20. As shown in FIGS. 57 and 58, the intermediate metallic sheet 70 includes an intermediate injection protruding portion 175 laterally protruding from the end surface. However, on the upper surface and the lower surface of the intermediate injection protruding portion 175, no recess is formed, and this portion has the same thickness as the unprocessed intermediate metallic sheet 70. The upper surface and the lower surface of the intermediate injection protruding portion 175 are formed to have flat shapes. The lower injection flow path recess 17 and the intermediate injection protruding portion 175 integrally form an injection flow path of the working fluid 2 when the lower metallic sheet 10 and the intermediate metallic sheet 70 are joined. The injection protruding portions 16, 25, 175 are configured to be overlapped with each other after the lower metallic sheet 10, the upper metallic sheet 20 and the intermediate metallic sheet 70 are joined. The intermediate injection protruding portion 175 may be formed similarly to the upper injection protruding portion 25.

However, there is no limitation thereto. For example, in addition to the lower injection flow path recess 17 or instead of the lower injection flow path recess 17, the injection flow path recess (injection flow path recess) may be formed on the lower surface of the upper injection protruding portion 25. Alternatively, instead of such an injection portion 4, the lower metallic sheet 10 or the upper metallic sheet 20 may be provided with an injection hole, and the working fluid 2 may be injected through the injection hole.

As described above, according to this embodiment, the intermediate metallic sheet 70 is interposed between the lower metallic sheet 10 and the upper metallic sheet 20, the lower surface 20a of the upper metallic sheet 20 is provided with the upper vapor flow path recess 21, and the upper surface 10a of the lower metallic sheet 10 is provided with the liquid flow path portion 30. The intermediate metallic sheet 70 is provided with communicating holes 71 allowing communication between the upper vapor flow path recesses 21 and the liquid flow path portion 30. Thereby, even in a case where three metallic sheets 10, 20, 70 constitute the vapor chamber 1, the heat of the device D can be transferred and released by circulating the working fluid 2 in the sealed space 3, with the change of phase being repeated. Since the upper vapor flow path recess 21 of the upper metallic sheet 20 widely communicates, which can smoothly diffuse the vapor of the working fluid 2, and improve the thermal transport efficiency.

According to this embodiment, similar to the tenth embodiment shown in FIGS. 43 to 56, the width w9 of the lower injection flow path recess 17 is wider than the width w7 of the lower vapor passage 81. Thereby, the operation of deaerating the sealed space 3 by vacuuming the injection flow path, and the subsequent operation of injecting the working fluid 2 into the sealed space 3, during manufacturing of the vapor chamber 1, can be performed efficiently and rapidly.

In this embodiment, the example where the planar shape of each communicating hole 71 is circular. However, not limited to this, as shown in FIG. 59, similar to FIG. 27, the communicating holes 71 are formed so as to extend to be elongated along the first direction X. That is, this embodiment described above can be combined with the fourth embodiment described above.

Twelfth Embodiment

Next, a vapor chamber, an electronic device, a metallic sheet for the vapor chamber and a manufacturing method of the vapor chamber according to a twelfth embodiment of the present invention will be explained using FIGS. 60 and 61.

Figure 60:
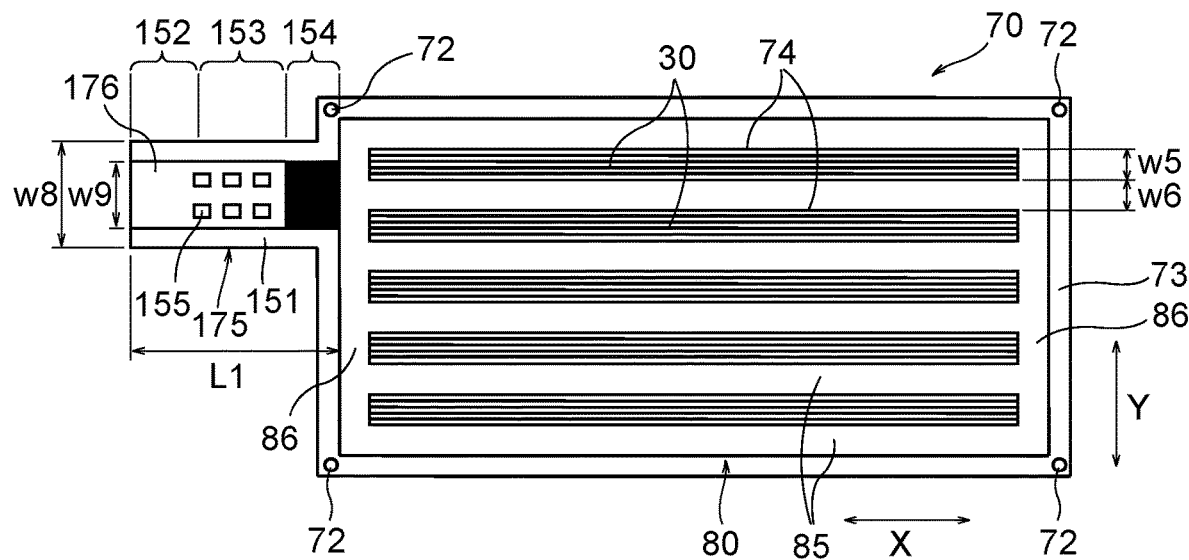
FIG. 60 is a bottom view of an intermediate metallic sheet of a vapor chamber according to a twelfth embodiment.
Figure 61:
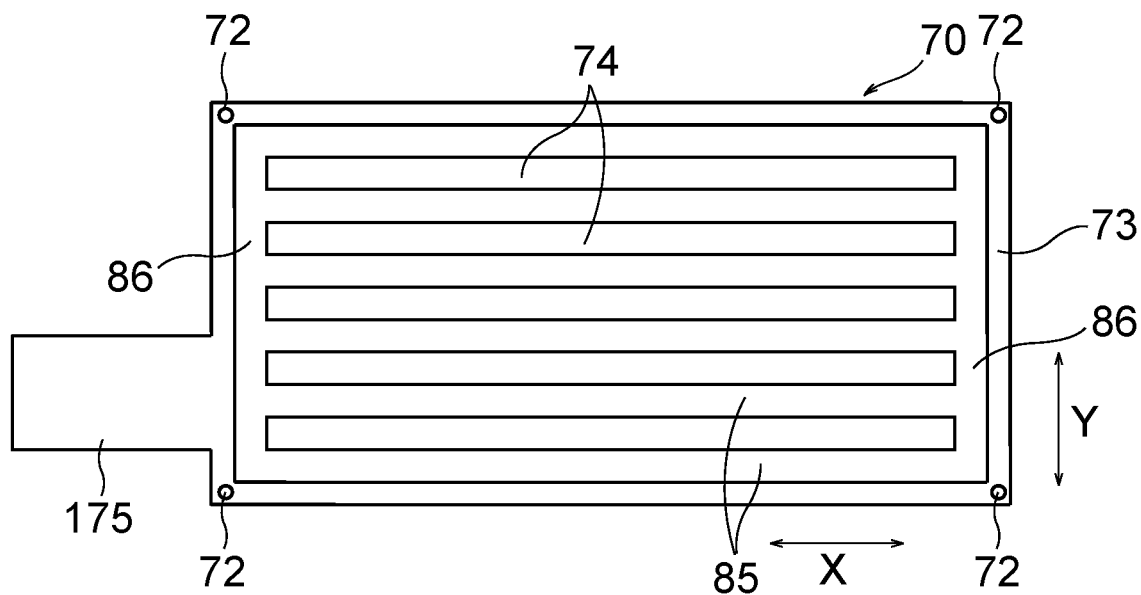
FIG. 61 is a top view of the intermediate metallic sheet of the vapor chamber according to the twelfth embodiment.

In the twelfth embodiment shown in FIGS. 60 and 61, a main difference is that a vapor flow path portion including a plurality of vapor passages on at least one of the lower surface and the upper surface of the intermediate metallic sheet, a liquid flow path portion is formed on at least one of the lower surface and the upper surface of the intermediate metallic sheet, an injection liquid flow path portion is formed on at least one of the lower surface and the upper surface of the intermediate metallic sheet, and the width of the injection liquid flow path portion is wider than the width of the vapor passage. The other configurations are substantially the same as in the fifth embodiment shown in FIGS. 28 to 33 and the eleventh embodiment shown in FIGS. 57 to 59. Additionally, in FIGS. 60 and 61, the same components as those in the fifth embodiment shown in FIGS. 28 to 33 and the eleventh embodiment shown in FIGS. 57 to 59 are assigned the same reference numerals, and a detailed explanation thereof is omitted.

In this embodiment, as shown in FIG. 28, an intermediate metallic sheet 70 is interposed between the lower metallic sheet 10 and the upper metallic sheet 20. As shown in FIG. 60, in this embodiment, the intermediate injection flow path portion 176 (injection flow path portion) is formed to be concave on the lower surface of the intermediate injection protruding portion 175 constituting the injection portion 4. The lower injection flow path recess 17 is not formed on the upper surface of the lower injection protruding portion 16. The upper surface is formed to have a planar shape. The lower injection protruding portion 16 and the intermediate injection flow path portion 176 integrally form an injection flow path of the working fluid 2 when the lower metallic sheet 10 and the intermediate metallic sheet 70 are joined. As shown in FIG. 61, the injection flow path portion is not formed on the upper surface of the intermediate injection protruding portion 175. In addition to the lower surface of the intermediate injection protruding portion 175 or instead of the lower surface, the intermediate injection flow path portion 176 may be formed on the upper surface of the intermediate injection protruding portion 175.

The intermediate injection protruding portion 175 and the intermediate injection flow path portion 176 can be formed similarly to the lower injection protruding portion 16 and the lower injection flow path recess 17 in the tenth embodiment. For example, the intermediate injection protruding portion 175 may have the width w8 and the length L1 similar to those of the lower injection protruding portion 16. For example, the intermediate injection flow path portion 176 may have the width w9 similar to that of the lower injection flow path recess 17.

In this embodiment, the width w9 of the intermediate injection flow path portion 176 may be wider than the width w6 of the intermediate vapor passage 85 described above. In this case, for example, the width w6 is 0.05 mm to 2.0 mm, and the width w9 is 1 mm to 10 mm. The width w9 of the intermediate injection flow path portion 176 is preferably at least 1.5 times as wide as the width w6 of the intermediate vapor passage 85. More specifically, for example, if the width w6 is 0.05 mm, the width w9 may be 1 mm to 6 mm, and preferably, 1 mm to 3 mm. If the width w6 is 2 mm, for example, the width w9 may be 3.5 mm to 10 mm, and preferably, 1 mm to 6 mm. In this way, the width w9 of the intermediate injection flow path portion 176 is configured to be wider than the width w6 of the intermediate vapor passage 85, which can rapidly perform deaeration from the sealed space 3 and inject the working fluid 2 into the sealed space 3.

The intermediate injection flow path portion 176 is not limited to that formed to be concave. For example, the intermediate injection flow path portion 176 may extend from the lower surface 70a to the upper surface 70b of the intermediate metallic sheet 70, and may be formed to penetrate the intermediate metallic sheet 70. In this case, the columns 155 may be supported by the bank portion 151 via a supporting portion, not shown. The projections 156 may be formed to have column shapes and be supported by the bank portion 151 via a supporting portion, not shown.

As described above, according to this embodiment, the intermediate metallic sheet 70 is interposed between the lower metallic sheet 10 and the upper metallic sheet 20, the upper surface 70*b* of the intermediate metallic sheet 70 is provided with the vapor flow path portion 80, and the lower surface 70*a* of the intermediate metallic sheet 70 is provided with the liquid flow path portion 30. Thereby, even in a case where three metallic sheets 10, 20, 70 constitute the vapor chamber 1, the heat of the device D can be transferred and released by circulating the working fluid 2 in the vapor chamber 1 in the sealed space 3, with the change of phase being repeated.

According to this embodiment, the vapor flow path portion 80 is provided on the upper surface 70*b* of the intermediate metallic sheet 70 interposed between the lower metallic sheet 10 and the upper metallic sheet 20, and the liquid flow path portions 30 are provided on the lower surface 70*a*. This negates the need of the etching process for forming the vapor flow path and the liquid flow path, to the lower metallic sheet 10 and the upper metallic sheet 20. In other words, the number of members to be subjected to the etching process can be reduced. Consequently, the step of manufacturing the vapor chamber 1 can be simplified, thereby allowing the vapor chamber 1 to be simply manufactured. The vapor flow path portion 80 and the liquid flow path portions 30 are formed on the intermediate metallic sheet 70. Consequently, the vapor flow path portion 80 and the liquid flow path portions 30 can be accurately positioned during the etching process. This negates the need to position the vapor flow path portion 80 and the liquid flow path portions 30 with respect to each other in an assembling step. As a result, the vapor chamber 1 can be simply manufactured. The height (or depth) of the vapor flow path can be defined by the thickness of the intermediate metallic sheet 70, and the vapor chamber 1 can be simply manufactured.

According to this embodiment, similar to the tenth embodiment shown in FIGS. 43 to 56, the width w9 of the intermediate injection flow path portion 176 is wider than the width w6 of the intermediate vapor passage 85. Thereby, the operation of deaerating the sealed space 3 by vacuuming the injection flow path, and the subsequent operation of injecting the working fluid 2 into the sealed space 3, during manufacturing of the vapor chamber 1, can be performed efficiently and rapidly.

Thirteenth Embodiment

Next, a vapor chamber, an electronic device, a metallic sheet for the vapor chamber and a manufacturing method of the vapor chamber according to a thirteenth embodiment of the present invention will be explained using FIGS. 62 to 76.

In the thirteenth embodiment shown in FIGS. 62 to 76, a main difference is that a first peripheral liquid flow path portion through which a working fluid in liquid form passes is formed on the first metallic sheet along the periphery of the first metallic sheet, and the first peripheral liquid flow path portion is formed over the entire periphery of the first metallic sheet. The other configurations are substantially the same as in the tenth embodiment shown in FIGS. 43 to 56. Additionally, in FIGS. 62 to 76, the same components as those in the tenth embodiment shown in FIGS. 43 to 56 are assigned the same reference numerals, and a detailed explanation thereof is omitted.

In the typical vapor chamber, a wick is arranged along the outer periphery of the sheet body. Consequently, if vapor is condensed to be the working fluid at any place on the vapor passage, the working fluid can be returned to a heat receiving portion by the capillary force of the wick. However, in Patent Literature 4, the wick is not formed continuously around an injection port (liquid injection nozzle). Accordingly, there is a possibility that a problem occurs in circulation of the working fluid at the outer peripheral portion of the sheet body especially around the injection port.

The thirteenth embodiment is made considering this point, and has an object to provide a vapor chamber, an electronic device, and a metallic sheet for the vapor chamber which allow the working fluid to circulate over the entire region of the outer peripheral portion of the metallic sheet. Consequently, this embodiment is not limited to that the width of the communicating groove is larger than the width of the main flow groove. The width of the injection flow path recess is not limited to a case of being wider than the width of the vapor passage.

This embodiment, and the fourteenth embodiment and the fifteenth embodiment which will be described later mainly correspond to the thirtieth solution to thirty-third solution described above. Hereinafter, this embodiment will be explained with reference to drawings.

In this embodiment, the sealed space 3 includes a vapor flow path portion 80 through which a vapor of the working fluid 2 mainly passes (a lower vapor flow path recess 12 and an upper vapor flow path recess 21 which will be described later) and a liquid flow path portion 30 and peripheral liquid flow path portions 118, 127 through which the working fluid 2 in liquid form mainly passes.

Figure 62:
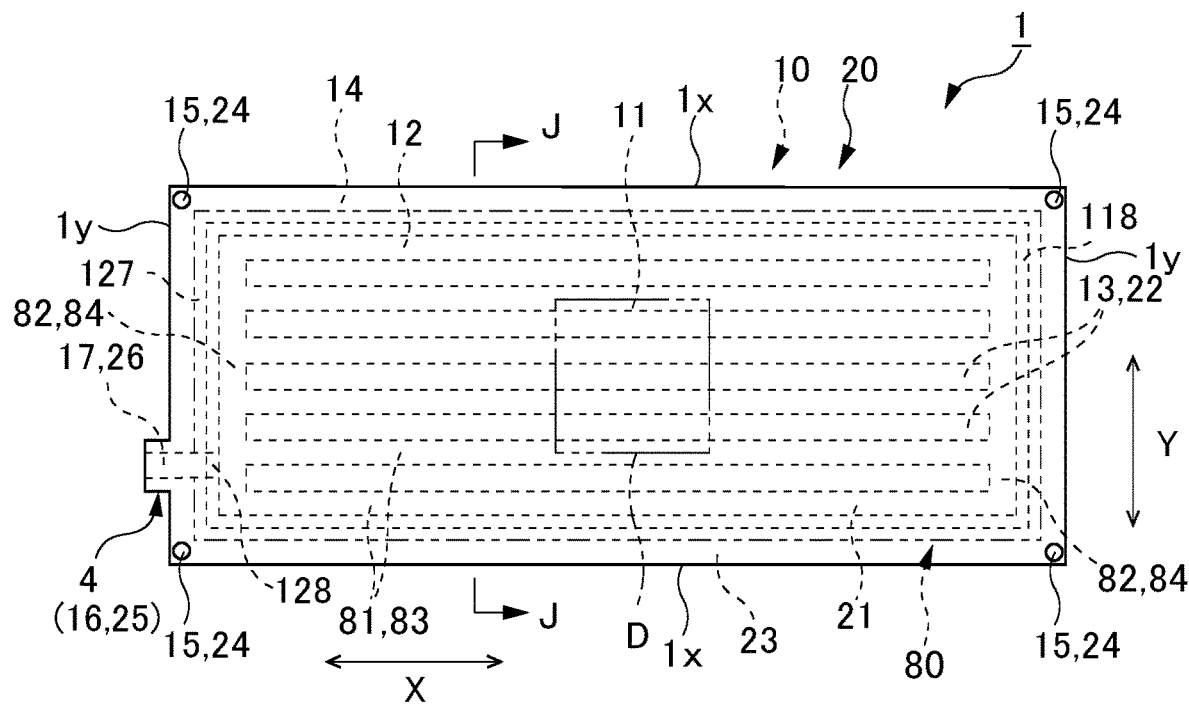
FIG. 62 is a top view showing a vapor chamber according to a thirteenth embodiment.

Also, as shown in FIG. 62, the vapor chamber 1 further includes an injection portion 4 for pouring the working fluid 2 into the sealed space 3 at one of a pair of end portions in the first direction X. The injection portion 4 includes the lower injection protruding portion 16 protruding from the end surface (the surface corresponding to the outer edges 1*y* in FIG. 62) of the lower metallic sheet 10, and the upper injection protruding portion 25 protruding from the end surface (the surface corresponding to the outer edges 1*y* in FIG. 62) of the upper metallic sheet 20. Among these components, the lower injection flow path recess 17 is formed on the upper surface of the lower injection protruding portion 16 (the surface corresponding to the upper surface 10*a* of the lower metallic sheet 10), and the upper injection flow path recess 26 is formed on the lower surface of the upper injection protruding portion 25 (the surface corresponding to the lower surface 20*a* of the upper metallic sheet 20). The lower injection flow path recess 17 communicates with the lower vapor flow path recess 12, and the upper injection flow path recess 26 communicates with the upper vapor flow path recess 21. The lower injection flow path recess 17 and the upper injection flow path recess 26 integrally form an injection flow path of the working fluid 2 when the lower metallic sheet 10 and the upper metallic sheet 20 are joined. The working fluid 2 then passes through the injection flow path and is poured into the sealed space 3. Additionally, in this embodiment, while an example in which the injection portion 4 is provided at one of the pair of end portions of the vapor chamber 1 in the first direction X, this is not restrictive. The injection portion 4 may be provided at any position. Two or more injection portions 4 may be provided.

As described above, the lower vapor passages 81 communicate with each other via the lower communicating vapor passage 82. Thereby, the vapor of the working fluid 2 can reciprocate between the lower vapor passages 81. Consequently, the vapor of the working fluid 2 can be further diffused.

In a region of the lower peripheral wall 14, on the side of the lower vapor flow path recess 12, a annular-shaped lower peripheral liquid flow path portion 118 (a first peripheral liquid flow path portion or a second peripheral liquid flow path portion) through which the working fluid 2 in liquid form passes is formed. The lower peripheral liquid flow path portion 118 is formed in an inner portion of the lower peripheral wall 14 along the periphery of the lower metallic sheet 10 in a planar view. The lower peripheral liquid flow path portion 118 is formed to surround the sealed space 3, especially the lower vapor flow path recess 12. In other words, in a planar view, between the liquid flow path portion 30 and the lower peripheral liquid flow path portion 118, the lower vapor passage 81 or the lower communicating vapor passage 82 of the lower vapor flow path recess 12 is interposed, and the liquid flow path portion 30 and the lower peripheral liquid flow path portion 118 are separated. The lower peripheral liquid flow path portion 118 has a rectangular annular shape in a planar view. Each side thereof is in parallel to the first direction X or the second direction Y.

Figure 64:
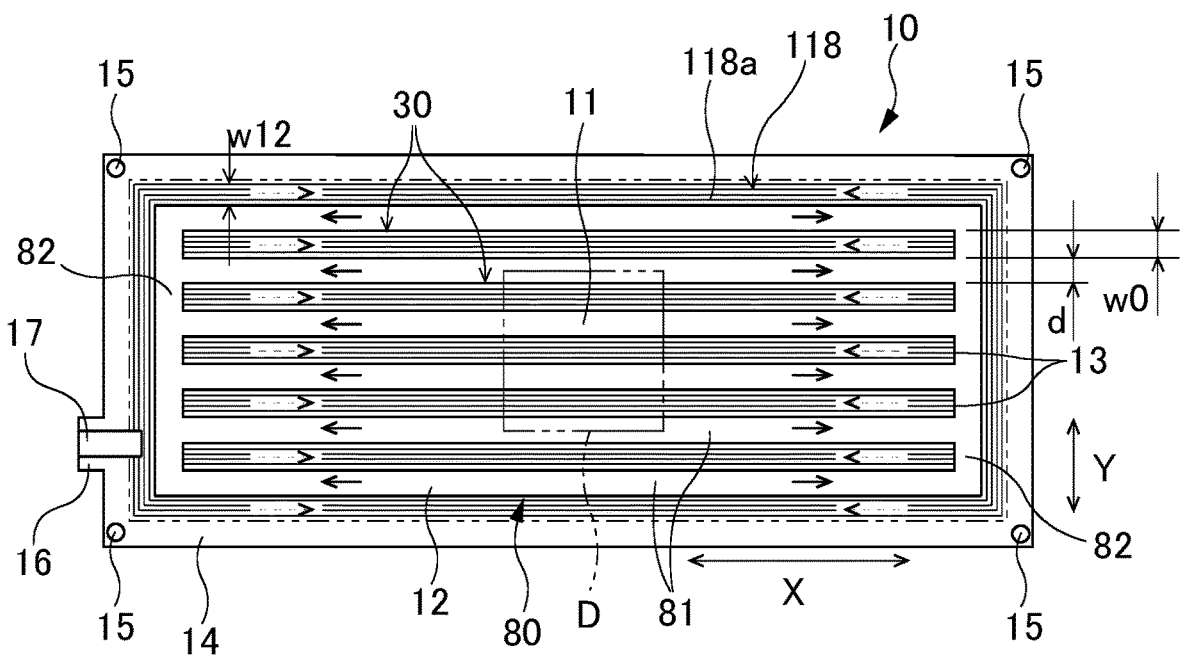
FIG. 64 is a top view showing a lower metallic sheet of the vapor chamber of FIG. 62.

As shown in FIG. 64, the lower peripheral liquid flow path portion 118 is formed on the entire periphery of the lower metallic sheet 10. In other words, the lower peripheral liquid flow path portion 118 is formed without discontinuity on the four sides constituting the rectangular lower metallic sheet 10. The lower peripheral liquid flow path portion 118 is formed across the injection flow path of the working fluid 2 formed of the lower injection flow path recess 17. The working fluid 2 can circulate also adjacent to the lower injection flow path recess 17. In FIG. 64, the lower injection flow path recess 17 extends to the middle of the lower peripheral liquid flow path portion 118 in the width direction (first direction X). However, not limited thereto, the lower injection flow path recess 17 does not necessarily extend to the lower peripheral liquid flow path portion 118.

The lower peripheral liquid flow path portion 118 is formed at a part (inner portion) of the annular-shaped lower peripheral wall 14 protruding upward (in the direction perpendicular to the bottom surface 12a) from the bottom surface 12a of the lower vapor flow path recess 12. The lower peripheral wall 14 includes the upper surface 14a that is in contact with a lower surface 23a of an upper peripheral wall 23 which will be described later. The upper surface 14a is a surface which is not etched by etching steps which will be described later, and formed on the same plane as the upper surface 10a of the lower metallic sheet 10.

The width w12 of the lower peripheral liquid flow path portion 118 is, for example, 0.03 mm to 30 mm, preferably, 0.03 mm to 2.0 mm. Here, the width w12 means the dimension of the lower peripheral liquid flow path portion 118 in a direction perpendicular to the longitudinal direction in a planar view. At a portion of the lower peripheral liquid flow path portion 118 parallel to the first direction X, the width w12 means the dimension in the second direction Y. At a portion parallel to the second direction Y, the width w12 means the dimension in the first direction X. The height of the lower peripheral wall 14 may be the same as the height of the lower flow path wall portion 13, and may be 10 μm to 200 μm.

In this embodiment, the upper metallic sheet 20 is different from that of the lower metallic sheet 10 in that the liquid flow path portions 30 which will be described later are not provided and the configuration of the upper peripheral liquid flow path portion 127 is different.

As described above, the upper vapor passages 83 communicate with each other via the upper communicating vapor passage 84. Thereby, the vapor of the working fluid 2 can reciprocate between the upper vapor passages 83. Consequently, the vapor of the working fluid 2 can be further diffused.

Figure 63:
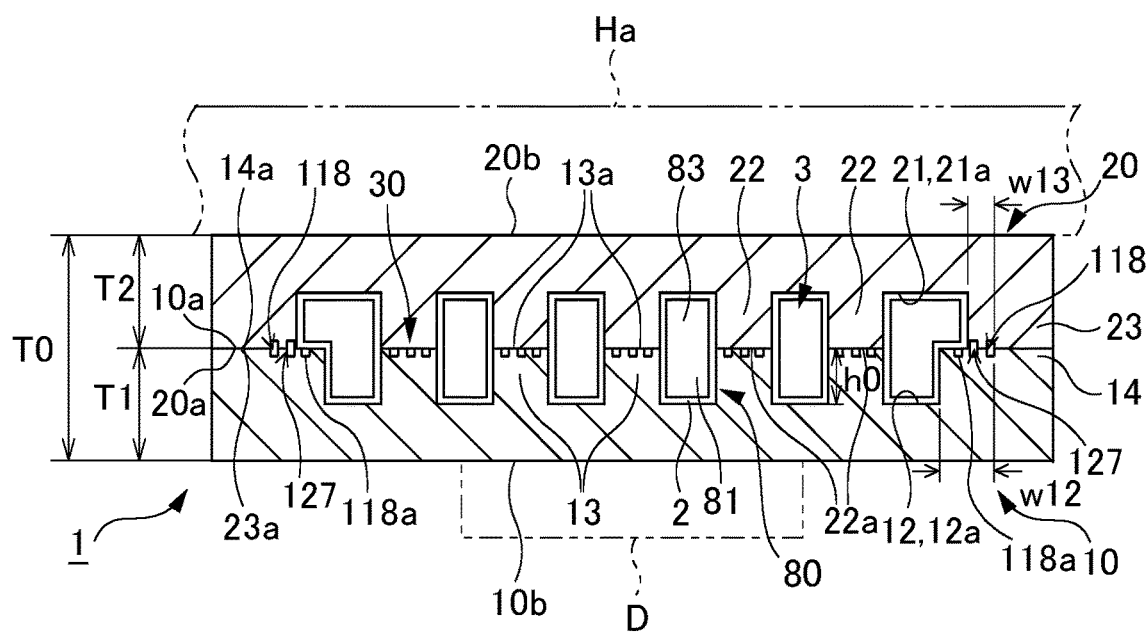
FIG. 63 is a cross-sectional view showing the vapor chamber of FIG. 62 taken along the line J-J.
Figure 65:
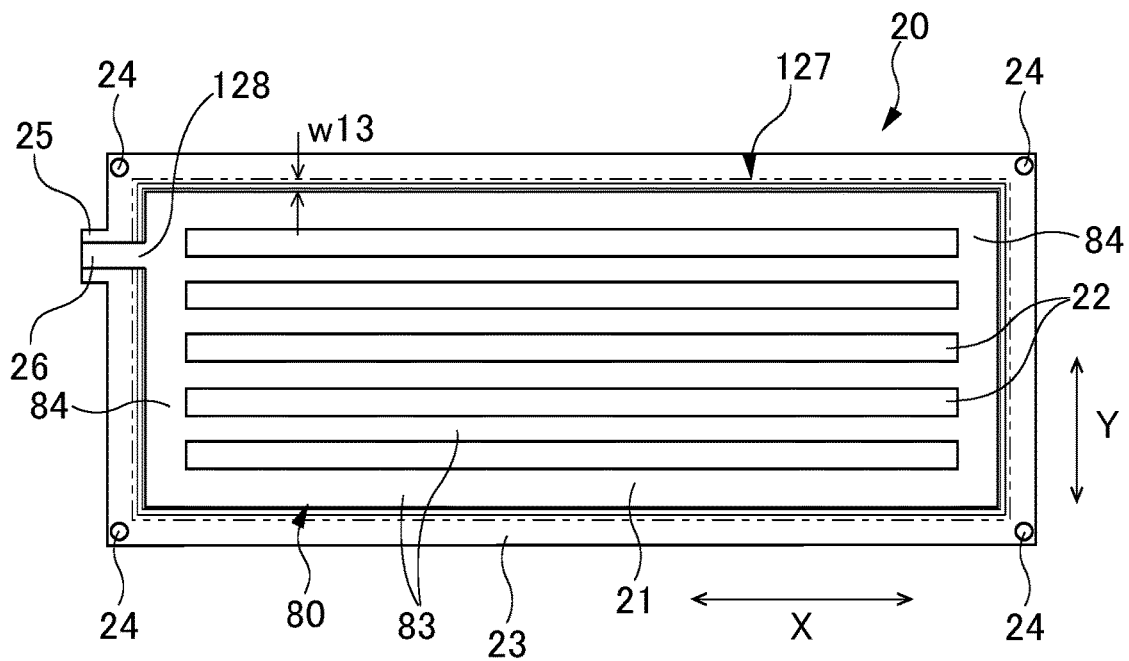
FIG. 65 is a bottom view showing an upper metallic sheet of the vapor chamber of FIG. 62.

As shown in FIGS. 63 and 65, in a region of the upper peripheral wall 23, on the side of the upper vapor flow path recess 21, a annular-shaped upper peripheral liquid flow path portion 127 (the second peripheral liquid flow path portion or the first peripheral liquid flow path portion) through which the working fluid 2 in liquid form is formed. The upper peripheral liquid flow path portion 127 is formed in an inner portion of the upper peripheral wall 23 along the periphery of the upper metallic sheet 20 in a planar view. The upper peripheral liquid flow path portion 127 is formed to surround the sealed space 3, especially the upper vapor flow path recess 21. In other words, in a planar view, between the liquid flow path portion 30 and the upper peripheral liquid flow path portion 127, the upper vapor passage 83 or the upper communicating vapor passage 84 of the upper vapor flow path recess 21 is interposed, and the liquid flow path portion 30 and the upper peripheral liquid flow path portion 127 are separated. The upper peripheral liquid flow path portion 127 has a rectangular annular shape in a planar view. Each side thereof is in parallel to the first direction X or the second direction Y.

As shown in FIG. 65, the upper peripheral liquid flow path portion 127 is formed over the entire region of the periphery of the upper metallic sheet 20 except a conduction portion 128 allowing communication between the upper injection flow path recess 26 and the upper vapor flow path recess 21. In other words, the upper peripheral liquid flow path portion 127 is partially noncontinuous at the conduction portion 128 through which the working fluid 2 is injected from the upper injection flow path recess 26. Consequently, in an enclosing step which will be described later, the working fluid 2 can be injected from the upper injection flow path recess 26 into the upper vapor flow path recess 21 through the conduction portion 128. On the other hand, the upper peripheral liquid flow path portion 127 is formed over the entire periphery of the upper metallic sheet 20 except the conduction portion 128. Accordingly, the working fluid 2 can circulate toward the evaporating portion 11 substantially over the entire periphery of the upper metallic sheet 20.

The upper peripheral liquid flow path portion 127 is formed at a part (inner portion) of the annular-shaped upper peripheral wall 23 protruding downward (in the direction perpendicular to the bottom surface 21a) from the bottom surface 21a of the upper vapor flow path recess 21. The upper peripheral wall 23 includes the lower surface 23a that is in contact with the upper surface 14a of a lower peripheral wall 14. The lower surface 23a is a surface which is not etched by etching steps which will be described later, and formed on the same plane as the lower surface 20a of the upper metallic sheet 20.

The width w13 of the upper peripheral liquid flow path portion 127 is, for example, 0.02 mm to 20 mm, preferably, 0.02 mm to 1.5 mm. Here, the width w13 means the dimension of the upper peripheral liquid flow path portion 127 in a direction perpendicular to the longitudinal direction in a planar view. At a portion of the upper peripheral liquid flow path portion 127 parallel to the first direction X, the width w13 means the dimension in the second direction Y. At a portion parallel to the second direction Y, the width w13 means the dimension in the first direction X. The height of the upper peripheral wall 23 may be the same as the height of the upper flow path wall portion 22, and may be 10 μm to 200 μm.

As shown in FIGS. 63 to 65, the width w12 of the lower peripheral liquid flow path portion 118 of the lower metallic sheet 10 is wider than the width w13 of the upper peripheral liquid flow path portion 127 of the upper metallic sheet 20 (w12>w13). Specifically, over the entire periphery except the conduction portion 128, the width w12 of the lower peripheral liquid flow path portion 118 is wider than the width w13 of the upper peripheral liquid flow path portion 127. The difference (w12−w13) between the width w12 of the lower peripheral liquid flow path portion 118 and the width w13 of the upper peripheral liquid flow path portion 127 may be 0.01 mm to 1 mm. The lower peripheral liquid flow path portion 118 protrudes toward the inside beyond the upper peripheral liquid flow path portion 127 in a planar view. The inner portion 118a of the protruding lower peripheral liquid flow path portion 118 is not in contact with the upper peripheral liquid flow path portion 127 and faces the upper vapor flow path recess 21. On the other hand, the outer periphery of the lower peripheral liquid flow path portion 118 is disposed at the same position as the outer periphery of the upper peripheral liquid flow path portion 127 in a planar view. In this way, in the inner portion 118a of the lower peripheral liquid flow path portion 118 extending toward the upper vapor flow path recess 21, the vapor of the working fluid 2 in the upper vapor flow path recess 21 can be directly condensed, which can stably perform condensation and circulation of the working fluid 2. However, not limited thereto, the width w13 of the upper peripheral liquid flow path portion 127 may be the same as the width w12 of the lower peripheral liquid flow path portion 118, and the width w13 of the upper peripheral liquid flow path portion 127 may be wider than the width w12 of the lower peripheral liquid flow path portion 118.

In this embodiment, a part of the lower peripheral liquid flow path portion 118 of the lower metallic sheet 10, and a part of the upper peripheral liquid flow path portion 127 of the upper metallic sheet 20 overlap with each other in a planar view. Specifically, except the inner portion 118a of the lower peripheral liquid flow path portion 118 and the conduction portion 128, the lower peripheral liquid flow path portion 118 and the upper peripheral liquid flow path portion 127 overlap with each other. Thereby, the lower peripheral liquid flow path portion 118 and the upper peripheral liquid flow path portion 127 can efficiently circulate the working fluid 2.

In this way, at the peripheries of the metallic sheets 10, 20, condensation and circulation of the working fluid 2 can be effectively performed between the lower peripheral liquid flow path portion 118 and the upper peripheral liquid flow path portion 127.

Next, the configurations of the liquid flow path portion 30 and the peripheral liquid flow path portion 118 will be explained in more detail using FIGS. 66 and 67.

Figure 66:
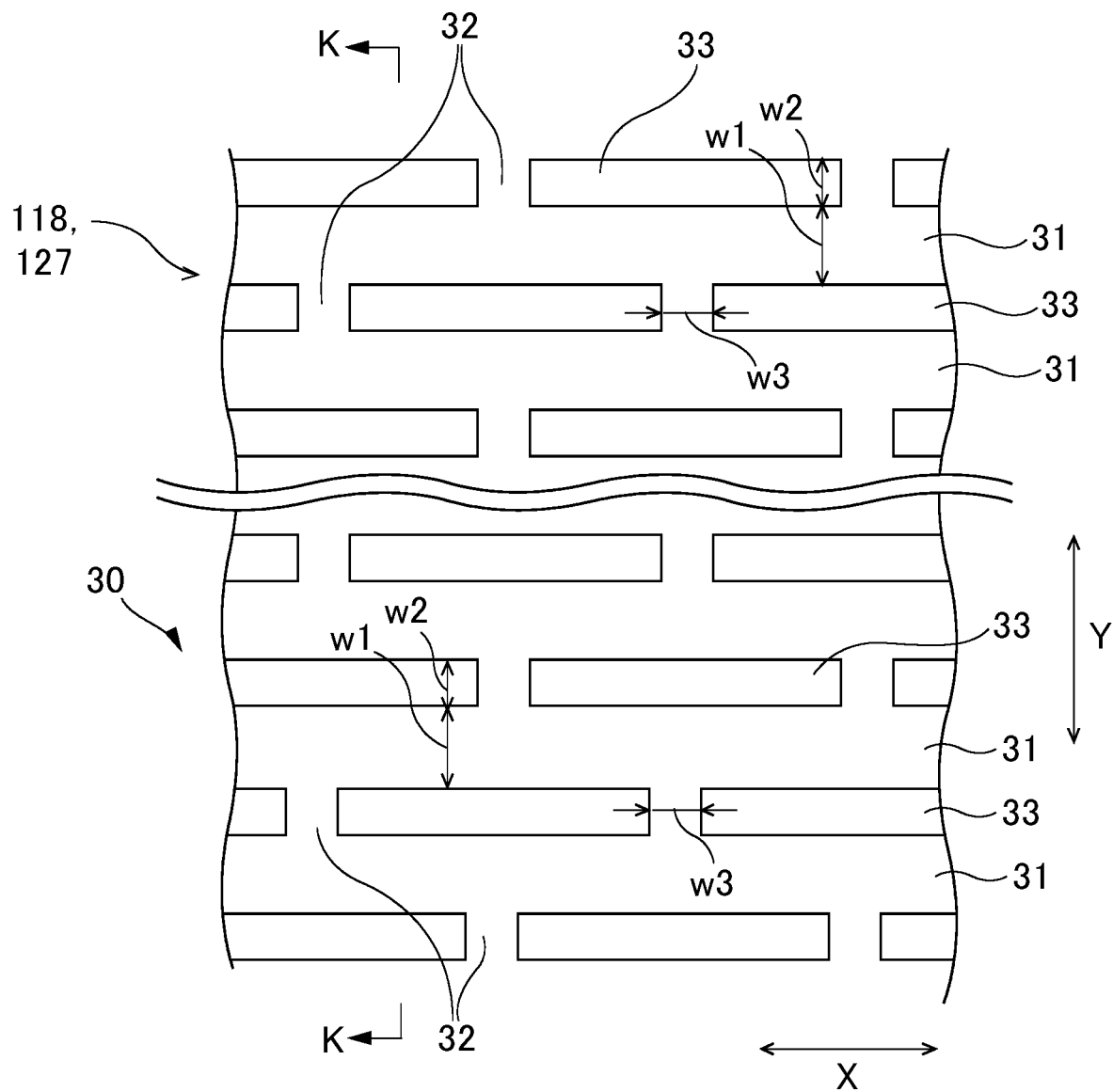
FIG. 66 is an enlarged top view showing a liquid flow path portion and peripheral liquid flow path portions of the vapor chamber of FIG. 64.

FIG. 66 is an enlarged plan view of the liquid flow path portion 30 and the peripheral liquid flow path portions 118, 127. FIG. 67 is a cross-sectional view of the liquid flow path portion 30 and the peripheral liquid flow path portions 118, 127. In this embodiment, an explanation will be made on a case where the shapes of the liquid flow path portion 30, the lower peripheral liquid flow path portion 118 and the upper peripheral liquid flow path portion 127 are the same as each other. However, the shapes of the liquid flow path portion 30, the lower peripheral liquid flow path portion 118 and the upper peripheral liquid flow path portion 127 may be different from each other.

As described above, the liquid flow path portion 30 through which the working fluid 2 in liquid form passes is provided in the upper surface 10a of the lower metallic sheet 10 (more specifically, the upper surface 13a of each lower flow path wall portion 13). The peripheral liquid flow path portions 118, 127 through which the working fluid 2 in liquid form passes are provided along the peripheries of the metallic sheets 10, 20. The liquid flow path portion 30 and the peripheral liquid flow path portions 118, 127 constitute a part of the above-described sealed space 3, and communicate with the lower vapor flow path recess 12 and the upper vapor flow path recess 21. The liquid flow path portion 30 is not necessarily provided in every lower flow path wall portions 13. For example, lower flow path wall portions 13 provided with no liquid flow path portion 30 may exist.

As shown in FIG. 66, the liquid flow path portion 30 and the peripheral liquid flow path portions 118, 127 include a plurality of main flow grooves 31 extending in parallel with each other, and communicating grooves 32 allowing the main flow grooves 31 adjacent to each other to communicate. At a portion of the liquid flow path portion 30 and the peripheral liquid flow path portions 118, 127 parallel with the first direction X, the main flow grooves 31 extend along the main flow direction of the working fluid 2 (the first direction X in this case). The communicating grooves 32 extend along a direction (the second direction Y in this case) orthogonal to the main flow direction of the working fluid 2, and allow the working fluid 2 to reciprocate between the main flow grooves 31 adjacent to each other. The working fluid 2 in liquid form passes through the main flow grooves 31 and the communicating grooves 32. The main flow grooves 31 and the communicating grooves 32 play a role of mainly transporting the working fluid 2, condensed from the vapor generated at the evaporating portion 11, to the evaporating portion 11. FIG. 66 shows both the lower peripheral liquid flow path portion 118 and the upper peripheral liquid flow path portion 127. In actuality, the lower peripheral liquid flow path portion 118 and the upper peripheral liquid flow path portion 127 overlap with each other in the vertical direction. A portion of the peripheral liquid flow path portions 118, 127 parallel with the second direction Y extends along the main flow direction of the working fluid 2 (the second direction Y in this case). The communicating grooves 32 extend along the first direction X.

In the liquid flow path portion 30 and the peripheral liquid flow path portions 118, 127, a plurality of convex portions 33 are formed in a staggered arrangement in a planar view. Each convex portion 33 is formed so as to be surrounded by the main flow grooves 31 and the communicating grooves 32. In FIG. 66, the plurality of convex portions 33 have shapes identical to each other, and each convex portion 33 is formed to be rectangular such that the first direction X is the longitudinal direction in a planar view. In this embodiment, the arrangement pitch of the convex portions 33 along the main flow direction of the working fluid 2 (the first direction X in this case) is constant. That is, the convex portions 33 are disposed at a regular interval in the first direction X. The convex portions 33 adjacent to each other in the second direction Y are disposed to deviate in the first direction X by substantially half a length of the convex portion 33.

The width (the dimension in the second direction Y) w1 of the main flow groove 31 may be larger than the width (the dimension in the second direction Y) w2 of the convex portions 33. In this case, the ratios of the main flow grooves 31 occupying the upper surface 13a of the lower flow path wall portion 13, the upper surface 14a of the lower peripheral wall 14, and the lower surface 23a of the upper peripheral wall 23 can be high. Consequently, the flow path densities of the main flow grooves 31 in the lower flow path wall portions 13, the lower peripheral wall 14 and the upper peripheral wall 23 are increased, which can improve the transport function of the working fluid 2 in liquid form. For example, the width w1 of the main flow groove 31 may be 20 μm to 200 μm, and the width w2 of the convex portion 33 may be 20 μm to 180 μm.

The depth h1 of the main flow groove 31 may be smaller than the depth h0 (see FIG. 63) of the above-described lower flow path wall portion 13. In this case, the capillary action of the main flow grooves 31 can be improved. For example, the depth h1 of the main flow groove 31 is preferably about half the height h0 of the lower flow path wall portions 13, and may be 5 μm to 200 μm.

The width of the communicating groove 32 (the dimension in the first direction X) w3 may be smaller than the width w1 of the main flow groove 31. Thereby, while the working fluid 2 in liquid form is transported to the evaporating portion 11 in each main flow groove 31, the working fluid 2 can be inhibited from flowing to the communicating grooves 32, and the transport function of the working fluid 2 can be improved. On the other hand, when dryout occurs in any of the main flow grooves 31, the working fluid 2 can be transported from adjacent main flow grooves 31 through corresponding communicating grooves 32, which can rapidly eliminate the dryout and secure the transport function of the working fluid 2. In other words, if the communicating grooves 32 allow the main flow grooves 31 adjacent to each other to communicate, the function can be exerted even with the width of each communicating groove 32 being smaller than the width w1 of each main flow groove 31. The width w3 of such a communicating groove 32 may be, for example, 50 μm.

The depth (not shown) of the communicating groove 32 may be shallower than the depth of the main flow groove 31 in conformity with the width w3. For example, the depth of the communicating groove 32 may be, for example, 10 μm to 200 μm. The shape of a cross section of the main flow groove 31 is not particularly limited, and for example, may be rectangular, C-shaped, semi-circular, semi-elliptical, curved, or V-shaped. The same is applied to the cross-sectional shape of the communicating groove 32.

Figure 67:
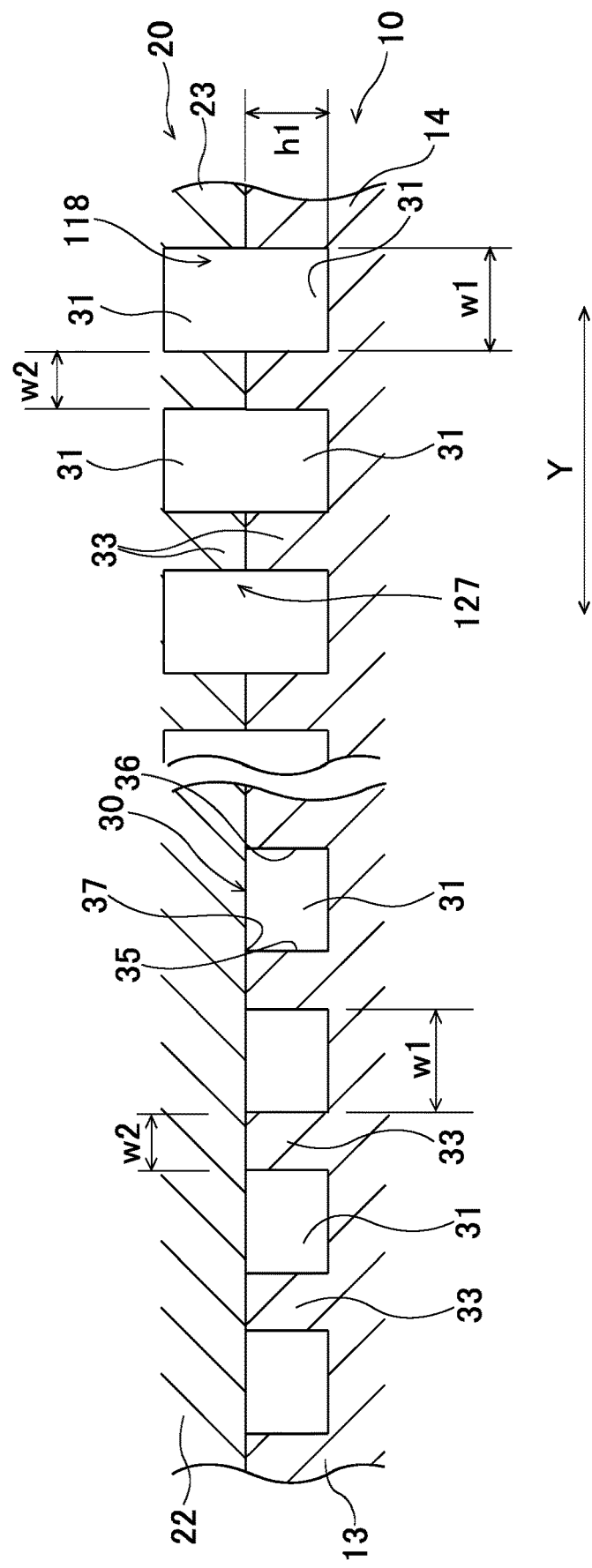
FIG. 67 is a cross-sectional view of FIG. 66 taken along the line K-K with addition of the upper metallic sheet.

As shown in FIG. 67, the liquid flow path portion 30 is formed on the upper surface 13a of each lower flow path wall portion 13 of the lower metallic sheet 10. On the other hand, in this embodiment, the lower surface 22a of each upper flow path wall portion 22 of the upper metallic sheet 20 is formed to be planar. Thereby, each of the main flow grooves 31 of the liquid flow path portion 30 is covered by the lower surface 22a which is planar. In this case, as shown in FIG. 67, by a pair of side walls 35, 36 extending in the first direction X of the main flow grooves 31 and the lower surface 22a of each upper flow path wall portion 22, a pair of corner portions 37 in a right angle or an acute angle can be formed, which can improve capillary action at the two corner portions 37.

The upper surface 14a of the lower peripheral wall 14 and the lower surface 23a of the upper peripheral wall 23 are in contact with each other, which allows at least a part of the lower peripheral liquid flow path portion 118 and at least a part of the upper peripheral liquid flow path portion 127 to overlap with each other. In this case, in a region where the peripheral liquid flow path portions 118, 127 overlap with each other, the main flow grooves 31, the communicating grooves 32 and the convex portions 33 of the lower peripheral liquid flow path portion 118 overlap with the main flow grooves 31, the communicating grooves 32 and the convex portions 33 of the upper peripheral liquid flow path portion 127, respectively. In other words, the main flow grooves 31, the communicating grooves 32 and the convex portions 33 of the lower peripheral liquid flow path portion 118 are arranged mirror-symmetrically with the main flow grooves 31, the communicating grooves 32 and the convex portions 33 of the upper peripheral liquid flow path portion 127, respectively. The main flow grooves 31 of the lower peripheral liquid flow path portion 118 and the main flow grooves 31 of the upper peripheral liquid flow path portion 127 are arranged so as to face with each other. Accordingly, the sectional areas of the main flow grooves 31 of the lower peripheral wall 14 and the upper peripheral wall 23 increase, which can improve the transport function of the working fluid 2 in liquid form. However, not limited thereto, at least a part of the main flow grooves 31, the communicating grooves 32 and the convex portions 33 of the lower peripheral liquid flow path portion 118 may be arranged to deviate from at least a part of the main flow grooves 31, the communicating grooves 32 and the convex portions 33 of the upper peripheral liquid flow path portion 127.

In this embodiment, the liquid flow path portions 30 are formed only on the lower metallic sheet 10. The vapor flow path recesses 12, 21 and the peripheral liquid flow path portions 118, 127 are formed on both the lower metallic sheet 10 and the upper metallic sheet 20. However, without limitation thereto, the liquid flow path portions 30, the vapor flow path recesses 12, 21 and the peripheral liquid flow path portions 118, 127 may be formed at least one of the lower metallic sheet 10 and the upper metallic sheet 20.

The shape of the liquid flow path portion 30 and the peripheral liquid flow path portions 118, 127 of each lower metallic sheet 10 is not limited to that described above.

Figure 68:
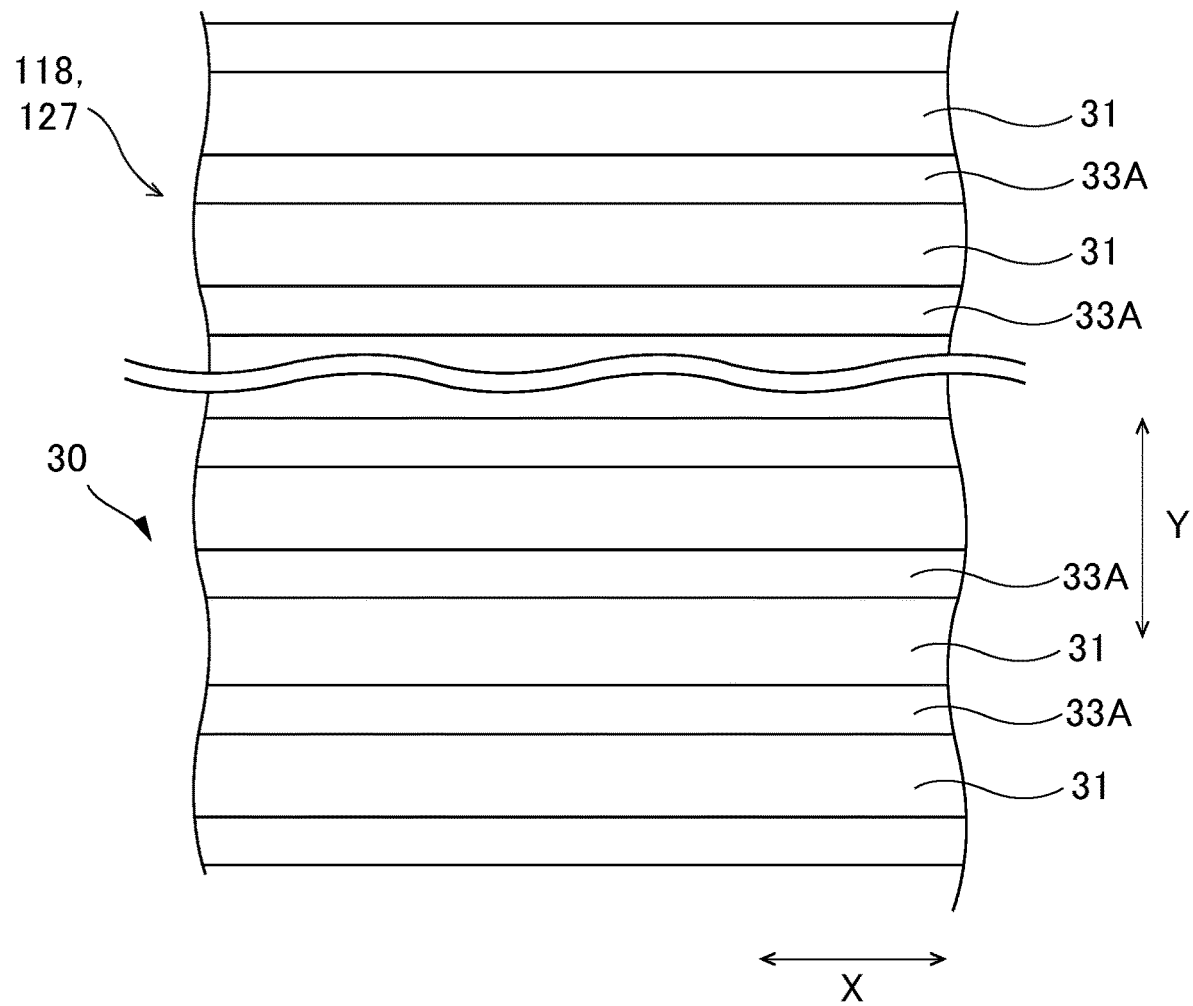
FIG. 68 is an enlarged top view showing a modification of the liquid flow path portion and the peripheral liquid flow path portions of FIG. 66.

For example, as shown in FIG. 68, the liquid flow path portion 30 and the peripheral liquid flow path portions 118, 127 include a plurality of main flow grooves 31 extending in parallel with each other, and elongated convex portions 33A configured between the main flow grooves 31 adjacent to each other. In this case, each convex portion 33A extends over a substantially entire region of the liquid flow path portion 30 and the peripheral liquid flow path portions 118, 127 in the longitudinal direction, along the main flow direction of the working fluid 2 (the first direction X in this case). Thereby, the working fluid 2 in liquid form can be efficiently transported toward the evaporating portion 11 in each main flow groove 31. Although not shown, a communicating groove may be provided for a part of the convex portion 33A, and the communicating groove may allow each main flow groove 31 to communicate with the lower vapor flow path recess 12 or the upper vapor flow path recess 21.

Figure 69:
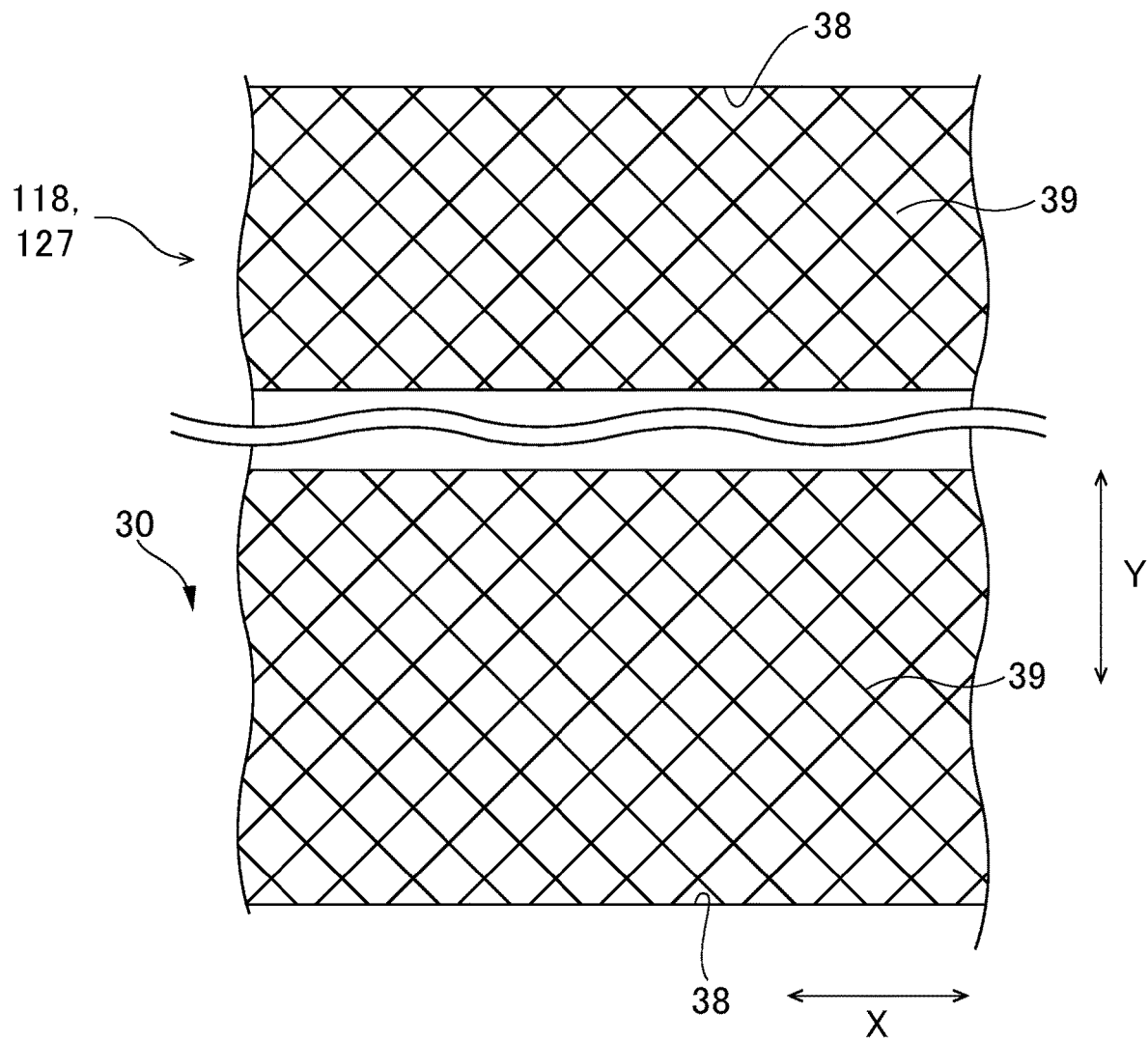
FIG. 69 is an enlarged top view showing another modification of the liquid flow path portion and the peripheral liquid flow path portions of FIG. 66.

Alternatively, as shown in FIG. 69, the liquid flow path portion 30 and the peripheral liquid flow path portions 118, 127 may include capillary structure members 39 with which the recesses 38 formed in the metallic sheets 10, 20 are filled. The capillary structure members 39 are members for allowing the working fluid 2 in liquid form to flow toward the evaporating portion 11 by the capillary action, and are configured to be separated from the metallic sheets 10, 20. For example, metal mesh, metal powder, metal unwoven fabric, etc. can be adopted as such capillary structure members 39.

The material used for the lower metallic sheet 10 and the upper metallic sheet 20 is not especially limited as long as the material has a good thermal conductivity. For example, copper (an oxygen-free copper), or a copper alloy may be used. In this case, the thermal conductivities of the lower metallic sheet 10 and the upper metallic sheet 20 can be improved, and the heat release efficiency of the vapor chamber 1 can be improved. The thickness of the vapor chamber 1 may be, for example, 0.1 mm to 2.0 mm. While FIG. 63 shows a case where a thickness T1 of the lower metallic sheet 10 and a thickness T2 of the upper metallic sheet 20 are equal, not limited to this, the thickness T1 of the lower metallic sheet 10 and the thickness T2 of the upper metallic sheet 20 may be different. The size of the entire vapor chamber 1 (the entire size of the metallic sheets 10, 20) may be about 1 cm×3 cm to about 15 cm square.

In a case of manufacturing the vapor chamber 1 according to this embodiment, similar to the liquid flow path portion 30, the lower peripheral liquid flow path portion 118 can be formed by half etching, and may be formed at the same time as the liquid flow path portion 30. Similar to the lower peripheral liquid flow path portion 118, the upper peripheral liquid flow path portion 127 can also be formed by half etching.

During operation of the vapor chamber 1 according to this embodiment, the peripheral liquid flow path portions 118, 127 are formed along the peripheries of the metallic sheets 10, 20. Accordingly, the working fluid 2 condensed and liquidized at the peripheries of the metallic sheets 10, 20 circulates through the peripheral liquid flow path portions 118, 127 by the capillary action and is transported toward the evaporating portion 11. Especially, the lower peripheral liquid flow path portion 118 is formed on the entire periphery of the lower metallic sheet 10 without discontinuity. Consequently, the liquidized working fluid 2 is not blocked around the lower injection flow path recess 17, smoothly flows through the lower peripheral liquid flow path portion 118 along the entire periphery of the lower metallic sheet 10, and is transported toward the evaporating portion 11. The upper peripheral liquid flow path portion 127 is noncontinuous at the conduction portion 128. However, the lower peripheral liquid flow path portion 118 is formed also at a portion facing the conduction portion 128, thereby facilitating the flow of the upper peripheral liquid flow path portion 127 in the circumferential direction.

As described above, according to this embodiment, the lower peripheral liquid flow path portion 118 is formed over the entire periphery of the lower metallic sheet 10. Accordingly, for example, the lower peripheral liquid flow path portion 118 can be prevented from being non-continuous around the lower injection flow path recess 17. Consequently, the capillary can be prevented from being non-continuous. Thereby, the circulation of the working fluid 2 can be prevented from being inhibited at the outer peripheral portion of the vapor chamber 1, and the working fluid 2 can smoothly circulate over the entire region of the vapor chamber 1. As a result, the condensation and circulation of the working fluid 2 at the outer peripheral portion of the vapor chamber 1 are stabilized, and the thermal transport performance of the vapor chamber 1 can be improved.

According to this embodiment, the lower peripheral liquid flow path portion 118 is formed over the entire periphery of the lower metallic sheet 10. Accordingly, the lower peripheral liquid flow path portion 118 can be interposed between the lower injection flow path recess 17 and the lower vapor flow path recess 12. Consequently, water accumulation in the conduction portion 128 can be prevented. In other words, in a case where the lower injection flow path recess 17 is directly connected to the lower vapor flow path recess 12, there is a possibility that water is accumulated in the lower injection flow path recess 17 (especially, a part of the lower injection flow path recess 17 nearer to the lower vapor flow path recess 12) and the conduction portion 128 and is frozen. In this case, there is a possibility that the lower metallic sheet 10 or the upper metallic sheet 20 is expanded and deformed or broken. However, in this embodiment, water accumulation in the conduction portion 128 can be prevented. Accordingly, such deformation and breakage of the metallic sheet 10 can be prevented. Consequently, the quality can be improved.

According to this embodiment, the upper peripheral liquid flow path portion 127 is formed along the periphery of the upper metallic sheet 20, and at least a part of the lower peripheral liquid flow path portion 118 and at least a part of the upper peripheral liquid flow path portion 127 overlap with each other. Consequently, at the part where the upper peripheral liquid flow path portion 127 and the lower peripheral liquid flow path portion 118 overlap with each other, a wide liquid flow path for circulating the working fluid 2 is formed, and the working fluid 2 at the outer peripheral portion of the vapor chamber 1 can be efficiently circulated.

According to this embodiment, the width w12 of the lower peripheral liquid flow path portion 118 is wider than the width w13 of the upper peripheral liquid flow path portion 127. Thereby, the inner portion 118a, which is of the lower peripheral liquid flow path portion 118 and protrudes from the upper peripheral liquid flow path portion 127, faces the upper vapor flow path recess 21. The protruding inner portion 118a of the lower peripheral liquid flow path portion 118 allows the working fluid 2 to be stably condensed and circulated.

Furthermore, according to this embodiment, the peripheral liquid flow path portions 118, 127 include a plurality of main flow grooves 31 extending in parallel with each other, and communicating grooves 32 allowing the main flow grooves 31 adjacent to each other to communicate. Thereby, the working fluid 2 in liquid form reciprocates between the main flow grooves 31 adjacent to each other, which inhibits occurrence of dryout in the main flow grooves 31. Accordingly, capillary action is applied to the working fluid 2 in each of the main flow grooves 31, so that the working fluid 2 is smoothly transported toward the evaporating portion 11.

Furthermore, according to this embodiment, in the peripheral liquid flow path portions 118, 127, a plurality of convex portions 33 are formed in a staggered arrangement in a planar view. Thereby, the capillary action applied to the working fluid 2 in the main flow grooves 31 can be equalized in the width direction of the main flow grooves 31. In other words, since the plurality of convex portions have a staggered arrangement in a planar view, the communicating grooves 32 alternately communicate with both the ends of the main flow grooves 31. Consequently, unlike a case where the communicating grooves 32 communicate at the same positions of both the ends of the main flow grooves 31, loss of capillary action in a direction toward the evaporating portion 11 by the communicating grooves 32 can be inhibited. Consequently, at intersections between the main flow grooves 31 and the communicating grooves 32, the capillary action can be inhibited from decreasing, and the capillary action can be continuously applied to the working fluid 2 toward the evaporating portion 11.

The sealed space 3 is depressurized as described above. Accordingly, the lower metallic sheet 10 and the upper metallic sheet 20 receive pressure in a direction of being recessed inwardly in the thickness direction from the outside air. Here, if the communicating grooves 32 communicate at the same positions on both the ends of the corresponding main flow grooves 31 in the longitudinal direction, a possibility can be considered that the lower metallic sheet 10 and the upper metallic sheet 20 are recessed inwardly in the thickness direction along a direction parallel with the communicating grooves 32. In this case, the flow path sectional area of each main flow groove 31 is decreased, and the flow path resistance of the working fluid 2 can be increased. On the contrary, according to this embodiment, in the liquid flow path portion 30 and the peripheral liquid flow path portions 118, 127, the plurality of convex portions 33 are formed in a staggered arrangement in a planar view. Thereby, even if the lower metallic sheet 10 and the upper metallic sheet 20 are recessed inwardly in the thickness direction along the communicating grooves 32, the recess can be prevented from traversing the main flow grooves 31, and the flow path sectional area of the main flow grooves 31 can be secured, which inhibits blocking of the flow of the working fluid 2.

Next, referring to FIGS. 70 to 76, each modification of the vapor chamber will be explained. Additionally, in FIGS. 70 to 76, the same components as those in FIGS. 62 to 69 are assigned the same reference numerals, and a detailed explanation thereof is omitted.

Figure 70:
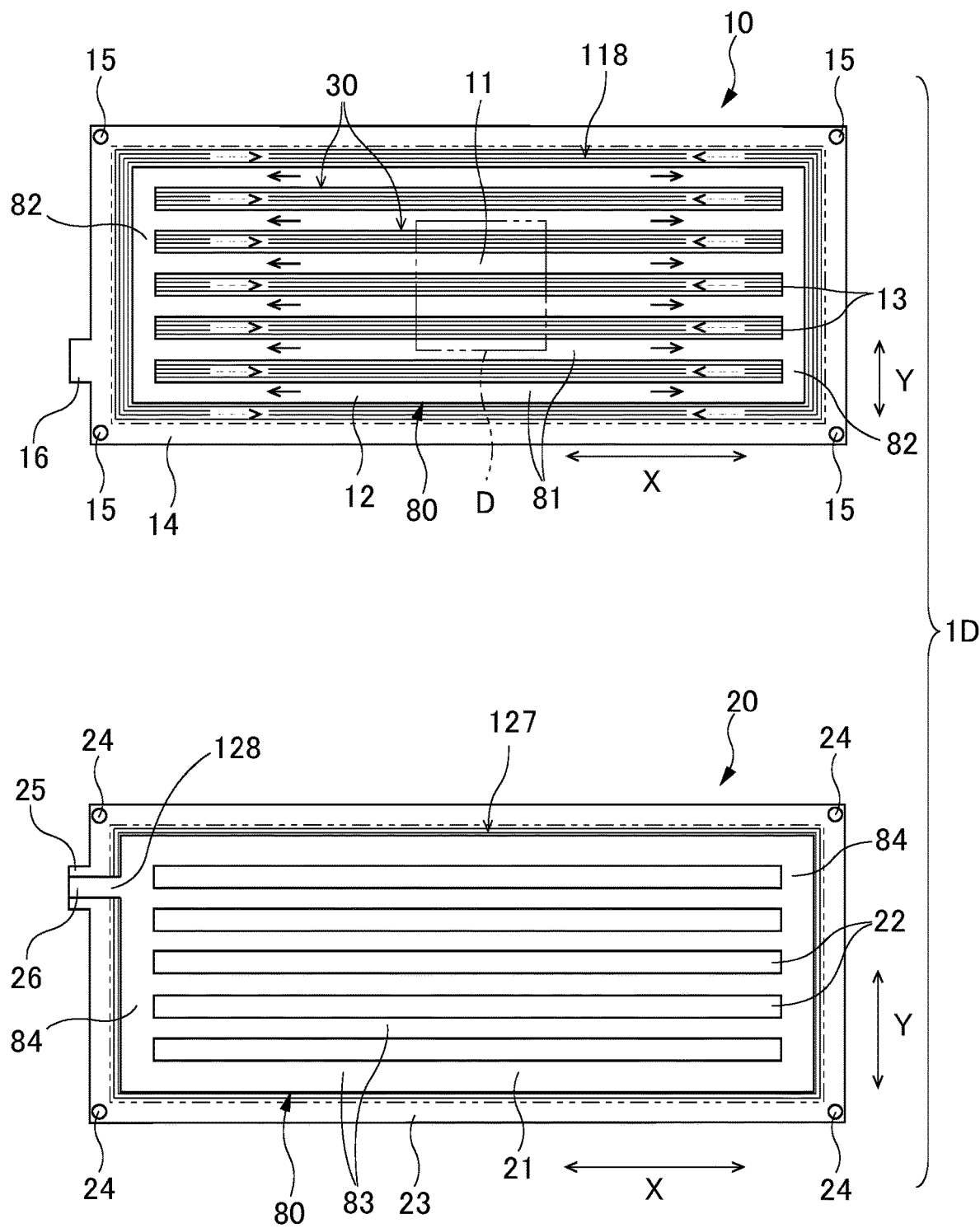
FIG. 70 is a drawing showing a modification of the vapor chamber of FIG. 62.

FIG. 70 shows a vapor chamber 1D according to a modification. Unlike this embodiment shown in FIGS. 62 to 69, in the vapor chamber 1D shown in FIG. 69, the lower injection flow path recess 17 is not formed at the lower injection protruding portion 16 of the lower metallic sheet 10. In this case, when the working fluid 2 is injected from the injection portion 4 into the sealed space 3 in the enclosing step (see FIG. 53C), blocking of injection of the working fluid 2 can be prevented by the lower peripheral liquid flow path portion 118, and the working fluid 2 can be smoothly injected.

Figure 71:
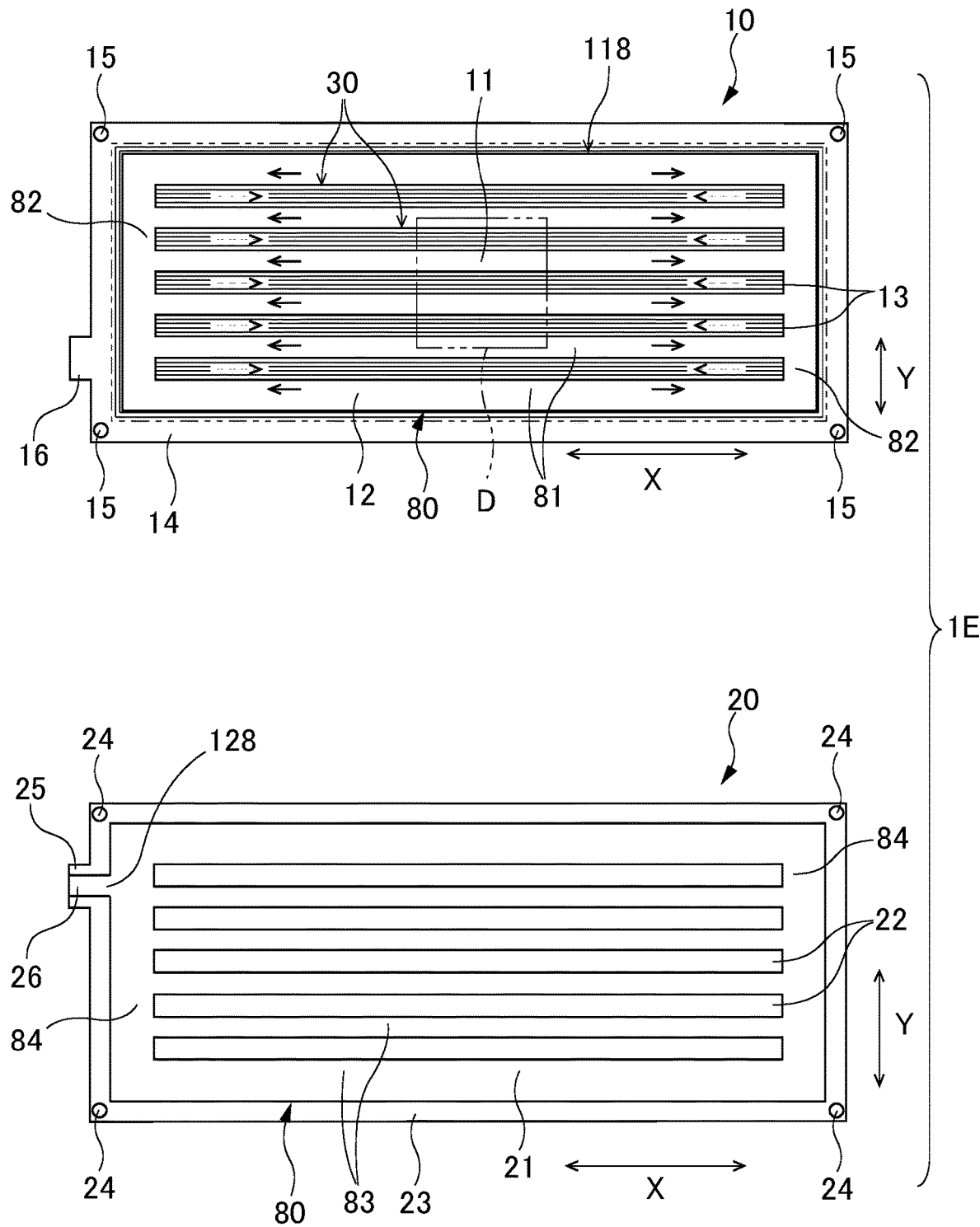
FIG. 71 is a drawing showing another modification of the vapor chamber of FIG. 62.

FIG. 71 shows a vapor chamber 1E according to another modification. Unlike this embodiment shown in FIGS. 62 to 69, in the vapor chamber 1E shown in FIG. 71, the lower injection flow path recess 17 is not formed at the lower injection protruding portion 16 of the lower metallic sheet 10. The upper peripheral liquid flow path portion 127 is not formed in the upper metallic sheet 20. The width of the lower peripheral liquid flow path portion 118 of the lower metallic sheet 10 may be narrower than that in the case of the mode shown in FIG. 64. This case negates the need to laminate the peripheral liquid flow path portions 118, 127 having fine shapes to face each other, thereby negating the need to improve the positioning accuracy of the metallic sheets 10, 20.

Figure 72:
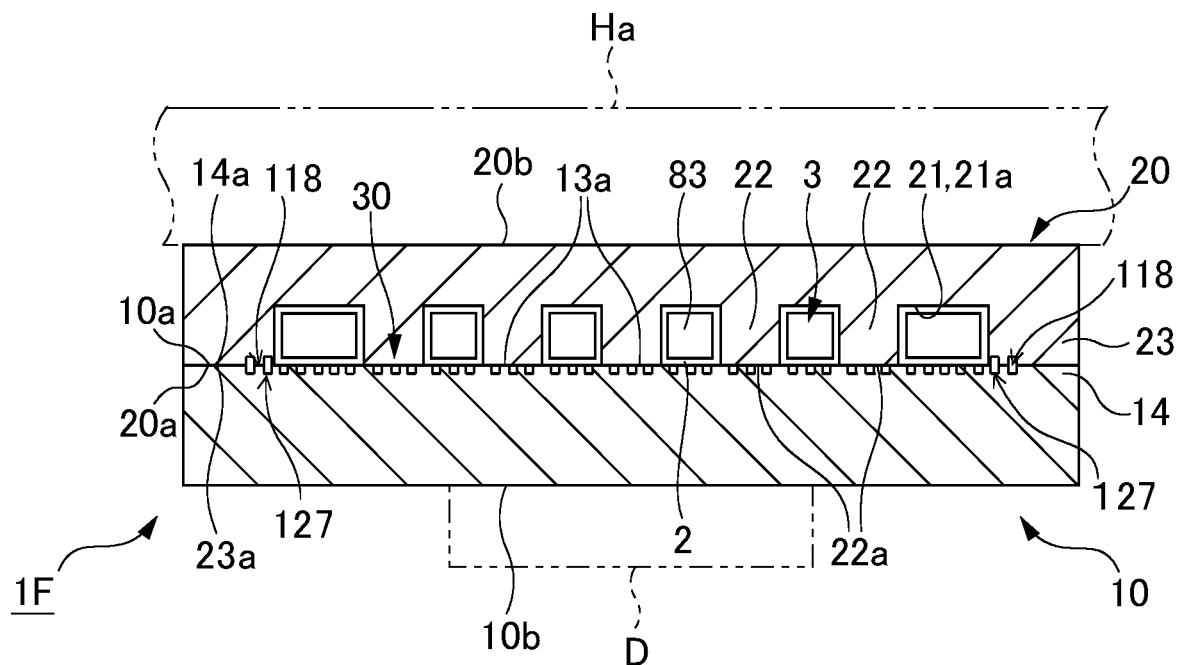
FIG. 72 is a drawing showing another modification of the vapor chamber of FIG. 63.

FIG. 72 shows a vapor chamber 1F according to another modification. Unlike this embodiment shown in FIGS. 62 to 69, in the vapor chamber 1F shown in FIG. 72, the lower metallic sheet 10 does not include the lower vapor flow path recess 12, and the liquid flow path portion 30 is provided in the upper surface 10*a* of the lower metallic sheet 10. A region where the liquid flow path portion 30 is formed in the upper surface 10*a* is formed not only in the region facing the upper flow path wall portion 22 but also in the region facing the upper vapor flow path recess 21. In such a case, the number of main flow grooves 31 constituting the liquid flow path portion 30 can be increased, which can improve the transport function of the working fluid 2 in liquid form. However, the region formed with the liquid flow path portion 30 is not limited to a region shown in FIG. 72, and is arbitrary as long as the transport function of the working fluid 2 in liquid form can be secured.

Figure 73:
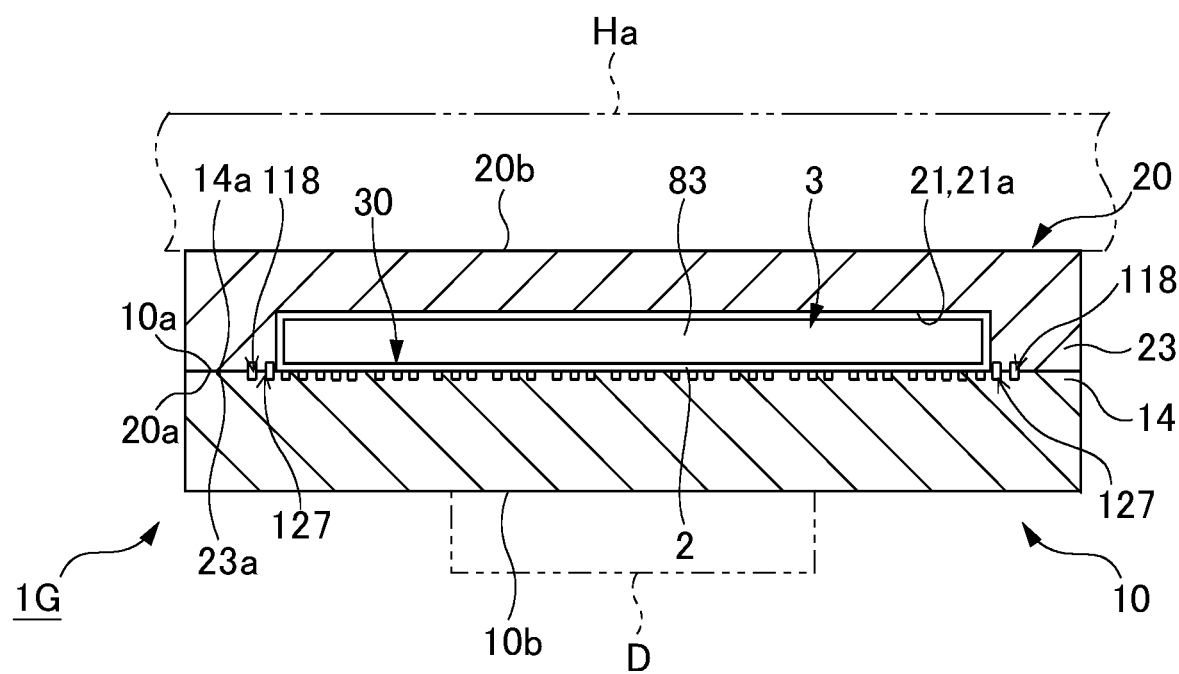
FIG. 73 is a drawing showing another modification (modification 4) of the vapor chamber of FIG. 63.

FIG. 73 shows a vapor chamber 1G according to a modification. Unlike this embodiment shown in FIGS. 62 to 69, in the vapor chamber 1G shown in FIG. 73, the lower metallic sheet 10 does not include the lower vapor flow path recess 12. The liquid flow path portion 30 is provided on the upper surface 10*a* of the lower metallic sheet 10. The upper flow path wall portion 20 is not formed on the upper metallic sheet 20. One upper vapor flow path recess 21 is formed so as to face the substantially entire region of the liquid flow path portion 30. In this case, the sectional area of the upper vapor flow path recess 21 can be increased, which can efficiently transport the vapor of the working fluid 2.

Figure 74:
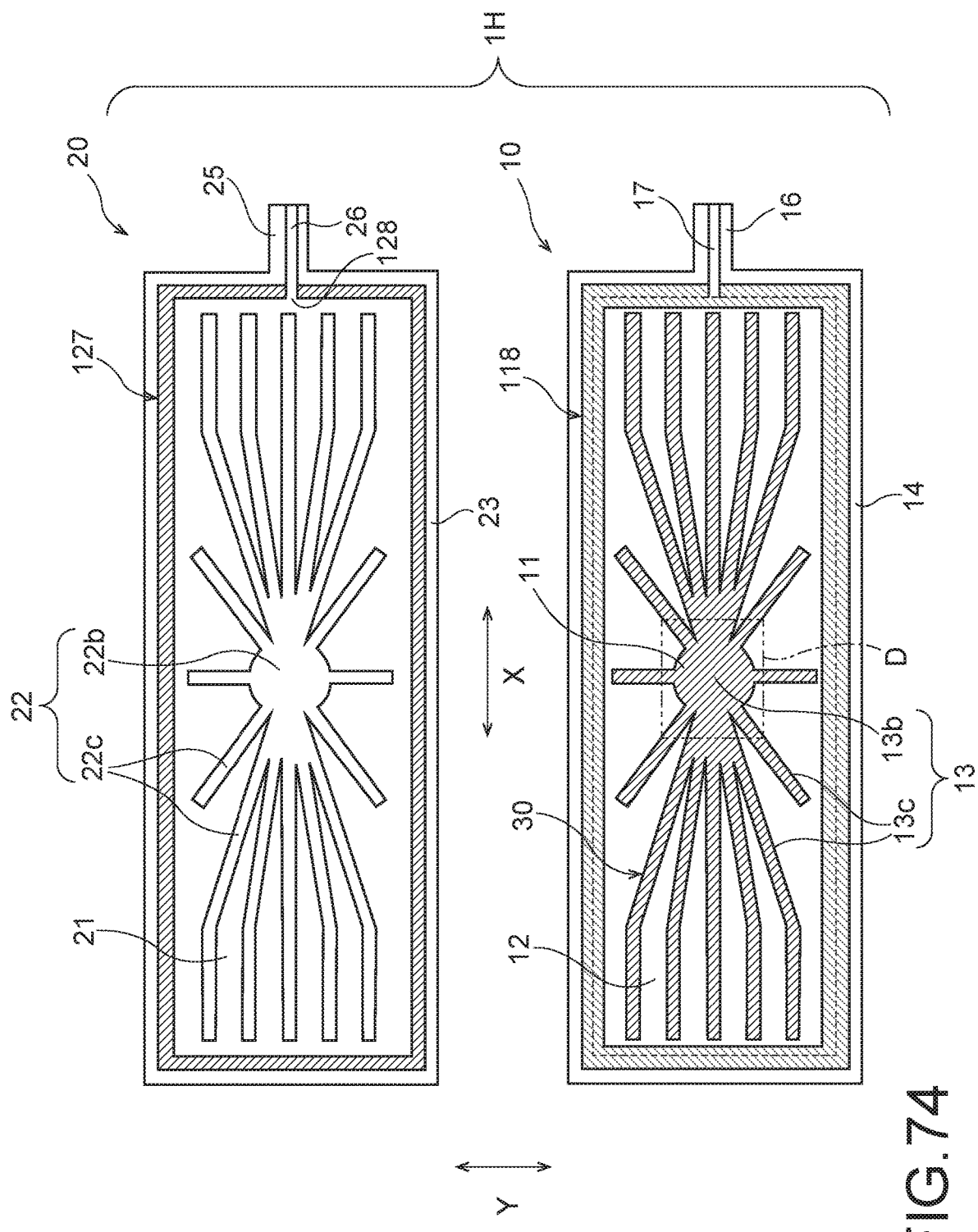
FIG. 74 is a drawing showing another modification (modification 5) of the vapor chamber of FIG. 62.

FIG. 74 shows a vapor chamber 1H according to a modification. Unlike the embodiment shown in FIGS. 62 to 69, in the vapor chamber 1H shown in FIG. 74, the lower flow path wall portions 13 of the lower metallic sheet 10 and the upper flow path wall portion 22 of the upper metallic sheet 20 are formed radially in a planar view. In other words, the lower flow path wall portion 13 includes a center portion 13*b* having a substantially circular shape in a planar view, and a plurality of radial portions 13*c* extending radially from the center portion 13*b*. In the same manner, the upper flow path wall portion 22 includes a center portion 22*b* having a substantially circular shape in a planar view, and a plurality of radial portions 22*c* extending radially from the center portion 22*b*. The liquid flow path portion 30 is formed in the lower flow path wall portion 13, but is not formed in the upper flow path wall portion 22. In this case, the lower flow path wall portion 13 is radially formed. Accordingly, the working fluid 2 in liquid form can be efficiently transported to the evaporating portion 11. In FIG. 74, the liquid flow path portion (the liquid flow path portion 30 and the peripheral liquid flow path portions 118, 127) are indicated by diagonal lines (the same is applied also to FIGS. 75 and 76).

Figure 75:
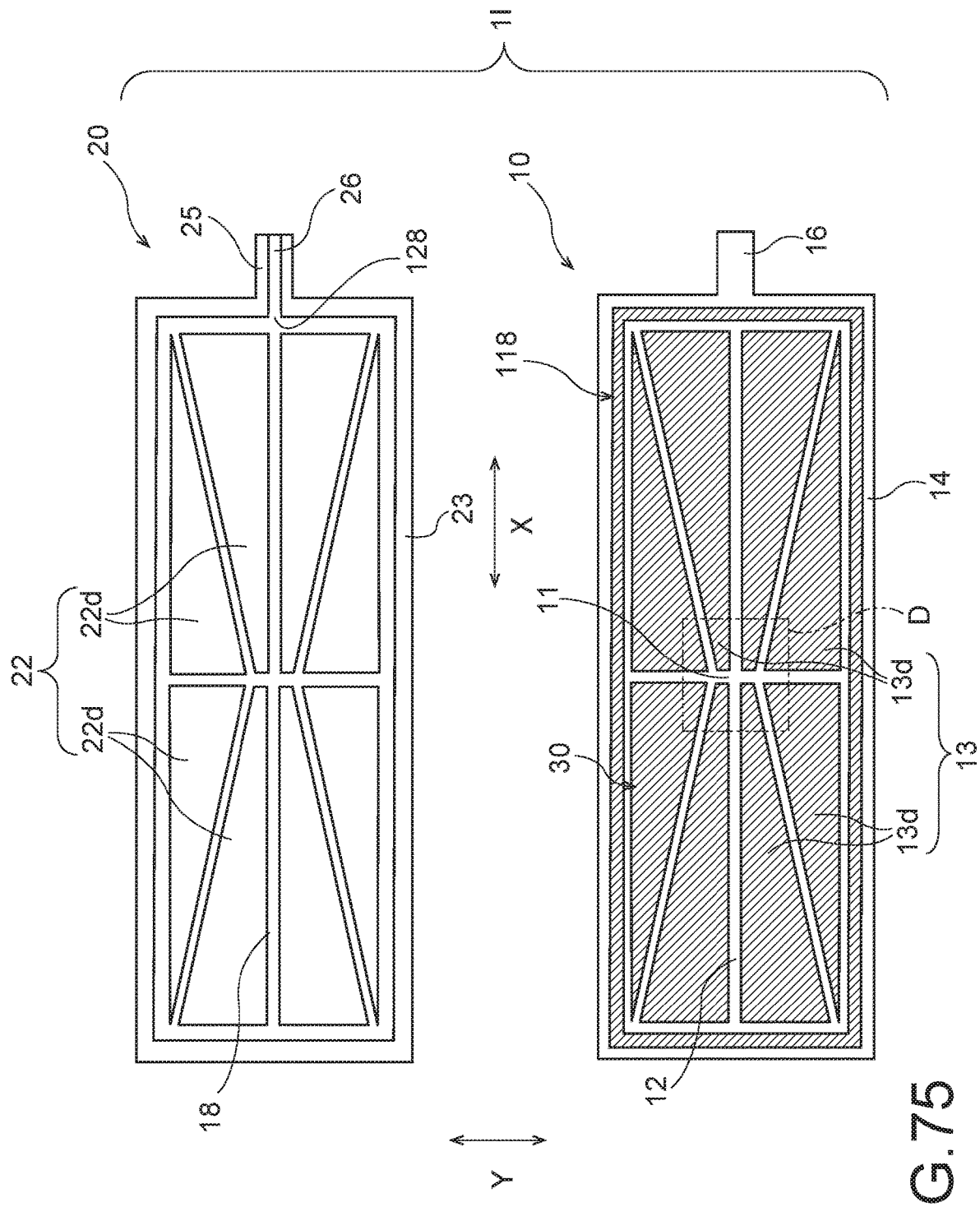
FIG. 75 is a drawing showing another modification (modification 6) of the vapor chamber of FIG. 62.

FIG. 75 shows a vapor chamber 1I according to a modification. Unlike this embodiment shown in FIGS. 62 to 69, in the vapor chamber 1I shown in FIG. 75, the lower injection flow path recess 17 is not formed at the lower injection protruding portion 16 of the lower metallic sheet 10. The upper peripheral liquid flow path portion 127 is not formed in the upper metallic sheet 20. Furthermore, the lower flow path wall portions 13 of the lower metallic sheet 10 includes a plurality of block portions 13*d* having a substantially triangular shape or a substantially trapezoidal shape in a planar view. In the same manner, the upper flow path wall portion 22 of the upper metallic sheet 20 includes a plurality of block portions 22*d* having a substantially triangular shape or a substantially trapezoidal shape in a planar view. The vapor passage of the lower vapor flow path recess 12 is formed between the block portions 13*d*, 13*d* of the lower flow path wall portion 13. The vapor passage of the upper vapor flow path recess 21 is formed between the block portions 22*d*, 22*d* of the upper flow path wall portion 22. The liquid flow path portion 30 is formed in the lower flow path wall portion 13, but is not formed in the upper flow path wall portion 22. In this case, the area of the liquid flow path portion 30 of the lower flow path wall portion 13 is secured to be wide. Accordingly, the working fluid 2 in liquid form can be efficiently transported to the evaporating portion 11.

Figure 76:
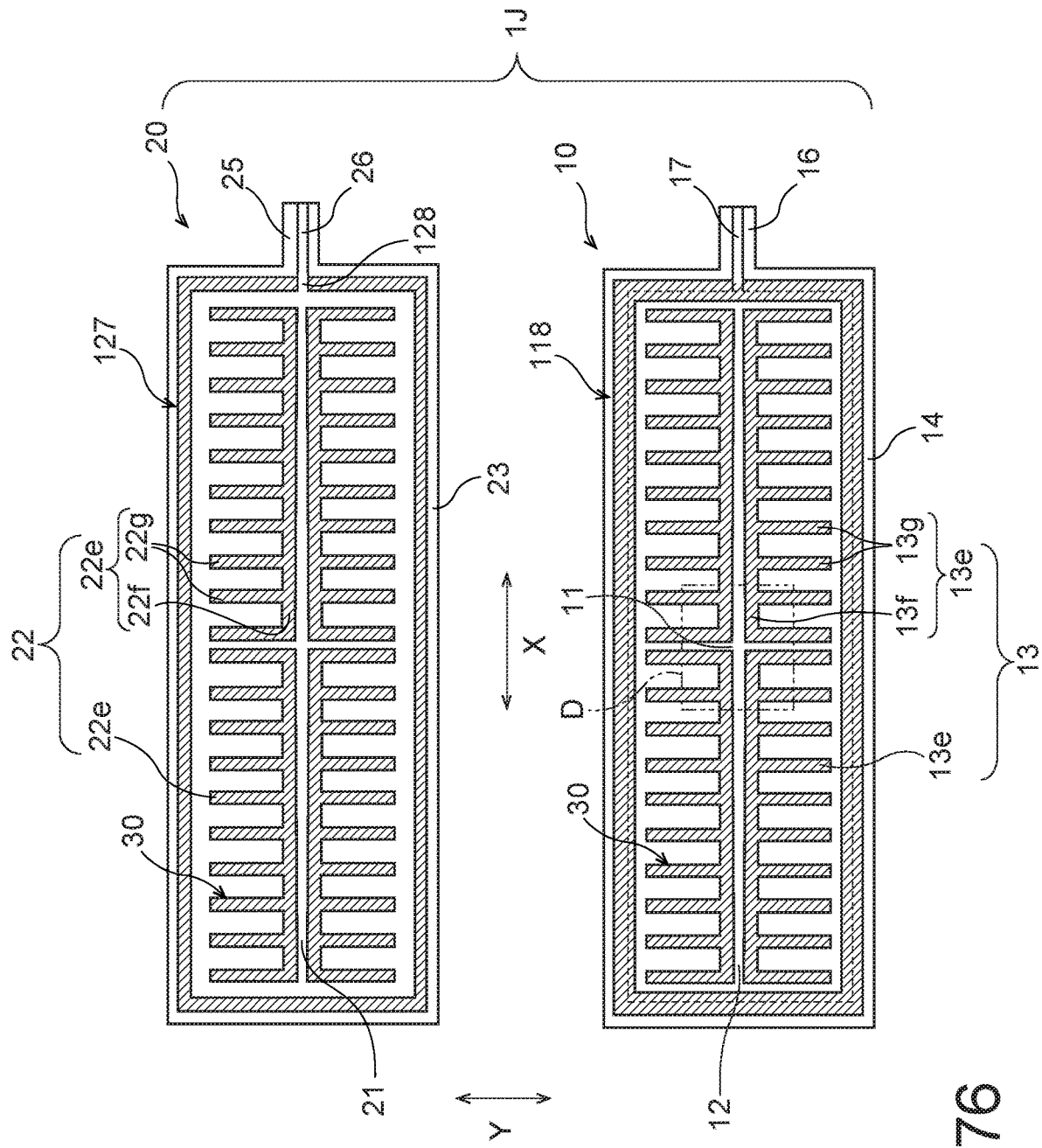
FIG. 76 is a drawing showing another modification (modification 7) of the vapor chamber of FIG. 62.

FIG. 76 shows a vapor chamber 1J according to a modification. Unlike this embodiment shown in FIGS. 62 to 69, in the vapor chamber 1J shown in FIG. 76, the lower flow path wall portion 13 of the lower metallic sheet 10 includes a plurality of (four in this case) comb teeth portions 13*e* with a substantially comb teeth shape in a planar view. Each comb teeth portion 13e of the lower flow path wall portions 13 includes a base portion 13f extending in the first direction X, and a plurality of comb portions 13g which are connected to the base portion 13f and extend in the second direction Y. In the same manner, the upper flow path wall portion 22 of the upper metallic sheet 20 includes a plurality of (four in this case) comb teeth portions 22e with a substantially comb teeth shape in a planar view. Each comb teeth portion 22e of the upper flow path wall portion 22 includes a base portion 22f extending in the first direction X, and a plurality of comb portions 22g which are connected to the base portion 22f and extend in the second direction Y. The liquid flow path portions 30 are formed in both the lower flow path wall portion 13 and the upper flow path wall portion 22. In this case, the working fluid 2 in liquid form is accumulated from the comb portions 13g, 22g toward the base portions 13f, 22f, and subsequently, flows toward the evaporating portion 11 through the base portions 13f, 22f. Consequently, the working fluid 2 in liquid form can be efficiently transported toward the evaporating portion 11.

Fourteenth Embodiment

Next, a vapor chamber, an electronic device, a metallic sheet for the vapor chamber and a manufacturing method of the vapor chamber according to a fourteenth embodiment of the present invention will be explained using FIGS. 77 to 80.

In the eleventh embodiment shown in FIGS. 77 to 80, a main difference is that an intermediate metallic sheet is interposed between a lower metallic sheet and an upper metallic sheet, the vapor flow path portion is formed in the upper metallic sheet, the liquid flow path portion is formed in the lower metallic sheet, and the intermediate metallic sheet is provided with communicating portions that allow the vapor flow path portion and the liquid flow path portion to communicate. The other configurations are substantially the same as in the eleventh embodiment shown in FIGS. 57 to 59 and the thirteenth embodiment shown in FIGS. 62 to 76. Additionally, in FIGS. 77 to 80, the same components as those in the eleventh embodiment shown in FIGS. 57 to 59 and the thirteenth embodiment shown in FIGS. 62 to 76 are assigned the same reference numerals, and a detailed explanation thereof is omitted.

Figure 77:
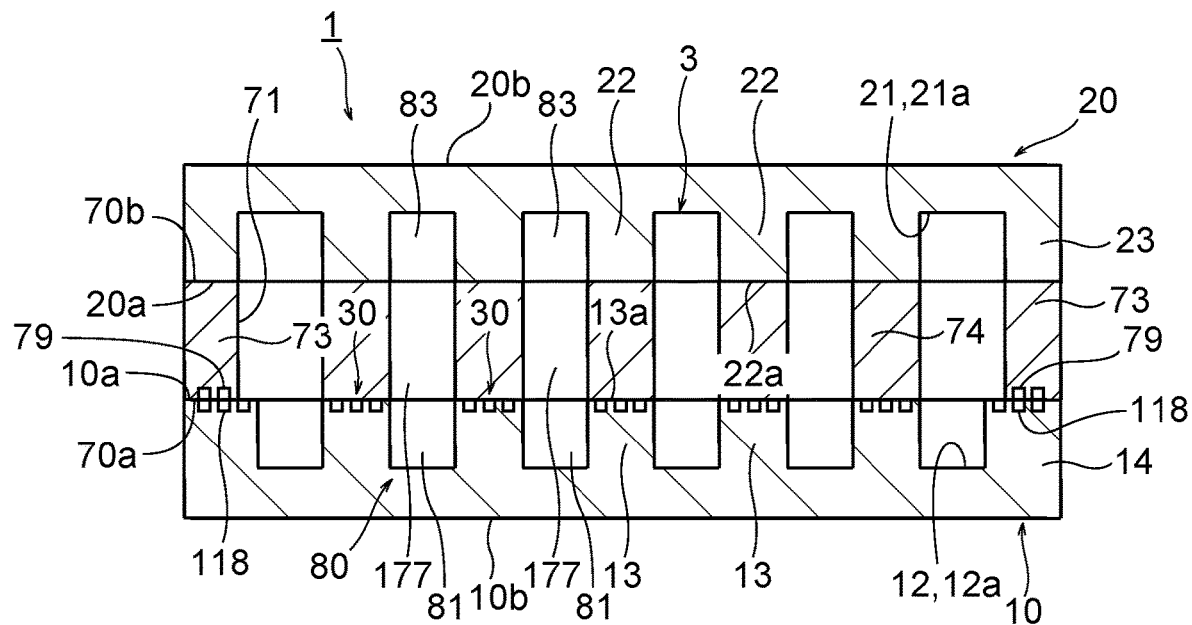
FIG. 77 is a cross-sectional view showing a vapor chamber according to a fourteenth embodiment.
Figure 78:
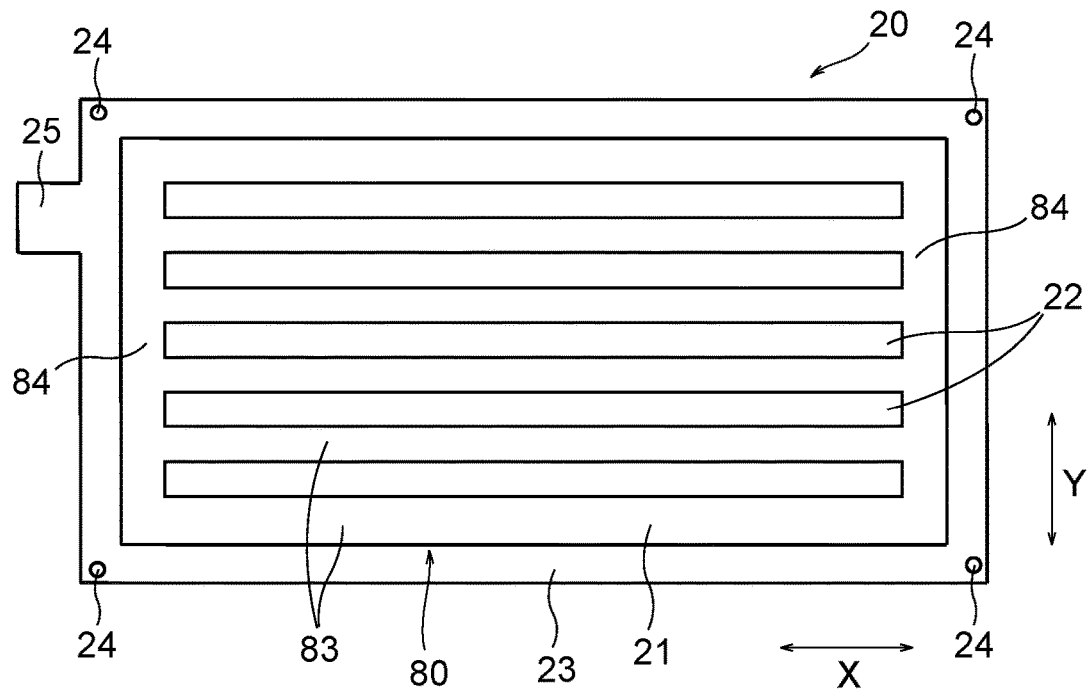
FIG. 78 is a bottom view of an upper metallic sheet of FIG. 77.

As shown in FIGS. 77 and 78, in this embodiment, the upper metallic sheet 20 is provided with no liquid flow path portion 30. The upper metallic sheet 20 includes an upper vapor flow path recess 21 (a second vapor flow path portion) similar to that in the thirteenth embodiment. The upper flow path wall portion 22 (second flow path protruding portion) similar to that in the thirteenth embodiment is provided in the upper vapor flow path recess 21.

Figure 79:
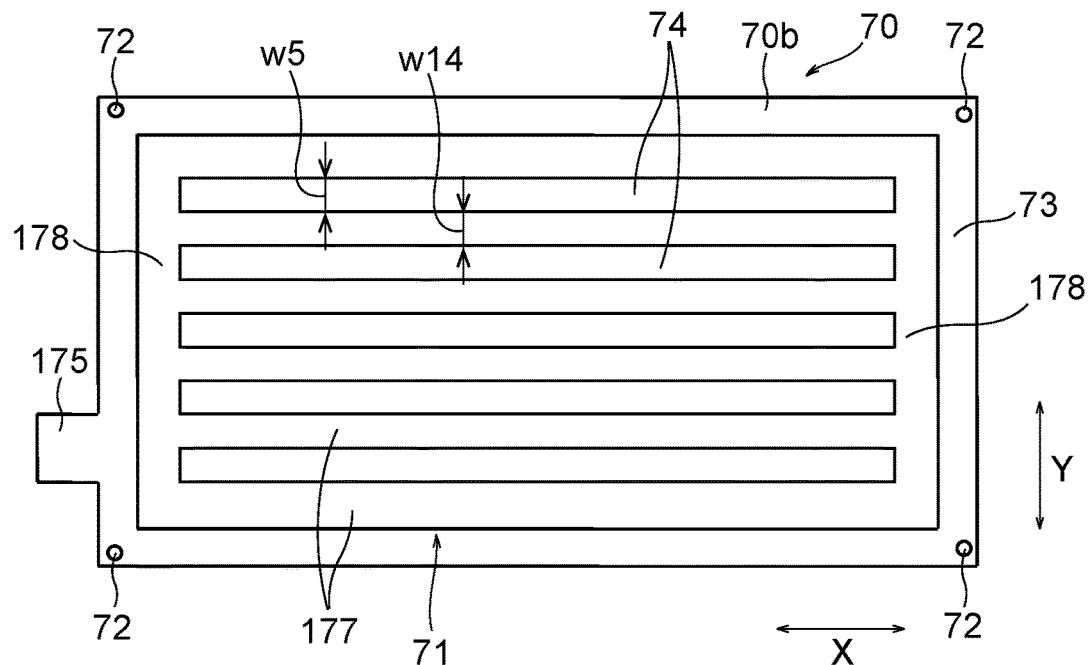
FIG. 79 is a top view of an intermediate metallic sheet of FIG. 77.
Figure 80:
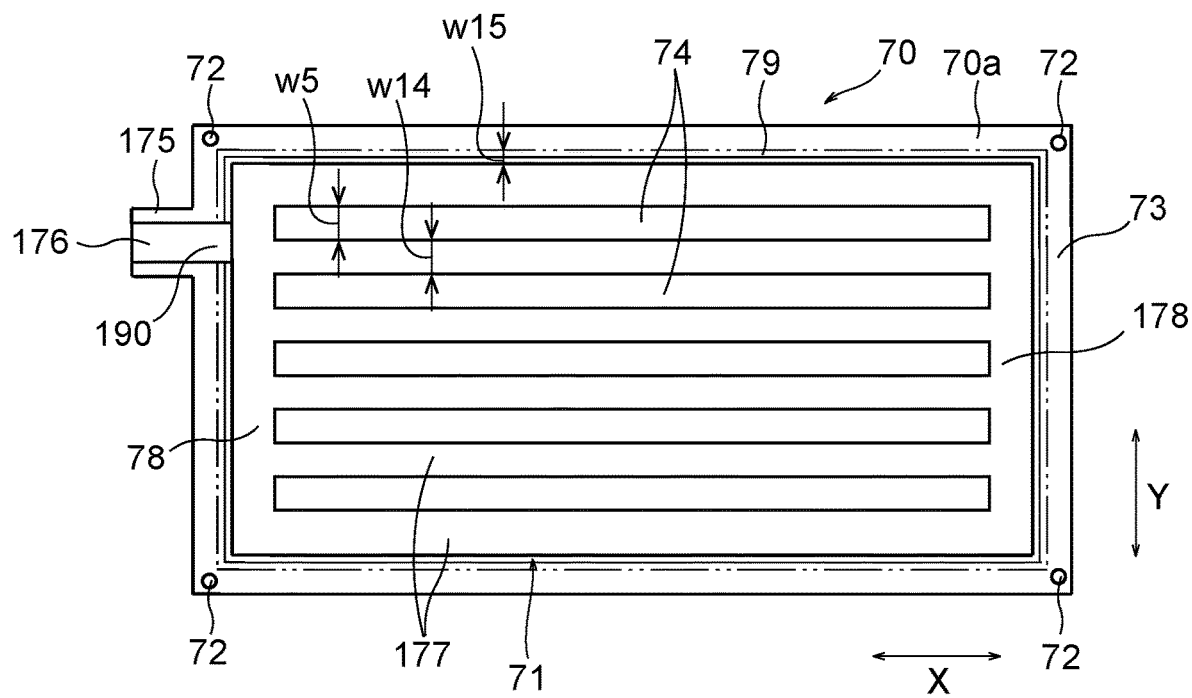
FIG. 80 is a bottom view of an intermediate metallic sheet of FIG. 77.

In this embodiment, as shown in FIG. 20, an intermediate metallic sheet 70 is interposed between the lower metallic sheet 10 and the upper metallic sheet 20. As shown in FIGS. 77, 79 and 80, the intermediate metallic sheet 70 is provided with a communicating portion 71 allowing communication between the liquid flow path portion 30 and the upper vapor flow path recess 21. More specifically, the communicating portion 71 allows communication between the liquid flow path portion 30 and the upper vapor flow path recess 21 via the lower vapor flow path recess 12. The communicating portion 71 is formed to be elongated from the upper surface 70b to the lower surface 70a of the intermediate metallic sheet 70, and penetrates the intermediate metallic sheet 70. The communicating portion 71 constitutes a part of the sealed space 3 described above. Thereby, such a configuration is made that in the upper vapor flow path recess 21, the working fluid 2 in liquid form generated from the vapor of the working fluid 2 by condensation enters the main flow grooves 31 of the liquid flow path portion 30 and the lower peripheral liquid flow path portion 118 through the communicating portion 71. On the other hand, the vapor of the working fluid 2 evaporated at the evaporating portion 11 can not only be diffused at the lower vapor flow path recess 12 but also be diffused to the upper vapor flow path recess 21 through the communicating portion 71.

As shown in FIGS. 79 and 80, the intermediate metallic sheet 70 includes a frame portion 73 formed to have a rectangular frame in a planar view, and a plurality of land portions 74 provided in the frame portion. The frame portion 73 and the land portions 74 are portions which are not etched during etching of the intermediate metallic sheet 70 and at which the material of the intermediate metallic sheet 70 remains. A plurality of the land portions 74 extend to be elongated along the first direction X, and are disposed in the communicating portion 71. The land portions 74 are supported by each other via a supporting portion, not shown, and are supported by the frame portion 73. The supporting portion is formed so as to inhibit blocking of the flow of the vapor of the working fluid 2 flowing in intermediate communication passages 177 which will be described later. For example, the supporting portion may be partially formed in the intermediate communication passages 177 and the intermediate communicating communication passage 178 in a planar view.

The communicating portion 71 includes a plurality of intermediate communicating passages 177 partitioned by the land portions 74. The intermediate communicating passages 177 extend to be elongated along the first direction X, and are disposed to be parallel with each other. The both end portions of each intermediate communication passage 177 communicate with the intermediate communicating communication passage 178 extending to be elongated along the second direction Y, and the intermediate communication passages 177 communicate with each other via the intermediate communicating communication passage 178. Additionally, in FIG. 77, the shape of the cross section (the section in the second direction Y) of each intermediate communication passage 177 is a rectangle. However, not limited to this, the shape of the cross section of each intermediate communication passage 177 and for example, may be curved, semi-circular or V-shaped, and may be arbitrary as long as the vapor of the working fluid 2 can be diffused. The same is applied to the intermediate communicating communication passage 178.

Each land portion 74 is disposed to be overlapped with the corresponding upper flow path wall portion 22 and lower flow path wall portion 13 in a planar view, which improves mechanical strength of the vapor chamber 1. The intermediate communication passage 177 is formed to be overlapped with the corresponding lower vapor passage 81 and upper vapor passage 83 in a planar view. In the same manner, the intermediate communicating communication passage 178 is formed to be overlapped with the corresponding lower communicating vapor passage 82 and upper communicating vapor passage 84 in a planar view.

As shown in FIGS. 79 and 80, in a case where the width w5 (the dimension in the second direction Y) of the land portion 74 of the intermediate metallic sheet 70 is the maximum dimension in a range from the upper surface 70b to the lower surface 70a, the width w5 may be, for example, 50 μm to 2000 μm. In a case where the width w14 (the dimension in the second direction Y) of the intermediate communication passage 177 is the minimum dimension in a range from the upper surface 70b to the lower surface 70a, the width w6 may be, for example, 50 µm to 2000 µm. The same is applied to the width (the dimension in the first direction X) of the intermediate communicating communication passage 178.

The communicating portion 71 may be formed by etching from the upper surface 70b of the intermediate metallic sheet 70. In this case, the intermediate communication passage 177 of the communicating portion 71 may be curved to have a shape convex toward the lower surface 70a. Alternatively, the communicating portion 71 may be etched from the lower surface 70a of the intermediate metallic sheet 70. In this case, the intermediate communication passage 177 may be curved to have a shape convex toward the upper surface 70b. Further alternatively, the communicating portion 71 may be formed by half etching from the lower surface 70a and half etching from the upper surface 70b. In this case, portions of the communicating portion 71 nearer to the upper surface 70b and those nearer to the lower surface 70a may have different shapes or sizes.

As shown in FIGS. 79 and 80, the intermediate metallic sheet 70 is provided with intermediate alignment holes 72 for positioning each of the metallic sheets 10, 20, 70. In other words, each intermediate alignment hole 72 is disposed to be overlapped with each of the above-described corresponding lower alignment hole 15 and upper alignment hole 24 at the time of temporary joint, which allows positioning among the metallic sheets 10, 20, 70.

As shown in FIG. 80, on the lower surface 70a of the intermediate metallic sheet 70, a annular-shaped intermediate peripheral liquid flow path portion 79 (third peripheral liquid flow path portion) through which the working fluid 2 in liquid form passes is formed. The intermediate peripheral liquid flow path portion 79 is formed in an inner portion of the frame portion 73 along the periphery of the intermediate metallic sheet 70 in a planar view. The intermediate peripheral liquid flow path portion 79 is formed to surround the sealed space 3, especially the communicating portion 71. In other words, in a planar view, the intermediate communicating passages 177 or the intermediate communicating communication passage 178 of the communicating portion 71 are interposed between the land portions 74 and the intermediate peripheral liquid flow path portion 79. The intermediate peripheral liquid flow path portion 79 has a rectangular annular shape in a planar view. Each side thereof is in parallel to the first direction X or the second direction Y.

As shown in FIG. 80, the intermediate peripheral liquid flow path portion 79 is formed over the entire periphery of the intermediate metallic sheet 70 except an after-mentioned conduction portion 190 allowing communication between the intermediate injection flow path portion 176 and the communicating portion 71. In other words, the intermediate peripheral liquid flow path portion 79 is partially noncontinuous at the conduction portion 190 (similar to the conduction portion 128 in the thirteenth embodiment) through which the working fluid 2 is injected from the intermediate injection flow path portion 176. Consequently, in the enclosing step, the working fluid 2 can be injected from the intermediate injection flow path portion 176 into the communicating portion 71 through the conduction portion 190. On the other hand, the intermediate peripheral liquid flow path portion 79 is formed over the entire periphery of the intermediate metallic sheet 70 except the conduction portion 190. Accordingly, the working fluid 2 can circulate toward the evaporating portion 11 substantially over the entire periphery of the intermediate metallic sheet 70.

The width w15 of the intermediate peripheral liquid flow path portion 79 may be similar to the width w13 of the upper peripheral liquid flow path portion 127 in the thirteenth embodiment. As shown in FIGS. 64 and 80, similar to the thirteenth embodiment, the width w12 of the lower peripheral liquid flow path portion 118 of the lower metallic sheet 10 may be wider than the width w15 of the intermediate peripheral liquid flow path portion 79 of the intermediate metallic sheet 70 (w12>w15).

In this embodiment, a part of the lower peripheral liquid flow path portion 118 of the lower metallic sheet 10, and a part of the intermediate peripheral liquid flow path portion 79 of the intermediate metallic sheet 70 overlap with each other in a planar view. Specifically, except the inner portion 118a of the lower peripheral liquid flow path portion 118 and the conduction portion 190, the lower peripheral liquid flow path portion 118 and the intermediate peripheral liquid flow path portion 79 overlap with each other. Thereby, the lower peripheral liquid flow path portion 118 and the intermediate peripheral liquid flow path portion 79 can efficiently circulate the working fluid 2.

As shown in FIG. 79, the peripheral liquid flow path portion is not formed in the upper surface 70b of the intermediate metallic sheet 70. As shown in FIG. 78, the peripheral liquid flow path portion is not formed in the lower surface 20a of the upper metallic sheet 20. However, not limited to this, in addition to or instead of the lower peripheral liquid flow path portion 118 and the intermediate peripheral liquid flow path portion 79 according to this embodiment, the peripheral liquid flow path portion may be formed in the upper surface 70b of the intermediate metallic sheet 70 similarly to the intermediate peripheral liquid flow path portion 79, and the peripheral liquid flow path portion may be formed in the lower surface 20a of the upper metallic sheet 20 similarly to the lower peripheral liquid flow path portion 118. In this case, the liquid flow path portion 30 may be provided in the lower surface 20a of the upper metallic sheet 20.

Additionally, in this embodiment, the injection portion 4 may be formed similarly to the injection portion 4 in the thirteenth embodiment shown in FIGS. 62 to 76. In other words, as shown in FIG. 63, the lower metallic sheet 10 includes the lower injection protruding portion 16, and the lower injection flow path recess (injection flow path recess) 17 is formed on the upper surface of the lower injection protruding portion 16. However, as shown in FIG. 78, the upper metallic sheet 20 includes the upper injection protruding portion 25. However, no recess is formed on the lower surface of the upper injection protruding portion 25, which is formed to have a flat shape.

As shown in FIGS. 79 and 80, the intermediate metallic sheet includes an intermediate injection protruding portion 175 laterally protruding from the end surface. As shown in FIG. 80, in the lower surface of the intermediate injection protruding portion 175, the intermediate injection flow path portion 176 is formed to be concave. As shown in FIG. 79, in the upper surface of the intermediate injection protruding portion 175, no recess is formed and a flat shape is formed. The lower injection flow path recess 17 and the intermediate injection flow path portion 176 integrally form an injection flow path of the working fluid 2 when the lower metallic sheet 10 and the intermediate metallic sheet 70 are joined. The injection protruding portions 16, 25, 175 are configured to be overlapped with each other after the lower metallic sheet 10, the upper metallic sheet 20 and the intermediate metallic sheet 70 are joined. The intermediate injection protruding portion 175 may be formed similarly to the upper injection protruding portion 25 in the thirteenth embodiment.

The intermediate injection flow path portion 176 is not limited to that formed to be concave. For example, the intermediate injection flow path portion 176 may extend from the lower surface 70*a* to the upper surface 70*b* of the intermediate metallic sheet 70, and may be formed to penetrate the intermediate metallic sheet 70.

However, there is no limitation thereto. For example, in addition to the lower injection flow path recess 17 or instead of the lower injection flow path recess 17, the injection flow path recess (injection flow path recess) may be formed on the lower surface of the upper injection protruding portion 25. In this case, the injection flow path recess may be formed also in the upper surface of the intermediate injection protruding portion 175. Alternatively, instead of such an injection portion 4, the lower metallic sheet 10 or the upper metallic sheet 20 may be provided with an injection hole, and the working fluid 2 may be injected through the injection hole.

As described above, according to this embodiment, the intermediate metallic sheet 70 is interposed between the lower metallic sheet 10 and the upper metallic sheet 20, the lower surface 20*a* of the upper metallic sheet 20 is provided with the upper vapor flow path recess 21, and the upper surface 10*a* of the lower metallic sheet 10 is provided with the liquid flow path portion 30. The intermediate metallic sheet 70 is provided with the communicating portion 71 allowing communication between the upper vapor flow path recesses 21 and the liquid flow path portion 30. Thereby, even in a case where three metallic sheets 10, 20, 70 constitute the vapor chamber 1, the heat of the device D can be transferred and released by circulating the working fluid 2 in the vapor chamber 1 in the sealed space 3, with the change of phase being repeated. Since the upper vapor flow path recess 21 of the upper metallic sheet 20 widely communicates, which can smoothly diffuse the vapor of the working fluid 2, and improve the thermal transport efficiency.

According to this embodiment, similar to the thirteenth embodiment shown in FIGS. 62 to 76, the lower peripheral liquid flow path portion 118 is formed over the entire periphery of the lower metallic sheet 10. Accordingly, for example, the lower peripheral liquid flow path portion 118 can be prevented from being non-continuous around the lower injection flow path recess 17. Consequently, the capillary can be prevented from being non-continuous. Thereby, the circulation of the working fluid 2 can be prevented from being inhibited at the outer peripheral portion of the vapor chamber 1, and the working fluid 2 can smoothly circulate over the entire region of the outer peripheral portion of the vapor chamber 1. As a result, the condensation and circulation of the working fluid 2 at the outer peripheral portion of the vapor chamber 1 are stabilized, and the thermal transport performance of the vapor chamber 1 can be improved.

Fifteenth Embodiment

Next, a vapor chamber, an electronic device, and a metallic sheet for the vapor chamber according to a fifteenth embodiment of the present invention will be explained using FIGS. 81 to 85.

In the fifteenth embodiment shown in FIGS. 81 to 85, a main difference is that an intermediate metallic sheet is interposed between a lower metallic sheet and an upper metallic sheet, the vapor flow path portion is provided on the upper surface of the intermediate metallic sheet, the liquid flow path portion and the intermediate peripheral liquid flow path portion are provided on the lower surface of the intermediate metallic sheet, and the intermediate peripheral liquid flow path portion is formed over the entire periphery of the intermediate metallic sheet. The other configurations are substantially the same as in the fifth embodiment shown in FIGS. 28 to 33 and the fourteenth embodiment shown in FIGS. 77 to 80. Additionally, in FIGS. 81 to 85, the same components as those in the fifth embodiment shown in FIGS. 28 to 33 and the fourteenth embodiment shown in FIGS. 77 to 80 are assigned the same reference numerals, and a detailed explanation thereof is omitted.

Figure 81:
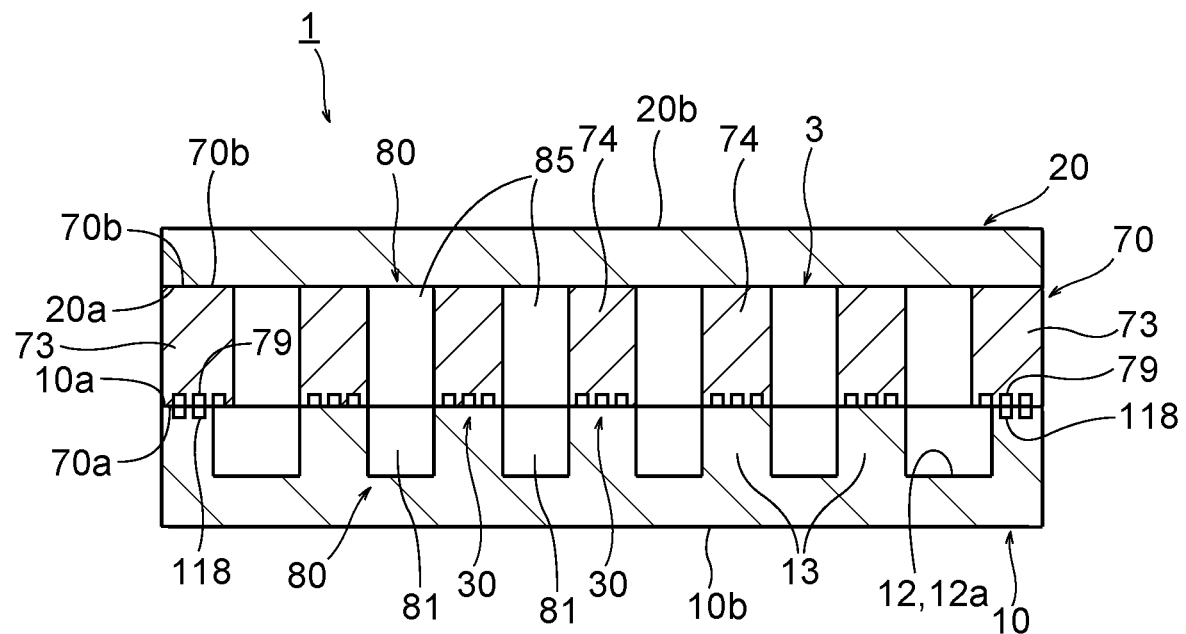
FIG. 81 is a cross-sectional view showing a vapor chamber according to a fifteenth embodiment.
Figure 82:
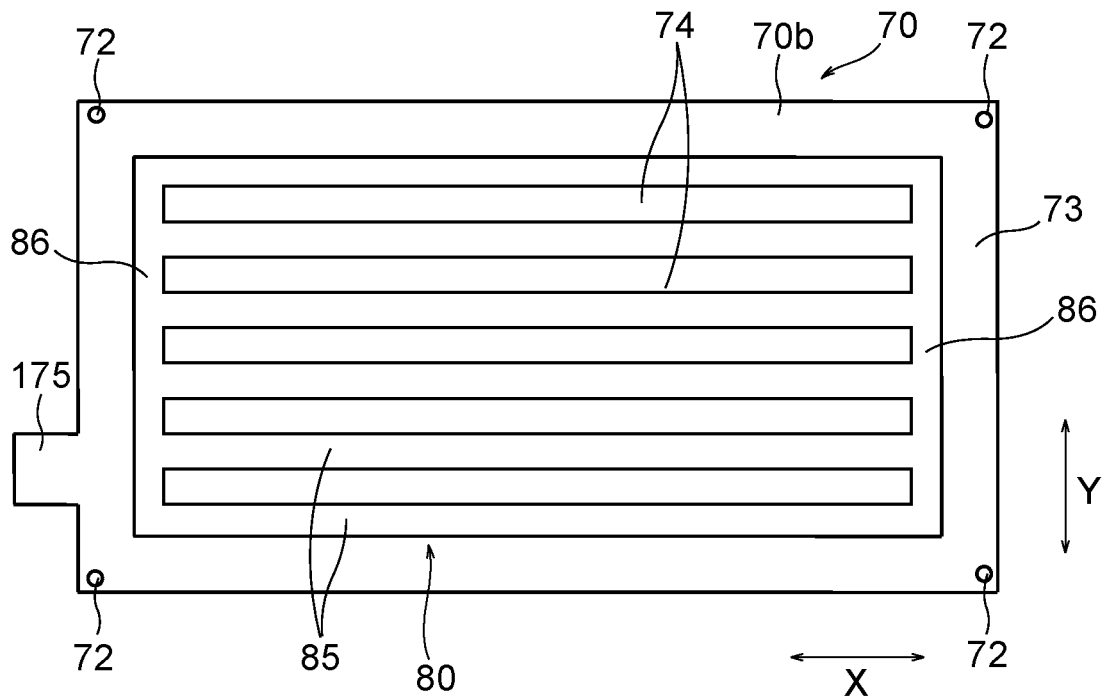
FIG. 82 is a top view of an intermediate metallic sheet of FIG. 81.
Figure 83:
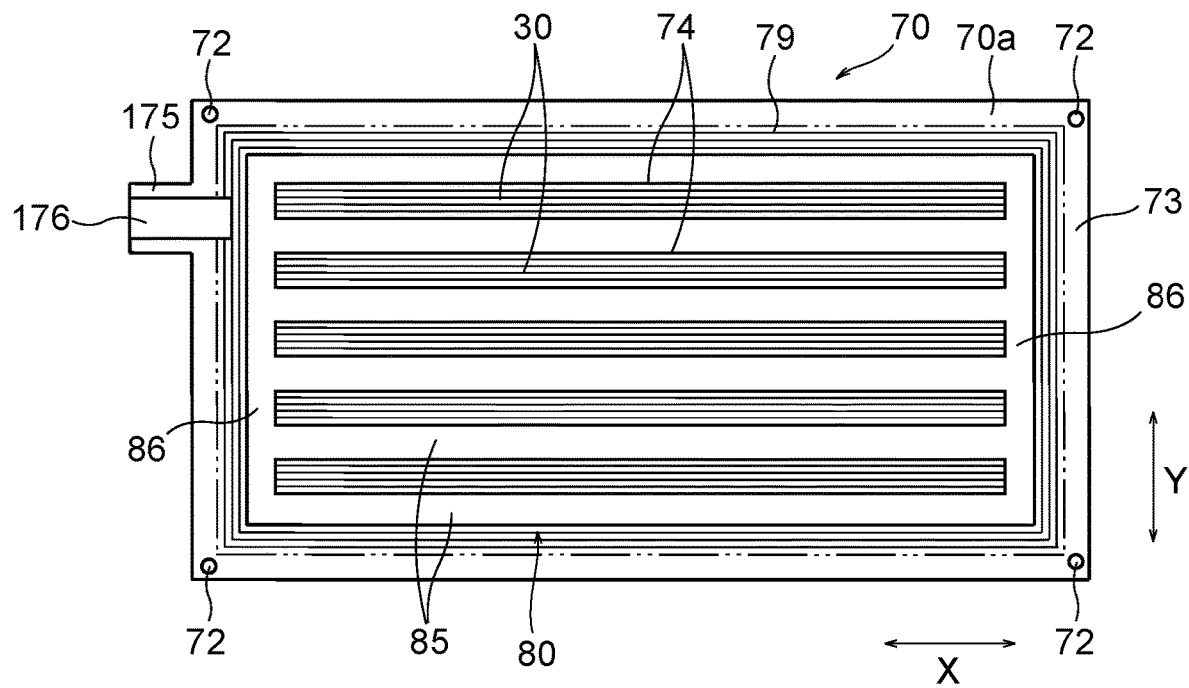
FIG. 83 is a bottom view of an intermediate metallic sheet of FIG. 81.

As shown in FIGS. 82 and 83, similar to the fourteenth embodiment, the intermediate metallic sheet 70 according to this embodiment includes a frame portion 73 formed to have a rectangular frame in a planar view, and a plurality of land portions 74 provided in the frame portion 73. The supporting portion which supports the land portions 74 and is not shown is formed so as to inhibit blocking of the flow of the vapor of the working fluid 2 flowing in the intermediate vapor passage 85 which will be described later. For example, the supporting portion may be formed at a part of a range from the upper surface 70*b* to the lower surface 70*a* of the intermediate metallic sheet 70 in the vertical direction in FIG. 81.

The vapor flow path portion 80 includes a plurality of intermediate vapor passages 85 (third vapor passages, vapor passages) partitioned by the land portions 74. The intermediate vapor passages 85 extend to be elongated along the first direction X, and are disposed to be parallel with each other. The both end portions of each intermediate vapor passage 85 communicate with the intermediate communicating vapor passage 86 extending to be elongated along the second direction Y, and each intermediate vapor passage 85 communicates via the intermediate communicating vapor passage 86. In this way, such a configuration is made that the vapor of the working fluid 2 flows along a periphery of each land portion 74 (the intermediate vapor passage 85 and the intermediate communicating vapor passage 86) and the vapor is transported to a peripheral portion of the vapor flow path portion 80, which inhibits blocking of vapor flow. Additionally, in FIG. 81, the shape of the cross section (the section in the second direction Y) of each intermediate vapor passage 85 is a rectangle. However, not limited to this, the shape of the cross section of each intermediate vapor passage 85 may be, for example, curved, semi-circular or V-shaped, and may be arbitrary as long as the vapor of the working fluid 2 can be diffused. The same is applied to the intermediate communicating vapor passage 86. The intermediate vapor passages 85 and the intermediate communicating vapor passage 86 can be formed by etching similarly to the intermediate communication passage 177 and the intermediate communicating communication passage 178 in the fourteenth embodiment shown in FIGS. 77 to 80, and have cross sectional shapes similarly to the intermediate communicating passages 177 and the intermediate communicating communication passage 178. The width of the intermediate vapor passage 85 and the width of the intermediate communicating vapor passage 86 can be similar to the width w14 of the intermediate communication passage 177.

As shown in FIG. 83, the liquid flow path portions 30 are provided on the land portions 74 on the lower surface 70*a* of the intermediate metallic sheet 70. In other words, the liquid flow path portions 30 are provided on the lower surfaces of the land portions 74. The intermediate peripheral liquid flow path portion 79 (third peripheral liquid flow path portion) is provided in the lower surface of the frame portion 73. The intermediate peripheral liquid flow path portion 79 may be formed similarly to the lower peripheral liquid flow path portion 118 in the thirteenth embodiment. In other words, the intermediate peripheral liquid flow path portion 79 is formed over the entire periphery of the intermediate metallic sheet 70. The intermediate peripheral liquid flow path portion 79 is formed without discontinuity over all the four sides constituting the rectangular intermediate metallic sheet 70. The intermediate peripheral liquid flow path portion 79 is formed across the injection flow path of the working fluid 2 formed of the intermediate injection flow path portion 176. The working fluid 2 can circulate also adjacent to the intermediate injection flow path portion 176. In FIG. 83, the intermediate injection flow path portion 176 extends to the middle of the intermediate peripheral liquid flow path portion 79 in the width direction (first direction X). However, not limited thereto, the intermediate injection flow path portion 176 does not necessarily extend to the intermediate peripheral liquid flow path portion 79.

Figure 84:
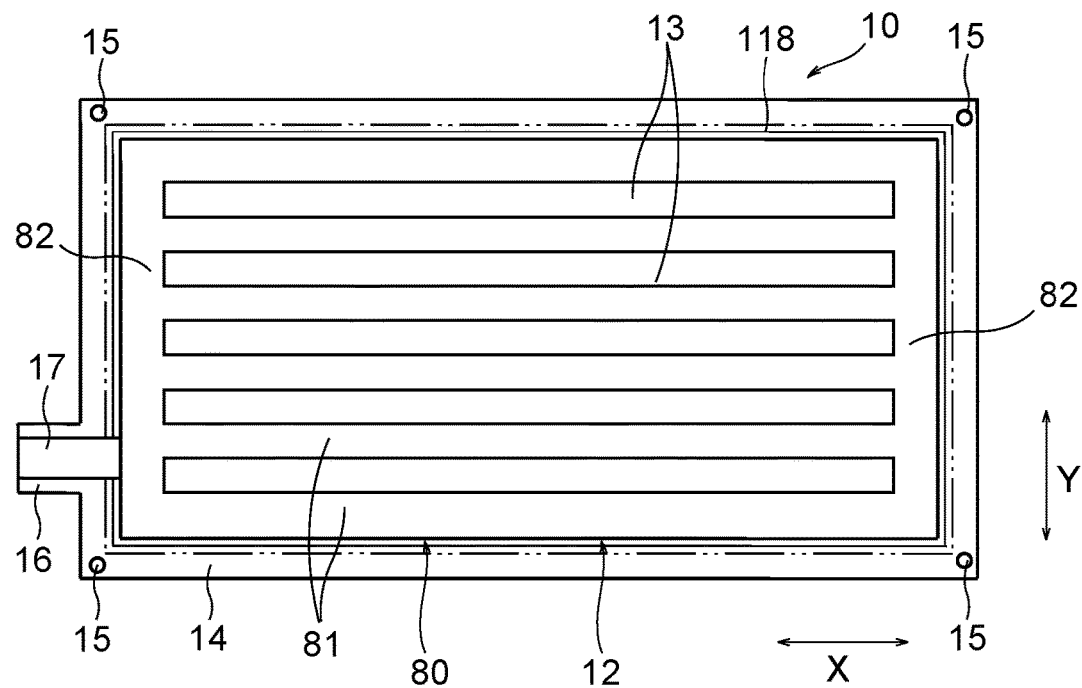
FIG. 84 is a top view of a lower metallic sheet of FIG. 84.

As shown in FIGS. 81 and 84, the upper surface 10a of the lower metallic sheet 10 according to this embodiment is provided with the lower vapor flow path recess 12 similar to that in the thirteenth embodiment bus is not provided with the liquid flow path portion 30. However, the lower peripheral liquid flow path portion 118 is provided in the upper surface 10a. The lower peripheral liquid flow path portion 118 shown in FIG. 84 may be formed similarly to the upper peripheral liquid flow path portion 127 in the thirteenth embodiment. The thickness of the lower metallic sheet 10 according to this embodiment may be similar to the thickness of the lower metallic sheet 10 in the thirteenth embodiment.

As shown in FIG. 81, the lower surface 20a of the upper metallic sheet 20 is provided with no upper vapor flow path recess 21 and with no liquid flow path portion 30. The lower surface 20a is formed to be planar. The thickness of the upper metallic sheet 20 according to this embodiment is, for example, 8 µm to 100 µm.

In the vapor chamber 1 according to this embodiment, the vapor flow path portion 80 and the liquid flow path portions 30 of the intermediate metallic sheet 70 can be formed by etching. Subsequently, the lower metallic sheet 10 and the upper metallic sheet 20 are joined, with the intermediate metallic sheet 70 being intervening therebetween. In other words, the lower metallic sheet 10 and the intermediate metallic sheet 70 are subjected to diffused junction, while the upper metallic sheet 20 and the intermediate metallic sheet 70 are subjected to diffused junction. Thereby, the sealed space 3 is formed. The lower metallic sheet 10, the intermediate metallic sheet 70 and the upper metallic sheet 20 may be integrally subjected to diffused junction at one time.

In this embodiment, the intermediate injection flow path portion 176 (injection flow path) is formed to be concave on the lower surface of the intermediate injection protruding portion 175 constituting the injection portion 4. In FIG. 84, the intermediate injection flow path portion 176 extends to the middle of the intermediate peripheral liquid flow path portion 79 in the width direction (first direction X). However, not limited thereto, the intermediate injection flow path portion 176 does not necessarily extend to the intermediate peripheral liquid flow path portion 79. The lower injection flow path recess 17 is formed in the upper surface of the lower injection protruding portion 16. However, in this embodiment, the lower injection flow path recess 17 communicates with the lower vapor flow path recess 12. The lower injection flow path recess 17 and the intermediate injection flow path portion 176 integrally form an injection flow path of the working fluid 2 when the lower metallic sheet 10 and the intermediate metallic sheet 70 are joined.

As described above, according to this embodiment, the intermediate metallic sheet 70 is interposed between the lower metallic sheet 10 and the upper metallic sheet 20, the upper surface 70b of the intermediate metallic sheet 70 is provided with the vapor flow path portion 80, and the lower surface 70a of the intermediate metallic sheet 70 is provided with the liquid flow path portion 30. Thereby, even in a case where three metallic sheets 10, 20, 70 constitute the vapor chamber 1, the heat of the device D can be transferred and released by circulating the working fluid 2 in the vapor chamber 1 in the sealed space 3, with the change of phase being repeated.

According to this embodiment, similar to the thirteenth embodiment shown in FIGS. 62 to 76, the intermediate peripheral liquid flow path portion 79 is formed over the entire periphery of the intermediate metallic sheet 70. Accordingly, for example, the intermediate peripheral liquid flow path portion 79 can be prevented from being non-continuous around the lower injection flow path recess 17. Consequently, the capillary can be prevented from being non-continuous. Thereby, the circulation of the working fluid 2 can be prevented from being inhibited at the outer peripheral portion of the vapor chamber 1, and the working fluid 2 can smoothly circulate over the entire region of the outer peripheral portion of the vapor chamber 1. As a result, the condensation and circulation of the working fluid 2 at the outer peripheral portion of the vapor chamber 1 are stabilized, and the thermal transport performance of the vapor chamber 1 can be improved.

According to this embodiment, the vapor flow path portion 80 extends from the upper surface 70b to the lower surface 70a of the intermediate metallic sheet 70. Thereby, the flow path resistance of the vapor flow path portion 80 can be reduced. Consequently, the working fluid 2 in liquid form generated from the vapor of the working fluid 2 by condensation at the vapor flow path portion 80 is allowed to smoothly enter the main flow grooves 31 of the liquid flow path portion 30. On the other hand, the vapor of the working fluid 2 evaporated at the evaporating portion 11 is allowed to be smoothly diffused to the vapor flow path portion 80.

Figure 85:
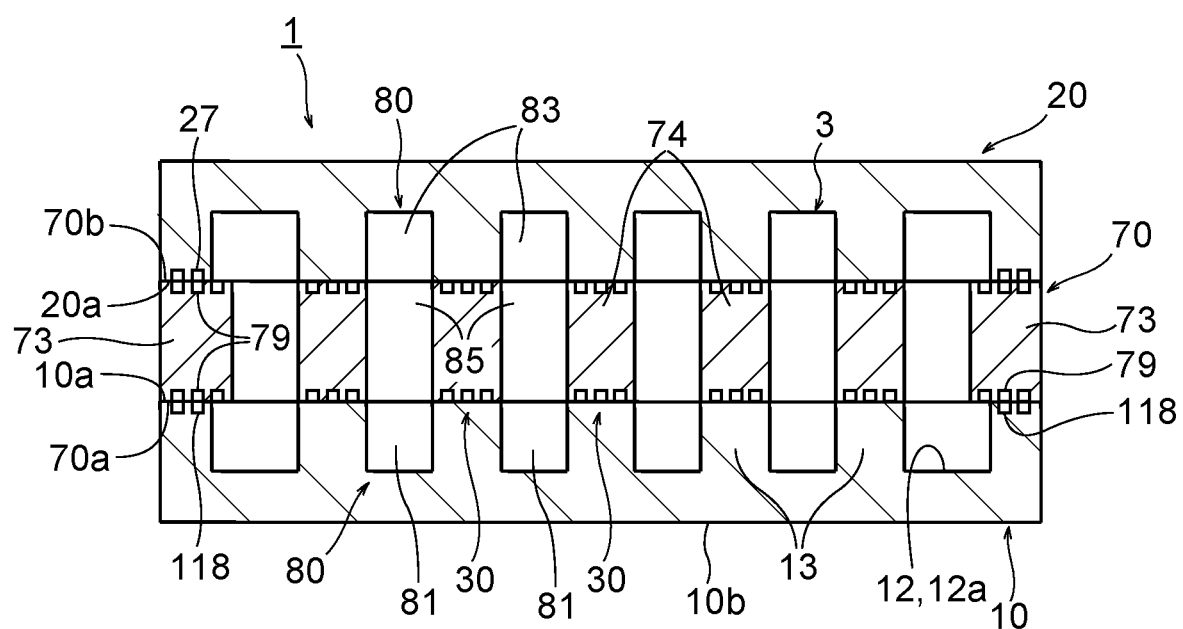
FIG. 85 is a cross-sectional view showing a modification of the vapor chamber of FIG. 81.

In this embodiment described above, an example in which the liquid flow path portion 30 is provided on the lower surface 70a of the intermediate metallic sheet 70 has been explained. However, not limited to this, as shown in FIG. 85, the liquid flow path portion 30 may be provided not only on the lower surface 70a but also on the upper surface 70b. In this case, the number of flow paths for transporting the working fluid 2 in liquid form to the evaporating portion 11 or a portion close to the evaporating portion 11 on the intermediate metallic sheet 70 can be increased, which can improve the transport efficiency of the working fluid 2 in liquid form. As a result, the thermal transport efficiency of the vapor chamber 1 can be improved. In this case, the upper peripheral liquid flow path portion 127 may be provided in the lower surface 20a of the upper metallic sheet 20, and the upper injection flow path recess 26 may be provided in the lower surface of the upper injection protruding portion 25. The intermediate peripheral liquid flow path portion 79 may be provided in the upper surface 70b of the intermediate metallic sheet 70, and the intermediate injection flow path portion 176 may be formed in the upper surface of the intermediate injection protruding portion 175.

The present invention is not directly limited to the above embodiments and modifications, and in an implementation phase, can be embodied with modification of constituent elements without departing the gist of the present invention. Also, various inventions can be made by an appropriate combination of a plurality of constituent elements disclosed in the above embodiments and modifications. Several constituent elements may be deleted from all the constituent elements shown in the embodiments and modifications. Moreover, in each of the above embodiments and modifications, the configuration of the lower metallic sheet 10 may be replaced with the configuration of the upper metallic sheet 20.

The invention claimed is:

1. A vapor chamber in which a working fluid is enclosed, the vapor chamber comprising:
   a first metallic sheet;
   a second metallic sheet laminated over the first metallic sheet;
   a third metallic sheet between the first metallic sheet and the second metallic sheet, and
   a sealed space which is between the first metallic sheet and the second metallic sheet, the sealed space including a vapor flow path portion through which a vapor of the working fluid passes and a liquid flow path portion through which the working fluid in liquid form passes,
   wherein the liquid flow path portion includes a plurality of grooves through which the working fluid in liquid form passes,
   the liquid flow path portion is in one of a surface of the first metallic sheet on a side of the third metallic sheet, and a surface of the third metallic sheet on a side of the first metallic sheet, and in a cross-sectional view, a plurality of groove convex portions each protrudes toward the inside of a corresponding one groove from the other one of the surface of the first metallic sheet on the side of the third metallic sheet, and the surface of the third metallic sheet on the side of the first metallic sheet, and
   a cross section of each of the groove convex portions is curve.

2. The vapor chamber according to claim 1, wherein the plurality of grooves includes a plurality of main flow grooves which each extend in a first direction, and
   the plurality of groove convex portions includes a plurality of main flow groove convex portions which each protrude toward the main flow grooves.

3. The vapor chamber according to claim 2, wherein the plurality of grooves further includes a plurality of communicating grooves,
   a convex array, which includes a plurality of liquid flow path convex portions arranged in the first direction via the communicating groove, is between a pair of the main flow grooves adjacent to each other, and
   the communicating groove allows communication between the corresponding pair of the main flow grooves.

4. The vapor chamber according to claim 3, wherein the depth of the communicating groove is deeper than the depth of the main flow groove.

5. The vapor chamber according to claim 3, wherein the main flow groove includes an intersection which communicates with the communicating groove, and a main flow groove main body which is positioned at a position different from the intersection in the first direction and is positioned between a pair of the liquid flow path convex portions adjacent to each other, and
   the depth of the intersection of the main flow groove is deeper than the depth of the main flow groove main body.

6. The vapor chamber according to claim 5, wherein the depth of the intersection of the main flow groove is deeper than the depth of the communicating groove.

7. The vapor chamber according to claim 3, wherein a rounded curved portion is at a corner portion of the liquid flow path convex portion.

8. The vapor chamber according to claim 3, wherein the communicating grooves are aligned in a second direction intersecting with the first direction.

9. The vapor chamber according to claim 1, wherein the plurality of grooves includes a plurality of main flow grooves which each extend in a first direction, and a plurality of communicating grooves,
   a convex array, which includes a plurality of liquid flow path convex portions arranged in the first direction via the communicating groove, is between a pair of the main flow grooves adjacent to each other,
   the communicating groove allows communication between the corresponding pair of the main flow grooves, and
   the plurality of groove convex portions includes a plurality of communicating groove convex portions which each protrude toward the communicating grooves.

10. The vapor chamber according to claim 9, wherein a cross section of the communicating groove convex portion is formed to be curved.

11. The vapor chamber according to claim 1, wherein the vapor flow path portion is in at least one of a surface of the second metallic sheet on a side of the third metallic sheet, and a surface of the third metallic sheet on a side of the second metallic sheet,
    the liquid flow path portion is in a surface of the first metallic sheet on a side of the third metallic sheet, and
    a communicating portion allowing communication between the vapor flow path portion and the liquid flow path portion is in the third metallic sheet.

12. The vapor chamber according to claim 1, wherein the third metallic sheet includes a first surface on a side of the first metallic sheet, and a second surface on a side of the second metallic sheet,
    the vapor flow path portion is in the second surface of the third metallic sheet, and
    the liquid flow path portion is in the first surface of the third metallic sheet, and communicates with the vapor flow path portion.

13. An electronic device comprising:
    a housing;
    a device housed in the housing; and
    the vapor chamber according to claim 1, the vapor chamber being thermally contact with the device.

14. The vapor chamber according to claim 1, wherein a corner portion formed by a side wall of the groove and the groove convex portion is wedge-shaped.

15. The vapor chamber according to claim 1, wherein a cross section of a space bounded by the groove and the groove convex portion is a crescent shape.

16. A vapor chamber in which a working fluid is enclosed, the vapor chamber comprising:
    a first metallic sheet;

a second metallic sheet laminated on the first metallic sheet;

a sealed space which is between the first metallic sheet and the second metallic sheet, the sealed space including a vapor flow path portion through which a vapor of the working fluid passes and a liquid flow path portion through which the working fluid in liquid form passes, wherein the liquid flow path portion includes a plurality of grooves through which the working fluid in liquid form passes, the liquid flow path portion is in a surface of the first metallic sheet on a side of the second metallic sheet, when seen in a cross-sectional view, a plurality of groove convex portions each protrude toward the inside of a corresponding one groove of the plurality of grooves first metallic sheet from a surface of the second metallic sheet on a side of the first metallic sheet, and a cross section of each of the groove convex portions is curved.

17. A manufacturing method of a vapor chamber comprising a first metallic sheet, a second metallic sheet laminated over the first metallic sheet, a third metallic sheet which is between the first metallic sheet and the second metallic sheet, and a sealed space which is between the first metallic sheet and the second metallic sheet and in which a working fluid is enclosed, the sealed space including a vapor flow path portion through which a vapor of the working fluid passes and a liquid flow path portion through which the working fluid in liquid form passes, the manufacturing method of the vapor chamber comprising:

half-etching in which the liquid flow path portion is formed in one of a surface of the first metallic sheet on a side of the third metallic sheet and on a surface of the third metallic sheet on a side of the first metallic sheet by half-etching;

joining the first metallic sheet and the second metallic sheet via the third metallic sheet such that the sealed space is formed between the first metallic sheet and the second metallic sheet; and enclosing the working fluid in the sealed space, wherein the liquid flow path portion includes a plurality of grooves through which the working fluid in liquid form passes, the liquid flow path portion is in one of a surface of the first metallic sheet on a side of the third metallic sheet, and a surface of the third metallic sheet on a side of the first metallic sheet, and in a cross-sectional view, a plurality of groove convex portions each protrude toward the inside of a corresponding one groove from the other one of the surface of the first metallic sheet on the side of the third metallic sheet, and the surface of the third metallic sheet on the side of the first metallic sheet, and a cross section of each of the groove convex portions is curved.

18. The manufacturing method of the vapor chamber according to claim 17, wherein the plurality of grooves includes a plurality of main flow grooves which each extend in a first direction, and the plurality of groove convex portions includes a plurality of main flow groove convex portions which each protrude toward the main flow grooves.

19. The manufacturing method of the vapor chamber according to claim 17, wherein the plurality of grooves includes a plurality of main flow grooves which each extend in a first direction, and a plurality of communicating grooves, a convex array, which includes a plurality of liquid flow path convex portions arranged in the first direction via the communicating groove, is between a pair of the main flow grooves adjacent to each other, the communicating groove allows communication between the corresponding pair of the main flow grooves, and the plurality of groove convex portions includes a plurality of communicating groove convex portions which protrude toward the communicating grooves.

20. The manufacturing method of the vapor chamber according to claim 17, further comprising:

forming the vapor flow path portion in at least one of a surface of the second metallic sheet on a side of the third metallic sheet, and a surface of the third metallic sheet on a side of the second metallic sheet; and forming a communicating portion in the third metallic sheet, the communicating portion allowing communication between the vapor flow path portion and the liquid flow path portion.

21. The manufacturing method of the vapor chamber according to claim 17, wherein the third metallic sheet includes a first surface on a side of the first metallic sheet, and a second surface on a side of the second metallic sheet, the vapor flow path portion is formed in the second surface of the third metallic sheet, and the liquid flow path portion is formed in the first surface of the third metallic sheet, the vapor flow path portion and the liquid flow path portion communicates.

22. A manufacturing method of a vapor chamber including a sealed space which is between a first metallic sheet and a second metallic sheet and in which a working fluid is enclosed, the sealed space including a vapor flow path portion through which a vapor of the working fluid passes and a liquid flow path portion through which the working fluid in liquid form passes, the manufacturing method of the vapor chamber comprising:

half-etching in which the liquid flow path portion is formed in a surface of the first metallic sheet on a side of the second metallic sheet by half-etching;

joining the first metallic sheet and the second metallic sheet such that the sealed space is formed between the first metallic sheet and the second metallic sheet; and enclosing the working fluid in the sealed space, wherein the liquid flow path portion includes a plurality of grooves through which the working fluid in liquid form passes, the second metallic sheet includes a plurality of groove convex portions, which when seen in a cross-sectional view, each protrude toward the inside of a corresponding one groove of the plurality of grooves from a surface of the second metallic sheet on a side of the first metallic sheet, and a cross section of each of the groove convex portions is curved.

* * * * *